United States Patent
Hatakeyama et al.

(10) Patent No.: US 11,637,250 B2
(45) Date of Patent: *Apr. 25, 2023

(54) POLYCYCLIC AROMATIC COMPOUND AND LIGHT EMITTING LAYER-FORMING COMPOSITION

(71) Applicants: Kwansei Gakuin Educational Foundation, Hyogo (JP); SK Materials JNC Co., Ltd., Gyeonggi-do (KR)

(72) Inventors: Takuji Hatakeyama, Hyogo (JP); Yasuhiro Kondo, Chiba (JP); Keiichi Nakamoto, Chiba (JP); Motoki Yanai, Chiba (JP)

(73) Assignees: Kwansei Gakuin Educational Foundation, Hyogo (JP); SK Materials JNC Co., Ltd., Gyeonggi-do (KR)

( * ) Notice: Subject to any disclaimer, the term of this patent is extended or adjusted under 35 U.S.C. 154(b) by 350 days.

This patent is subject to a terminal disclaimer.

(21) Appl. No.: 16/860,261

(22) Filed: Apr. 28, 2020

(65) Prior Publication Data

US 2020/0259089 A1 Aug. 13, 2020

Related U.S. Application Data

(62) Division of application No. 15/556,551, filed as application No. PCT/JP2016/056399 on Mar. 2, 2016, now Pat. No. 10,680,186.

(30) Foreign Application Priority Data

Mar. 9, 2015 (JP) .................................. 2015-045902

(51) Int. Cl.
*C07F 5/02* (2006.01)
*H01L 51/00* (2006.01)
(Continued)

(52) U.S. Cl.
CPC .............. *H01L 51/008* (2013.01); *C07F 5/02* (2013.01); *C07F 5/027* (2013.01); *C09K 11/025* (2013.01);
(Continued)

(58) Field of Classification Search
CPC .................................... C07F 5/02; C07F 5/027
See application file for complete search history.

(56) References Cited

U.S. PATENT DOCUMENTS 9,166,176 B2  10/2015 Hatakeyama et al.
10,374,166 B2  8/2019 Hatakeyama et al.
10,689,402 B2 *  6/2020 Hatakeyama ....... H01L 51/0052
(Continued)

FOREIGN PATENT DOCUMENTS

CN  105431439 A  3/2016
EP  1640430 A1  3/2006
(Continued)

OTHER PUBLICATIONS

Edura et al., "Al cathode deposition for all wet-processed OLED devices with TADF emitting material by rotation magnet sputtering," The 61st JSAP Spring Meeting 2014, 17a-PG1-12, with English translation of Abstract.
(Continued)

*Primary Examiner* — Rosalynd A Keys
(74) *Attorney, Agent, or Firm* — Foley & Lardner LLP

(57) ABSTRACT

The present invention addresses the problem of providing a polycyclic aromatic compound which has improved solubility in solvents, film formability, wet coatability and in-plane orientation. The above-described problem is solved by a composition for forming a light emitting layer, which contains, as a first component, at least one compound selected from the group consisting of compounds represented by general formula (A-1) and compounds represented by general formula (A-2), as a second component, at least one compound that has a triplet energy ($E_T$) of 1.8-3.0 eV, and as a third component, at least one organic solvent.

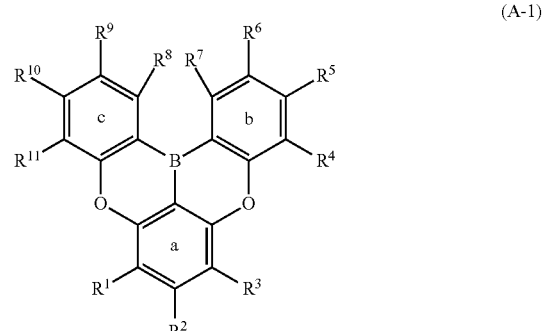

(A-1)

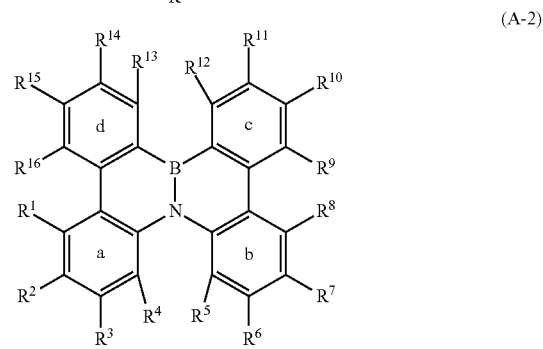

(A-2)

In the formulae, R represents a hydrogen atom, an aryl group, a heteroaryl group, a diarylamino group, a diheteroarylamino group or an aryl heteroarylamino group.

6 Claims, 2 Drawing Sheets

(51) Int. Cl.
  *H01L 51/50* (2006.01)
  *C09K 11/06* (2006.01)
  *H05B 33/20* (2006.01)
  *H05B 33/14* (2006.01)
  *C09K 11/02* (2006.01)

(52) U.S. Cl.
  CPC .......... *C09K 11/06* (2013.01); *H01L 51/0059* (2013.01); *H01L 51/50* (2013.01); *H05B 33/14* (2013.01); *H05B 33/20* (2013.01); *H01L 51/0007* (2013.01); *H01L 51/0037* (2013.01); *H01L 51/0085* (2013.01); *H01L 51/5016* (2013.01); *H01L 2251/308* (2013.01)

(56) References Cited

U.S. PATENT DOCUMENTS

| | | |
|---|---|---|
| 2002/0048687 A1 | 4/2002 | Hosokawa et al. |
| 2013/0214259 A1 | 8/2013 | Watanabe et al. |
| 2013/0292665 A1 | 11/2013 | Ono |
| 2014/0027734 A1 | 1/2014 | Kwong |
| 2014/0058099 A1 | 2/2014 | Wakamiya et al. |
| 2015/0097162 A1 | 4/2015 | Ono et al. |
| 2015/0236274 A1 | 8/2015 | Hatakeyama et al. |
| 2016/0049600 A1 | 2/2016 | Hatakeyama et al. |

FOREIGN PATENT DOCUMENTS

| | | |
|---|---|---|
| EP | 3109253 A1 | 12/2016 |
| JP | 2013-247179 A | 12/2013 |
| WO | WO 2015/102118 A1 | 7/2015 |

OTHER PUBLICATIONS

Fukushima et al., "Molecular weight dependency of emitting property of polymer emitting material," Proceedings of the 18th Organic EL Symposium S3-3, Jul. 17, 2014, 9-10, with English translation of Abstract.

Hashimoto et al., "Triplet Energy Control of Polycyclic Aromatic Hydrocarbons by BN Replacement: Development of Ambipolar Host Materials for Phosphorescent Organic Light-Emitting Diodes," Chemistry of Materials, Oct. 5, 2014, 26:6265-6271.

Hirai et al., "One-Step Borylation of 1,3-Diaryloxybenzenes Towards Efficient Materials for Organic Light-Emitting Diodes," Angew Chem. Int. Ed. Engl., Sep. 18, 2015, 54(46):13581-13585, abstract only.

Tai et al., "Theoretical Design of π-Conjugated Heteropolycyclic Compounds Containing a Tricoordinated Boron Center," The Journal of Physical Chemistry, Jul. 3, 2013, 117:14999-15008.

\* cited by examiner

POLYCYCLIC AROMATIC COMPOUND AND LIGHT EMITTING LAYER-FORMING COMPOSITION

CROSS-REFERENCE TO RELATED APPLICATIONS

This application is a Divisional of U.S. application Ser. No. 15/556,551, which is the U.S. National Stage application of PCT/JP2016/056399, filed Mar. 2, 2016, which claims priority from Japanese application JP 2015-045902, filed Mar. 9, 2015.

TECHNICAL FIELD

The present invention relates to a polycyclic aromatic compound, a light emitting layer-forming composition (ink composition) using the same, and an organic electroluminescent element (organic EL element) manufactured using the composition. More specifically, the present invention relates to a light emitting layer-forming composition containing a polycyclic aromatic compound having high triplet energy ($E_T$), capable of wet film formation, and exhibiting excellent characteristics in a case of use as a constituent component of an organic EL element. In addition, the present invention relates to a polycyclic aromatic compound having high triplet energy ($E_T$), having a functional group bonded thereto.

BACKGROUND ART

An organic EL element can manufacture a display element and lighting which are driven by low power, are thin and light, and have excellent flexibility, and has been therefore actively studied as a next generation light emitting display element.

An organic EL element has a structure having a pair of electrodes composed of a positive electrode and a negative electrode, and a single layer or a plurality of layers which are disposed between the pair of electrodes and contain an organic compound. Examples of a layer containing an organic compound include a light emitting layer and a charge transport/injection layer for transporting or injecting a charge such as a hole or an electron. As a method for forming these organic layers, a vacuum deposition method or a wet film formation method is used.

The vacuum deposition method is advantageous in that a high-quality film can be formed uniformly on a substrate, a luminescent element which can be easily laminated and has excellent characteristics can be easily obtained, an extremely small amount of impurities derived from a manufacturing process are mixed, and the like. Many organic EL elements which are practically used now are obtained by the vacuum deposition method using a low molecular weight material. Meanwhile, a vacuum deposition apparatus used in the vacuum deposition method has such problems that the apparatus is generally expensive, continuous manufacturing is difficult, and manufacturing cost is high when all the steps are performed in vacuum.

On the other hand, the wet film formation method does not require a vacuum process, does not require an expensive vacuum deposition apparatus, and therefore makes it possible to form a layer at relatively low cost. In addition, the wet film formation method is advantageous in that an area can be large, continuous manufacturing is possible, a plurality of materials having various functions can be contained in one layer (coating liquid), and the like. Meanwhile, in the wet film formation method, lamination is difficult, and it is difficult to obtain a high-quality and uniform coating film which does not contain impurities derived from a manufacturing process (for example, a solvent).

For the wet film formation method, ink compositions utilizing phosphorescent light or thermally activated delayed fluorescence have been developed (Non Patent Literatures 1 and 2), but in general, a host compound and a dopant compound constituting these ink compositions have a low solubility, film formability is not good, and optimization of these compositions has not been progressed. Therefore, at present, a characteristic comparable to an organic EL element using the vacuum deposition method has not been achieved yet.

CITATION LIST

Patent Literature

Patent Literature 1: WO 2001/072673 A
Patent Literature 2: WO 2012/102333 A
Patent Literature 3: JP 2006-045503 A
Patent Literature 4: JP 2013-168411 A
Patent Literature 5: JP 2013-247179 A
Patent Literature 6: US 2013/214259 A

Non Patent Literature

Non Patent Literature 1: Proceedings of the 61st Annual Meeting of the Japan Society of Applied Physics, Spring Science Lecture 17a-PG1-12
Non Patent Literature 2: Proceedings of the 18th Organic EL Symposium S3-3

SUMMARY OF INVENTION

Technical Problem

An object of the present invention is to provide a polycyclic aromatic compound having excellent solubility in a solvent, and having high triplet energy despite of a low molecular weight material. Another object of the present invention is to provide a polycyclic aromatic compound having improved solubility, film formability, wet coatability, and in-plane orientation of the compound by imparting a functional group to the above polycyclic aromatic compound. Still another object of the present invention is to provide a light emitting layer-forming ink composition for wet film formation using the above polycyclic aromatic compound or the above polycyclic aromatic compound to which a functional group is imparted as a host. Further still another object of the present invention is to provide an organic EL element in which at least one of efficiency, lifetime, and driving voltage is excellent by using the ink composition as a light emitting layer of the organic EL element due to use of a wet film formation method.

Solution to Problem

As a result of intensive studies to solve the above problems, the present inventors have found that a novel polycyclic aromatic compound in which a plurality of aromatic rings is linked with a boron atom, an oxygen atom, or the like has excellent solubility in a solvent, and has high triplet energy despite of a low molecular weight material. In addition, the present inventors have found that solubility, film formability, wet coatability, and in-plane orientation of the compound can be further improved by imparting a functional group to the above polycyclic aromatic compound. Furthermore, the present inventors have found that by combining the above polycyclic aromatic compound or the above polycyclic aromatic compound to which a functional group is imparted as a host, a phosphorescent material or a thermally activated delayed fluorescent material having a triplet energy ($E_T$) of 1.8 to 3.0 eV as a dopant, and a suitable organic solvent, a light emitting layer-forming composition (ink composition) having good film formability and storage stability can be obtained by a wet film formation method. In addition, the present inventors have found that at least one of efficiency, lifetime, and driving voltage of an organic EL element using the ink composition is excellent.

[1]

A light emitting layer-forming composition for applying and forming a light emitting layer of an organic electroluminescent element, comprising:

at least one selected from the group consisting of a compound represented by the following general formula (A-1) and a compound represented by the following general formula (A-2) as a first component;

at least one compound having triplet energy ($E_T$) of 1.8 to 3.0 eV as a second component; and at least one organic solvent as a third component.

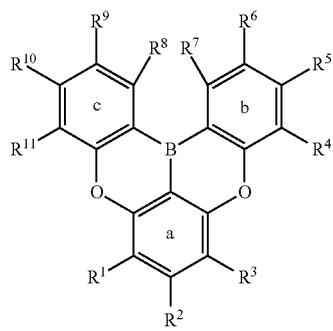

(A-1)

(In general formula (A-1), $R^1$ to $R^{11}$ each independently represent a hydrogen atom, an aryl, a heteroaryl, a diarylamino, a diheteroarylamino, an arylheteroarylamino, or an aryloxy, while at least one hydrogen atom in these may be further substituted by an aryl, a heteroaryl, or a diarylamino, adjacent groups among $R^1$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, or an aryloxy, at least one hydrogen atom in these may be further substituted by an aryl, a heteroaryl, or a diarylamino, at least one hydrogen atom in a compound represented by the above formula (A-1) may be substituted by a group represented by the following general formula (FG-1), a group represented by the following general formula (FG-2), an alkyl having 1 to 24 carbon atoms, a halogen atom, or a deuterium atom, any —$CH_2$— in the alkyl may be substituted by —O— or —Si($CH_3$)$_2$—, any —$CH_2$— excluding —$CH_2$— directly bonded to a compound represented by the above formula (A-1) in the alkyl may be substituted by an arylene having 6 to 24 carbon atoms, and any hydrogen atom in the alkyl may be substituted by a fluorine atom.)

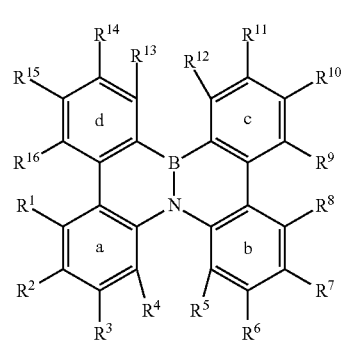

(A-2)

(In general formula (A-2), $R^1$ to $R^{16}$ each independently represent a hydrogen atom, an aryl, a heteroaryl, a diarylamino, a diheteroarylamino, an arylheteroarylamino, or an aryloxy, while at least one hydrogen atom in these may be further substituted by an aryl, a heteroaryl, or a diarylamino, adjacent groups among $R^1$ to $R^{16}$ may be bonded to each other to form an aryl ring or a heteroaryl ring together with ring a, ring b, ring c, or ring d, at least one hydrogen atom in the ring thus formed may be substituted by an aryl, a heteroaryl, a diarylamino, a diheteroarylamino, an arylheteroarylamino, or an aryloxy, at least one hydrogen atom in these may be further substituted by an aryl, a heteroaryl, or a diarylamino, at least one hydrogen atom in a compound represented by the above formula (A-2) may be substituted by a group represented by the following general formula (FG-1), a group represented by the following general formula (FG-2), an alkyl having 1 to 24 carbon atoms, a halogen atom, or a deuterium atom, any —$CH_2$— in the alkyl may be substituted by —O— or —Si($CH_3$)$_2$—, any —$CH_2$— excluding —$CH_2$— directly bonded to a compound represented by the above formula (A-2) in the alkyl may be substituted by an arylene having 6 to 24 carbon atoms, and any hydrogen atom in the alkyl may be substituted by a fluorine atom.)

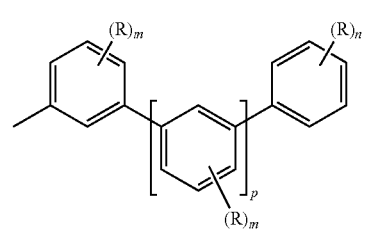

(FG-1)

(In general formula (FG-1),

R's each independently represent a fluorine atom, a trimethylsilyl, a trifluoromethyl, an alkyl having 1 to 24 carbon atoms, or a cycloalkyl having 3 to 24 carbon atoms, any —$CH_2$— in the alkyl may be substituted by —O—, any —$CH_2$— excluding —$CH_2$— directly bonded to a phenyl or a phenylene in the alkyl may be substituted by an arylene having 6 to 24 carbon atoms, at least one hydrogen atom in the cycloalkyl may be substituted by an alkyl having 1 to 24 carbon atoms or an aryl having 6 to 12 carbon atoms, when two adjacent R's each represent an alkyl or a cycloalkyl, these R's may be bonded to each other to form a ring, m's each independently represent an integer of 0 to 4,
n's each independently represent an integer of 0 to 5, and
p's each independently represent an integer of 1 to 5.)

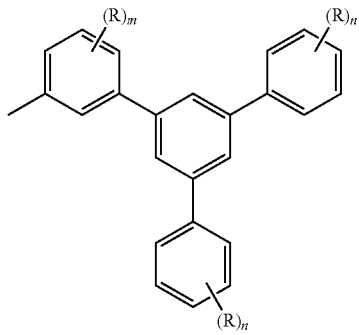

(FG-2)

(In general formula (FG-2),

R's each independently represent a fluorine atom, a trimethylsilyl, a trifluoromethyl, an alkyl having 1 to 24 carbon atoms, a cycloalkyl having 3 to 24 carbon atoms, or an aryl having 6 to 12 carbon atoms, any —$CH_2$— in the alkyl may be substituted by —O—, any —$CH_2$— excluding —$CH_2$— directly bonded to a phenyl or a phenylene in the alkyl may be substituted by an arylene having 6 to 24 carbon atoms, at least one hydrogen atom in the cycloalkyl may be substituted by an alkyl having 1 to 24 carbon atoms or an aryl having 6 to 12 carbon atoms, at least one hydrogen atom in the aryl may be substituted by an alkyl having 1 to 24 carbon atoms, when two adjacent R's each represent an alkyl or a cycloalkyl, these R's may be bonded to each other to form a ring, m's each independently represent an integer of 0 to 4, and n's each independently represent an integer of 0 to 5)

[2]
The light emitting layer-forming composition described in [1], in which the first component comprises a compound represented by the above formula (A-1).

[3]
The light emitting layer-forming composition described in [1] or [2], in which in the above formula (A-1), $R^1$ to $R^{11}$ each independently represent a hydrogen atom, an aryl having 6 to 30 carbon atoms, a heteroaryl having 2 to 30 carbon atoms or a diarylamino (the aryl is an aryl having 6 to 12 carbon atoms), at least one hydrogen atom in these may be further substituted by an aryl having 6 to 30 carbon atoms, a heteroaryl having 2 to 30 carbon atoms or a diarylamino (the aryl is an aryl having 6 to 12 carbon atoms), adjacent groups among $R^1$ to $R^{11}$ may be bonded to each other to form an aryl ring having 9 to 16 carbon atoms or a heteroaryl ring having 6 to 15 carbon atoms together with ring a, ring b, or ring c, at least one hydrogen atom in the ring thus formed may be substituted by an aryl having 6 to 30 carbon atoms, a heteroaryl having 2 to 30 carbon atoms or a diarylamino (the aryl is an aryl having 6 to 12 carbon atoms), at least one hydrogen atom in these may be further substituted by an aryl having 6 to 30 carbon atoms, a heteroaryl having 2 to 30 carbon atoms or a diarylamino (the aryl is an aryl having 6 to 12 carbon atoms), and at least one hydrogen atom in a compound represented by the above formula (A-1) may be substituted by a group represented by the above formula (FG-1), a group represented by the above formula (FG-2), an alkyl having 1 to 24 carbon atoms, a halogen atom, or a deuterium atom.

[4]
The light emitting layer-forming composition described in any one of [1] to [3], in which in the above formula (A-1), $R^1$ to $R^{11}$ each independently represent any one selected from the group consisting of a hydrogen atom and groups represented by the following formulas (RG-1) to (RG-10), and the groups represented by the following formulas (RG-1) to (RG-10) are each bonded to the above formula (A-1) at *, and

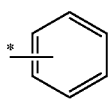

(RG-1)

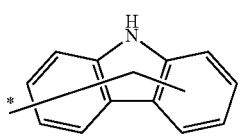

(RG-2)

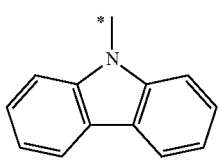

(RG-3)

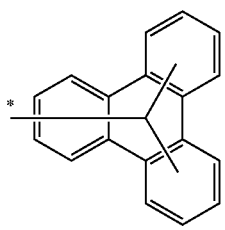

(RG-4)

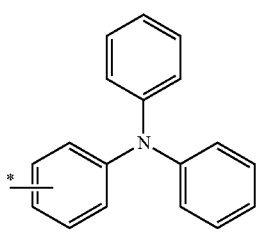

(RG-5)

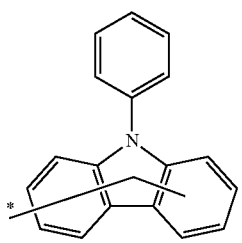

(RG-6)

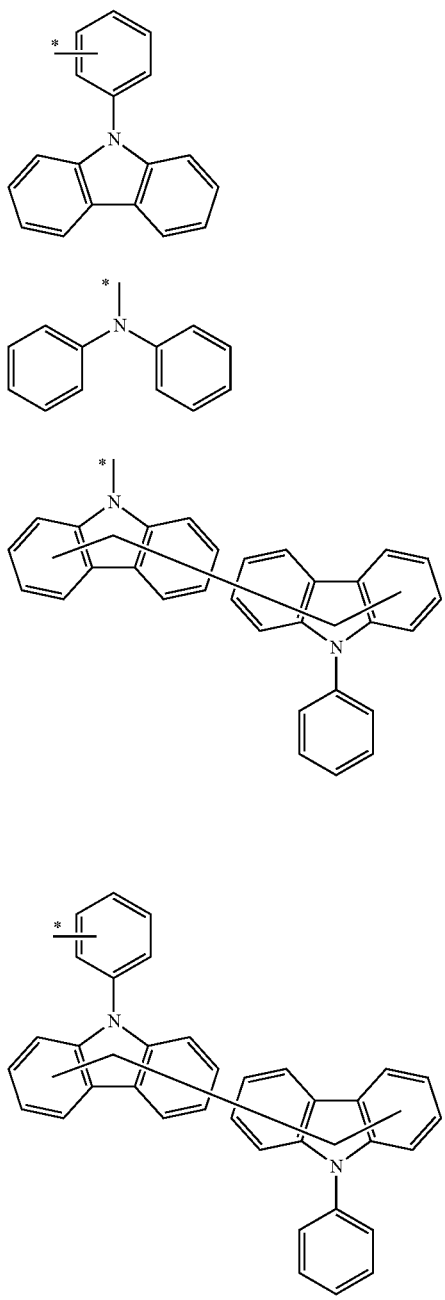
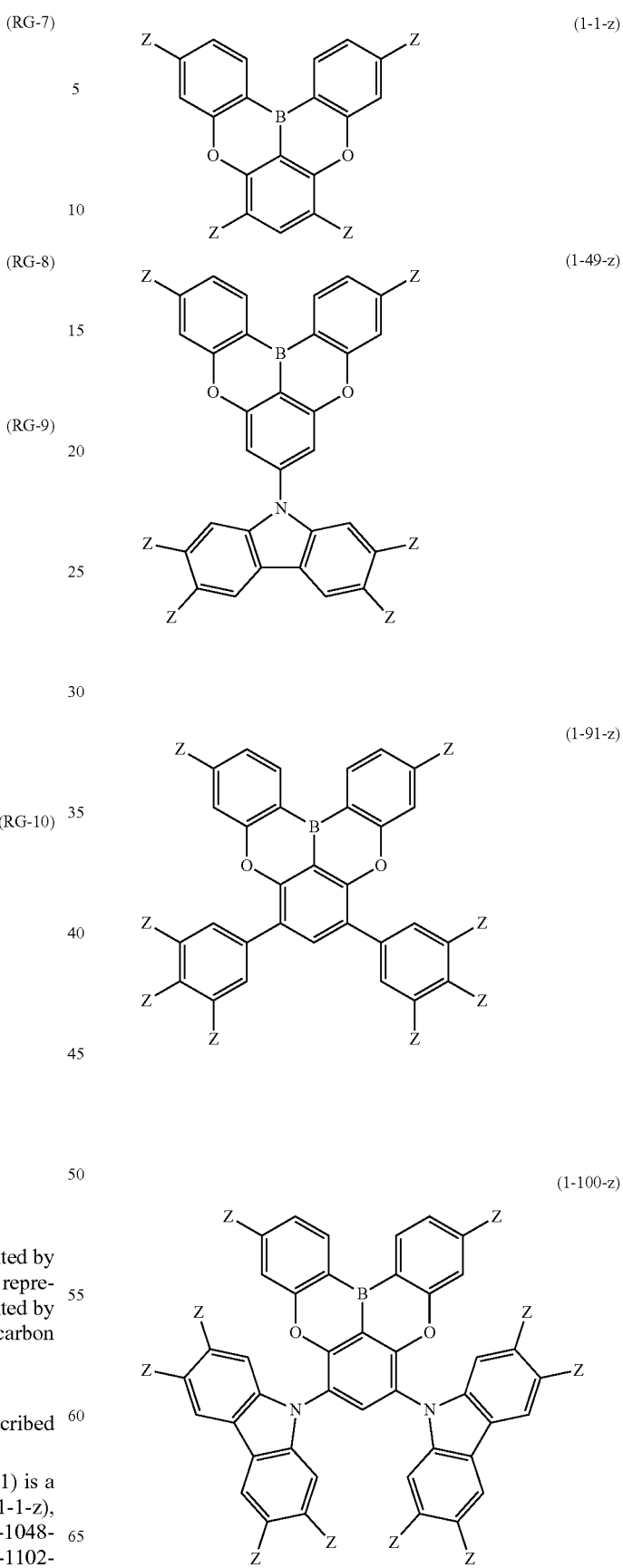

at least one hydrogen atom in a compound represented by the above formula (A-1) is substituted by a group represented by the above formula (FG-1), a group represented by the above formula (FG-2), or an alkyl having 7 to 24 carbon atoms.

[5]

The light emitting layer-forming composition described in any one of [1] to [4], in which a compound represented by the above formula (A-1) is a compound represented by the following formula (1-1-z), (1-49-z), (1-91-z), (1-100-z), (1-152-z), (1-176-z), (1-1048-z), (1-1049-z), (1-1050-z), (1-1069-z), (1-1101-z), (1-1102-z), or (1-1103-z).

(1-152-z)
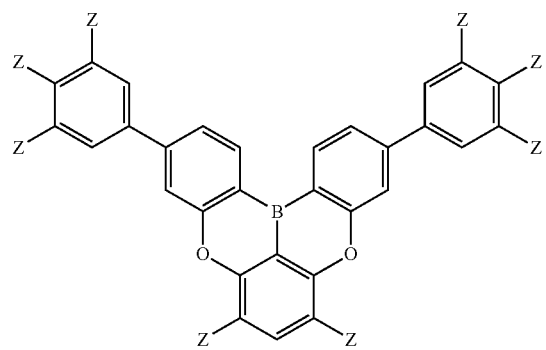
(1-1049-z)
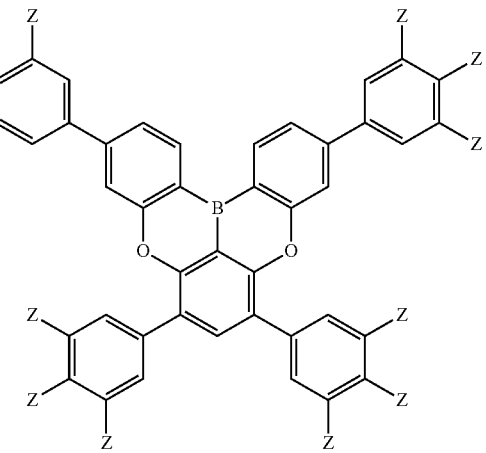
(1-176-z)
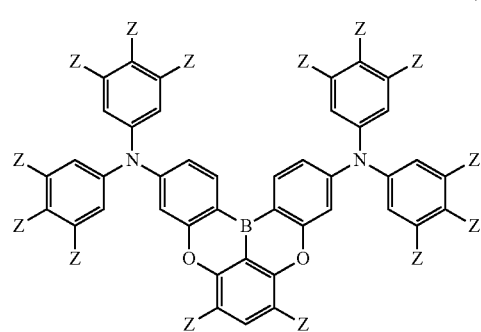
(1-1050-z)
(1-1048-z)
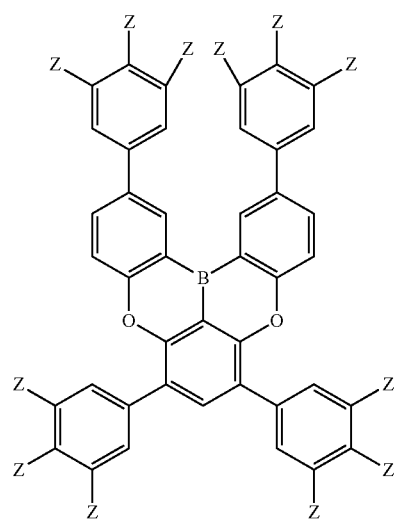
(1-1069-z)
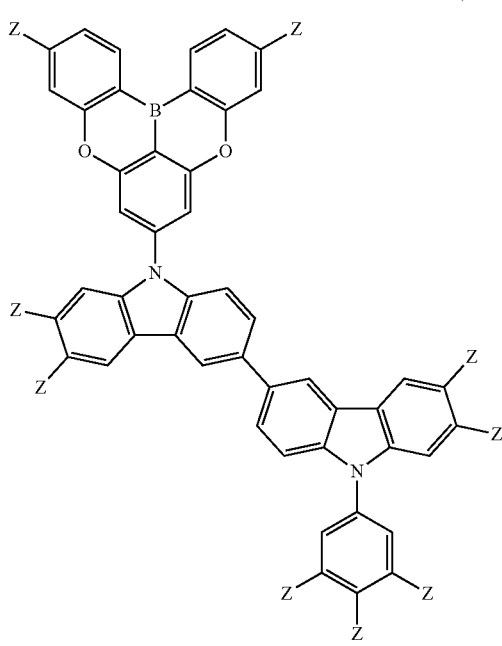

-continued

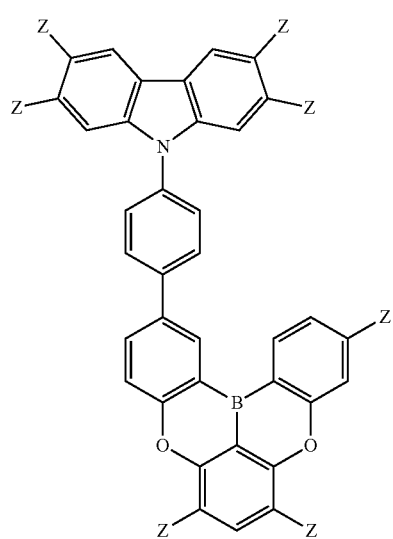
(1-1101-z)

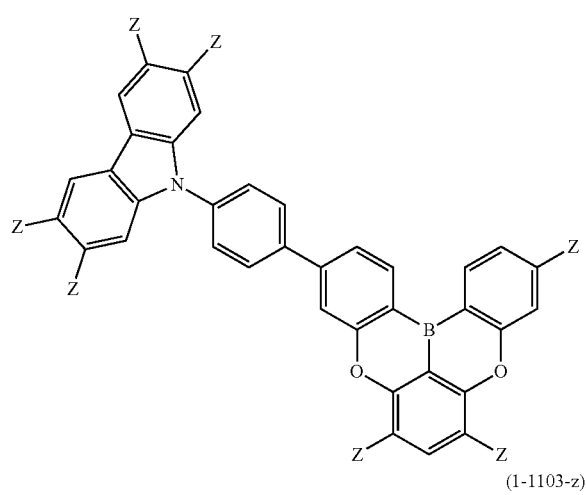
(1-1102-z)

(1-1103-z)

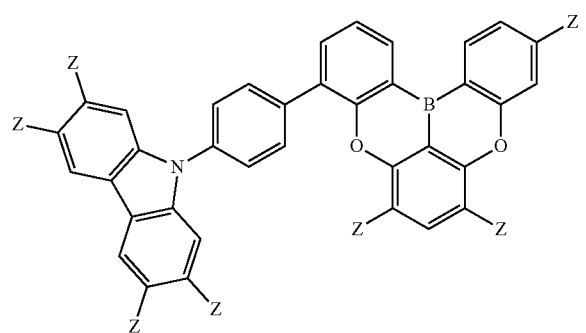

(z's in the above formulas each represent a hydrogen atom, a group represented by the above formula (FG-1), a group represented by the above formula (FG-2), or an alkyl having 7 to 24 carbon atoms, and not all z's represent hydrogen atoms.)

[6]

The light emitting layer-forming composition described in any one of [1] to [5], in which the first component comprises a compound represented by the above formula (A-2).

[7]

The light emitting layer-forming composition described in any one of [1] to [5], in which in the above formula (A-2), $R^1$ to $R^{16}$ each independently represent a hydrogen atom, an aryl having 6 to 30 carbon atoms, a heteroaryl having 2 to 30 carbon atoms or a diarylamino (the aryl is an aryl having 6 to 12 carbon atoms), at least one hydrogen atom in these may be further substituted by an aryl having 6 to 30 carbon atoms, a heteroaryl having 2 to 30 carbon atoms or a diarylamino (the aryl is an aryl having 6 to 12 carbon atoms), adjacent groups among $R^1$ to $R^{16}$ may be bonded to each other to form an aryl ring having 9 to 16 carbon atoms or a heteroaryl ring having 6 to 15 carbon atoms together with ring a, ring b, or ring c, at least one hydrogen atom in the ring thus formed may be substituted by an aryl having 6 to 30 carbon atoms, a heteroaryl having 2 to 30 carbon atoms or a diarylamino (the aryl is an aryl having 6 to 12 carbon atoms), at least one hydrogen atom in these may be further substituted by an aryl having 6 to 30 carbon atoms, a heteroaryl having 2 to 30 carbon atoms or a diarylamino (the aryl is an aryl having 6 to 12 carbon atoms), and at least one hydrogen atom in a compound represented by the above formula (A-2) may be substituted by a group represented by the above formula (FG-1), a group represented by the above formula (FG-2), an alkyl having 1 to 24 carbon atoms, a halogen atom, or a deuterium atom.

[8]

The light emitting layer-forming composition described in any one of [1] to [7], in which in the above formula (A-2), $R^1$ to $R^{16}$ each independently represent any one selected from the group consisting of a hydrogen atom and groups represented by the above formulas (RG-1) to (RG-10), the groups represented by the above formulas (RG-1) to (RG-10) are each bonded to the above formula (A-2) at *, and at least one hydrogen atom in a compound represented by the above formula (A-2) is substituted by a group represented by the above formula (FG-1), a group represented by the above formula (FG-2), or an alkyl having 7 to 24 carbon atoms.

[9]

The light emitting layer-forming composition described in any one of [1] to [8], in which in the above formula (FG-1), m and n each represent 0, and p represents an integer of 1 to 3, and in the formula (FG-2), m and n each represent 0.

[10]

The light emitting layer-forming composition described in any one of [1] to [9], in which at least one hydrogen atom in a compound represented by the above formula (A-1) or a compound represented by the above formula (A-2) is substituted by a group represented by the above formula (FG-1).

[11]

The light emitting layer-forming composition described in any one of [1] to [10], in which the second component is at least one selected from the group consisting of a compound represented by the following general formula (B-1) and a compound represented by the following general formula (B-2).

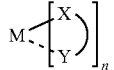
(B-1)

(In general formula (B-1),

M represents at least one selected from the group consisting of Ir, Pt, Au, Eu, Ru, Re, Ag, and Cu, n represents an integer of 1 to 3, and "(X-Y)'s" each independently represent a bidentate monoanionic ligand.)

ED-Ln-EA     (B-2)

(In general formula (B-2),

ED represents an electron-donating group, Ln represents a bonding group, EA represents an electron-accepting group, and an energy difference ($\Delta S^1 T^1$) between singlet energy ($S^1$) and triplet energy ($T^1$) of a compound represented by formula (B-2) is 0.2 eV or less.)

[12]

The light emitting layer-forming composition described in any one of [1] to [11], in which the boiling point of at least one organic solvent in the third component is from 130° C. to 300° C.

[13]

The light emitting layer-forming composition described in any one of [1] to [12], in which the third component comprises a good solvent (GS) and a poor solvent (PS) for a compound represented by the above formula (A-1) and/or a compound represented by the above formula (A-2), and the boiling point ($BP_{GS}$) of the good solvent (GS) is lower than the boiling point ($BP_{PS}$) of the poor solvent (PS)

[14]

The light emitting layer-forming composition described in any one of [1] to [13], in which the content of the first component is from 0.0999% by weight to 8.0% by weight with respect to the total weight of the light emitting layer-forming composition, the content of the second component is from 0.0001% by weight to 2.0% by weight with respect to the total weight of the light emitting layer-forming composition, and the content of the third component is from 90.0% by weight to 99.9% by weight with respect to the total weight of the light emitting layer-forming composition.

[15]

An organic electroluminescent element comprising a light emitting layer formed using the light emitting layer-forming composition described in any one of [1] to [14].

[16]

A display apparatus comprising the organic electroluminescent element described in [15].

[17]

A compound represented by the following general formula (A-1).

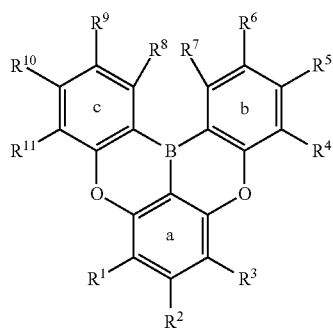

(A-1)

(In general formula (A-1), $R^1$ to $R^{11}$ each independently represent a hydrogen atom, an aryl, a heteroaryl, a diarylamino, a diheteroarylamino, an arylheteroarylamino, or an aryloxy, while at least one hydrogen atom in these may be further substituted by an aryl, a heteroaryl, or a diarylamino, adjacent groups among $R^1$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, or an aryloxy, at least one hydrogen atom in these may be further substituted by an aryl, a heteroaryl, or a diarylamino, at least one hydrogen atom in a compound represented by the above formula (A-1) is substituted by a group represented by the following general formula (FG-1), a group represented by the following general formula (FG-2), or an alkyl having 7 to 24 carbon atoms, at least one hydrogen atom in a compound represented by the above formula (A-1) may be further substituted by a halogen atom or a deuterium atom, any —$CH_2$— in the alkyl may be substituted by —O— or —$Si(CH_3)_2$—, any —$CH_2$— excluding —$CH_2$— directly bonded to the compound represented by the above formula (A-1) in the alkyl may be substituted by an arylene having 6 to 24 carbon atoms, and any hydrogen atom in the alkyl may be substituted by a fluorine atom.)

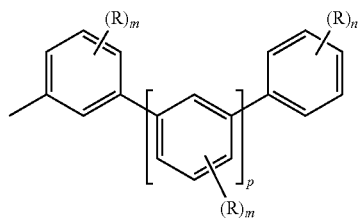

(FG-1)

(In general formula (FG-1),

R's each independently represent a fluorine atom, a trimethylsilyl, a trifluoromethyl, an alkyl having 1 to 24 carbon atoms, or a cycloalkyl having 3 to 24 carbon atoms, any —$CH_2$— in the alkyl may be substituted by —O—, any —$CH_2$— excluding —$CH_2$— directly bonded to a phenyl or a phenylene in the alkyl may be substituted by an arylene having 6 to 24 carbon atoms, at least one hydrogen atom in the cycloalkyl may be substituted by an alkyl having 1 to 24 carbon atoms or an aryl having 6 to 12 carbon atoms, when two adjacent R's each represent an alkyl or a cycloalkyl, these R's may be bonded to each other to form a ring, m's each independently represent an integer of 0 to 4, n's each independently represent an integer of 0 to 5, and p's each independently represent an integer of 1 to 5.)

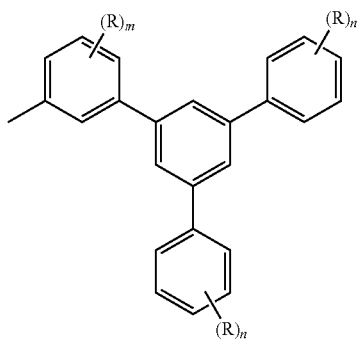
(FG-2)

(In general formula (FG-2),
R's each independently represent a fluorine atom, a trimethylsilyl, a trifluoromethyl, an alkyl having 1 to 24 carbon atoms, a cycloalkyl having 3 to 24 carbon atoms, or an aryl having 6 to 12 carbon atoms, any —CH$_2$— in the alkyl may be substituted by —O—, any —CH$_2$— excluding —CH$_2$— directly bonded to a phenyl or a phenylene in the alkyl may be substituted by an arylene having 6 to 24 carbon atoms, at least one hydrogen atom in the cycloalkyl may be substituted by an alkyl having 1 to 24 carbon atoms or an aryl having 6 to 12 carbon atoms, at least one hydrogen atom in the aryl may be substituted by an alkyl having 1 to 24 carbon atoms, when two adjacent R's each represent an alkyl or a cycloalkyl, these R's may be bonded to each other to form a ring, m's each independently represent an integer of 0 to 4, and n's each independently represent an integer of 0 to 5)

[18]
A compound represented by the following general formula (A-2).

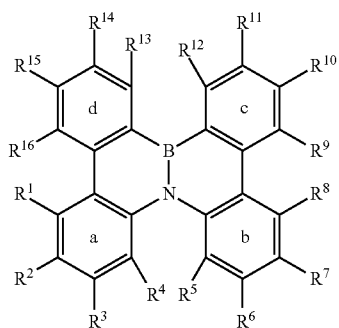
(A-2)

(In general formula (A-2),
R$^1$ to R$^{16}$ each independently represent a hydrogen atom, an aryl, a heteroaryl, a diarylamino, a diheteroarylamino, an arylheteroarylamino, or an aryloxy, while at least one hydrogen atom in these may be further substituted by an aryl, a heteroaryl, or a diarylamino, adjacent groups among R$^1$ to R$^{16}$ may be bonded to each other to form an aryl ring or a heteroaryl ring together with ring a, ring b, ring c, or ring d, at least one hydrogen atom in the ring thus formed may be substituted by an aryl, a heteroaryl, a diarylamino, a diheteroarylamino, an arylheteroarylamino, or an aryloxy, at least one hydrogen atom in these may be further substituted by an aryl, a heteroaryl, or a diarylamino, at least one hydrogen atom in a compound represented by the above formula (A-2) is substituted by a group represented by the following formula (FG-1), a group represented by the following general formula (FG-2), or an alkyl having 7 to 24 carbon atoms, at least one hydrogen atom in a compound represented by the above formula (A-2) may be further substituted by a halogen atom or a deuterium atom, any —CH$_2$— in the alkyl may be substituted by —O— or —Si(CH$_3$)$_2$—, any —CH$_2$— excluding —CH$_2$— directly bonded to a compound represented by the above formula (A-2) in the alkyl may be substituted by an arylene having 6 to 24 carbon atoms, and any hydrogen atom in the alkyl may be substituted by a fluorine atom.)

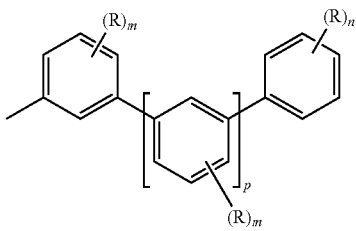
(FG-1)

(In general formula (FG-1),
R's each independently represent a fluorine atom, a trimethylsilyl, a trifluoromethyl, an alkyl having 1 to 24 carbon atoms, or a cycloalkyl having 3 to 24 carbon atoms, any —CH$_2$— in the alkyl may be substituted by —O—, any —CH$_2$— excluding —CH$_2$— directly bonded to a phenyl or a phenylene in the alkyl may be substituted by an arylene having 6 to 24 carbon atoms, at least one hydrogen atom in the cycloalkyl may be substituted by an alkyl having 1 to 24 carbon atoms or an aryl having 6 to 12 carbon atoms, when two adjacent R's each represent an alkyl or a cycloalkyl, these R's may be bonded to each other to form a ring, m's each independently represent an integer of 0 to 4,
n's each independently represent an integer of 0 to 5, and
p's each independently represent an integer of 1 to 5.)

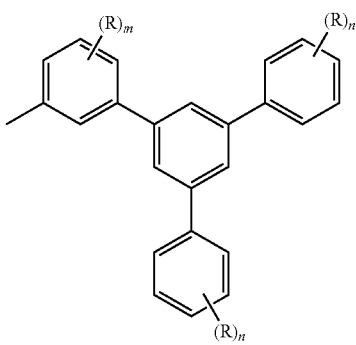
(FG-2)

(In general formula (FG-2),
R's each independently represent a fluorine atom, a trimethylsilyl, a trifluoromethyl, an alkyl having 1 to 24 carbon atoms, a cycloalkyl having 3 to 24 carbon atoms, or an aryl having 6 to 12 carbon atoms, any —CH$_2$— in the alkyl may be substituted by —O—, any —CH$_2$— excluding —CH$_2$— directly bonded to a phenyl or a phenylene in the alkyl may be substituted by an arylene having 6 to 24 carbon atoms, at least one hydrogen atom in the cycloalkyl may be substituted by an alkyl having 1 to 24 carbon atoms or an aryl having 6 to 12 carbon atoms, at least one hydrogen atom in the aryl may be substituted by an alkyl having 1 to 24 carbon atoms, when two adjacent R's each represent an alkyl or a cycloalkyl, these R's may be bonded to each other to form a ring, m's each independently represent an integer of 0 to 4, and n's each independently represent an integer of 0 to 5.)

Advantageous Effects of Invention

According to a preferable embodiment of the present invention, for example, a polycyclic aromatic compound that can be used as a material for an organic EL element cam be provided, and a light emitting layer-forming ink composition having good film formability and storage stability can be provided by a wet film formation method utilizing excellent solubility, film formability, wet coatability, and in-plane orientation of this polycyclic aromatic compound. Furthermore, an excellent organic EL element can be provided using a composition containing this polycyclic aromatic compound.

DESCRIPTION OF EMBODIMENTS

1. Light Emitting Layer-Forming Composition

Figure 1:
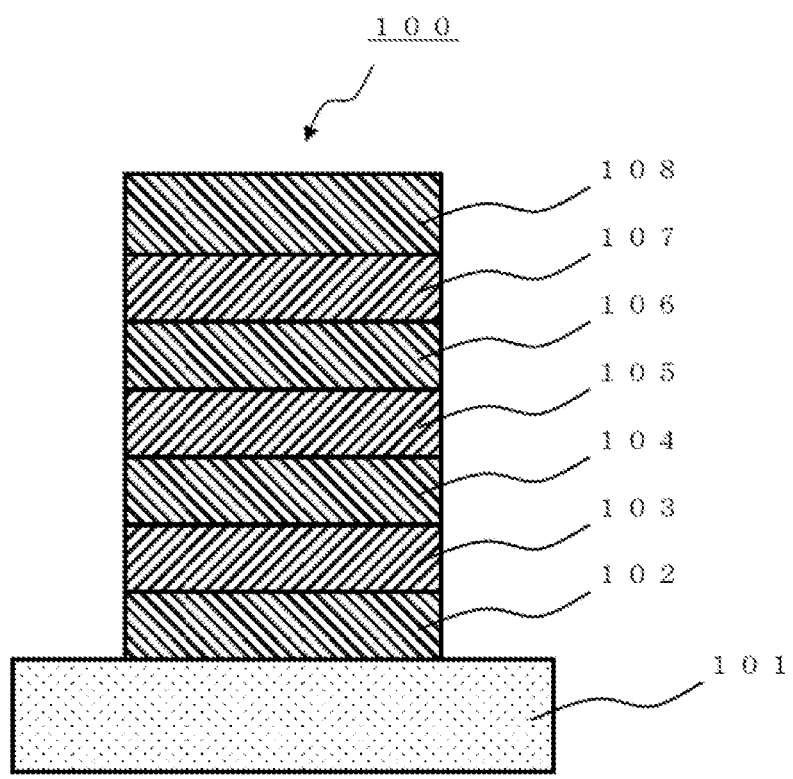
FIG. 1 is a schematic cross-sectional view illustrating an organic EL element according to the present embodiment.

A light emitting layer-forming composition of the present invention is a composition for coating and forming a light emitting layer of an organic EL element. The composition contains at least one selected from the group consisting of a compound represented by general formula (A-1) and a compound represented by general formula (A-2) as a first component, at least one compound having triplet energy ($E_T$) of 1.8 to 3.0 eV as a second component, and at least one organic solvent as a third component. The first component functions as a host component of a light emitting layer obtained from the composition, and the second component functions as a dopant component of the light emitting layer.

1-1. First Component

A polycyclic aromatic compound which is a compound represented by formula (A-1) or (A-2) has a large HOMO-LUMO gap (band gap Eg in a thin film) and high triplet excitation energy ($E_T$). This is because a decrease in the HOMO-LUMO gap that comes along with extension of a conjugated system is suppressed due to low aromaticity of a 6-membered ring containing a hetero element, and SOMO1 and SOMO2 of the triplet excitation state (T1) are localized by electronic perturbation of the hetero element. In addition, these polycyclic aromatic compounds can have energy of HOMO and LUMO arbitrarily shifted by introducing a substituent, and therefore ionization potential or electron affinity can be optimized in accordance with a peripheral material. A compound represented by formula (A-1) or (A-2) has high triplet energy, and therefore is preferable as a host of a phosphorescent material and a thermally activated delayed fluorescent material.

1-1-1. Compound Represented by General Formula (A-1)

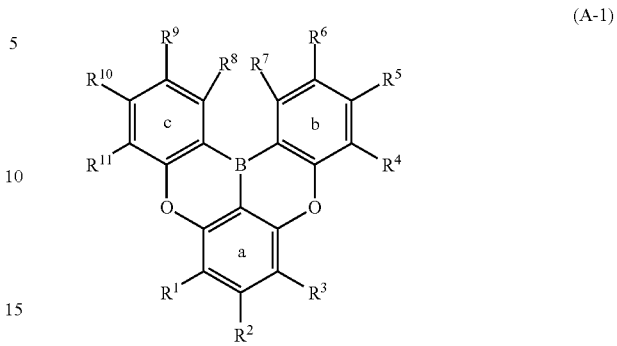

In formula (A-1), $R^1$ to $R^{11}$ each independently represent a hydrogen atom, an aryl, a heteroaryl, a diarylamino, a diheteroarylamino, an arylheteroarylamino, or an aryloxy, while at least one hydrogen atom in these may be further substituted by an aryl, a heteroaryl, or a diarylamino, adjacent groups among $R^1$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, or an aryloxy, and at least one hydrogen atom in these may be further substituted by an aryl, a heteroaryl, or a diarylamino.

At least one hydrogen atom in a compound represented by the above formula (A-1) may be substituted by a group represented by general formula (FG-1), a group represented by general formula (FG-2), or an alkyl having 1 to 24 carbon atoms, any —CH$_2$— in the alkyl may be substituted by —O— or —Si (CH$_3$)$_2$—, any —CH$_2$— excluding —CH$_2$— directly bonded to a compound represented by the above formula (A-1) in the alkyl may be substituted by an arylene having 6 to 24 carbon atoms, and any hydrogen atom in the alkyl may be substituted by a fluorine atom.

At least one hydrogen atom in a compound represented by the above formula (A-1) may be substituted by a halogen atom or a deuterium atom.

In formula (A-1), adjacent groups among the substituents $R^1$ to $R^{11}$ of ring a, ring b, and ring c may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, or an aryloxy, and at least one hydrogen atom in these may be further substituted by an aryl, a heteroaryl, or a diarylamino. However, the term "adjacent groups" used herein means groups adjacent to each other on the same ring. A compound in which "adjacent groups are bonded to each other to form an aryl ring or a heteroaryl ring together with ring a, ring b, or ring c" corresponds to compounds represented by formulas (1-2) to (1-17) listed as specific compounds described below, for example. That is, for example, these compounds are formed by condensing a benzene ring, an indole ring, a pyrrole ring, a benzofuran ring, and a benzothiophene ring with ring a (or ring b or ring c), and the condensed rings thus formed are a naphthalene ring, a carbazole ring, an indole ring, a dibenzofuran ring, and a dibenzothiophene ring, respectively.

1-1-2. Compound Represented by General Formula (A-2)

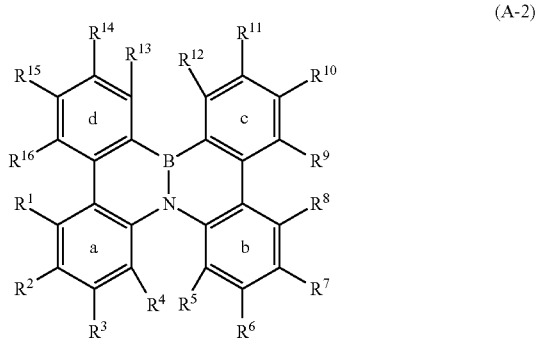

(A-2)

In formula (A-2), $R^1$ to $R^{16}$ each independently represent a hydrogen atom, an aryl, a heteroaryl, a diarylamino, a diheteroarylamino, an arylheteroarylamino, or an aryloxy, while at least one hydrogen atom in these may be further substituted by an aryl, a heteroaryl, or a diarylamino, adjacent groups among $R^1$ to $R^{16}$ may be bonded to each other to form an aryl ring or a heteroaryl ring together with ring a, ring b, ring c, or ring d, at least one hydrogen atom in the ring thus formed may be substituted by an aryl, a heteroaryl, a diarylamino, a diheteroarylamino, an arylheteroarylamino, or an aryloxy, and at least one hydrogen atom in these may be further substituted by an aryl, a heteroaryl, or a diarylamino.

In addition, at least one hydrogen atom in a compound represented by the above formula (A-2) may be substituted by a group represented by general formula (FG-1), a group represented by general formula (FG-2), or an alkyl having 1 to 24 carbon atoms, any —CH$_2$— in the alkyl may be substituted by —O— or —Si (CH$_3$)$_2$—, any —CH$_2$— excluding —CH$_2$— directly bonded to a compound represented by the above formula (A-2) in the alkyl may be substituted by an arylene having 6 to 24 carbon atoms, and any hydrogen atom in the alkyl may be substituted by a fluorine atom.

At least one hydrogen atom in a compound represented by the above formula (A-2) may be substituted by a halogen atom or a deuterium atom.

In formula (A-2), adjacent groups among the substituents $R^1$ to $R^{16}$ of ring a, ring b, ring c, and ring d may be bonded to each other to form an aryl ring or a heteroaryl ring together with ring a, ring b, ring c, or ring c, at least one hydrogen atom in the ring thus formed may be substituted by an aryl, a heteroaryl, a diarylamino, a diheteroarylamino, an arylheteroarylamino, or an aryloxy, and at least one hydrogen atom in these may be further substituted by an aryl, a heteroaryl, or a diarylamino. However, the term "adjacent groups" used herein means groups adjacent to each other on the same ring. A compound in which "adjacent groups are bonded to each other to form an aryl ring or a heteroaryl ring together with ring a, ring b, ring c, or ring d" can be described with reference to compounds represented by formulas (1-2) to (1-17) listed as specific compounds of formula (A-1) described below, for example. That is, for example, these compounds are formed by condensing a benzene ring, an indole ring, a pyrrole ring, a benzofuran ring, and a benzothiophene ring with ring a (or ring b or ring c or ring d), and the condensed rings thus formed are a naphthalene ring, a carbazole ring, an indole ring, a dibenzofuran ring, and a dibenzothiophene ring, respectively.

1-1-3. "$R^1$ to $R^{11}$ in General Formula (A-1)" and "$R^1$ to $R^{16}$ in General Formula (A-2)"

"$R^1$ to $R^{11}$ in formula (A-1)" and "$R^1$ to $R^{16}$ in formula (A-2)" each independently represent a hydrogen atom, an aryl, a heteroaryl, a diarylamino, a diheteroarylamino, an arylheteroarylamino, or an aryloxy. An aryl having 6 to 30 carbon atoms, a heteroaryl having 2 to 30 carbon atoms, a diarylamino (amino containing two aryls each having 6 to 30 carbon atoms), a diheteroarylamino (amino containing two heteroaryls each having 2 to 30 carbon atoms), an arylheteroarylamino (amino containing an aryl having 6 to 30 carbon atoms and a heteroaryl having 2 to 30 carbon atoms), or an aryloxy having 6 to 30 carbon atoms is preferable.

Examples of the aryl of the "aryl" and "diarylamino", the aryl of the "arylheteroarylamino", and the aryl of the "aryloxy" include: a benzene ring which is a monocyclic system; a biphenyl ring which is a bicyclic system; a naphthalene ring which is a fused bicyclic system; a terphenyl ring (m-terphenyl, o-terphenyl, or p-terphenyl) which is a tricyclic system; an acenaphthylene ring, a fluorene ring, a phenalene ring, and a phenanthrene ring which are fused tricyclic systems; a triphenylene ring, a pyrene ring, and a naphthacene ring which are fused tetracyclic systems; and a perylene ring and a pentacene ring which are fused pentacyclic systems. Furthermore, as described below, a group in which each of these aryls is substituted by a heteroaryl defined below is also defined as an aryl here.

Examples of the heteroaryl of the "heteroaryl" and "diheteroarylamino" and the heteroaryl of the "arylheteroarylamino" include a monovalent group such as a pyrrole ring, an oxazole ring, an isoxazole ring, a thiazole ring, an isothiazole ring, an imidazole ring, an oxadiazole ring, a thiadiazole ring, a triazole ring, a tetrazole ring, a pyrazole ring, a pyridine ring, a pyrimidine ring, a pyridazine ring, a pyrazine ring, a triazine ring, an indole ring, an isoindole ring, a 1H-indazole ring, a benzimidazole ring, a benzoxazole ring, a benzothiazole ring, a 1H-benzotriazole ring, a quinoline ring, an isoquinoline ring, a cinnoline ring, a quinazoline ring, a quinoxaline ring, a phthalazine ring, a naphthyridine ring, a purine ring, a pteridine ring, a carbazole ring, an acridine ring, a phenoxathiin ring, a phenoxazine ring, a phenothiazine ring, a phenazine ring, an indolizine ring, a furan ring, a benzofuran ring, an isobenzofuran ring, a dibenzofuran ring, a thiophene ring, a benzothiophene ring, a dibenzothiophene ring, a furazane ring, an oxadiazole ring, a thianthrene ring, or the heteroaryl which has been subjected to N-aryl substitution. Furthermore, as described below, a group in which each of these hetroaryls is substituted by the aryl defined above is also defined as a heteroaryl here.

In an aryl, a heteroaryl, a diarylamino, a diheteroarylamino, an arylheteroarylamino, or an aryloxy described as $R^1$ to $R^{11}$ in formula (A-1) or $R^1$ to $R^{16}$ in formula (A-2), at least one hydrogen atom may be further substituted by an aryl, a heteroaryl, or a diarylamino. Examples of such an aryl, heteroaryl, or diarylamino for substitution include the same ones as those described in the sections of $R^1$ to $R^{11}$ and $R^1$ to $R^{16}$.

Specific examples of $R^1$ to $R^{11}$ and $R^1$ to $R^{16}$ include groups represented by the following formulas (RG-1) to (RG-10). Note that the groups represented by the following formulas (RG-1) to (RG-10) are bonded to the above formula (A-1) or (A-2) at *.

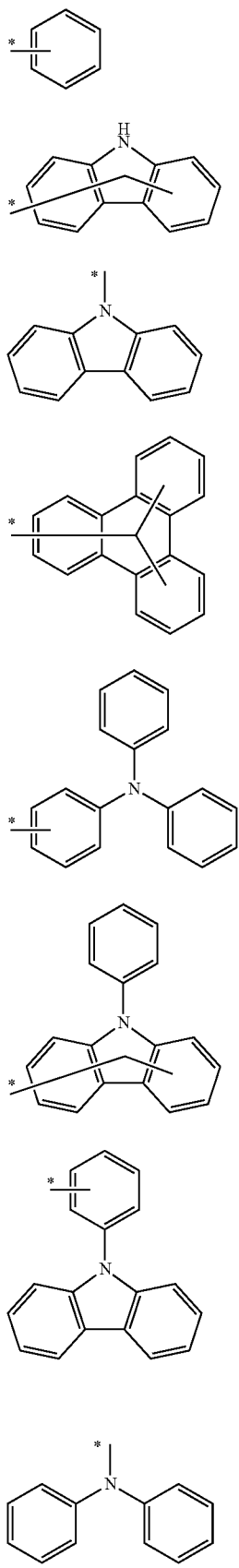

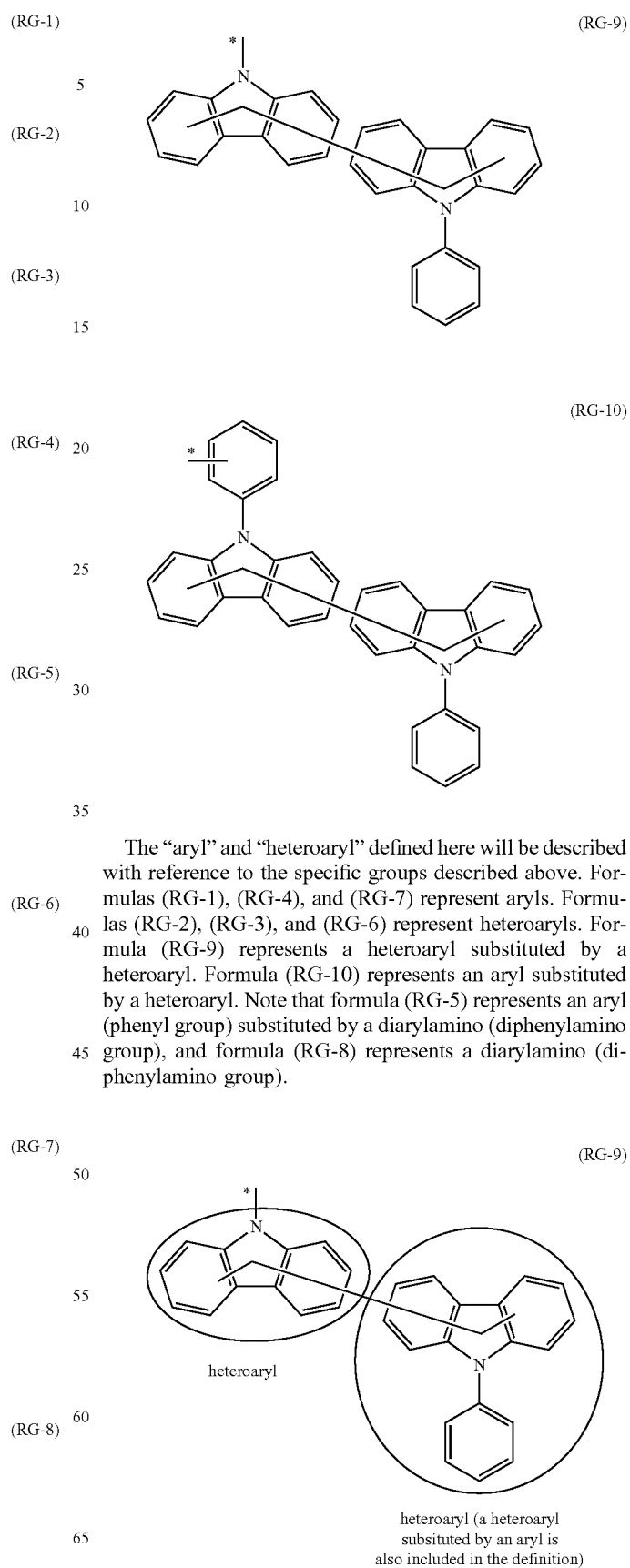

The "aryl" and "heteroaryl" defined here will be described with reference to the specific groups described above. Formulas (RG-1), (RG-4), and (RG-7) represent aryls. Formulas (RG-2), (RG-3), and (RG-6) represent heteroaryls. Formula (RG-9) represents a heteroaryl substituted by a heteroaryl. Formula (RG-10) represents an aryl substituted by a heteroaryl. Note that formula (RG-5) represents an aryl (phenyl group) substituted by a diarylamino (diphenylamino group), and formula (RG-8) represents a diarylamino (diphenylamino group).

-continued (RG-10)

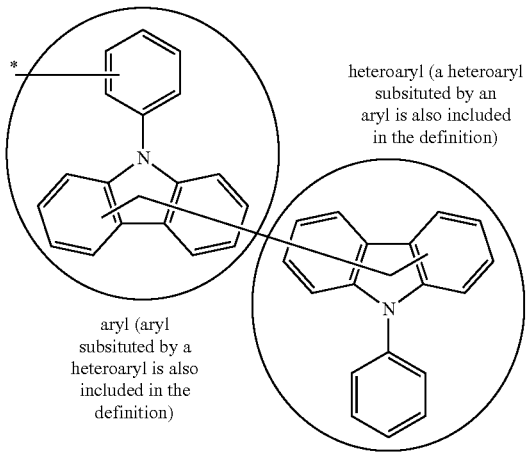

aryl (aryl subsituted by a heteroaryl is also included in the definition)

heteroaryl (a heteroaryl subsituted by an aryl is also included in the definition)

1-1-4. Ring Formed by Bonding Adjacent Groups of Ring a, Ring b, or Ring c to Each Other in General Formula (A-1), and Ring Formed by Bonding Adjacent Groups of Ring a, Ring b, Ring c, or Ring d to Each Other in General Formula (A-2)

Examples of the "aryl ring formed by bonding adjacent groups among $R^1$ to $R^{11}$ to each other together with ring a, ring b, or ring c" in formula (A-1) and the "aryl ring formed by bonding adjacent groups among $R^1$ to $R^{16}$ to each other together with ring a, ring b, ring c, or ring d" in formula (A-2)" include an aryl ring having 6 to 30 carbon atoms. An aryl ring having 6 to 16 carbon atoms is preferable, an aryl ring having 6 to 12 carbon atoms is more preferable, and an aryl ring having 6 to 10 carbon atoms is particularly preferable. However, the number of carbon atoms of the aryl ring thus formed includes the number of carbon atoms 6 of ring a, ring b, ring c, or ring d.

Specific examples of the aryl ring thus formed include: a naphthalene ring which is a condensed bicyclic ring system; an acenaphthylene ring, a fluorene ring, a phenalene ring, and a phenanthrene ring which are fused tricyclic systems; a triphenylene ring, a pyrene ring, and a naphthacene ring which are fused tetracyclic systems; and a perylene ring and a pentacene ring which are fused pentacyclic systems.

Examples of the "aryl ring formed by bonding adjacent groups among $R^1$ to $R^{11}$ to each other together with ring a, ring b, or ring c" in formula (A-1) and the "aryl ring formed by bonding adjacent groups among $R^1$ to $R^{16}$ to each other together with ring a, ring b, ring c, or ring d" in formula (A-2)" include a heteroaryl ring having 6 to 30 carbon atoms. A heteroaryl ring having 6 to 25 carbon atoms is preferable, a heteroaryl ring having 6 to 20 carbon atoms is more preferable, a heteroaryl ring having 6 to 15 carbon atoms is still more preferable, and a heteroaryl ring having 6 to 10 carbon atoms is particularly preferable. In addition, examples of the "heteroaryl ring" include a heterocyclic ring containing 1 to 5 heteroatoms selected from an oxygen atom, a sulfur atom, and a nitrogen atom in addition to a carbon atom as a ring-constituting atom. However, the number of carbon atoms of the heteroaryl ring thus formed includes the number of carbon atoms 6 of ring a, ring b, ring c, or ring d.

Specific examples of the heteroaryl ring thus formed include an indole ring, an isoindole ring, a 1H-indazole ring, a benzimidazole ring, a benzoxazole ring, a benzothiazole ring, a 1H-benzotriazole ring, a quinoline ring, an isoquinoline ring, a cinnoline ring, a quinazoline ring, a quinoxaline ring, a phthalazine ring, a carbazole ring, an acridine ring, a phenoxathiin ring, a phenoxazine ring, a phenothiazine ring, a phenazine ring, a benzofuran ring, an isobenzofuran ring, a dibenzofuran ring, a benzothiophene ring, a dibenzothiophene ring, and a thianthrene ring.

At least one hydrogen atom in the ring thus formed may be substituted by an aryl, a heteroaryl, a diarylamino, a diheteroarylamino, an arylheteroarylamino, or an aryloxy, while at least one hydrogen atom in these may be further substituted by an aryl, a heteroaryl, or a diarylamino. For this description, description of $R^1$ to $R^{11}$ in formula (A-1) and $R^1$ to $R^{16}$ in formula (A-2) can be cited.

1-1-5. Substitution on Compound

At least one hydrogen atom in a compound represented by formula (A-1) or (A-2) (at least one hydrogen atom in an aryl ring or a heteroaryl ring in the compound) may be substituted by a group represented by formula (FG-1), a group represented by formula (FG-2), or an alkyl having 1 to 24 carbon atoms, any —$CH_2$— in the alkyl may be substituted by —O— or —Si $(CH_3)_2$—, any —$CH_2$— excluding —$CH_2$— directly bonded to the compound in the alkyl may be substituted by an arylene having 6 to 24 carbon atoms, and any hydrogen atom in the alkyl may be substituted by a fluorine atom.

A group represented by formula (FG-1), a group represented by formula (FG-2), or an alkyl having 1 to 24 carbon atoms can further improve solubility in a solvent, film formability, wet coatability, thermal stability, and orientation of a compound because of being substituted by an appropriate length and structure at an appropriate position of a molecule.

One of molecular design guidelines for solubility control is to impart flexibility to molecules. Because of this, it is considered that solubility can be improved or controlled by reducing a cohesive force between solid molecules and prompting immediate solvent infiltration upon dissolution. In general, an alkyl chain is introduced into a molecule. However, in a case of use as an organic EL element, the alkyl chain may inhibit accumulation of molecules and may break a carrier path, and therefore a driving voltage of the organic EL element may be raised or mobility may be lowered.

In such a situation, it has been found that high solubility can be imparted without deteriorating a characteristic of the organic EL element by introducing a group represented by formula (FG-1) or (FG-2) having a structure in which a phenylene is linked at an m-position. When a plurality of rotations between a phenyl and a phenyl in a group represented by formula (FG-1) or (FG-2) is combined, the group represented by formula (FG-1) or (FG-2) can draw a large rotating volume and is very flexible. Therefore, it is considered that a derivative to which a group represented by formula (FG-1) or (FG-2) is imparted can have high solubility. Particularly, as a group represented by formula (FG-1) is longer, flexibility is higher, and higher solubility can be imparted to a molecule from a viewpoint of solubility. Therefore, a longer group is more preferable. A structure that does not interfere with flexibility of a group represented by formula (FG-1) or (FG-2) throughout a molecule is preferable because flexibility of the group represented by formula (FG-1) or (FG-2) is utilized to the utmost and sufficient solubility is imparted thereto.

In addition, it is known that a biphenyl structure has a planar structure with an angle of 0° between phenyl rings in a crystal. Similarly, a group represented by formula (FG-1) or (FG-2) can have a planar structure in a solid. A group represented by formula (FG-1) or (FG-2) has flexibility in a solution. However, it is considered that flexibility of the group represented by formula (FG-1) or (FG-2) is suppressed after film formation, and molecules are sufficiently densely packed in a film. This generates a carrier transporting path in the film, and therefore leads to an improvement in carrier mobility and a reduction in drive voltage. Particularly, as a group represented by formula (FG-1) is shorter, the density of a structure of portions other than the group represented by formula (FG-1) responsible for the path can be higher from a viewpoint of the carrier transporting path. Therefore, a shorter group is more preferable.

Here, the term "wet coatability" means a measure of smoothness and uniformity of a film formed with wet coatability. During wet film formation, when solubility is low, a film cannot be formed but a crystal may be deposited. On the other hand, when solubility is high, a film defect such as a pinhole or cissing may be generated. Strictly speaking, when there is an extremely large difference from other components in solubility, component separation may occur. Furthermore, compatibility with a solvent, a composition, and a film formation/drying/baking step may have an influence on a film quality, and precise adjustment of each element may be required in order to obtain a high-quality film. Therefore, it is considered that control of solubility without changing HOMO and LUMO of a molecule leads to control of wet coatability.

A group represented by formula (FG-1) or (FG-2) can control solubility without having a large influence on a structure of portions other than the group represented by formula (FG-1) or (FG-2) responsible for HOMO or LUMO. In addition, the group represented by formula (FG-1) or (FG-2) can give a certain range to solubility, and can adjust a light emitting layer-forming composition flexibly.

Stability during driving of an organic EL element is estimated by thermal stability (glass transition point). It is considered that a cohesive force of a molecule may be increased in order to raise the glass transition point. That is, as solubility is improved more, the molecule may be more flexible, the glass transition point may be lower, and thermal stability may be lower.

By imparting a group represented by formula (FG-1), flexibility can be imparted to a molecule, while dense packing can be expected in a film. As a result, molecular motion can be restricted, and therefore stability to internal and external heat may be improved. As a group represented by formula (FG-1) is longer, a molecule can be larger, and Tg can be raised from a viewpoint of thermal stability. A group represented by formula (FG-2) has higher planarity than a group represented by formula (FG-1), and therefore an effect of raising Tg is larger.

In order to improve characteristics of a compound used for an organic EL element, studies have been made to impart in-plane orientation by giving a rigid structure to a molecule. In general, a compound having in-plane orientation has a rigid and highly linear structure like a p-terphenyl, and therefore has poor solubility.

However, contrary to conventional common general technical knowledge, the present inventors have found that high in-plane orientation can be imparted even to a molecule which is not rigid by performing a substitution such that a group represented by formula (FG-1) is long and the molecule has a rod-like shape. In this case, the molecule does not have a rigid and highly linear structure, and therefore solubility is never lowered. Preferably, a group represented by formula (FG-1) is long and the molecule has a rod-like shape from a viewpoint of in-plane orientation. When a group represented by formula (FG-1) is sufficiently long, high in-plane orientation can be exhibited even when a molecule is bent.

Even in a molecule into which an alkyl chain is introduced, deterioration of characteristics of an organic EL element can be prevented by controlling a chain length and a structure such that the alkyl chain does not inhibit accumulation of the molecules.

In a compound represented by formula (A-1) or (A-2), at least one hydrogen atom in the molecule is more preferably substituted by a group represented by formula (FG-1), a group represented by formula (FG-2), or an alkyl having 7 to 24 carbon atoms from a viewpoint of improving coating film formability and in-plane orientation.

1-1-5-1. Group Represented by General Formula (FG-1)

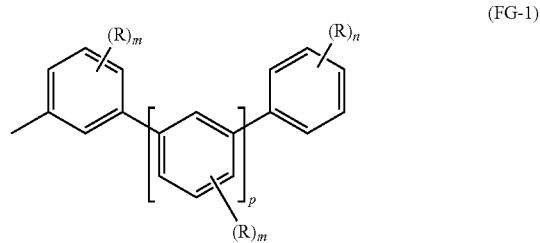

(FG-1)

In formula (FG-1), R's each independently represent a fluorine atom, a trimethylsilyl, a trifluoromethyl, an alkyl having 1 to 24 carbon atoms, or a cycloalkyl having 3 to 24 carbon atoms, any —$CH_2$— in the alkyl may be substituted by —O—, any —$CH_2$— excluding —$CH_2$— directly bonded to a phenyl or a phenylene in the alkyl may be substituted by an arylene having 6 to 24 carbon atoms, at least one hydrogen atom in the cycloalkyl may be substituted by an alkyl having 1 to 24 carbon atoms or an aryl having 6 to 12 carbon atoms, when two adjacent R's each represent an alkyl or a cycloalkyl, these R's may be bonded to each other to form a ring, m's each independently represent an integer of 0 to 4, n's each independently represent an integer of 0 to 5, and p's each independently represent an integer of 1 to 5. Note that the term "two adjacent R's" means groups adjacent to each other on the same ring.

The linking number p of a phenylene is preferably from 1 to 5, more preferably from 1 to 3, and still more preferably 1 or 2 from a viewpoint of solubility, film formability, wet coatability, thermal stability, and in-plane orientation of a compound.

Regarding the substitution numbers m and n of the substituent R, m is preferably from 0 to 4, more preferably from 0 to 2, still more preferably from 0 to 1, and particularly preferably 0, and n is preferably from 0 to 5, more preferably from 0 to 3, still more preferably from 0 to 1, and particularly preferably 0.

Regarding the "substituent R on a group represented by formula (FG-1)", the substituent R is preferably present at a position other than the o-position with respect to a phenyl-phenyl bond (based on a bonding position of adjacent phenyl groups), and is more preferably present at a position further apart with respect to the phenyl-phenyl bond from a viewpoint of flexibility of a functional group and a filling property during film formation.

Specific examples of the "substituent R on a group represented by formula (FG-1)" include a fluorine atom, a trimethylsilyl, a trifluoromethyl, an alkyl having 1 to 24 carbons, a cycloalkyl having 3 to 24 carbons, an alkyl which has 1 to 24 carbon atoms and in which any —CH$_2$— is substituted by —O—, an alkyl which has 1 to 24 carbon atoms and in which any —CH$_2$— excluding —CH$_2$— directly bonded to a phenyl or a phenylene is substituted by an arylene having 6 to 24 carbon atoms, a cycloalkyl which has 3 to 24 carbon atoms and in which at least one hydrogen atom is substituted by an alkyl having 1 to 24 carbon atoms, and a cycloalkyl which has 3 to 24 carbon atoms and in which at least one hydrogen atom is substituted by an aryl having 6 to 12 carbon atoms.

The "alkyl having 1 to 24 carbon atoms" may be a linear chain or a branched chain, and examples thereof include a linear alkyl having 1 to 24 carbon atoms and a branched alkyl having 3 to 24 carbon atoms. The alkyl having 1 to 24 carbon atoms is preferably an alkyl having 1 to 18 carbon atoms (branched alkyl having 3 to 18 carbon atoms), more preferably an alkyl having 1 to 12 carbon atoms (branched alkyl having 3 to 12 carbon atoms), still more preferably an alkyl having 1 to 6 carbon atoms (branched alkyl having 3 to 6 carbon atoms), and particularly preferably an alkyl having 1 to 4 carbon atoms (branched alkyl having 3 to 4 carbon atoms).

Specific examples of the "alkyl having 1 to 24 carbon atoms" include a methyl, an ethyl, an n-propyl, an isopropyl, an n-butyl, an isobutyl, an s-butyl, a t-butyl, an n-pentyl, an isopentyl, a neopentyl, a t-pentyl, an n-hexyl, a 1-methylpentyl, a 4-methyl-2-pentyl, a 3,3-dimethylbutyl, a 2-ethylbutyl, an n-heptyl, a 1-methylhexyl, an n-octyl, a t-octyl, a 1-methylheptyl, a 2-ethylhexyl, a 2-propylpentyl, an n-nonyl, 2,2-dimethylheptyl, a 2,6-dimethyl-4-heptyl, a 3,5,5-trimethylhexyl, an n-decyl, an n-undecyl, a 1-methyldecyl, an n-dodecyl, an n-tridecyl, a 1-hexylheptyl, an n-tetradecyl, an n-pentadecyl, an n-hexadecyl, an n-heptadecyl, an n-octadecyl, and an n-eicosyl, but are not limited thereto.

Specific examples of the "alkyl which has 1 to 24 carbon atoms and in which any —CH$_2$— is substituted by —O—" include a methoxy, an ethoxy, a propoxy, an isopropoxy, an n-butoxy, an isobutoxy, an s-butoxy, a t-butoxy, a pentyloxy, a hexyloxy, a heptyloxy, an octyloxy, a 2-methoxyethoxy, a 2-ethoxyethoxy, a 2-propoxyethoxy, a 2-butoxyethoxy, a 2-ethoxy-(2-ethoxyethoxy), and a 2-ethoxy-(2-ethoxy-(2-ethoxyethoxy)), but are not limited thereto.

Specific examples of the "alkyl which has 1 to 24 carbon atoms and in which any —CH$_2$— excluding —CH$_2$— directly bonded to a phenyl or a phenylene is substituted by an arylene having 6 to 24 carbon atoms" include a methylbenzyl, an ethylbenzyl, and a propylbenzyl, but are not limited thereto.

The "cycloalkyl having 3 to 24 carbon atoms" is preferably a cycloalkyl having 3 to 12 carbon atoms, more preferably a cycloalkyl having 3 to 10 carbon atoms, still more preferably a cycloalkyl having 3 to 8 carbon atom, and further still more preferably a cycloalkyl having 3 to 6 carbon atom.

Specific examples of the cycloalkyl having 3 to 24 carbon atoms include a cyclopropyl, a cyclobutyl, a cyclopentyl, a cyclohexyl, a cycloheptyl, and a cyclooctyl, but are not limited thereto.

Specific examples of the "cycloalkyl which has 3 to 24 carbon atoms and in which at least one hydrogen atom is substituted by an alkyl having 1 to 24 carbon atoms" or the "cycloalkyl which has 3 to 24 carbon atoms and in which at least one hydrogen atom is substituted by an aryl having 6 to 12 carbon atoms" include a methylcyclopentyl, a methylcyclohexyl, a dimethylcyclohexyl, a phenylcyclohexyl, and a naphthylcyclohexyl, but are not limited thereto.

1-1-5-2. Group Represented by General Formula (FG-2)

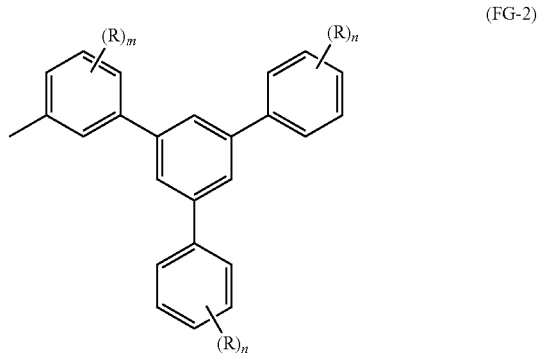

(FG-2)

In formula (FG-2), R's each independently represent a fluorine atom, a trimethylsilyl, a trifluoromethyl, an alkyl having 1 to 24 carbon atoms, a cycloalkyl having 3 to 24 carbon atoms, or an aryl having 6 to 12 carbon atoms, any —CH$_2$— in the alkyl may be substituted by —O—, any —CH$_2$— excluding —CH$_2$— directly bonded to a phenyl or a phenylene in the alkyl may be substituted by an arylene having 6 to 24 carbon atoms, at least one hydrogen atom in the cycloalkyl may be substituted by an alkyl having 1 to 24 carbon atoms or an aryl having 6 to 12 carbon atoms, at least one hydrogen atom in the aryl may be substituted by an alkyl having 1 to 24 carbon atoms, when two adjacent R's each represent an alkyl or a cycloalkyl, these R's may be bonded to each other to form a ring, m's each independently represent an integer of 0 to 4, and n's each independently represent an integer of 0 to 5. Note that the term "two adjacent R's" means groups adjacent to each other on the same ring.

Regarding the substitution numbers m and n of the substituent R, m is preferably from 0 to 4, more preferably from 0 to 2, still more preferably from 0 to 1, and particularly preferably 0, and n is preferably from 0 to 5, more preferably from 0 to 3, still more preferably from 0 to 1, and particularly preferably 0.

Note that for the substituent R in formula (FG-2), description of the substituent R in formula (FG-1) can be cited. For the "aryl having 6 to 12 carbon atoms", description in the section of a compound represented by formula (A-1) can be cited.

1-1-5-3. Alkyl which has 1 to 24 Carbon Atoms and May be Substituted by a Hydrogen Atom in a Molecule In general, when a molecule into which an alkyl chain is introduced is used as an organic EL element, the alkyl chain may inhibit accumulation of the molecules and may break a carrier path. Meanwhile, even in a molecule into which an alkyl chain is introduced, deterioration of characteristics of an organic EL element can be prevented by controlling a chain length and a structure such that the alkyl chain does not inhibit accumulation of the molecules.

By substitution of at least one hydrogen atom at the ortho-position of a phenyl group or a p-phenylene group at a terminal in a compound by a methyl group or the like, adjacent aromatic rings are likely to intersect each other perpendicularly, and conjugation is weakened. As a result, triplet excitation energy ($E_T$) can be increased.

At least one hydrogen atom in a compound represented by formula (A-1) or (A-2) (at least one hydrogen atom in an aryl ring or a heteroaryl ring in the compound) may be substituted by an alkyl having 1 to 24 carbon atoms, any —CH₂— in the alkyl may be substituted by —O— or —Si (CH₃)₂—, any —CH₂— excluding —CH₂— directly bonded to the compound in the alkyl may be substituted by an arylene having 6 to 24 carbon atoms, and any hydrogen atom in the alkyl may be substituted by a fluorine atom. However, the term "the alkyl" used herein means all the alkyls which "may be substituted" by at least one hydrogen atom of an aryl ring or a heteroaryl ring.

The "alkyl having 1 to 24 carbon atoms" may be a linear chain or a branched chain, and examples thereof include a linear alkyl having 1 to 24 carbon atoms and a branched alkyl having 3 to 24 carbon atoms. The alkyl having 1 to 24 carbon atoms is preferably an alkyl having 1 to 18 carbon atoms (branched alkyl having 3 to 18 carbon atoms), more preferably an alkyl having 1 to 12 carbon atoms (branched alkyl having 3 to 12 carbon atoms), still more preferably an alkyl having 1 to 6 carbon atoms (branched alkyl having 3 to 6 carbon atoms), and particularly preferably an alkyl having 1 to 4 carbon atoms (branched alkyl having 3 to 4 carbon atoms).

As another example, a linear or branched alkyl having 7 to 24 carbon atoms can be used. In this case, a linear or branched alkyl having 7 to 18 carbon atoms is preferable, and a linear or branched alkyl having 7 to 12 carbon atoms is more preferable.

Specific examples of the alkyl having 1 to 24 carbon atoms include a methyl, an ethyl, an n-propyl, an isopropyl, an n-butyl, an isobutyl, an s-butyl, a t-butyl, an n-pentyl, an isopentyl, a neopentyl, a t-pentyl, an n-hexyl, a 1-methylpentyl, a 4-methyl-2-pentyl, a 3,3-dimethylbutyl, a 2-ethylbutyl, an n-heptyl, a 1-methylhexyl, an n-octyl, a t-octyl, a 1-methylheptyl, a 2-ethylhexyl, a 2-propylpentyl, an n-nonyl, a 2,2-dimethylheptyl, a 2,6-dimethyl-4-heptyl, a 3,5,5-trimethylhexyl, an n-decyl, an n-undecyl, a 1-methyldecyl, an n-dodecyl, an n-tridecyl, a 1-hexylheptyl, an n-tetradecyl, an n-pentadecyl, an n-hexadecyl, an n-heptadecyl, an n-octadecyl, and an n-eicosyl.

Any —CH₂— in the alkyl may be substituted by —O— or —Si (CH₃)₂—. Examples thereof include an alkoxy, an alkylether, and an alkylsilyl. Specific examples thereof include a methoxy, an ethoxy, a propoxy, an isopropoxy, a butoxy, an isobutoxy, an s-butoxy, a t-butoxy, a pentyloxy, a hexyloxy, a heptyloxy, an octyloxy, a methoxymethyl, a 2-methoxyethoxy, a 2-(2-methoxyethoxy) ethoxy, and a trimethylsilyl.

Any —CH₂— excluding —CH₂— directly bonded to the compound in the alkyl may be substituted by an arylene having 6 to 24 carbon atoms. Examples thereof include a 2-methylbenzyl, a 3-methylbenzyl, and a 4-methylbenzyl.

1-1-5-4. Substitution Position on Compound

In a case where a compound represented by formula (A-1) or (A-2) is substituted by a group represented by formula (FG-1), a group represented by formula (FG-2), or an alkyl having 1 to 24 carbon atoms (or an alkyl having 7 to 24 carbon atoms), at least one of z's in the following formulas (A-1-Z1), (A-1-Z2), (A-2-Z1), and (A-2-Z2) is preferably substituted.

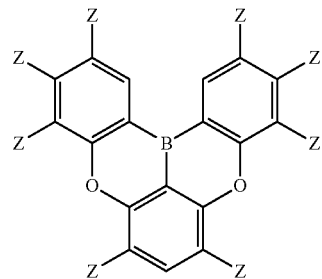

(A-1-Z1)

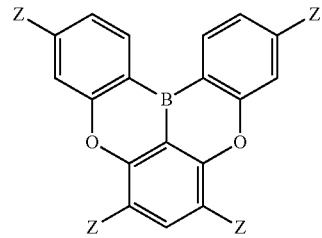

(A-1-Z2)

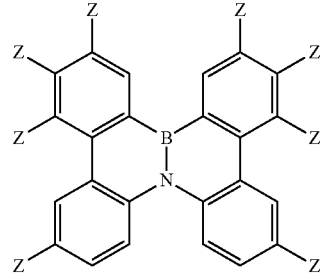

(A-2-Z1)

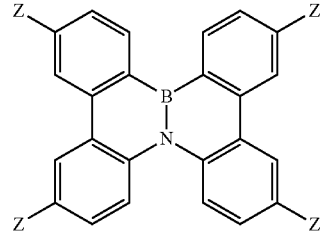

(A-2-Z2)

More specifically, at least one of z's in the following formulas (1-1-z), (1-49-z), (1-91-z), (1-100-z), (1-152-z), (1-176-z), (1-1048-z), (1-1049-z), (1-1050-z), (1-1069-z), (1-1101-z), (1-1102-z), and (1-1103-z) is preferably substituted.

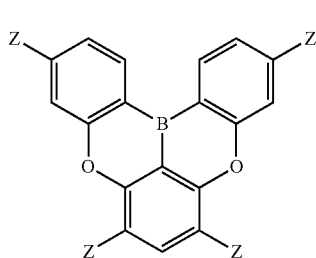

(1-1-z)

(1-49-z)
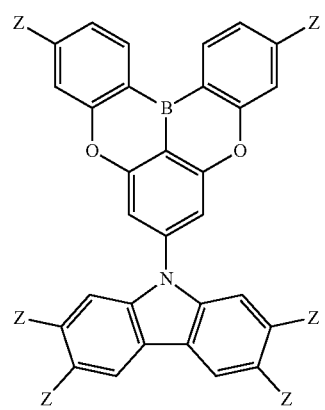
(1-91-z)
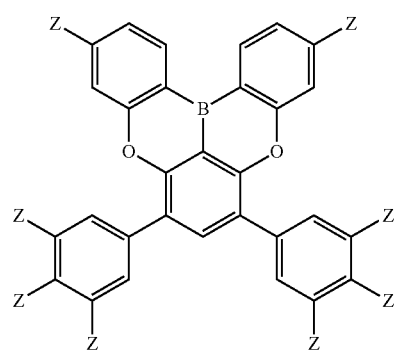
(1-100-z)
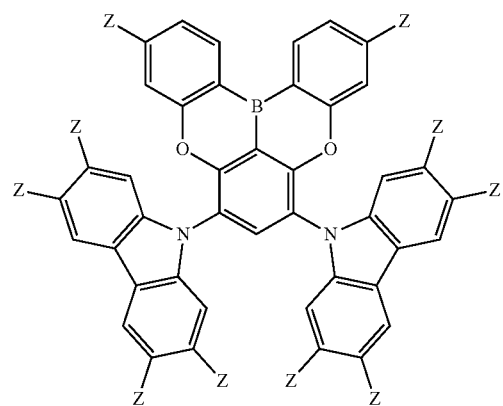
(1-152-z)
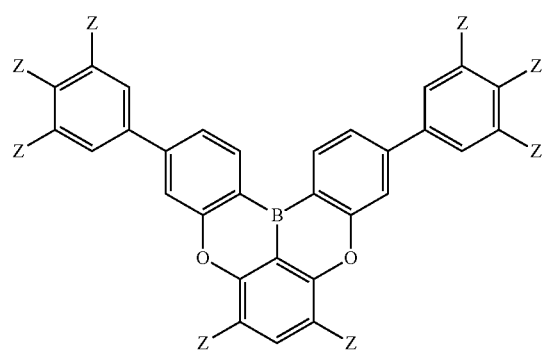
(1-176-z)
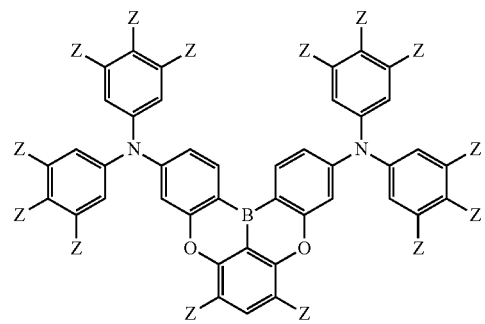
(1-1048-z)
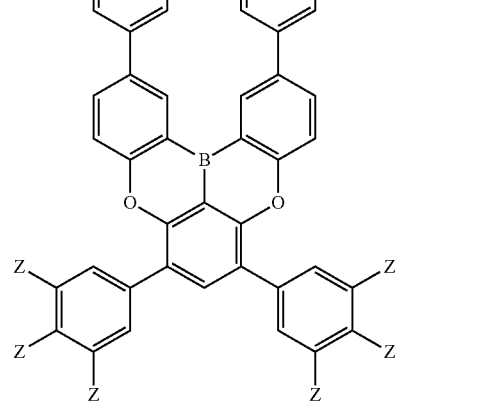
(1-1049-z)
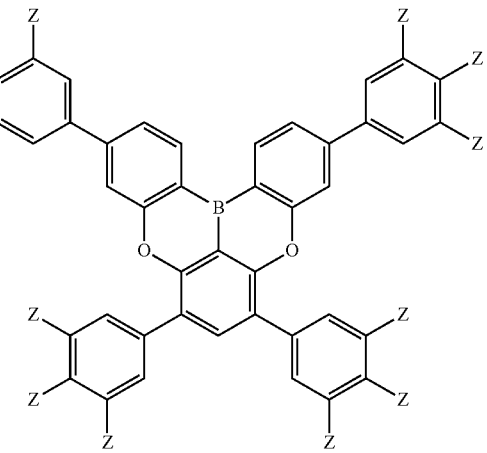

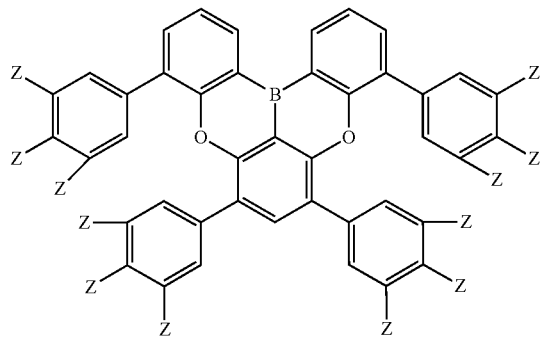
(1-1050-z)

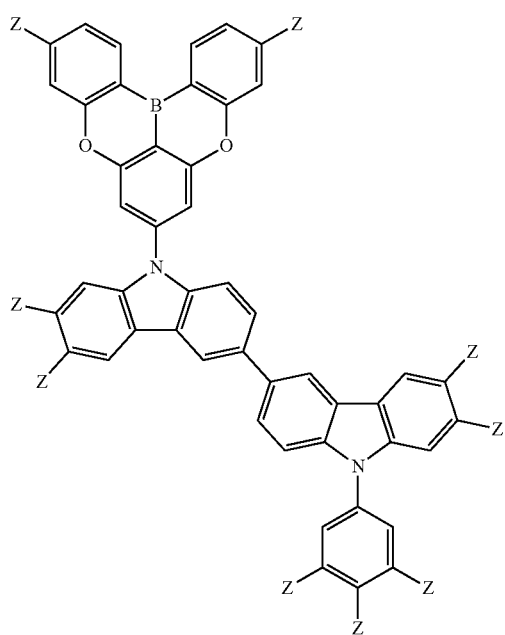
(1-1069-z)

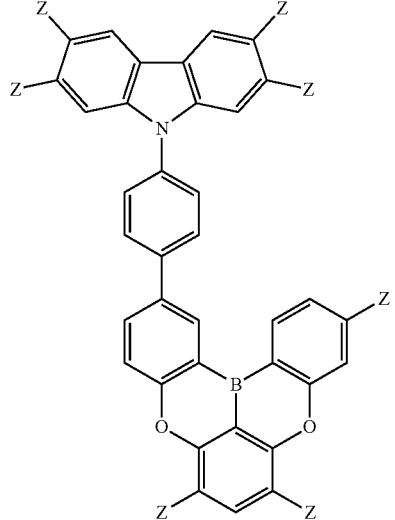
(1-1101-z)

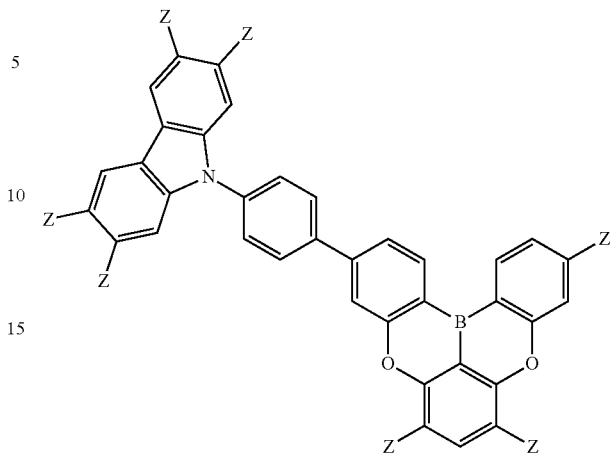
(1-1102-z)

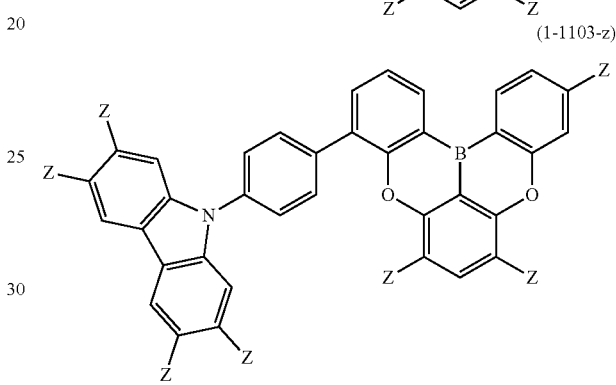
(1-1103-z)

1-1-6. Substitution on Compound by Deuterium Atom and Halogen Atom

All or a portion of hydrogen atoms in a compound represented by formula (A-1) or (A-2) may be deuterium atoms. Furthermore, all or a portion of hydrogen atoms in a compound represented by formula (A-1) or (A-2) may be halogen atoms. For example, in formula (A-1), a hydrogen atom on ring a, ring b, ring c, or a substituent on these rings may be substituted by a deuterium atom or a halogen atom. However, among these, particularly, an embodiment in which all or a portion of hydrogen atoms at an aryl portion or a heteroaryl portion is substituted by a deuterium atom or a halogen atom is exemplified. The halogen is fluorine, chlorine, bromine, or iodine, preferably fluorine, chlorine, or bromine, and more preferably chlorine.

1-1-7. Specific Examples of Compound

More specific structures of a compound represented by (A-1) or (A-2) are indicated below. Each of the following formulas (1-1) to (1-1271) and the following formulas (2-1) to (2-216) has a structure not substituted by a group represented by formula (FG-1), a group represented by formula (FG-2), or an alkyl having 1 to 24 carbon atoms.

A specific structure of such a compound represented by formula (A-1) or (A-2) may be substituted by a group represented by formula (FG-1), a group represented by formula (FG-2), or an alkyl having 1 to 24 carbon atoms. Specific structures of these substituents are indicated in the following formulas (FG-1-1) to (FG-1-5), the following formulas (FG-1-1001) to (FG-1-1103), the following formulas (FG-1-2001) to (FG-1-2089), the following formula (FG-2-1), the following formulas (FG-2-1001) to (FG-2-

1006), the following formulas (FG-2-1041) to (FG-2-1103), and the following formulas (R-1) to (R-37).

Note that at least one hydrogen atom in a compound represented by formula (A-1) or (A-2) is substituted by groups represented by the following formulas (FG-1-1) to (FG-1-5), the following formulas (FG-1-1001) to (FG-1-1103), the following formulas (FG-1-2001) to (FG-1-2089), the following formula (FG-2-1), the following formulas (FG-2-1001) to (FG-2-1006), the following formulas (FG-2-1041) to (FG-2-1103), and the following formulas (R-1) to (R-37) at * in each of the formulas.

A compound represented by formula (A-1) or (A-2) is bonded to a group represented by formula (FG-1), a group represented by formula (FG-2), or an alkyl having 1 to 24 carbon atoms at any position.

That is, it should be understood that the following formulas (1-1) to (1-1271) and (2-1) to (2-216) disclose both a compound not substituted by a group represented by formula (FG-1), a group represented by formula (FG-2), or an alkyl having 1 to 24 carbon atoms, and a compound substituted thereby at any position.

(1-1)

(1-2)

(1-3)

(1-4)

(1-5)

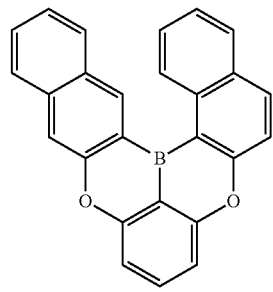

(1-6)

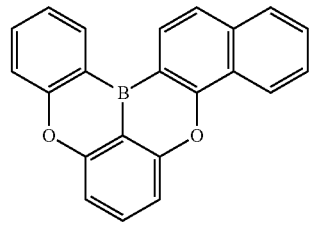

(1-7)

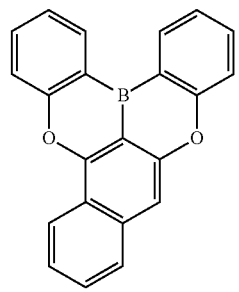

(1-8)

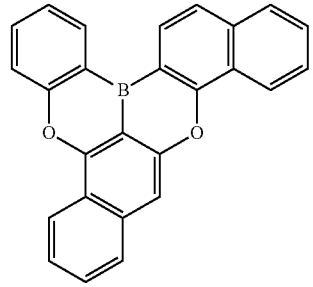

(1-9)

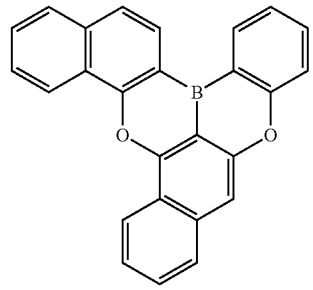

-continued
(1-10)
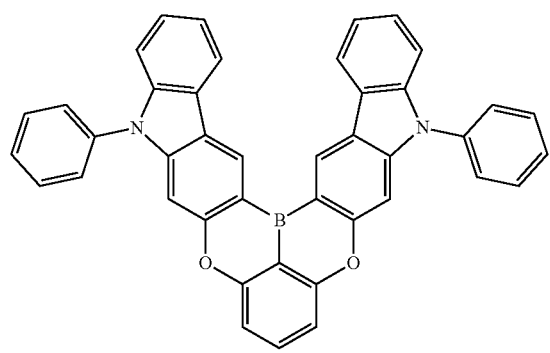
(1-11)
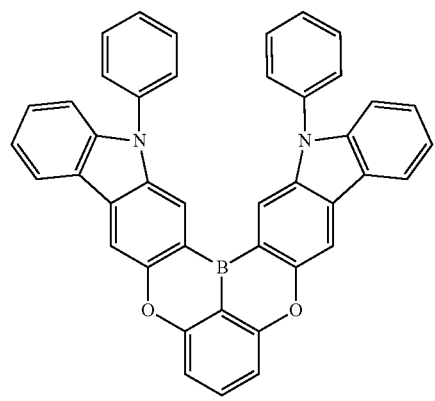
(1-12)
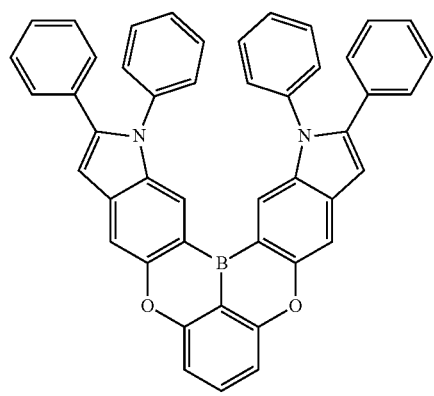
(1-13)
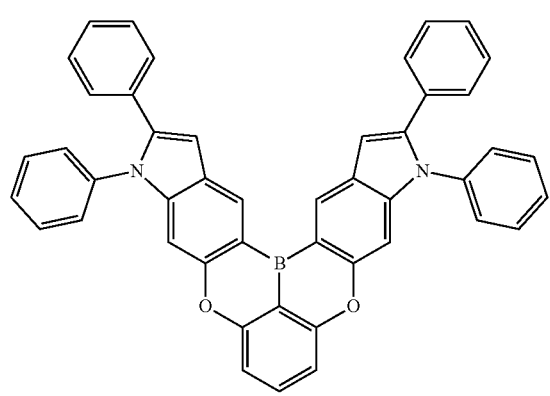
-continued
(1-14)
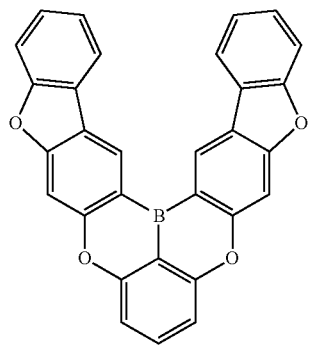
(1-15)
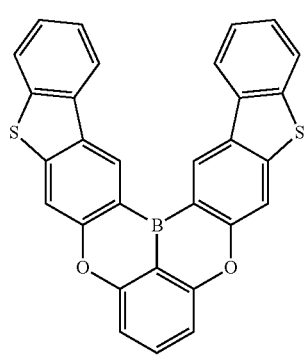
(1-16)
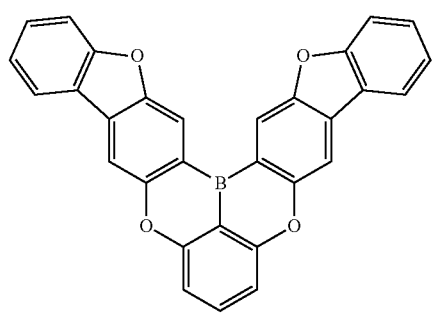
(1-17)
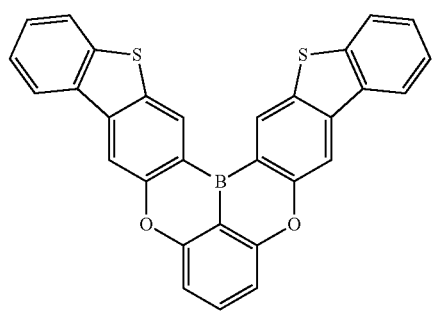

-continued
(1-41)
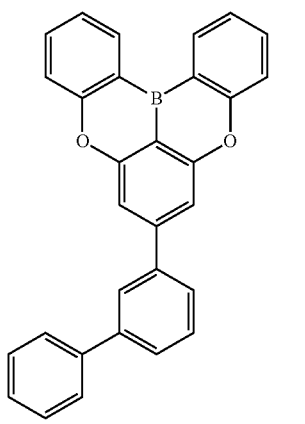
(1-42)
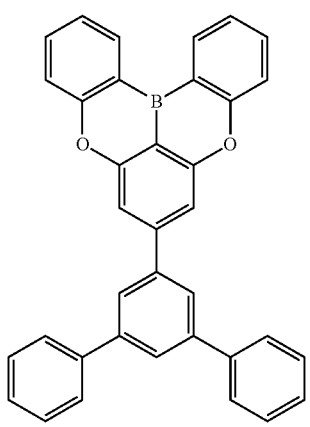
(1-43)
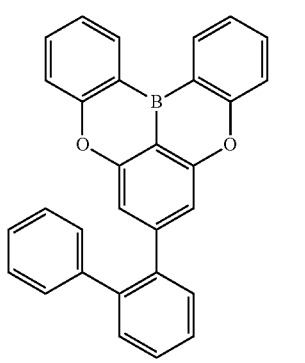
(1-44)
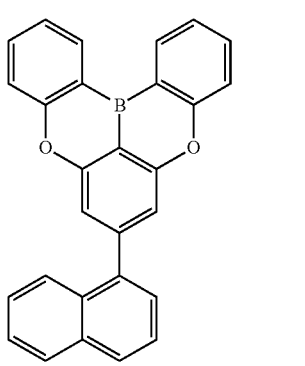
-continued
(1-45)
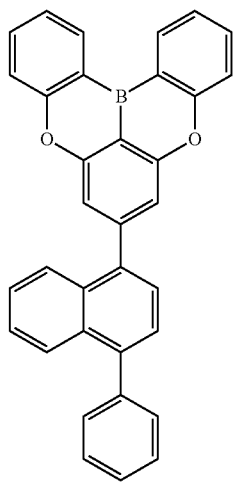
(1-46)
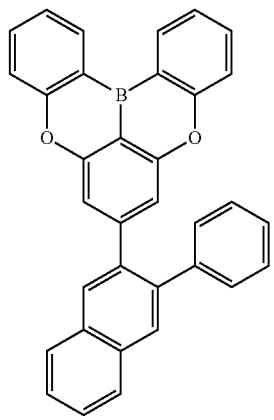
(1-47)
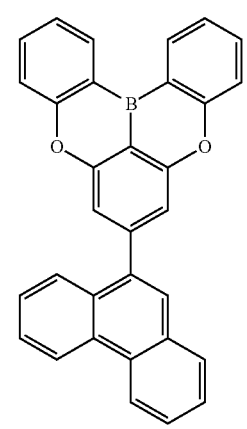

(1-48)
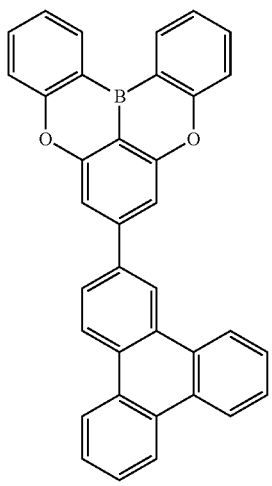
(1-49)
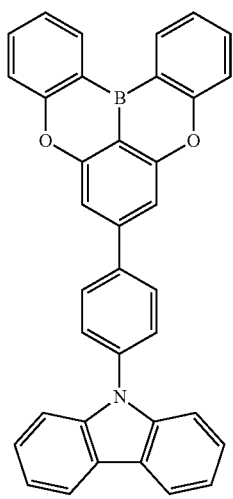
(1-50)
(1-51)
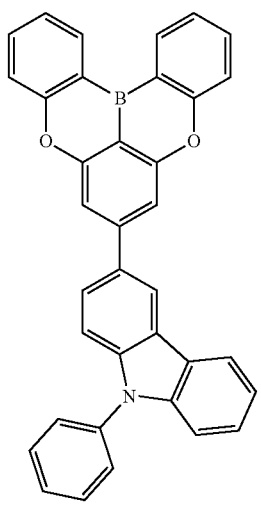
(1-52)
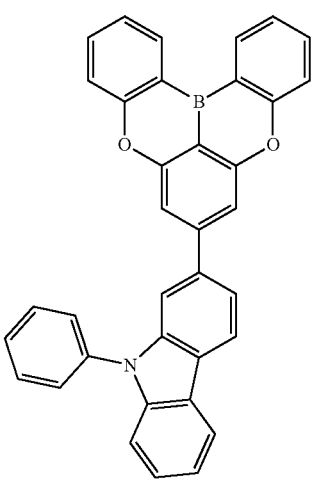
(1-61)
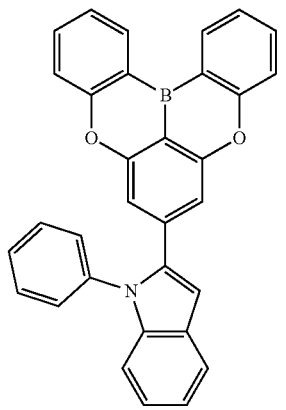

(1-62)
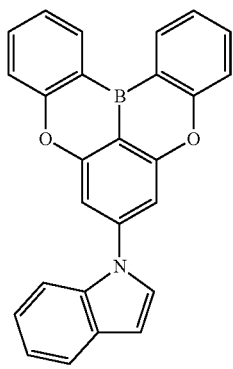
(1-63)
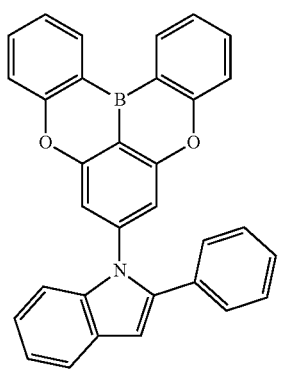
(1-64)
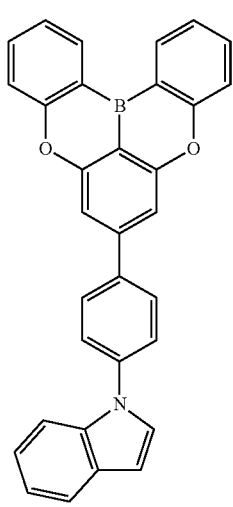
(1-65)
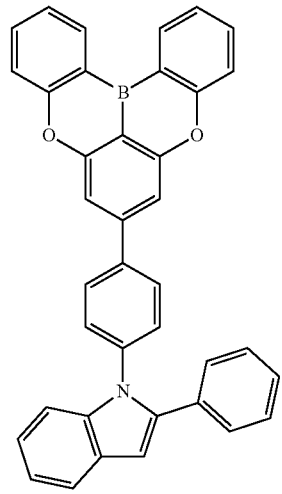
(1-66)
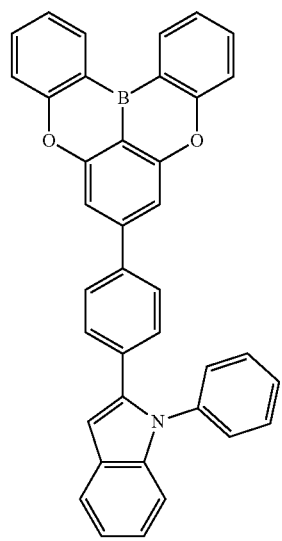
(1-67)
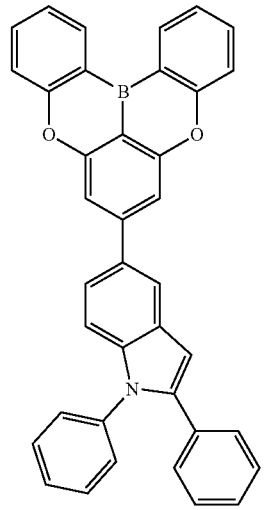

(1-68)
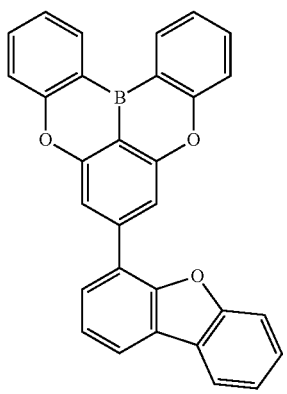
(1-69)
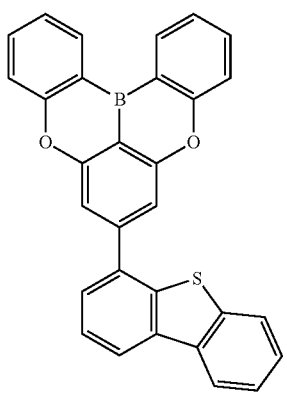
(1-70)
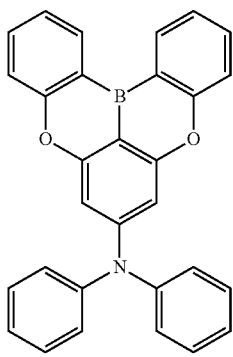
(1-71)
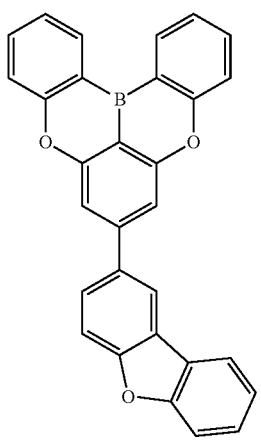
(1-72)
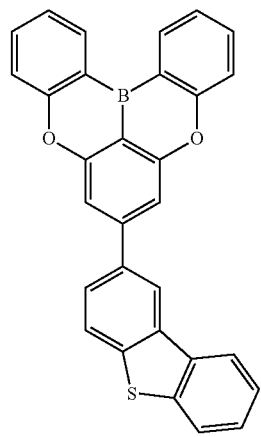
(1-73)
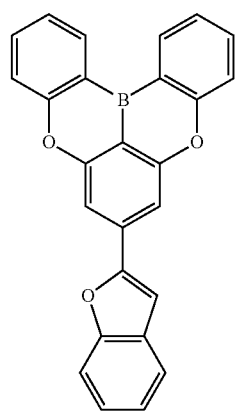
(1-74)
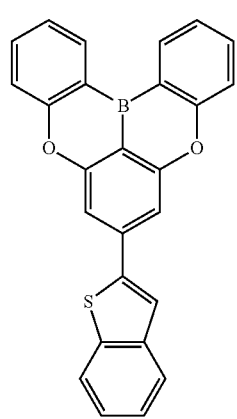

(1-75) 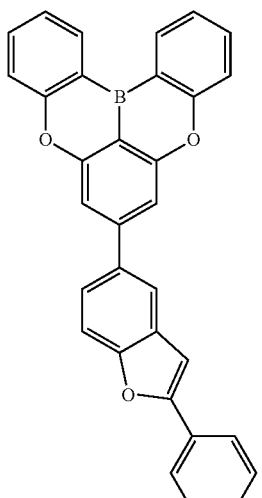
(1-76) 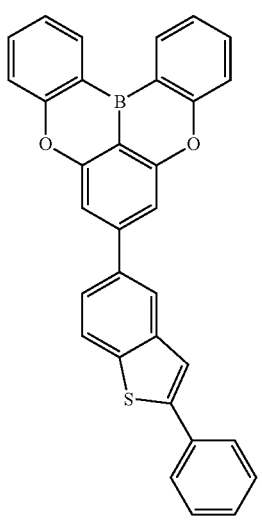
(1-77) 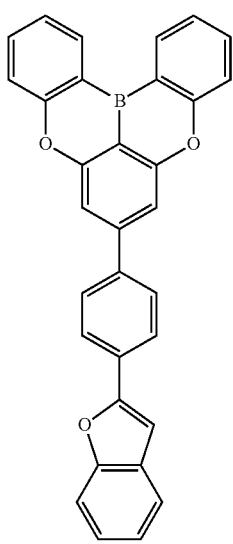
(1-78) 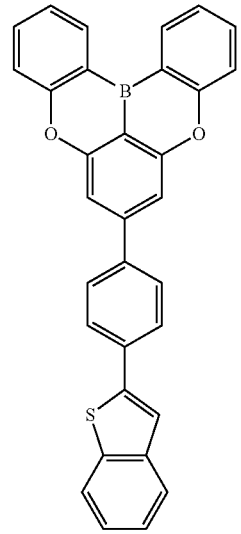
(1-79) 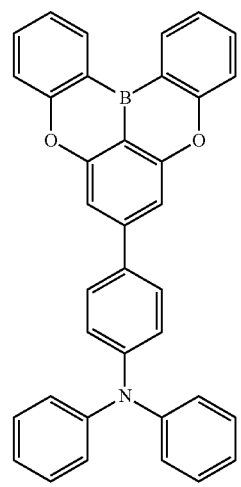
(1-80) 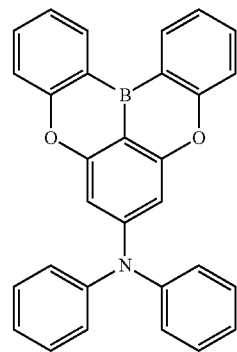

-continued
(1-81)
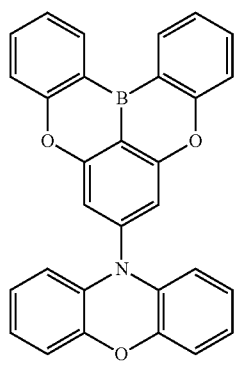
(1-82)
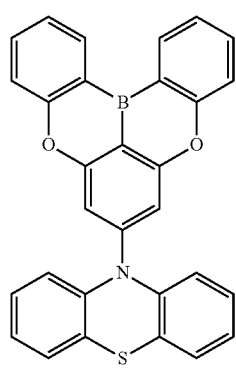
(1-83)
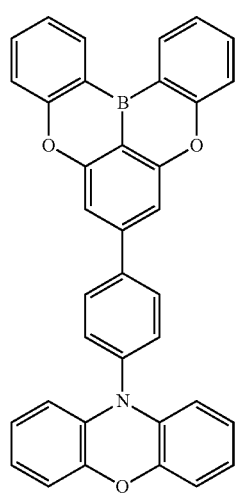
-continued
(1-84)
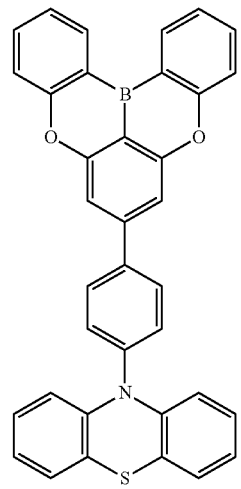
(1-91)
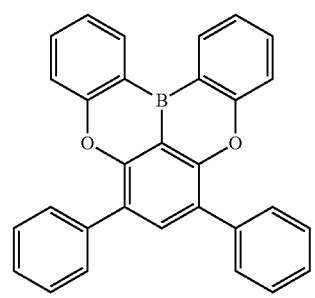
(1-92)
(1-93)
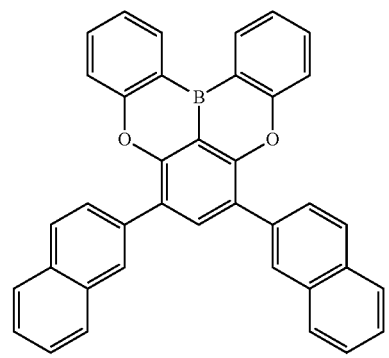

(1-94)
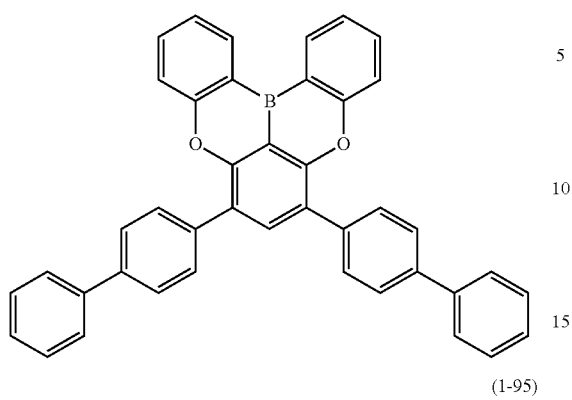
(1-95)
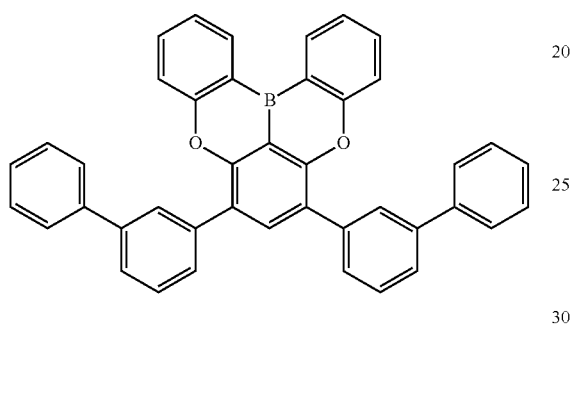
(1-96)
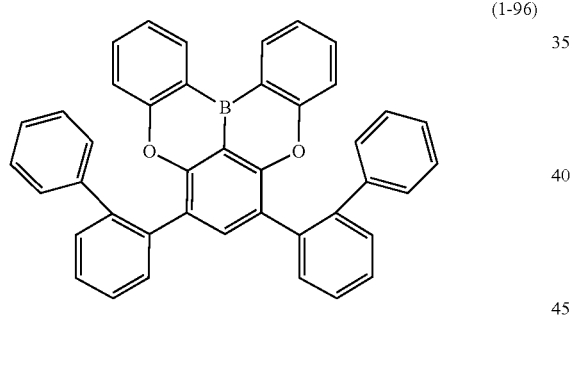
(1-97)
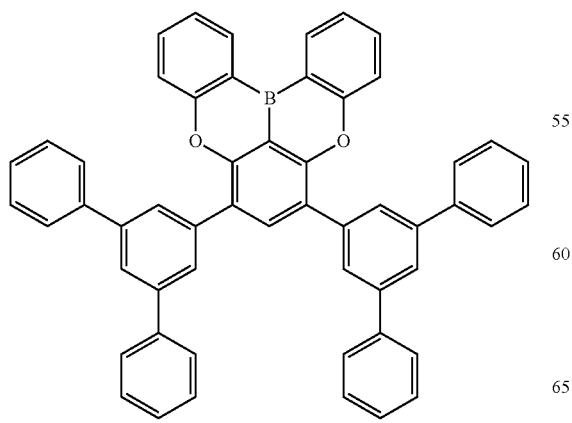
(1-98)
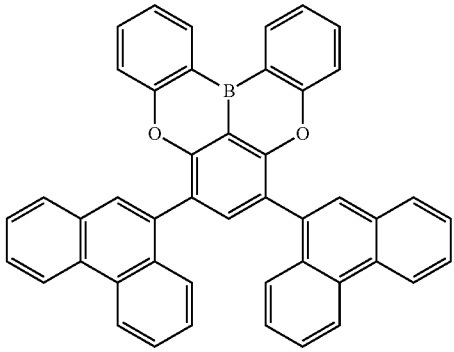
(1-99)
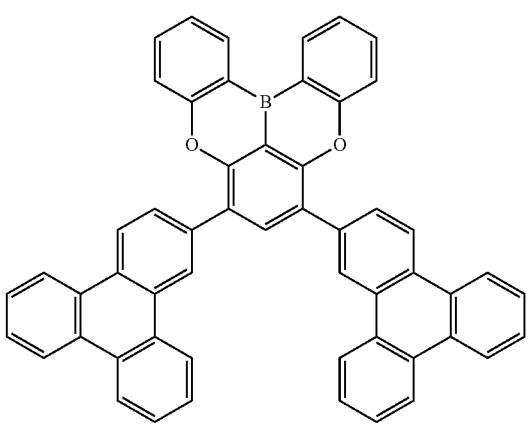
(1-100)
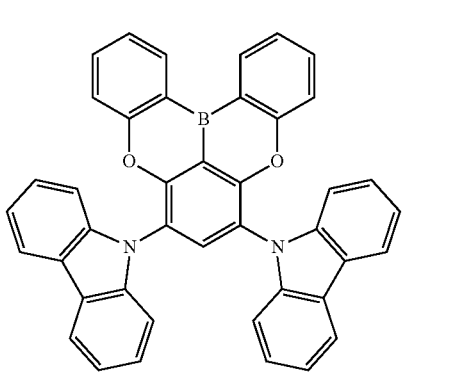
(1-101)
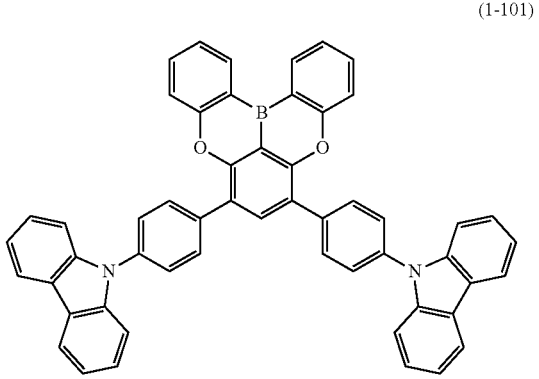

(1-111)
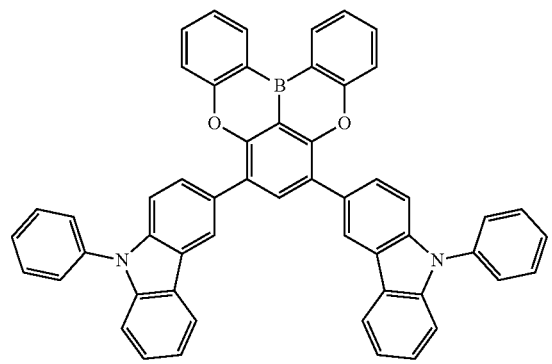
(1-112)
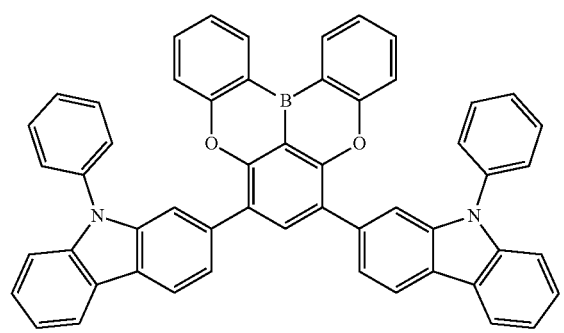
(1-113)
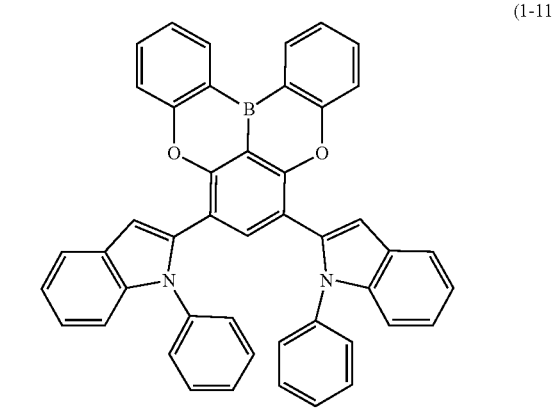
(1-114)
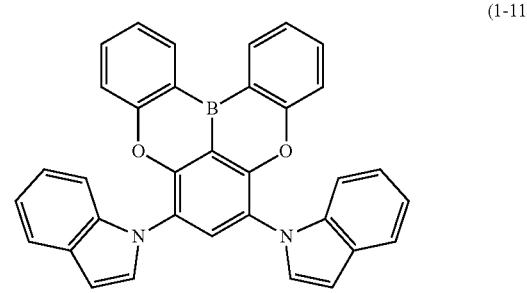
(1-115)
(1-116)
(1-117)
(1-118)
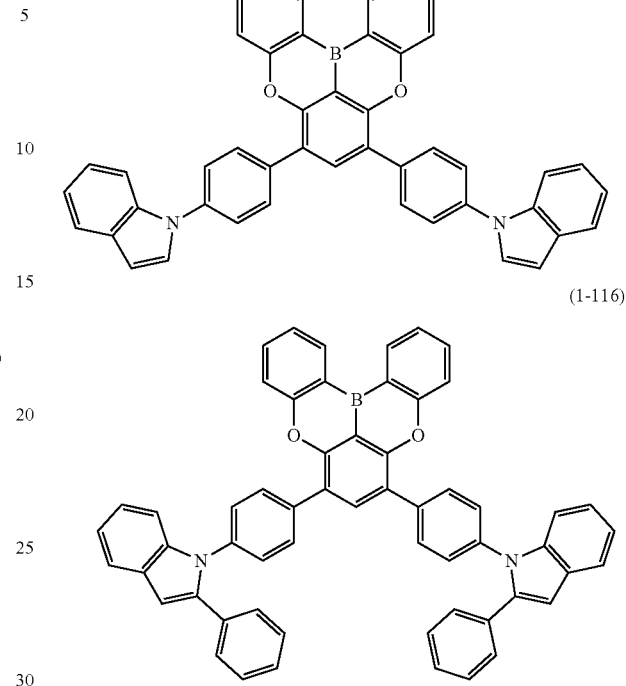
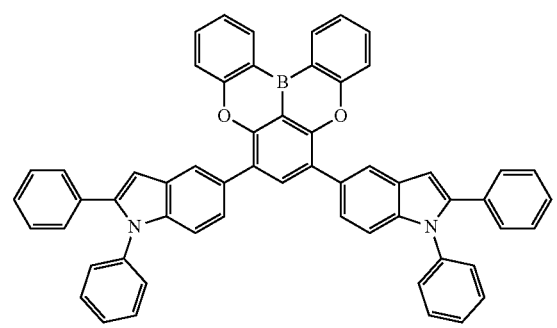

(1-121)
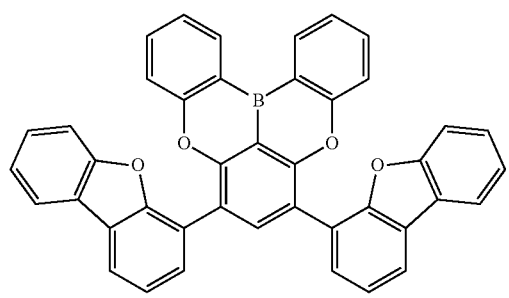
(1-122)
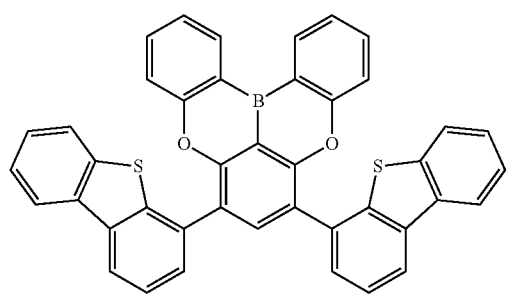
(1-123)
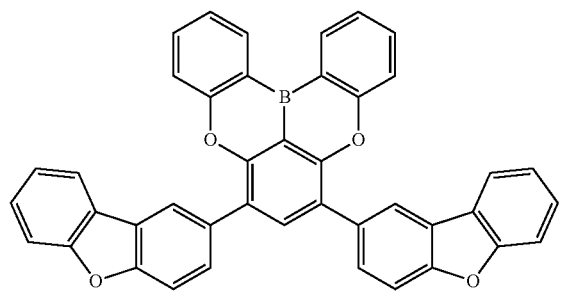
(1-124)
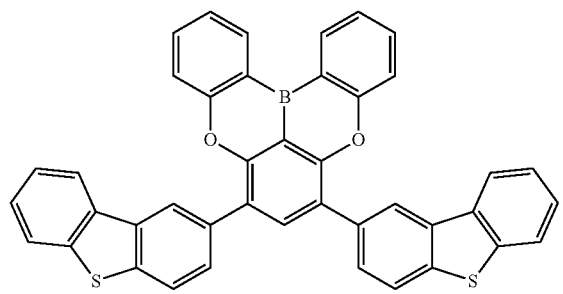
(1-125)
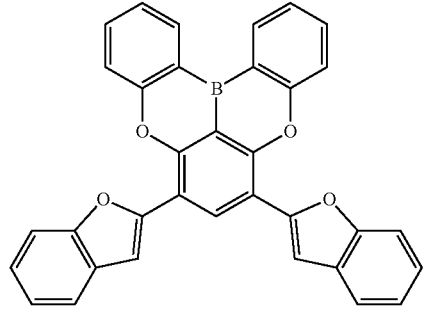
(1-126)
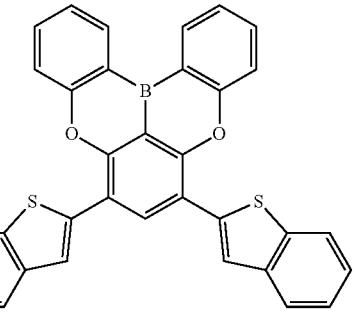
(1-127)
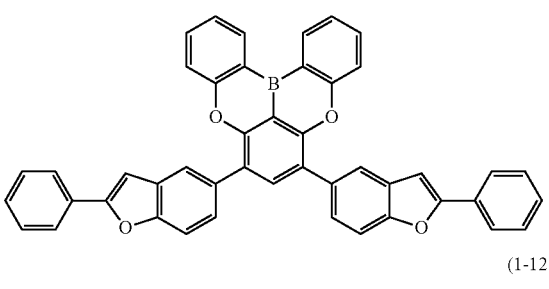
(1-128)
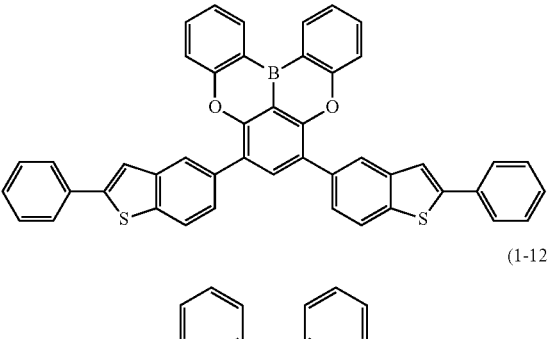
(1-129)
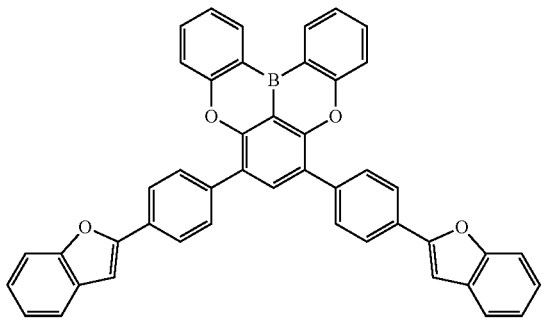
(1-130)
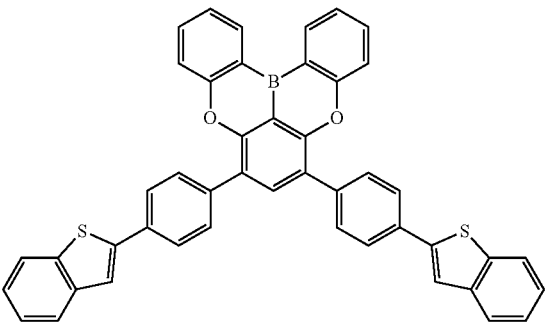

(1-141)
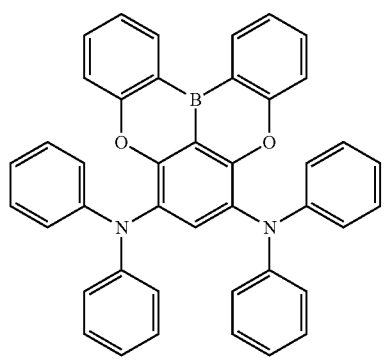
(1-142)
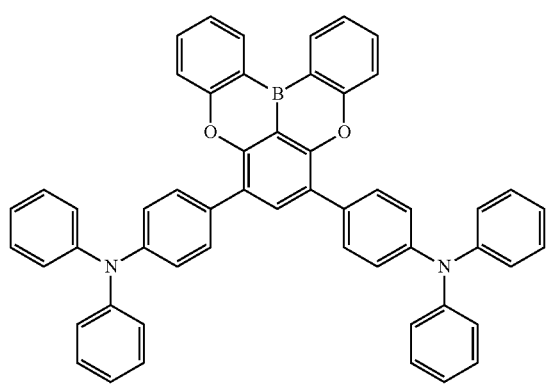
(1-143)
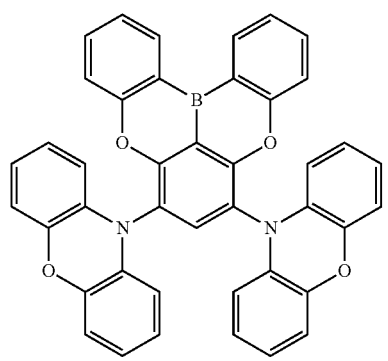
(1-144)
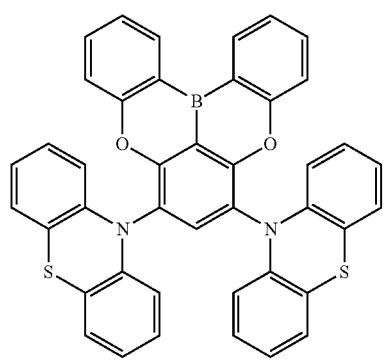
(1-145)
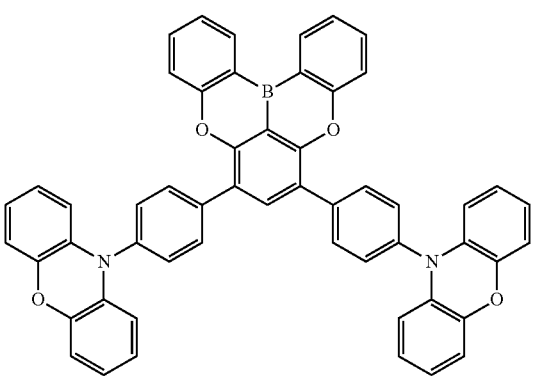
(1-146)
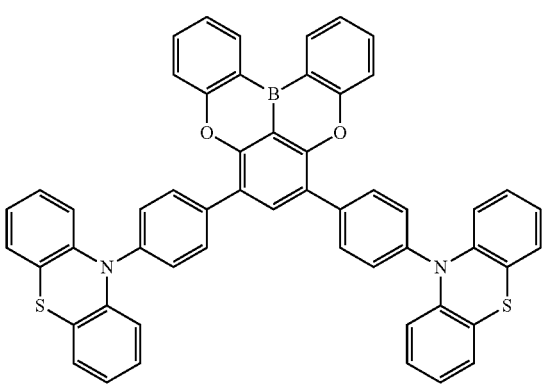
(1-151)
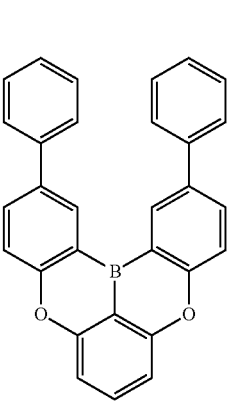
(1-152)
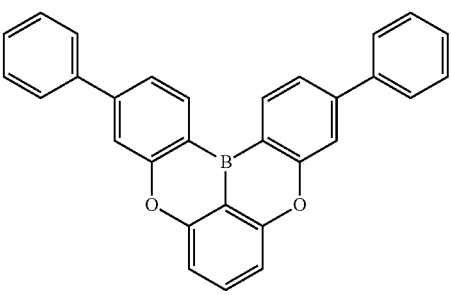

(1-153)
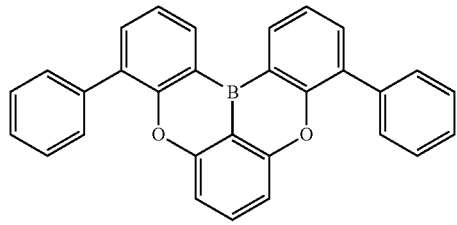
(1-154)
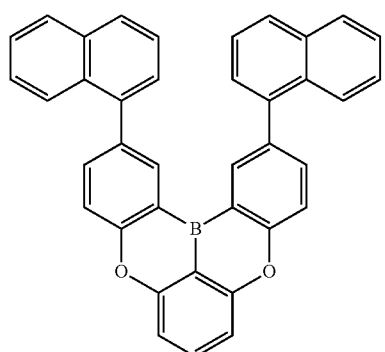
(1-155)
(1-156)
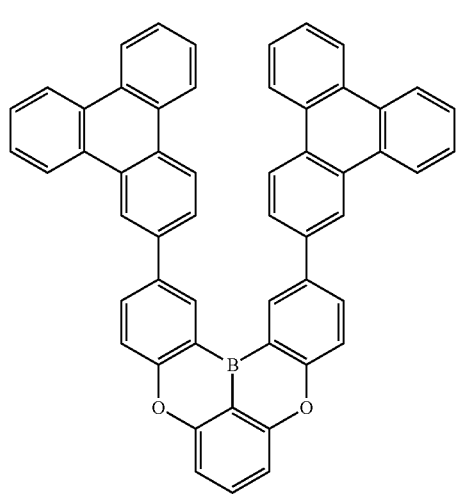
(1-157)
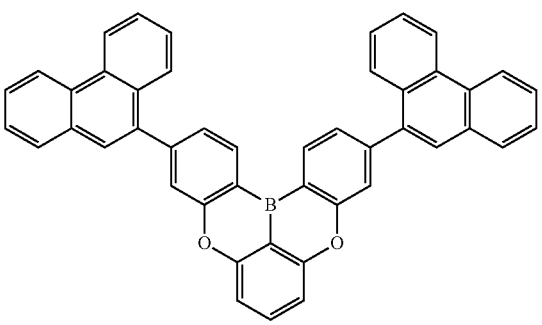
(1-158)
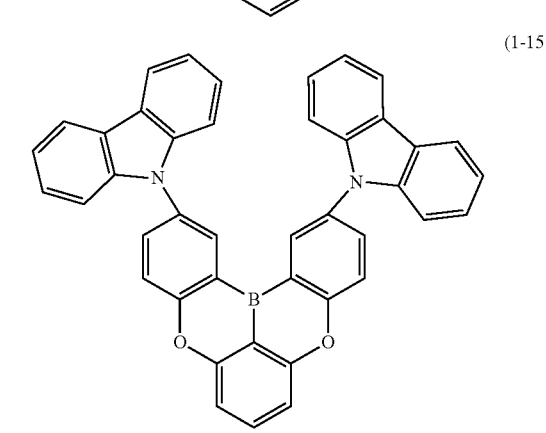
(1-159)
(1-160)
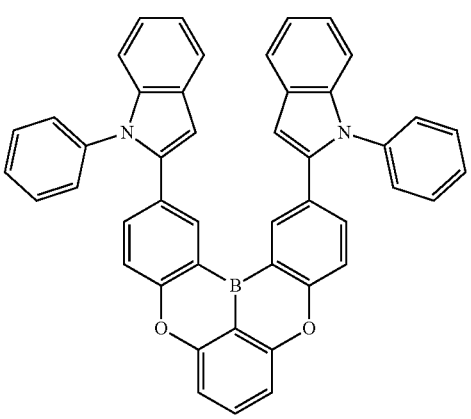
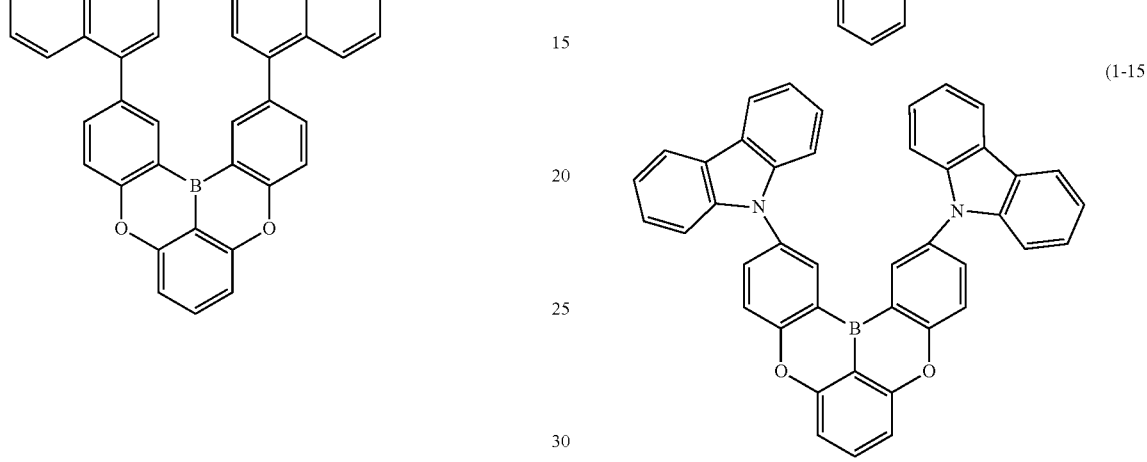
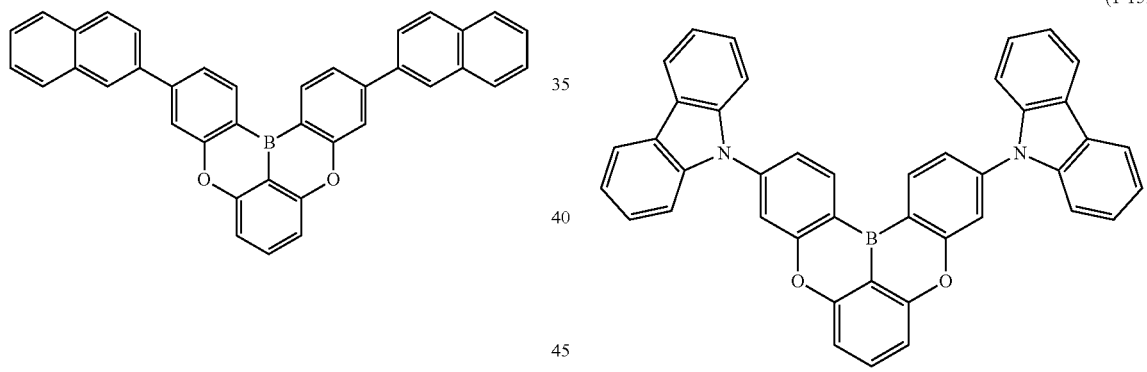

-continued
(1-161)
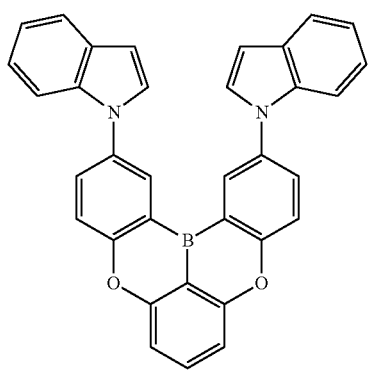
(1-171)
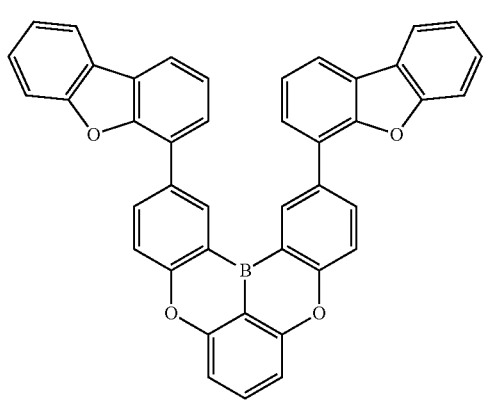
(1-172)
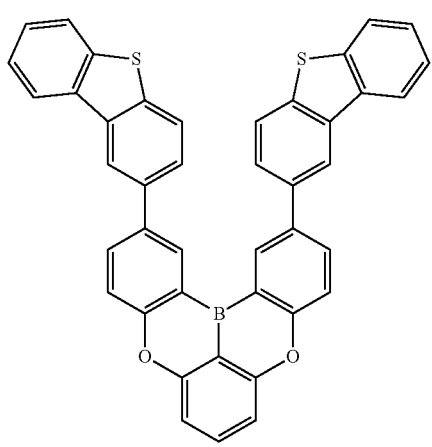
-continued
(1-173)
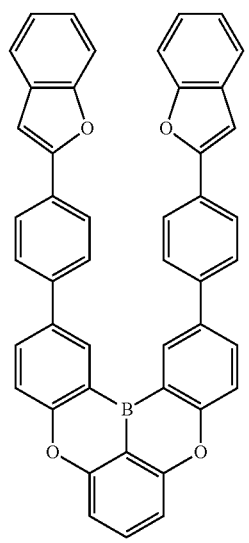
(1-174)
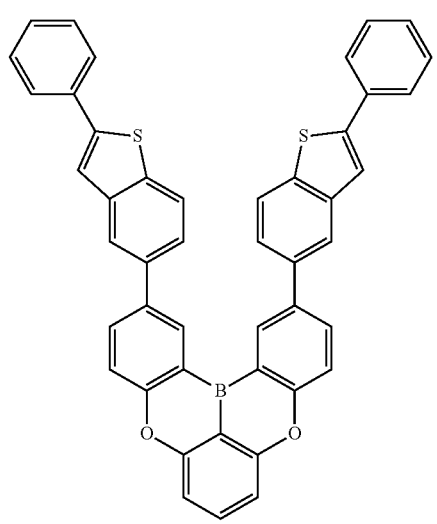
(1-175)
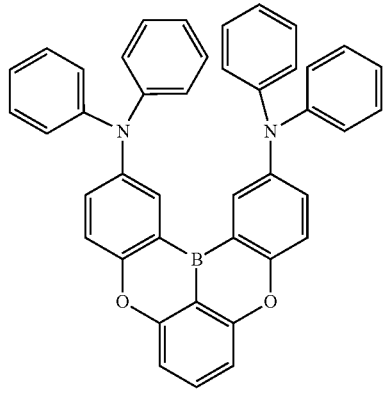

(1-176)
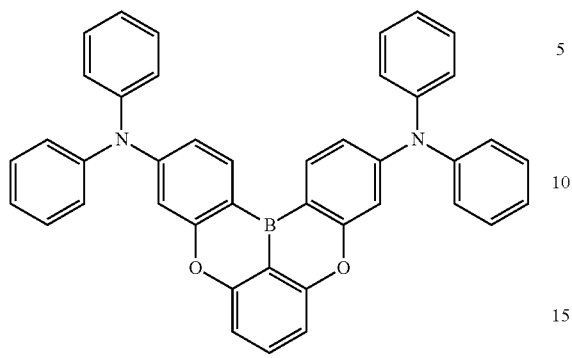
(1-177)
(1-178)
(1-179)
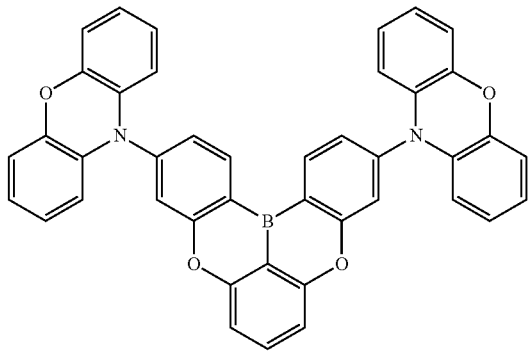
(1-1001)
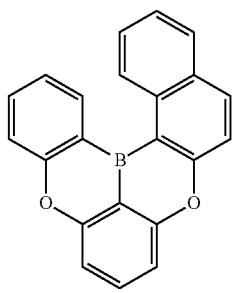
(1-1002)
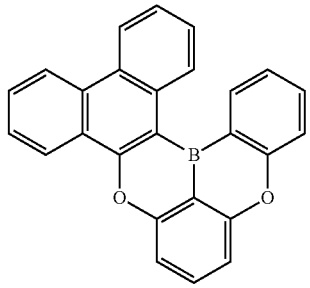
(1-1003)
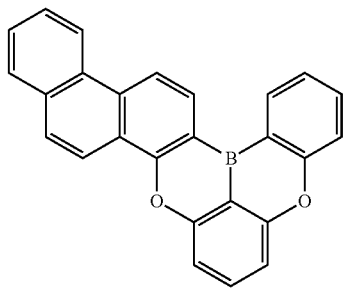
(1-1004)
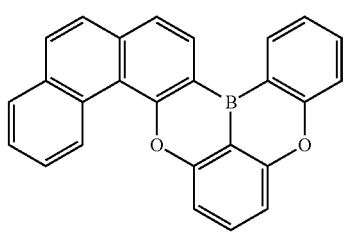

(1-1005)
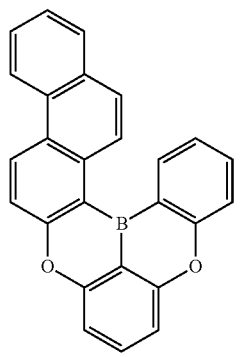
(1-1006)
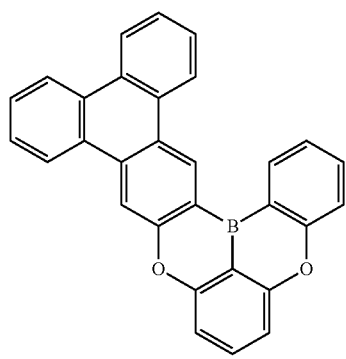
(1-1007)
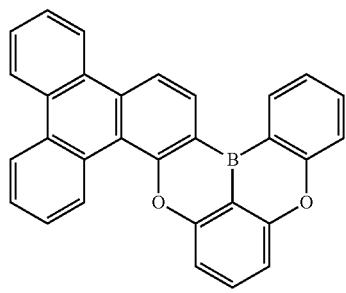
(1-1008)
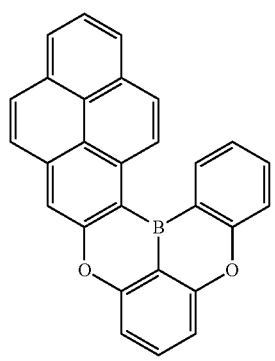
(1-1009)
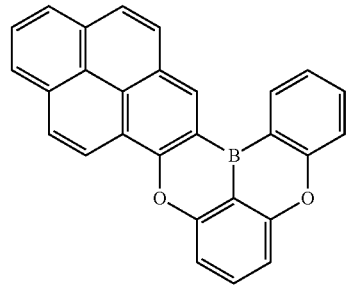
(1-1010)
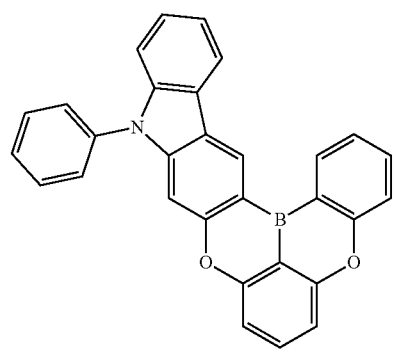
(1-1011)
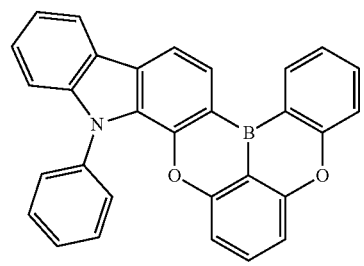
(1-1012)
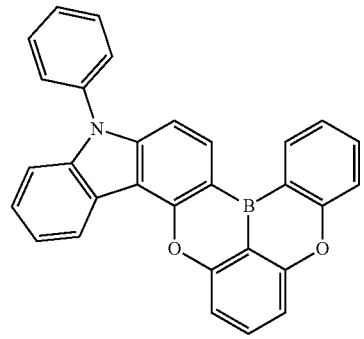
(1-1013)
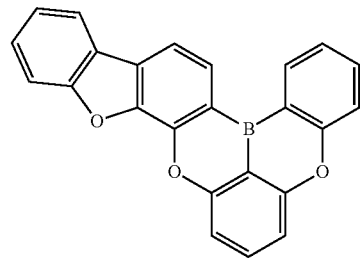

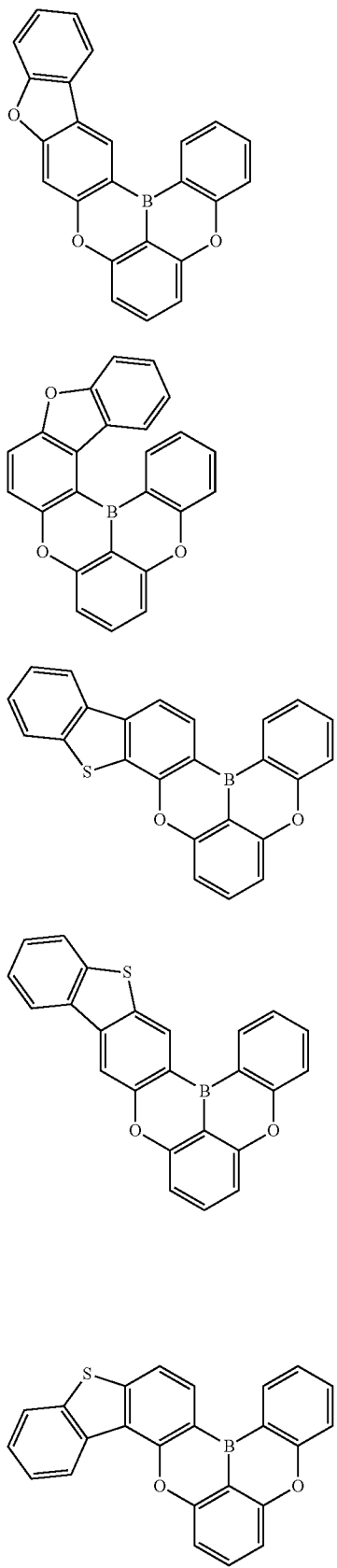
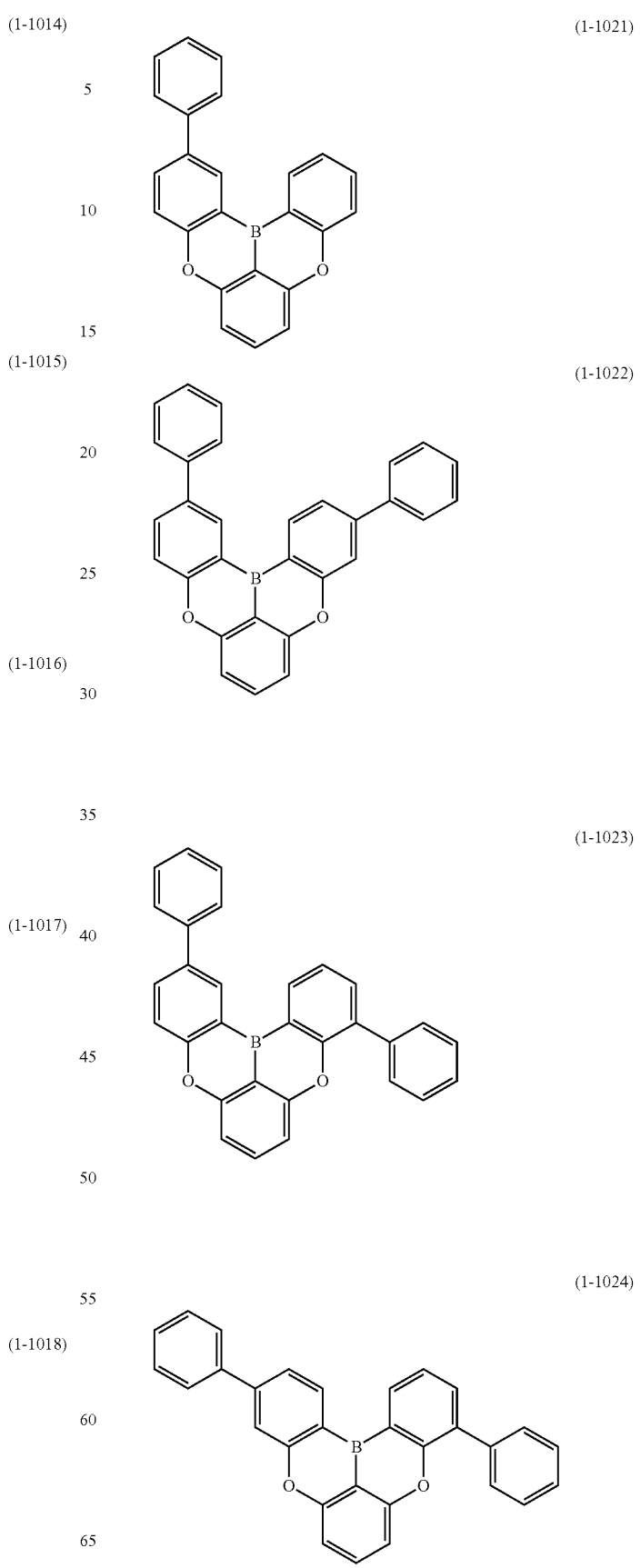

(1-1025)
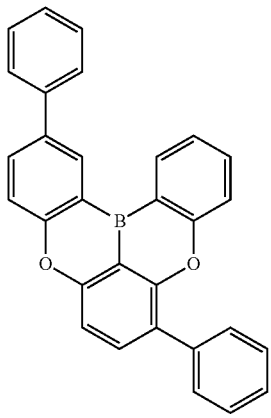
(1-1028)
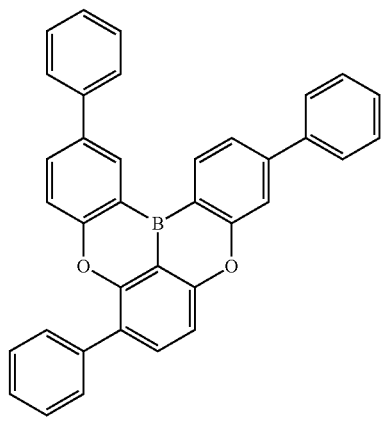
(1-1026)
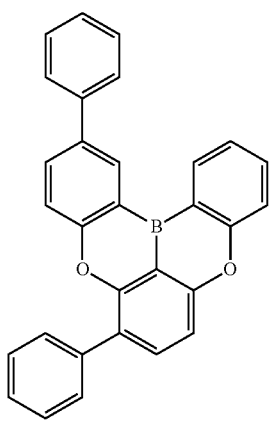
(1-1029)
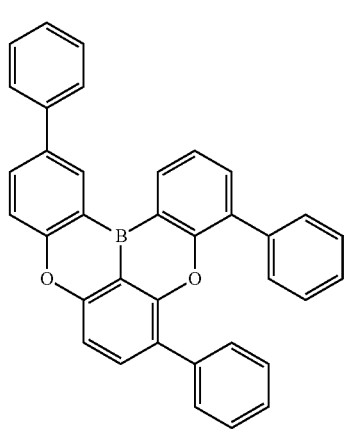
(1-1027)
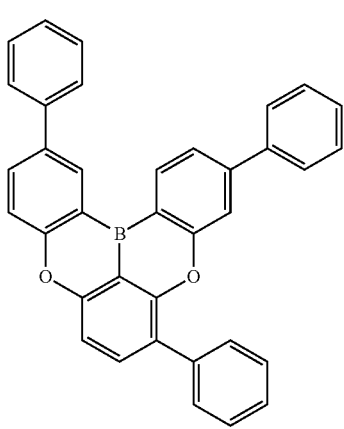
(1-1030)
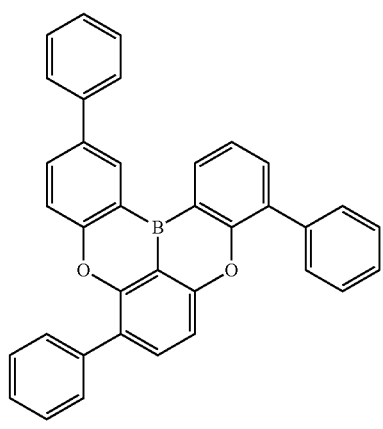

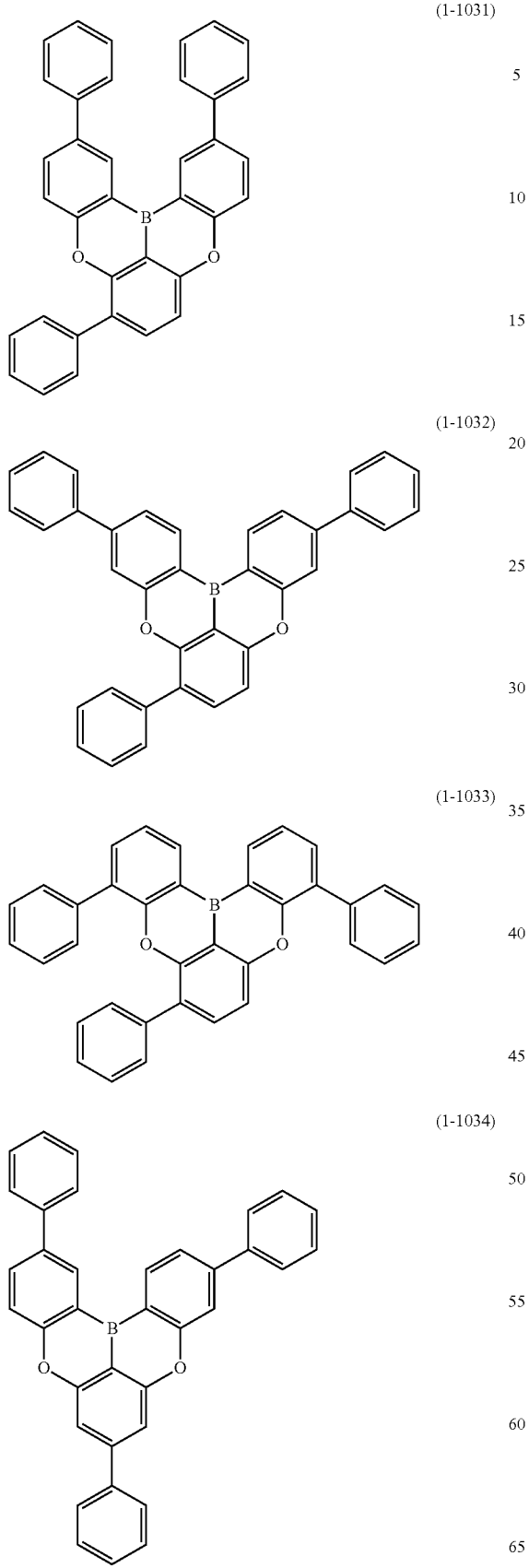
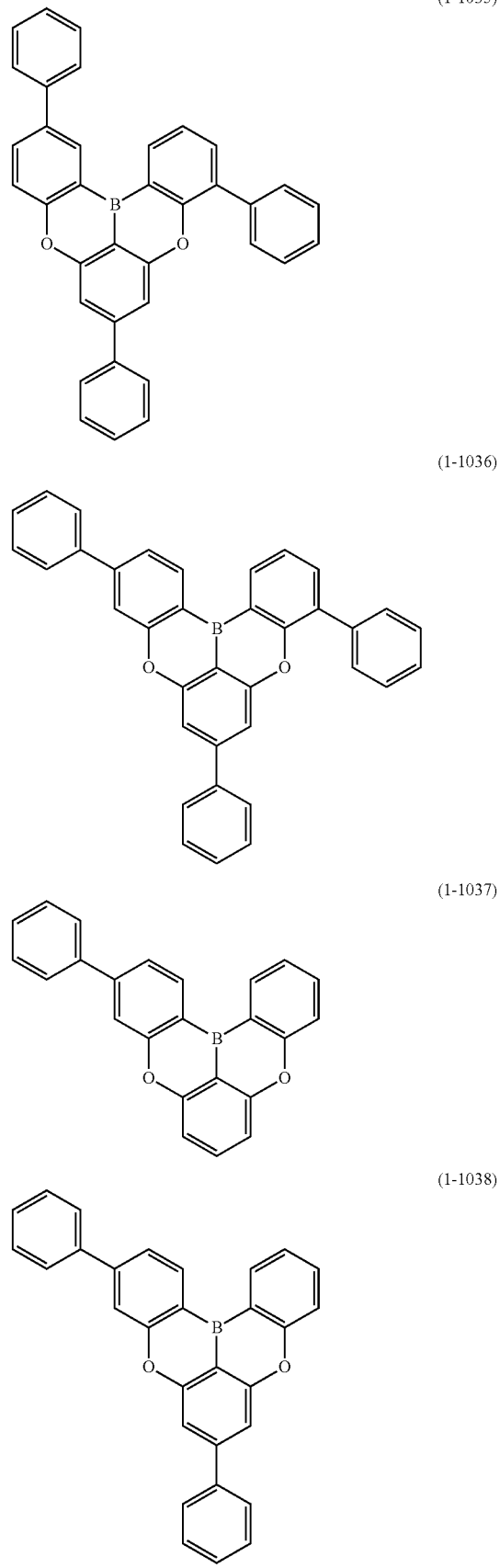

73
-continued
(1-1039)
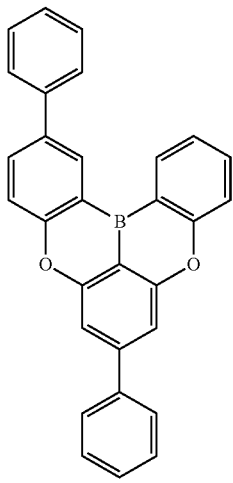
(1-1041)
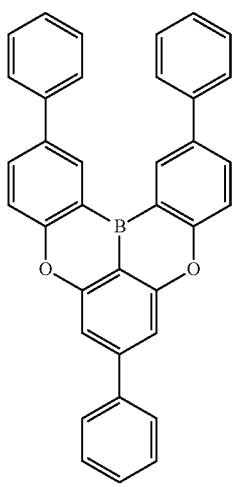
(1-1042)
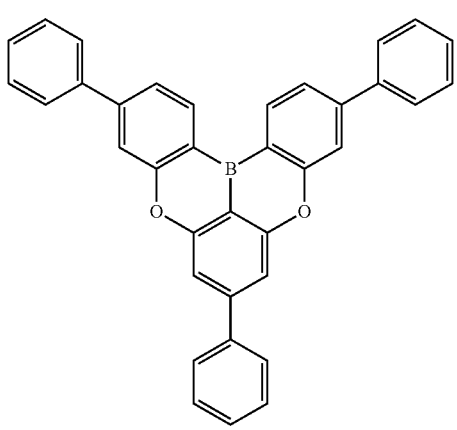
74
-continued
(1-1043)
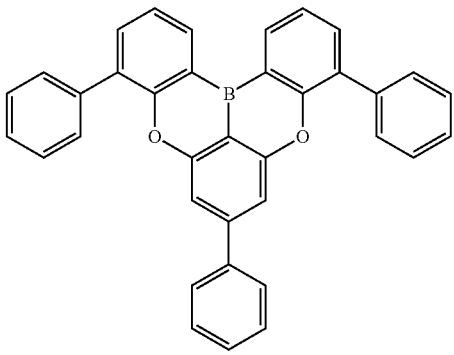
(1-1044)
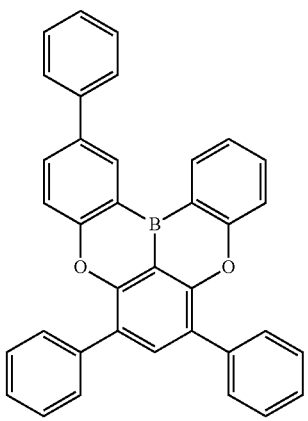
(1-1045)
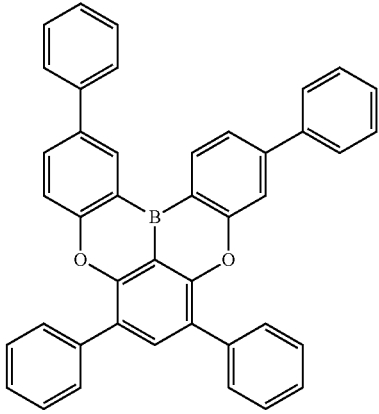
(1-1046)
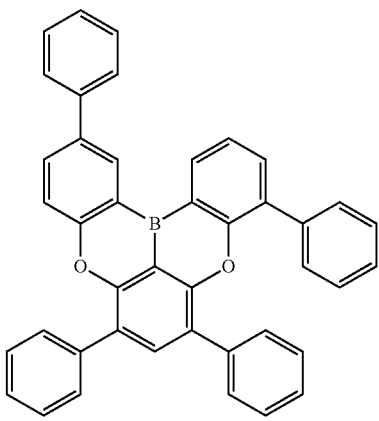

(1-1047)
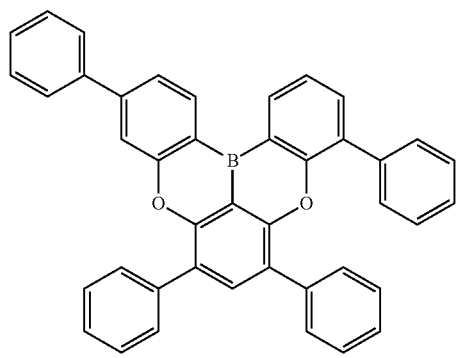
(1-1048)
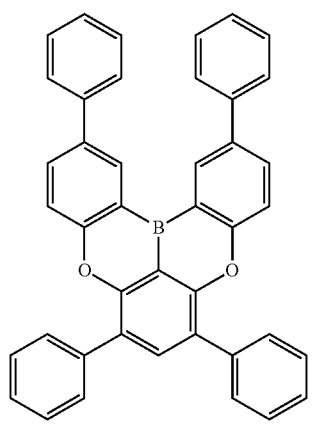
(1-1049)
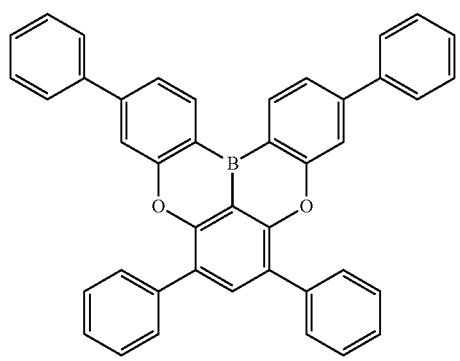
(1-1050)
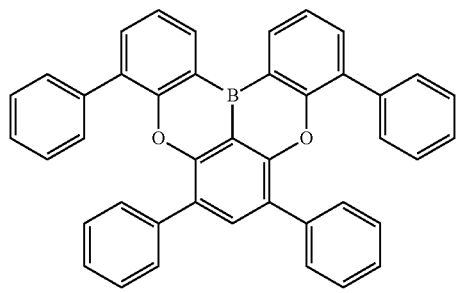
(1-1061)
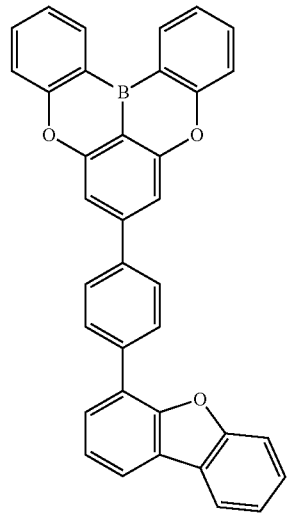
(1-1062)
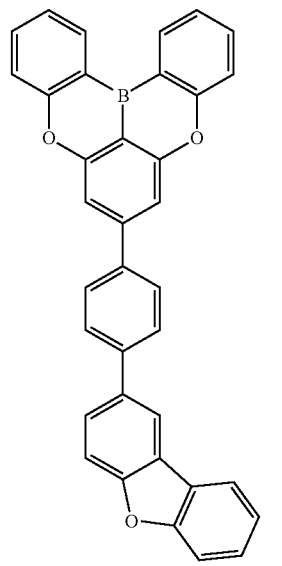
(1-1063)
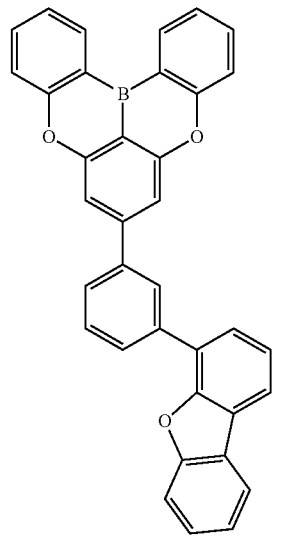

(1-1064)
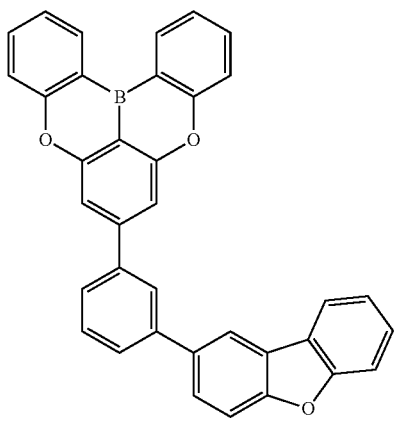
(1-1065)
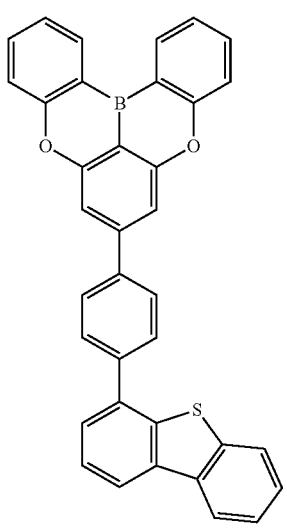
(1-1066)
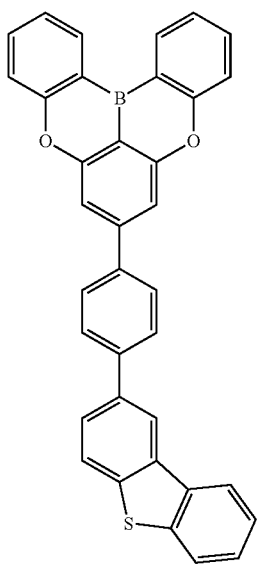
(1-1067)
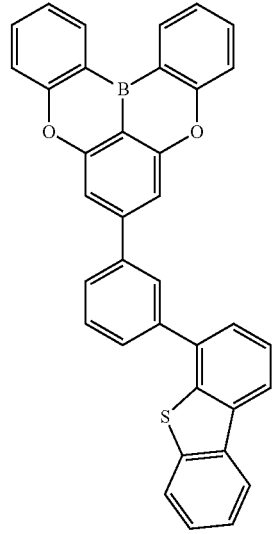
(1-1068)
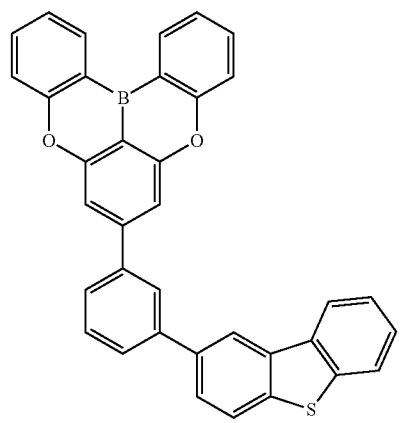
(1-1069)
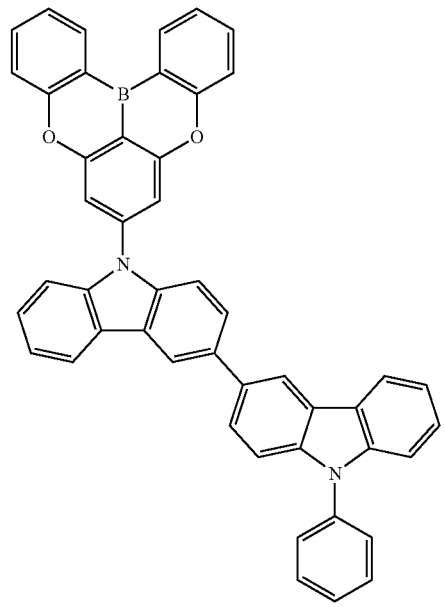

(1-1070)
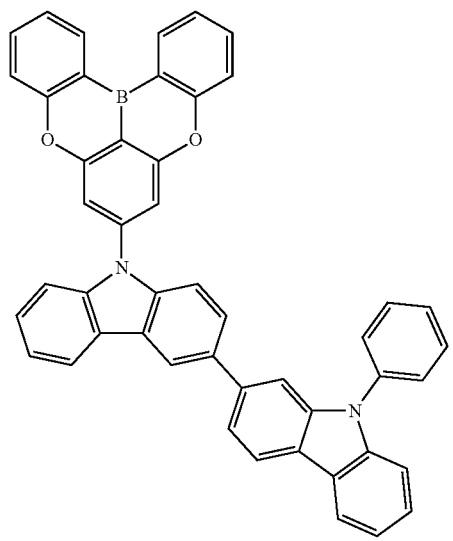
(1-1071)
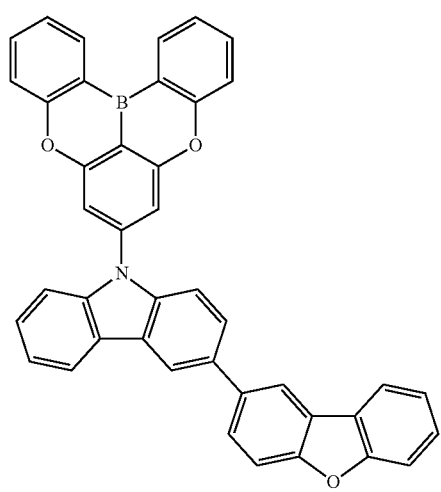
(1-1072)
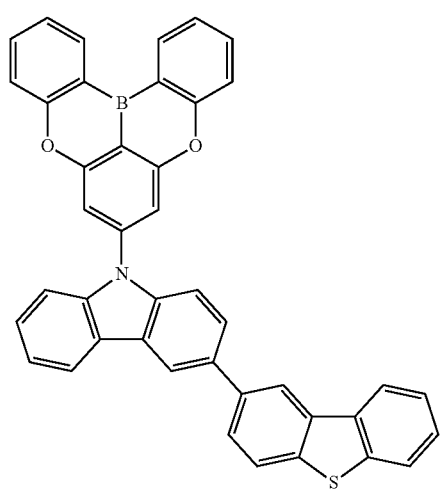
(1-1081)
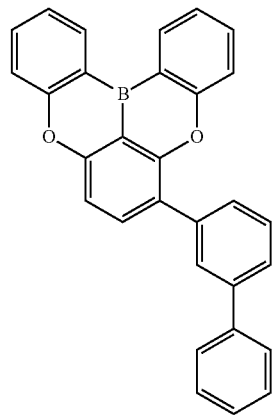
(1-1082)
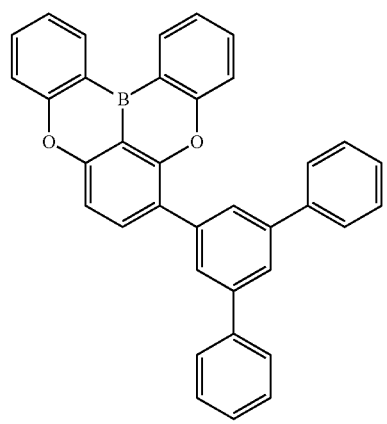
(1-1083)
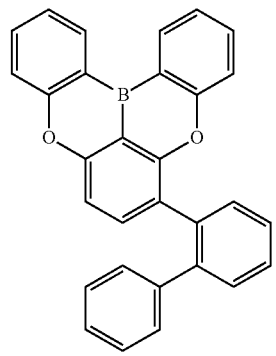
(1-1084)
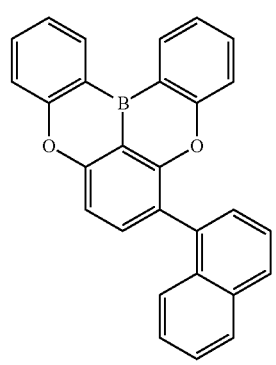

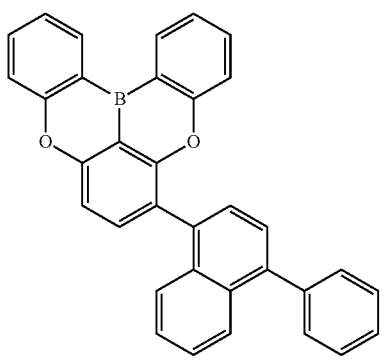 (1-1085)
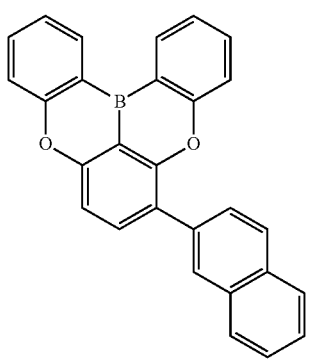 (1-1086)
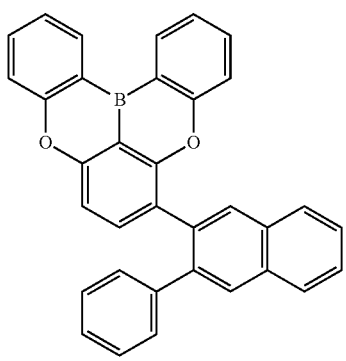 (1-1087)
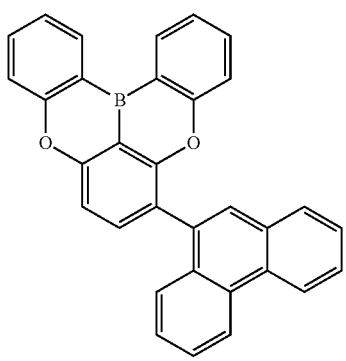 (1-1088)
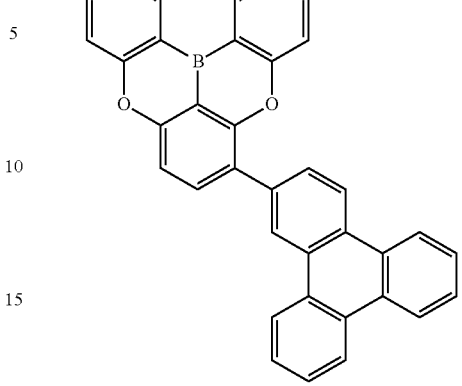 (1-1089)
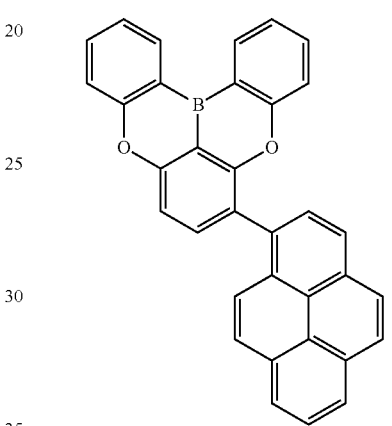 (1-1090)
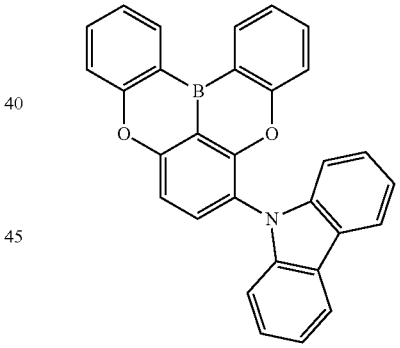 (1-1091)
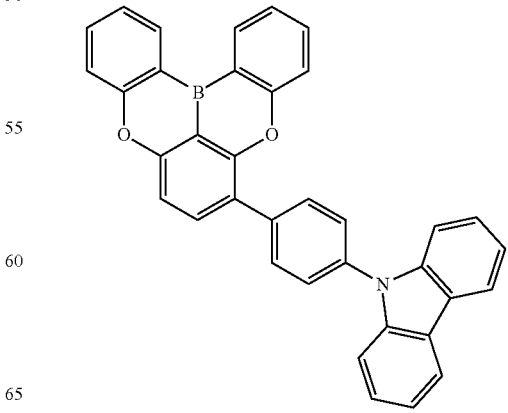 (1-1092)

(1-1093)
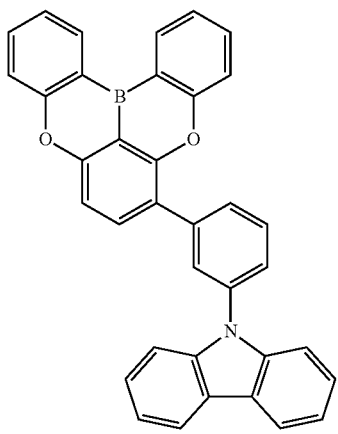
(1-1094)
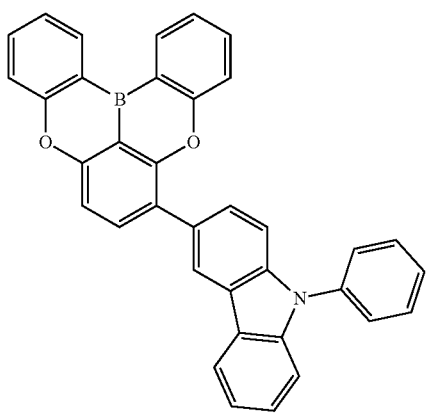
(1-1095)
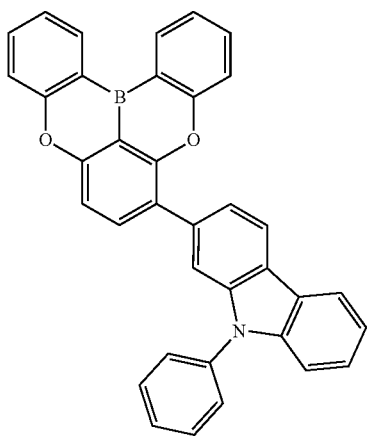
(1-1096)
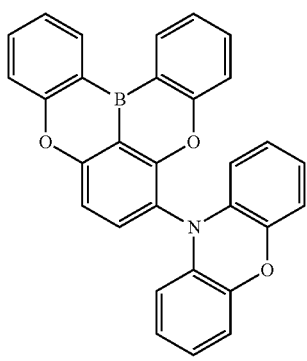
(1-1101)
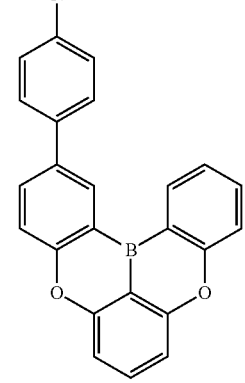
(1-1102)
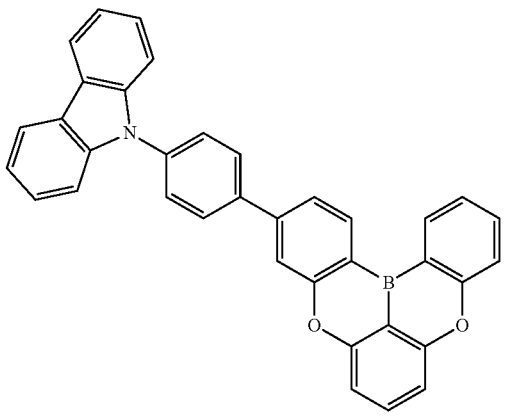
(1-1103)
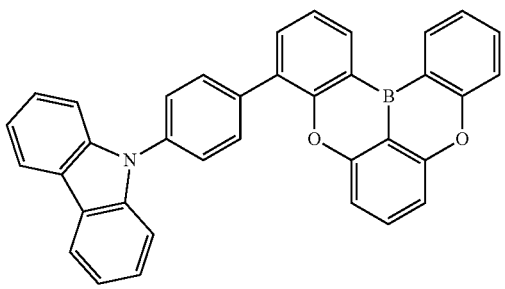
(1-1104)
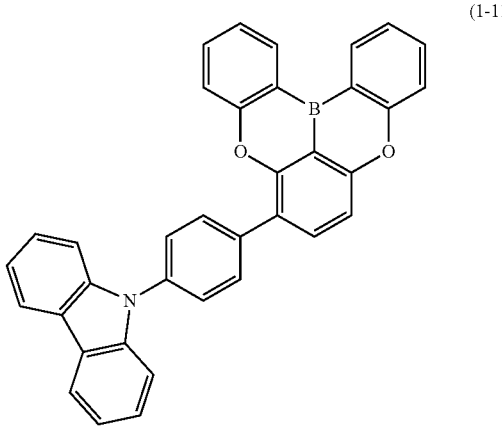

(1-1105)
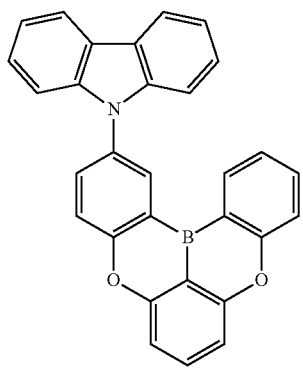
(1-1106)
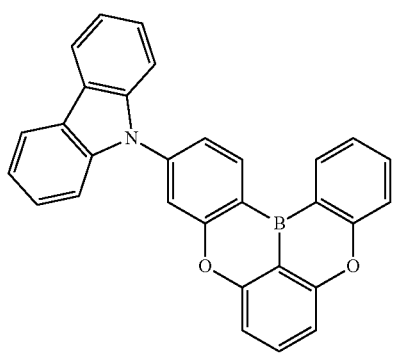
(1-1107)
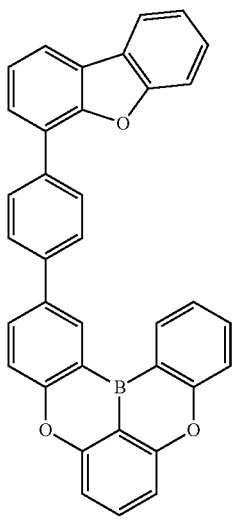
(1-1108)
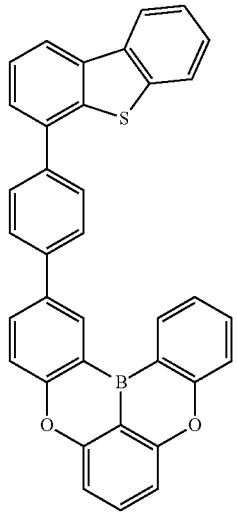
(1-1109)
(1-1110)
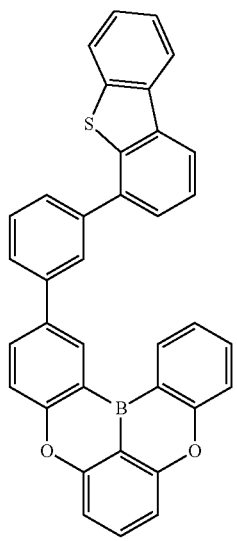

(1-1111)
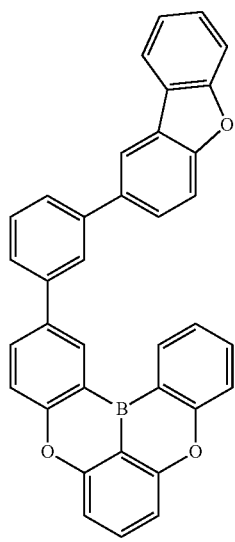
(1-1112)
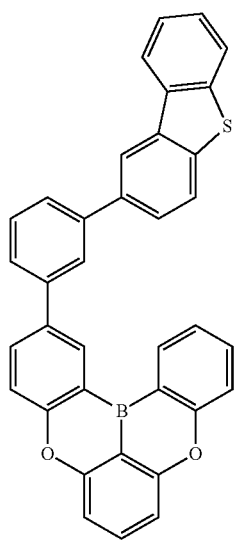
(1-1113)
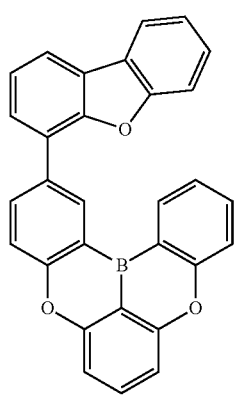
(1-1114)
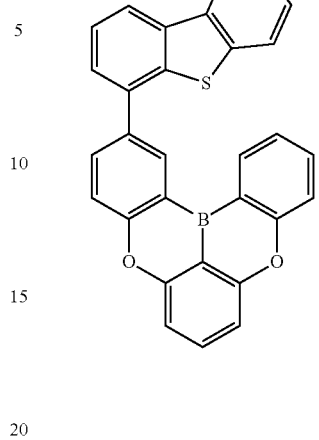
(1-1121)
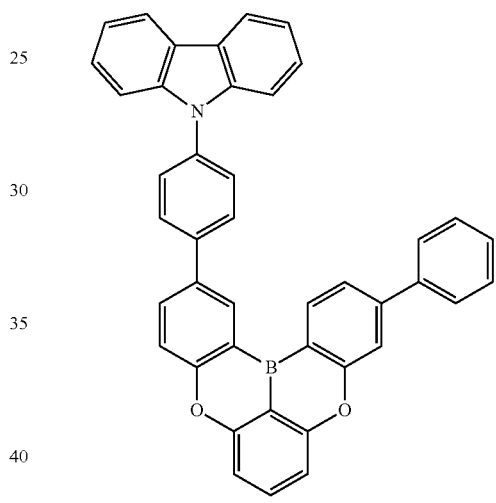
(1-1122)
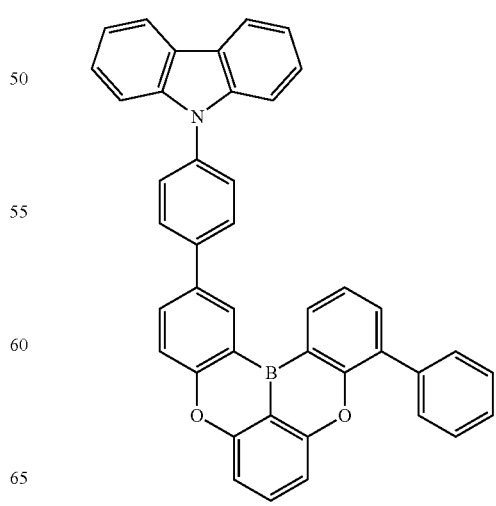

(1-1123)
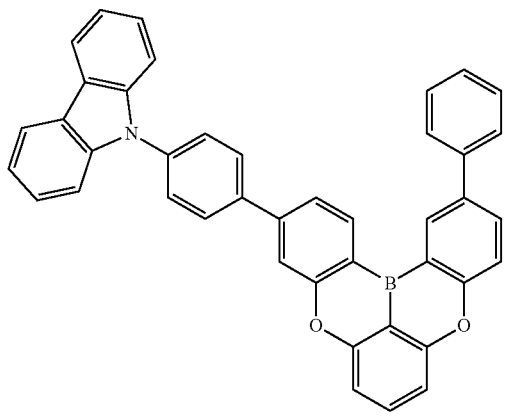
(1-1126)
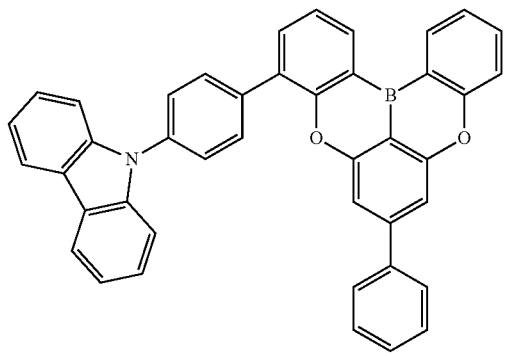
(1-1124)
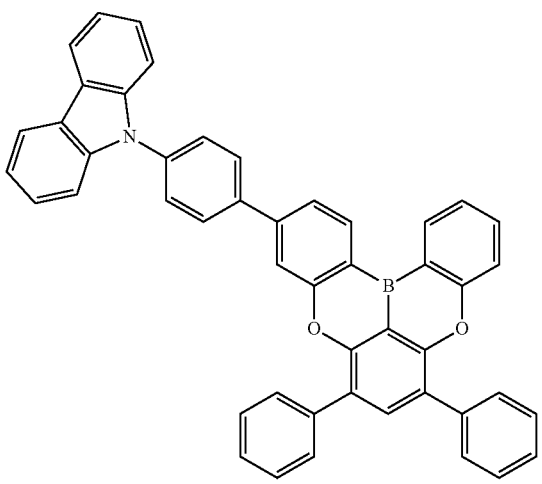
(1-1127)
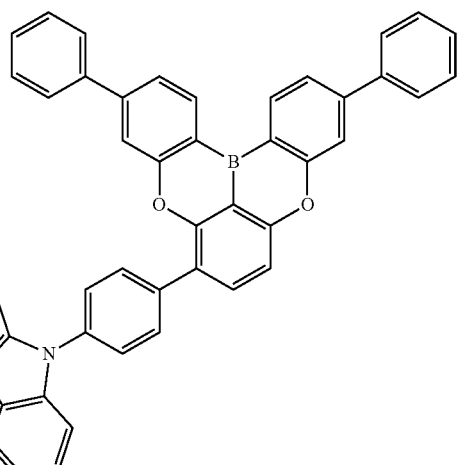
(1-1125)
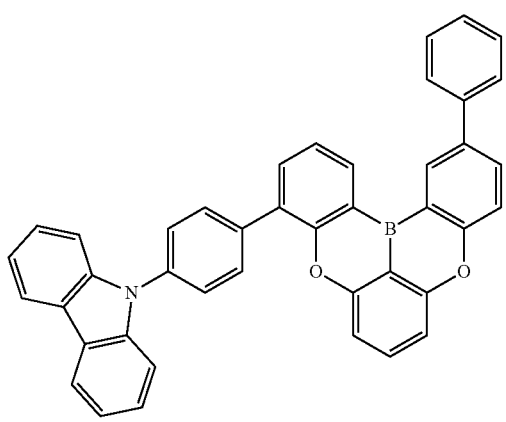
(1-1128)
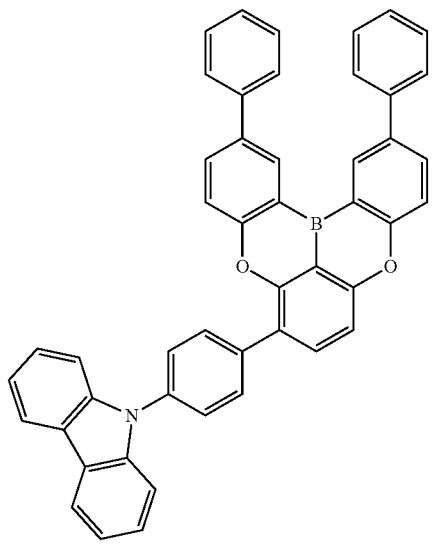

-continued
(1-1129)
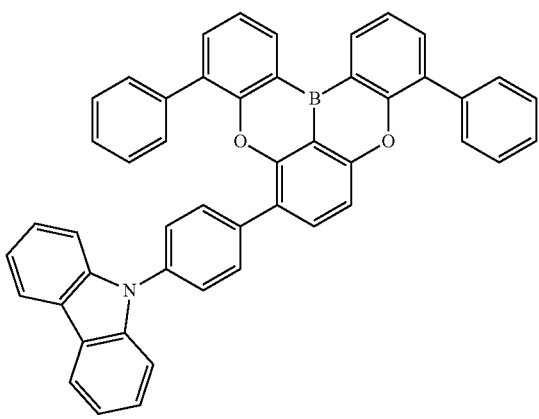
(1-1130)
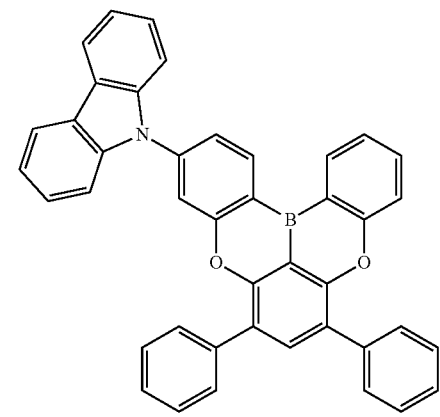
(1-1131)
-continued
(1-1132)
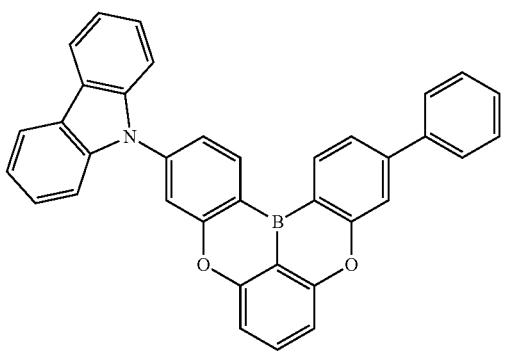
(1-1141)
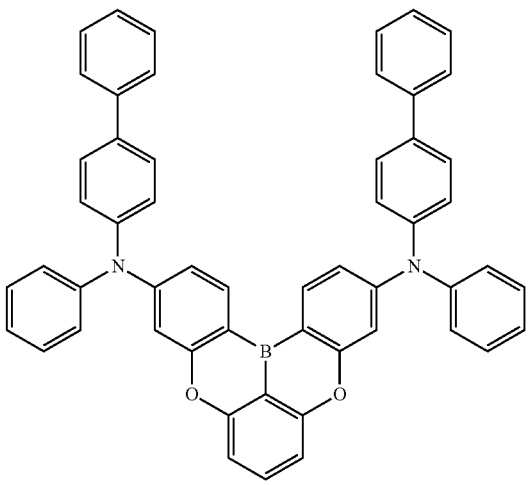
(1-1142)
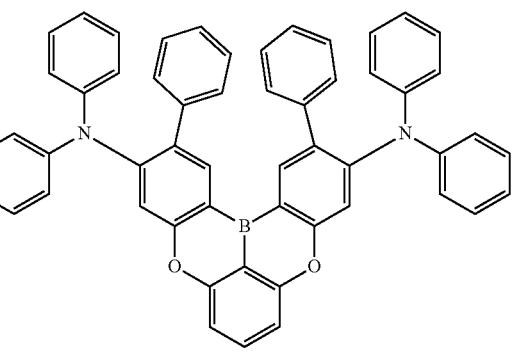
(1-1143)
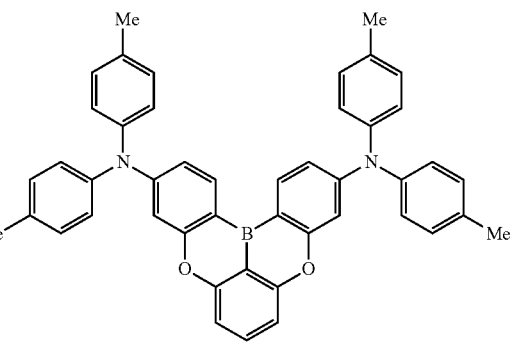

(1-1144)
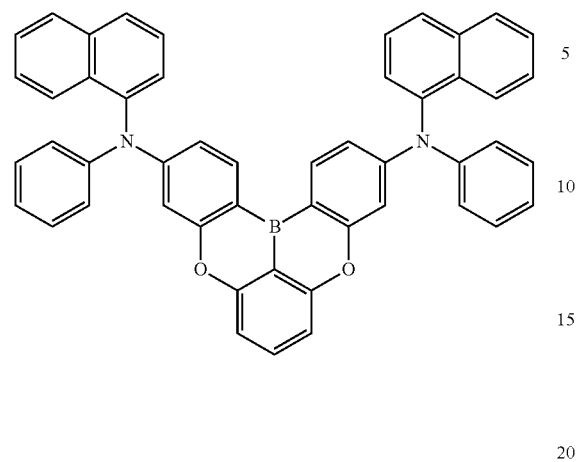
(1-1147)
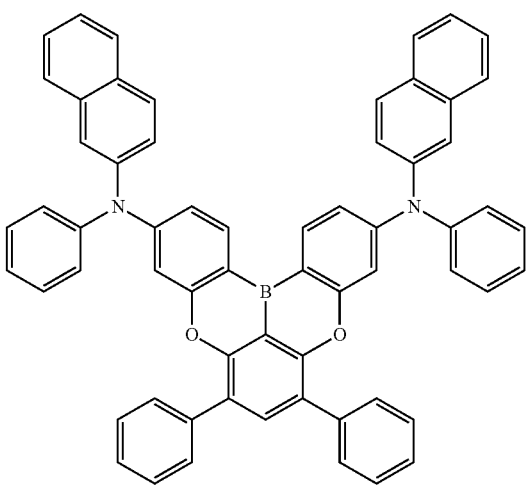
(1-1145)
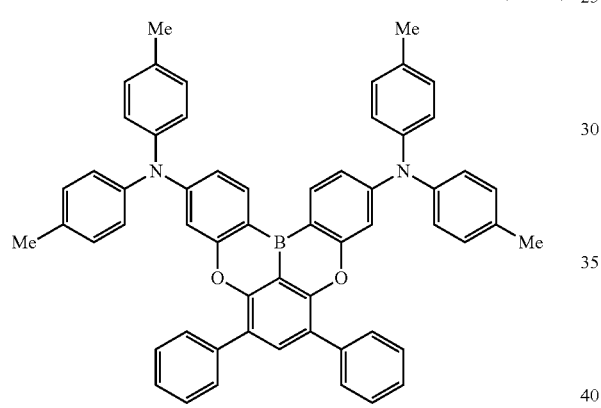
(1-1148)
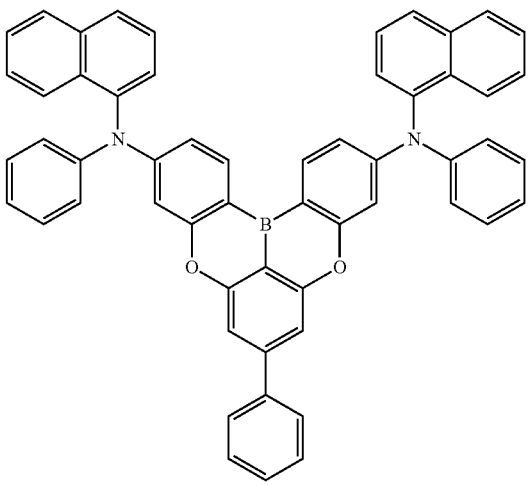
(1-1146)
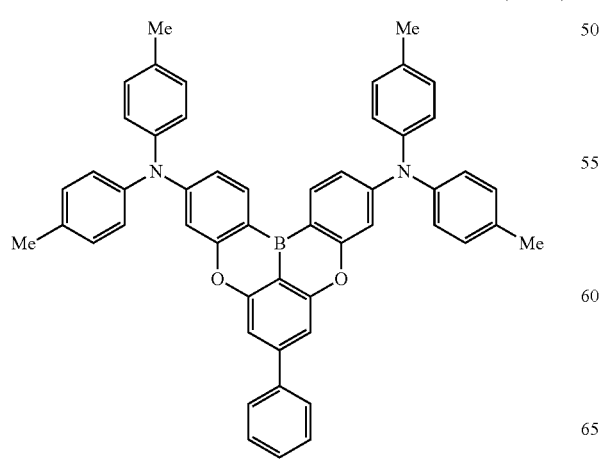
(1-1271)
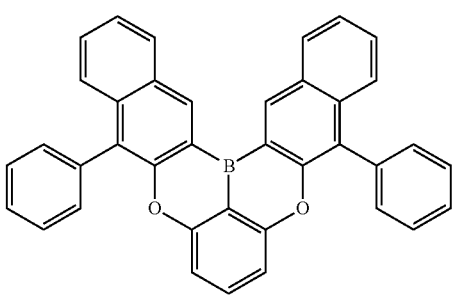
(2-1)
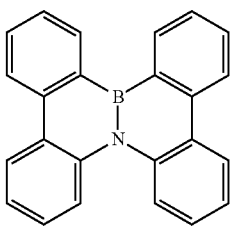

(2-2)
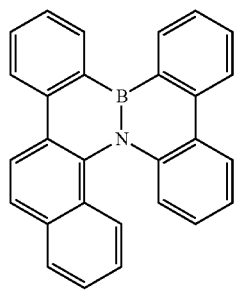
(2-3)
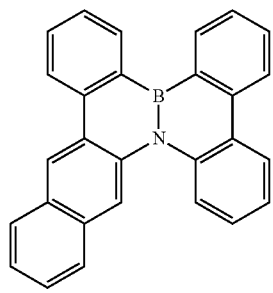
(2-4)
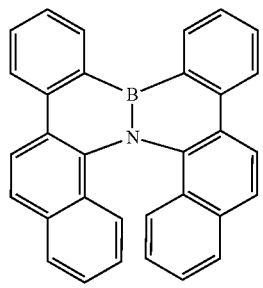
(2-5)
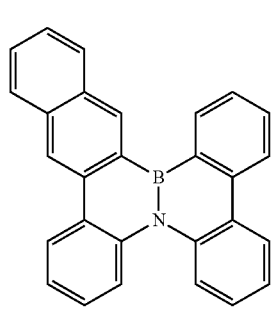
(2-51)
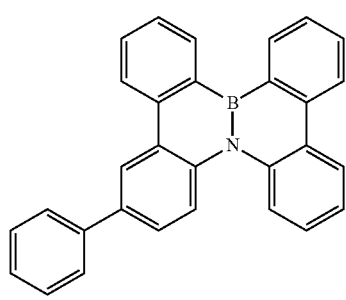
(2-52)
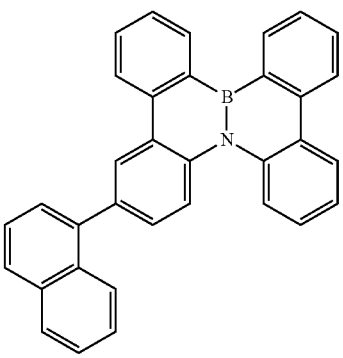
(2-53)
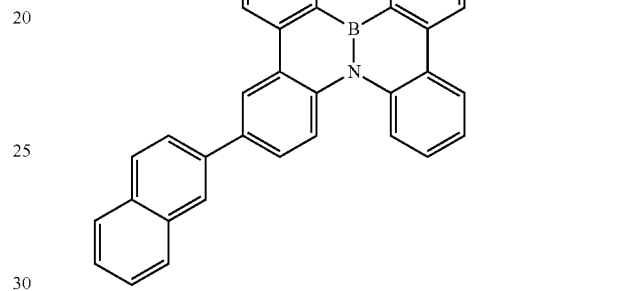
(2-54)
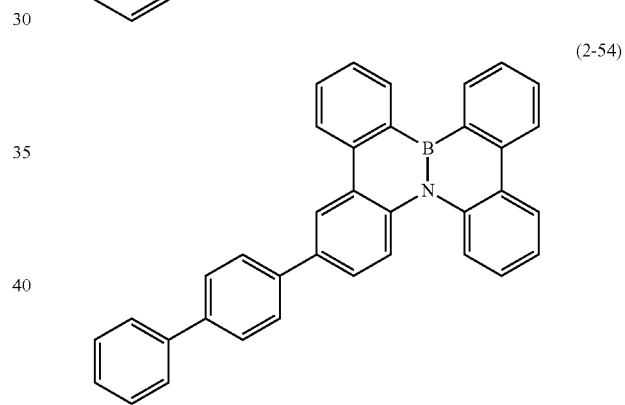
(2-55)
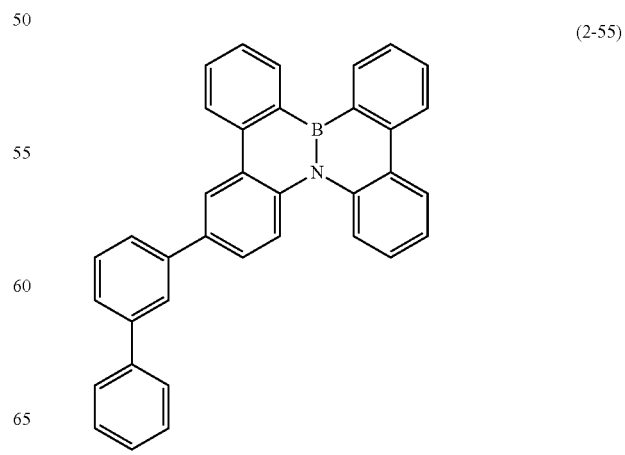

(2-56)
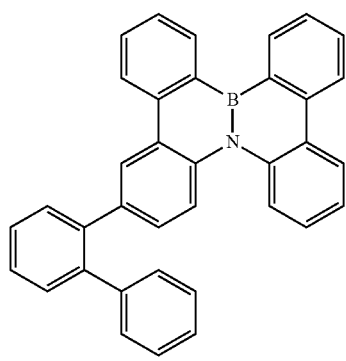
(2-57)
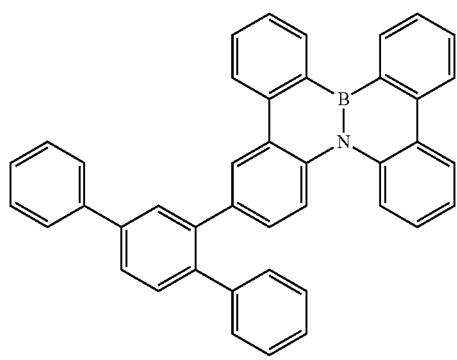
(2-58)
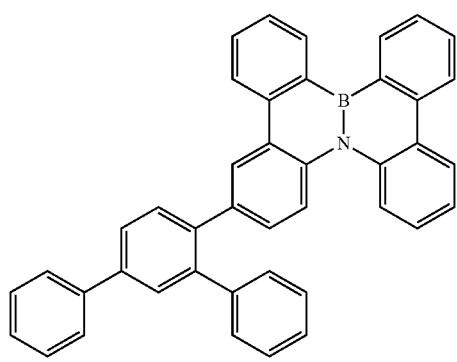
(2-59)
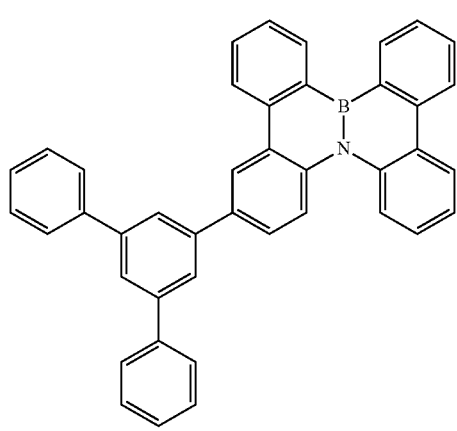
(2-60)
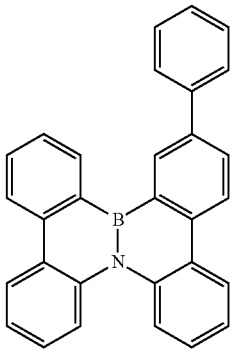
(2-61)
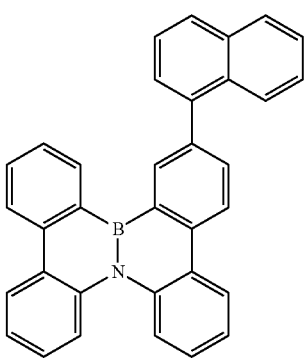
(2-62)
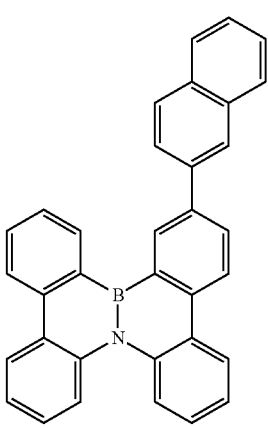
(2-63)
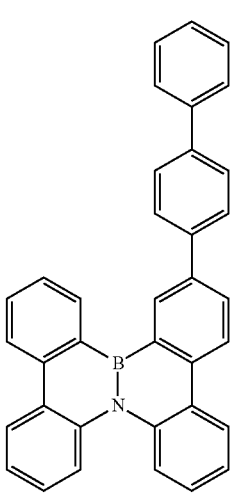

(2-64)
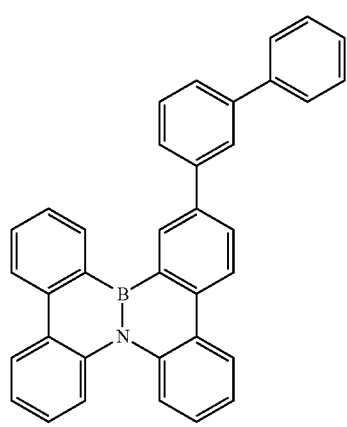
(2-65)
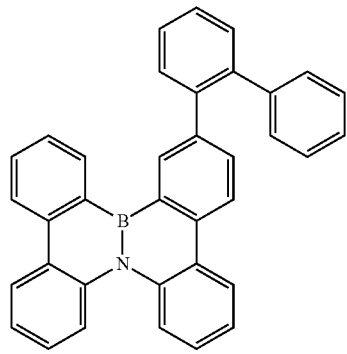
(2-66)
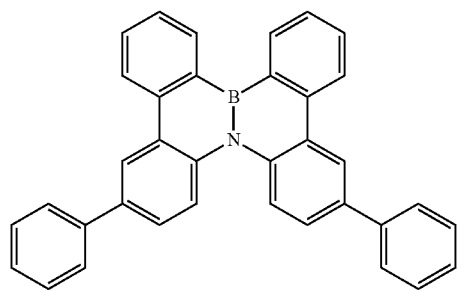
(2-67)
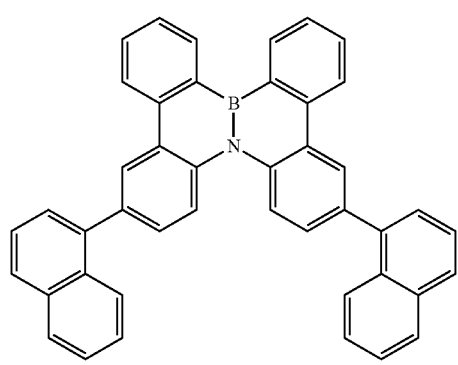
(2-68)
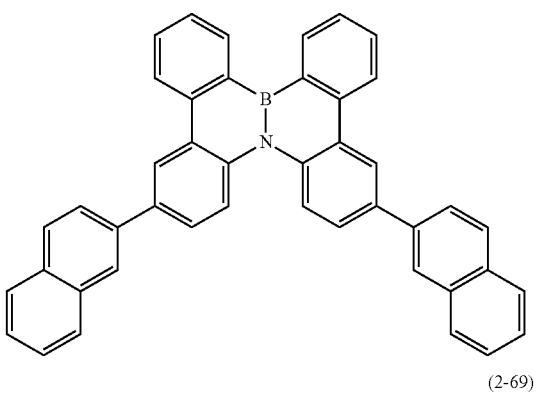
(2-69)
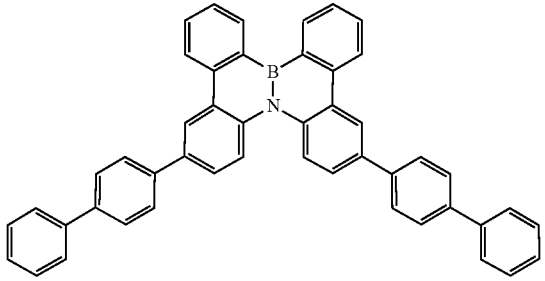
(2-70)
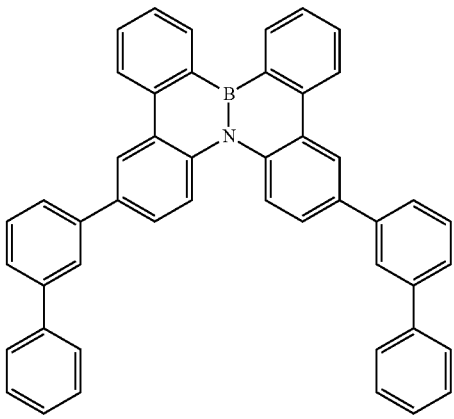
(2-71)
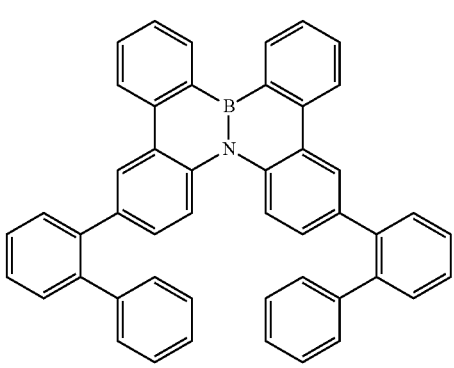

(2-72)
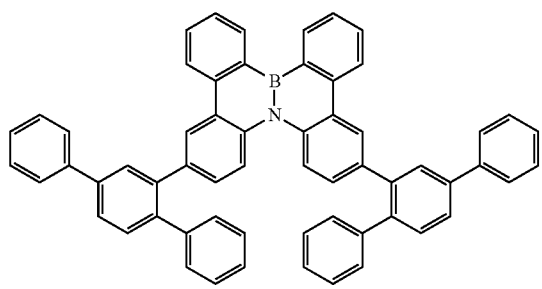
(2-73)
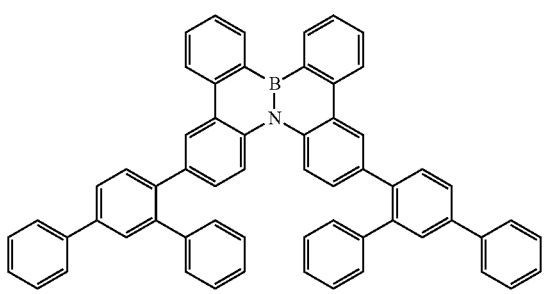
(2-74)
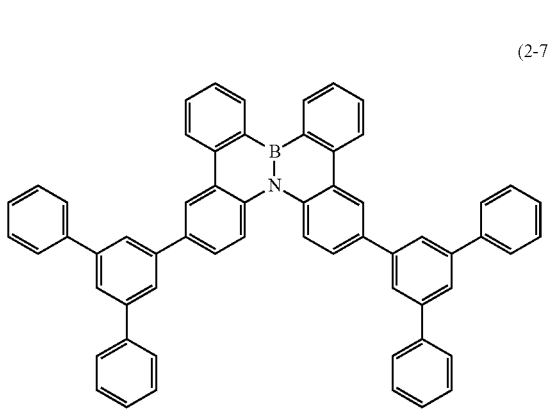
(2-75)
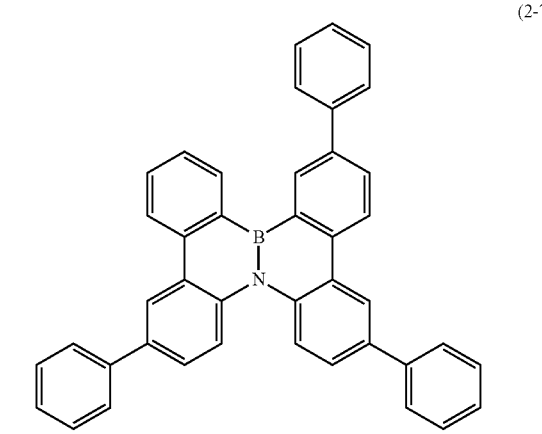
(2-76)
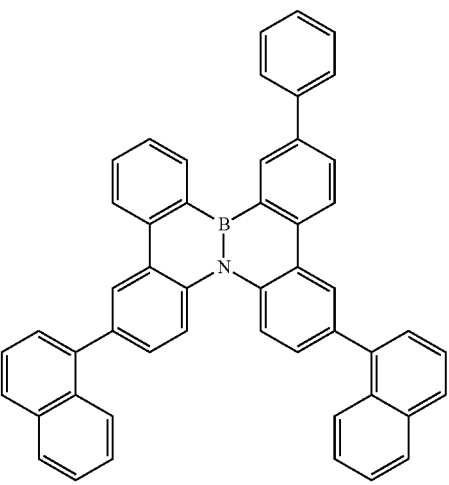
(2-77)
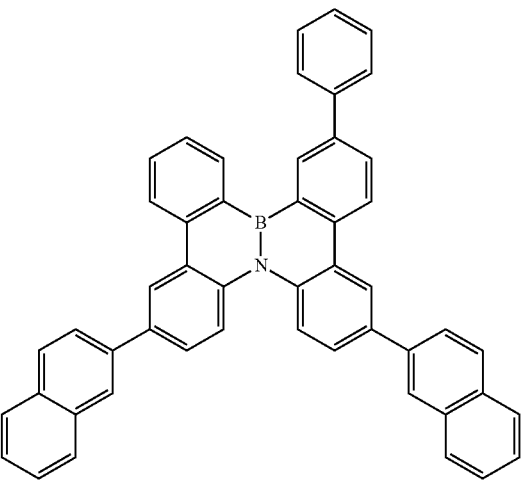
(2-78)
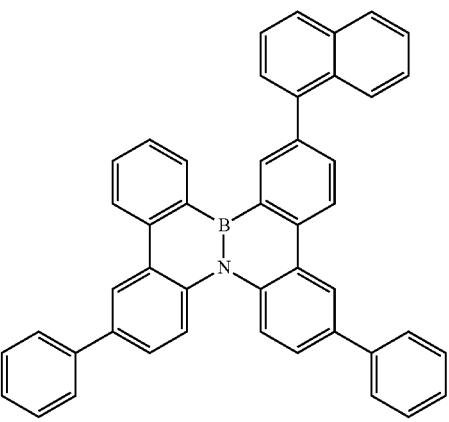

(2-79)
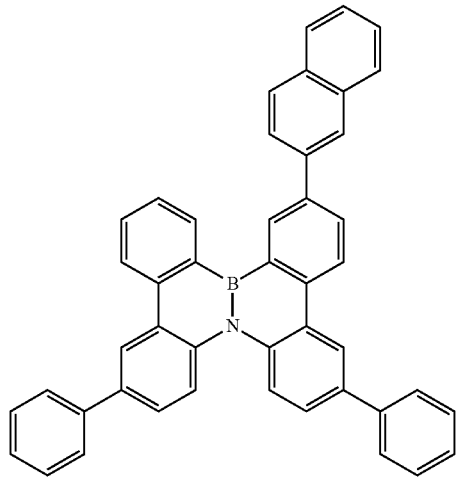
(2-80)
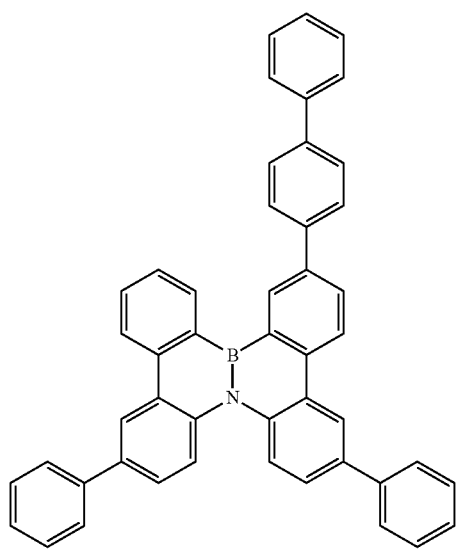
(2-81)
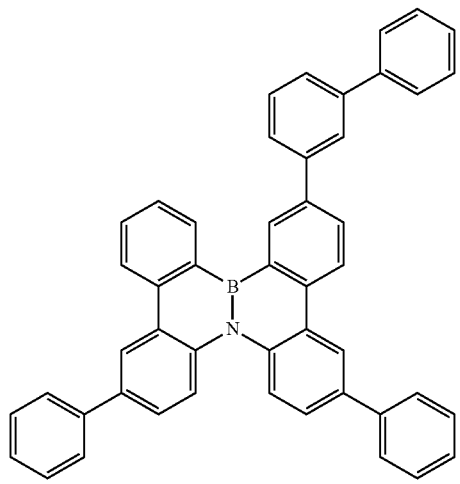
(2-82)
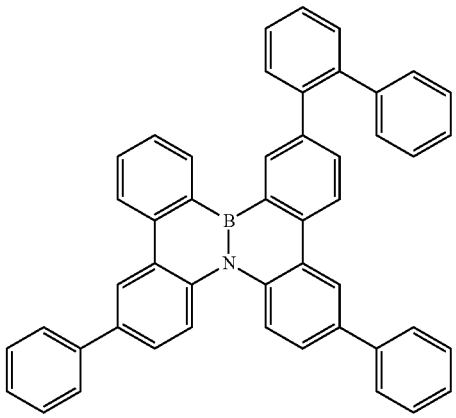
(2-83)
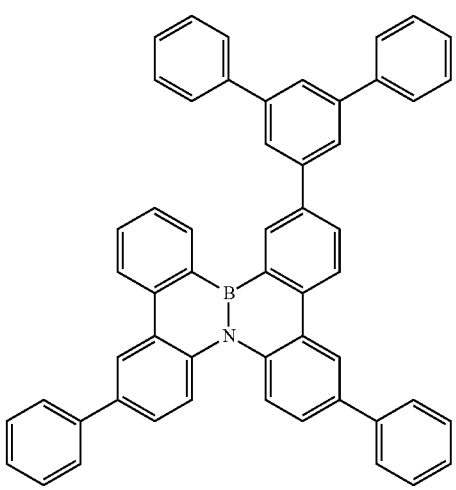
(2-84)
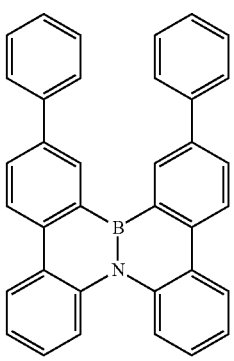

(2-85)
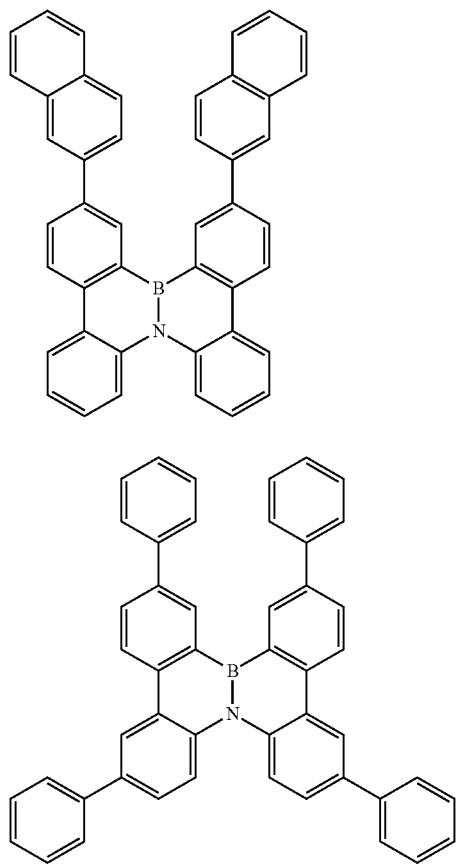
(2-86)
(2-87)
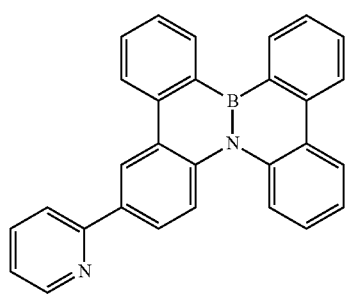
(2-88)
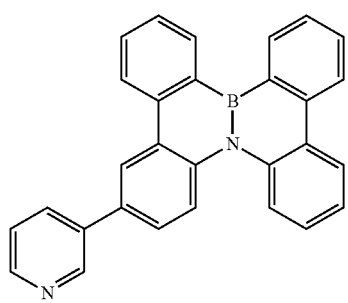
(2-89)
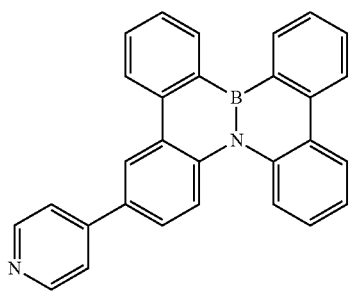
(2-90)
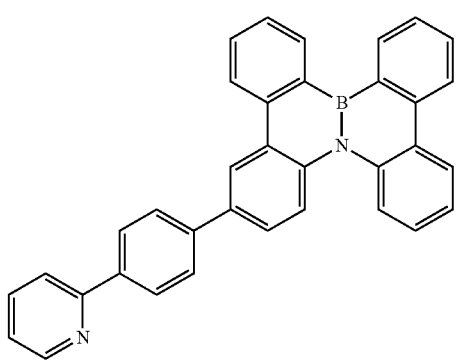
(2-91)
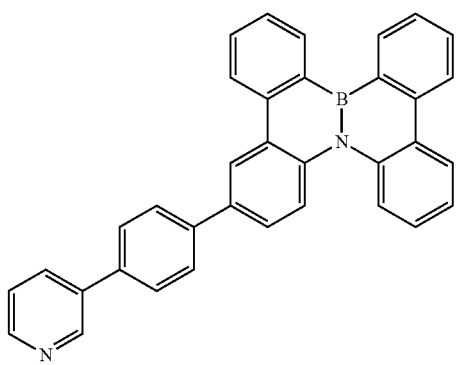
(2-92)
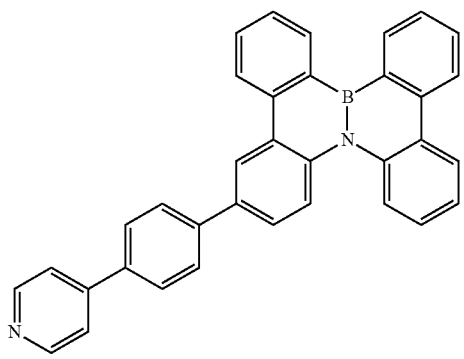

(2-93)
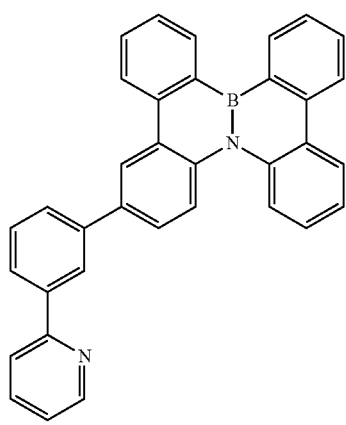
(2-94)
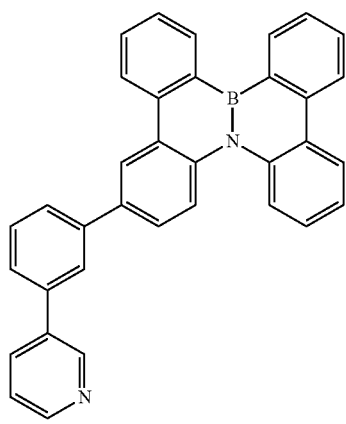
(2-95)
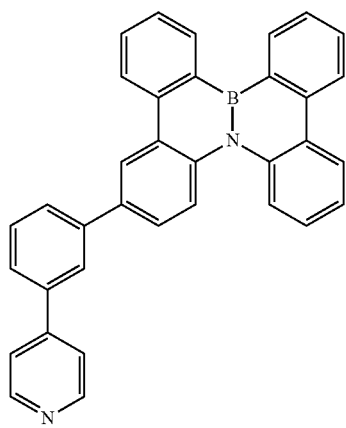
(2-101)
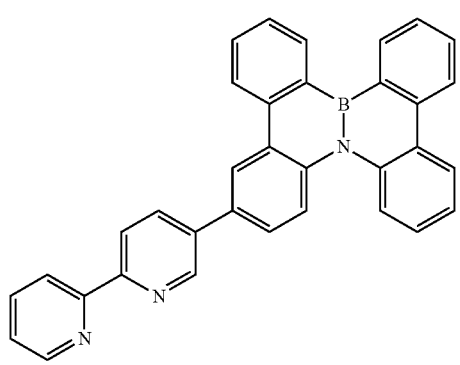
(2-102)
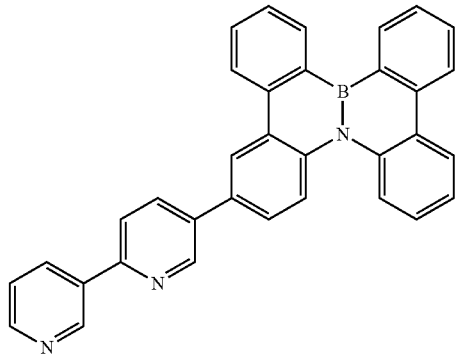
(2-103)
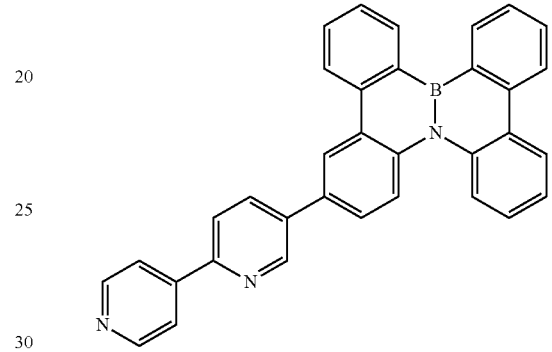
(2-104)
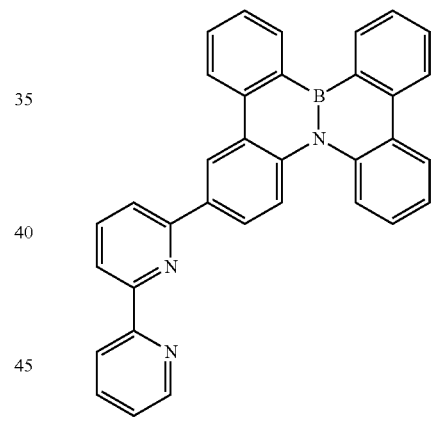
(2-105)
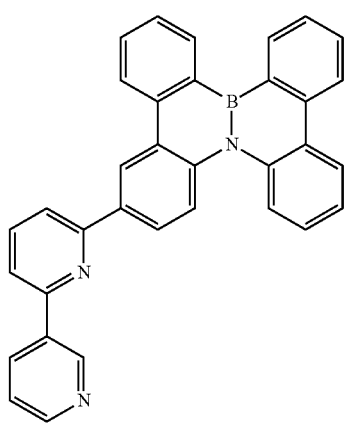

-continued
(2-106)
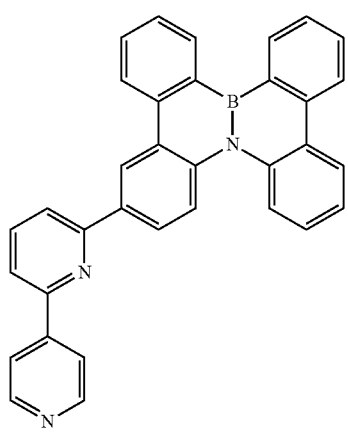
(2-107)
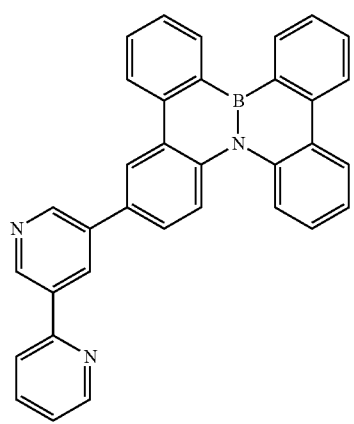
(2-108)
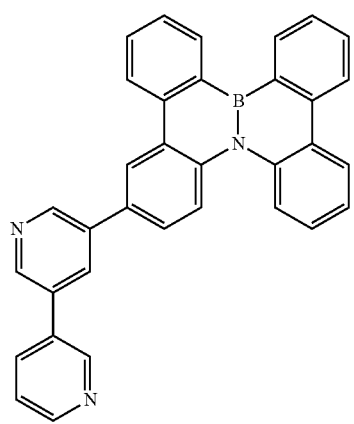
-continued
(2-109)
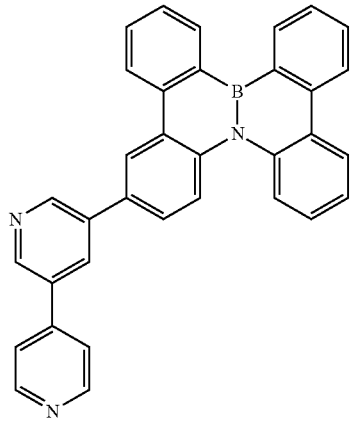
(2-110)
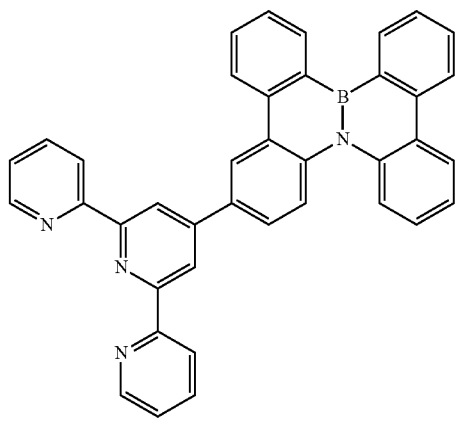
(2-111)
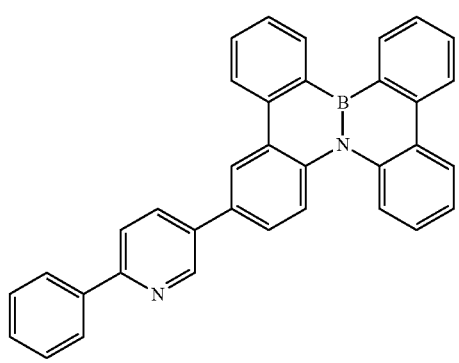
(2-112)
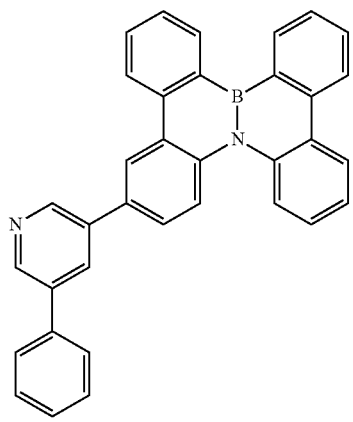

-continued
(2-113)
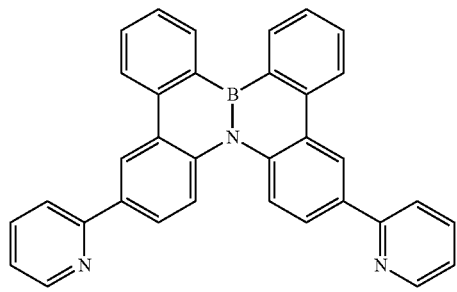
(2-114)
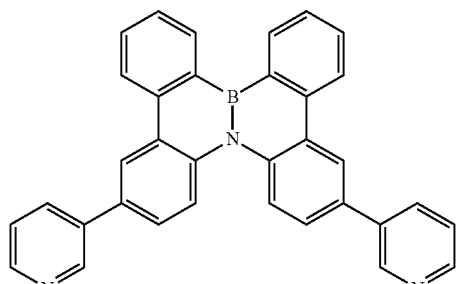
(2-115)
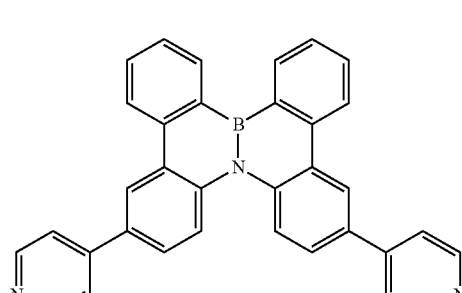
(2-116)
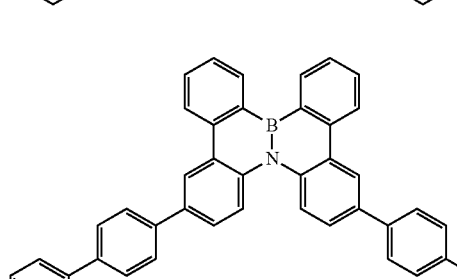
(2-117)
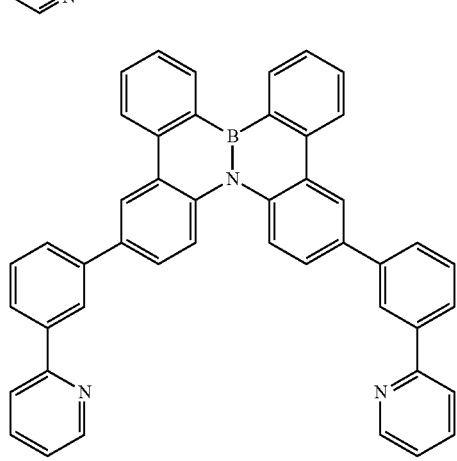
-continued
(2-118)
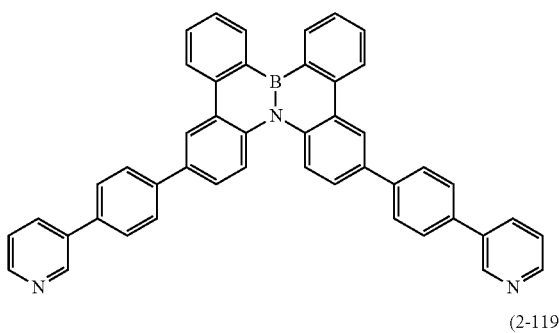
(2-119)
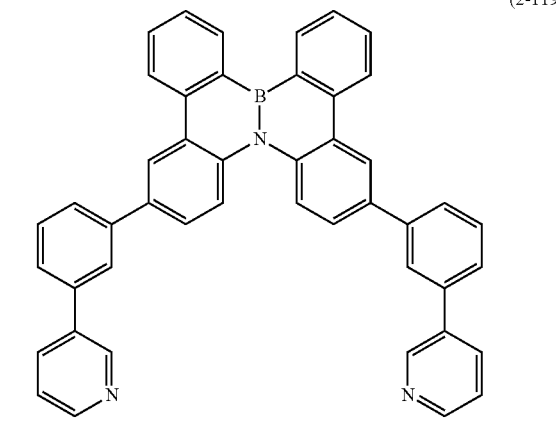
(2-120)
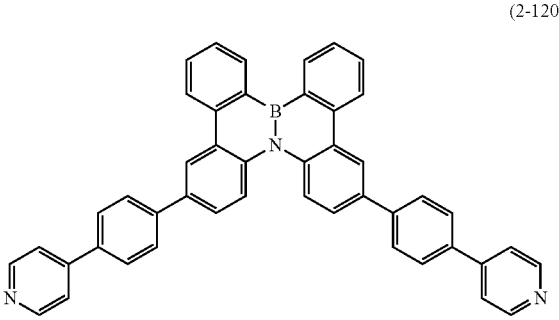
(2-121)
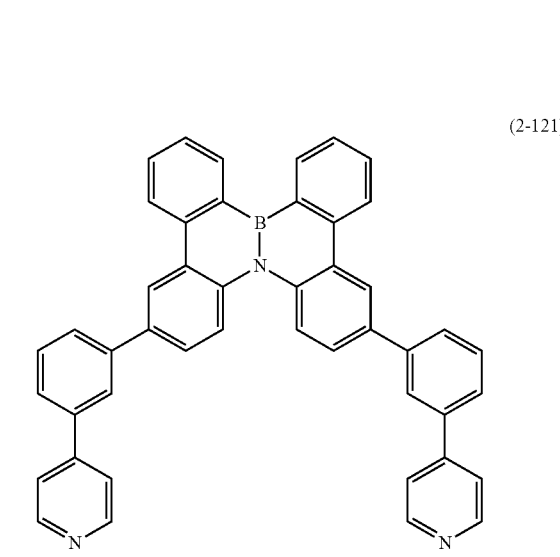

(2-131)
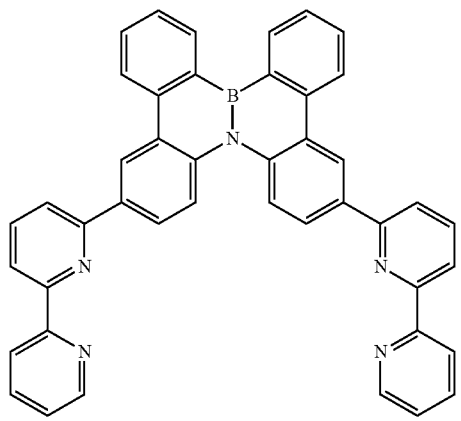
(2-132)
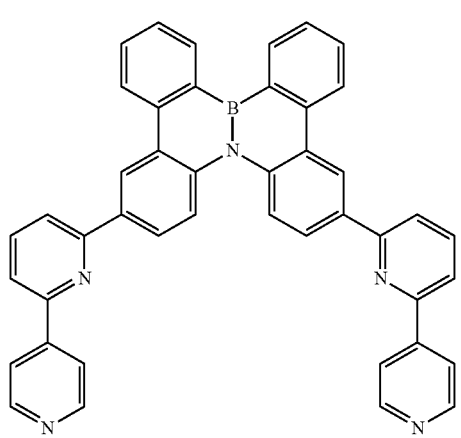
(2-133)
(2-134)
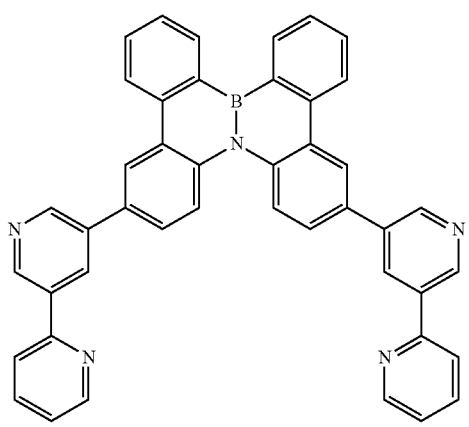
(2-135)
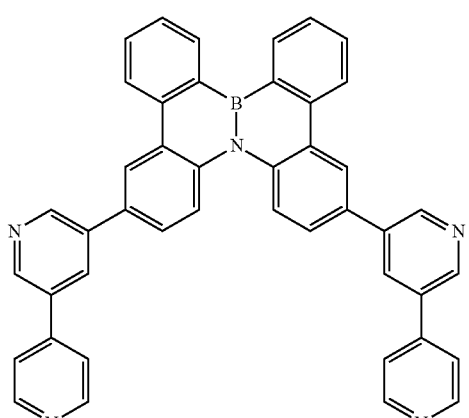
(2-136)
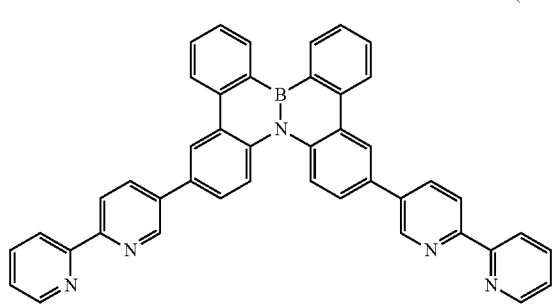
(2-137)
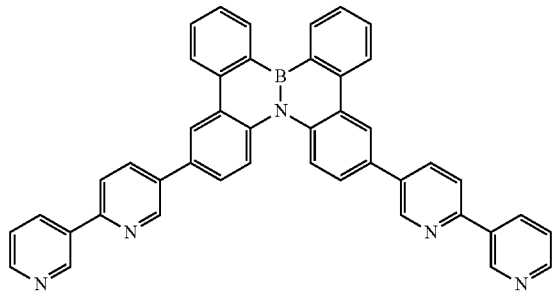

(2-138)
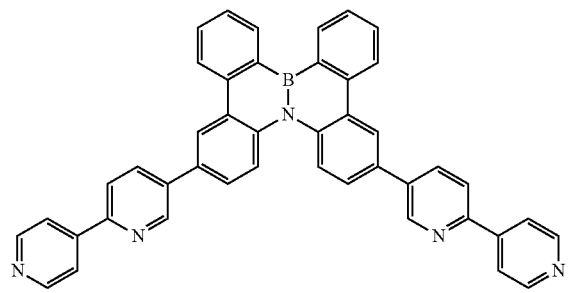
(2-139)
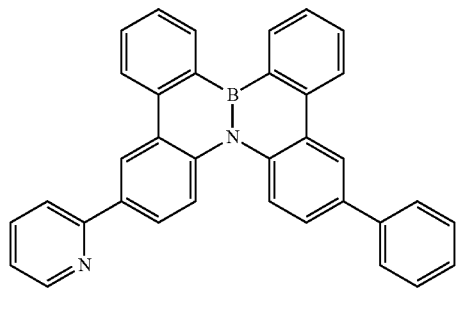
(2-140)
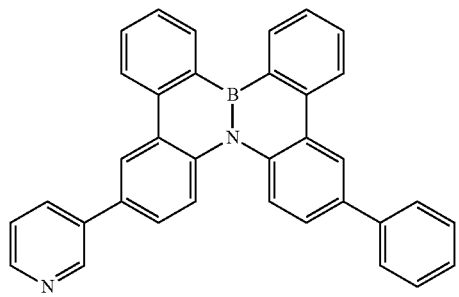
(2-141)
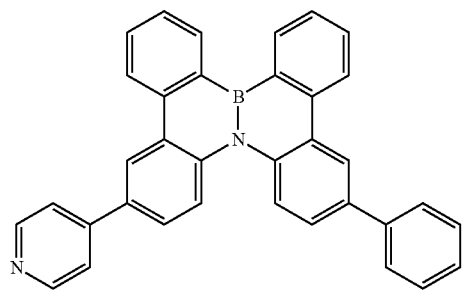
(2-142)
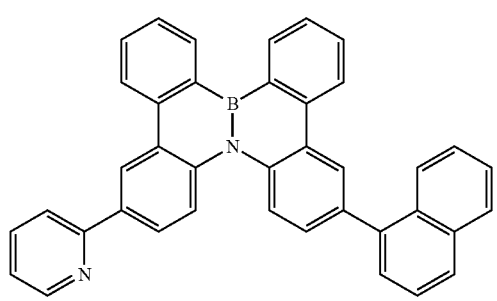
(2-143)
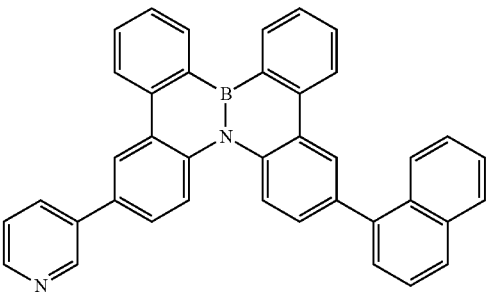
(2-144)
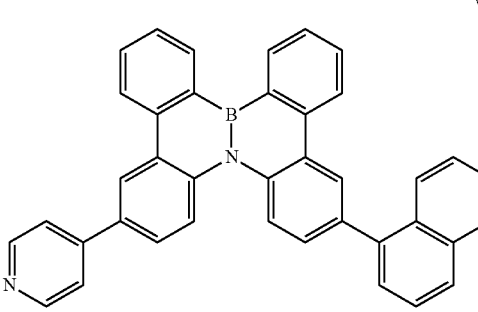
(2-145)
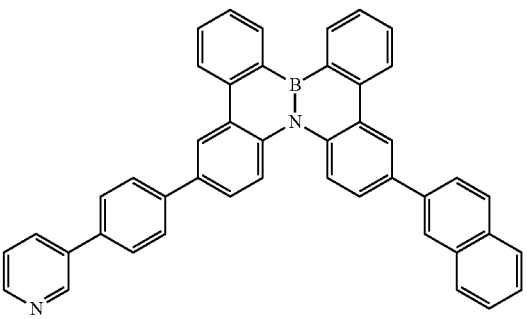
(2-146)
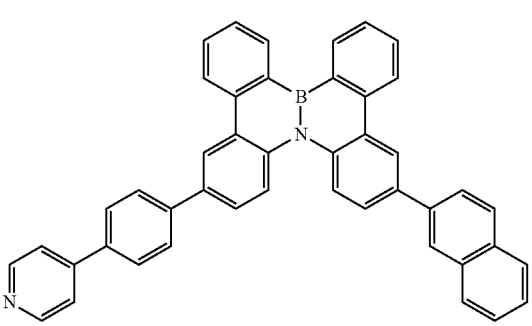

-continued
(2-151)
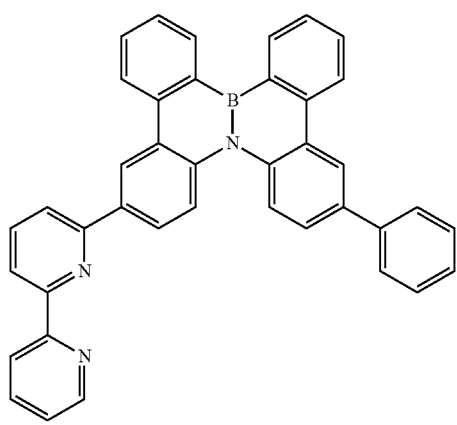
(2-152)
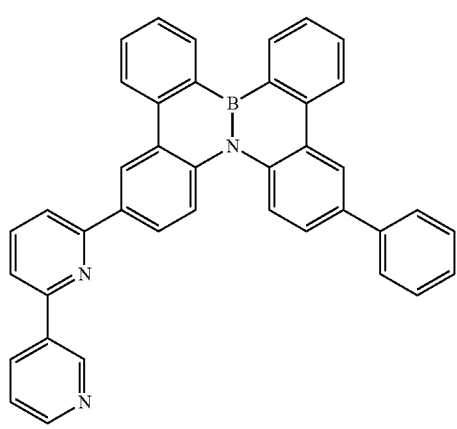
(2-153)
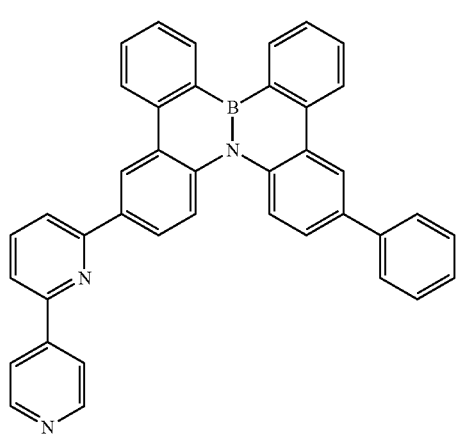
-continued
(2-154)
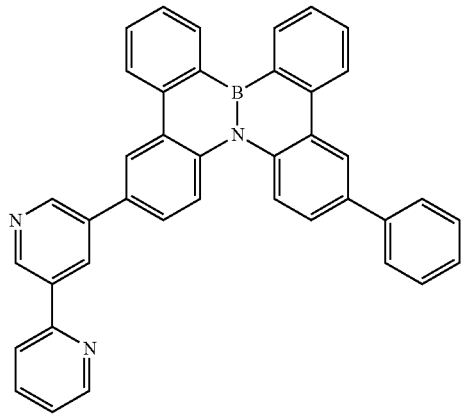
(2-155)
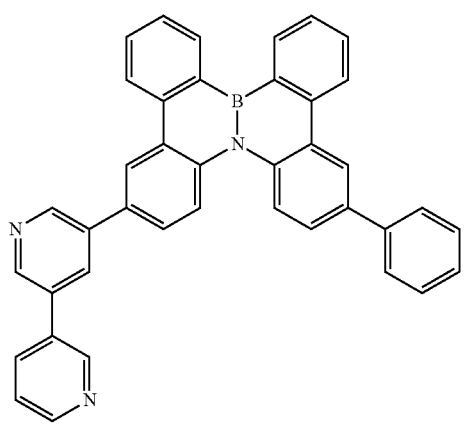
(2-156)
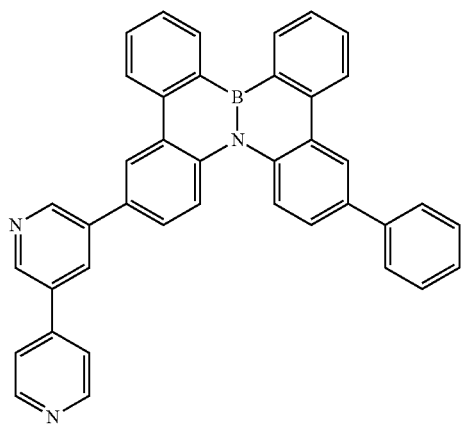
(2-157)
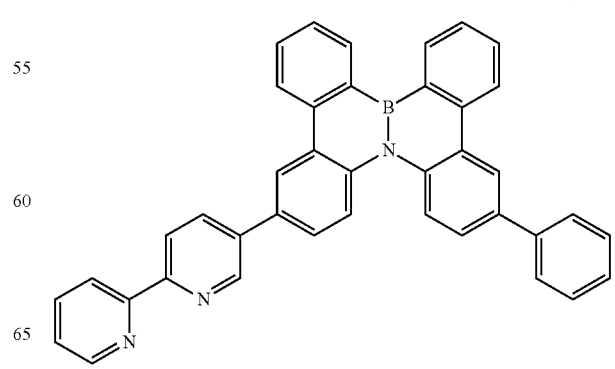

-continued
(2-158)
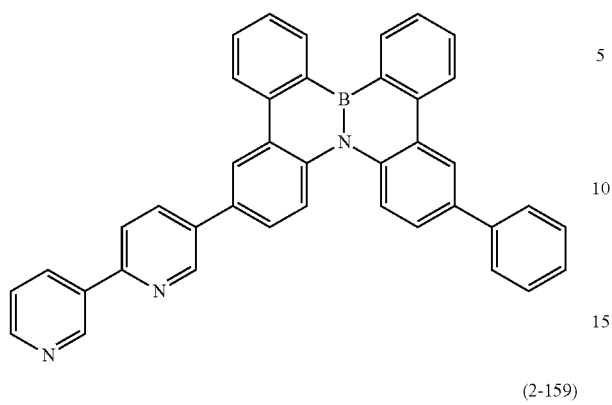
(2-159)
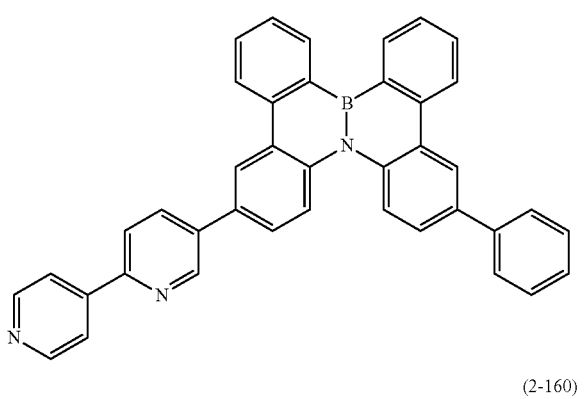
(2-160)
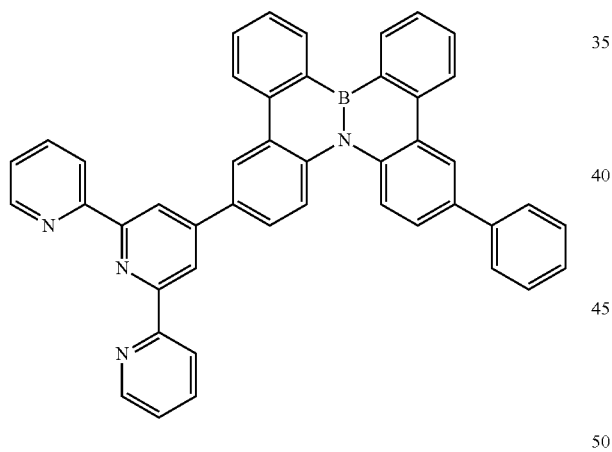
(2-161)
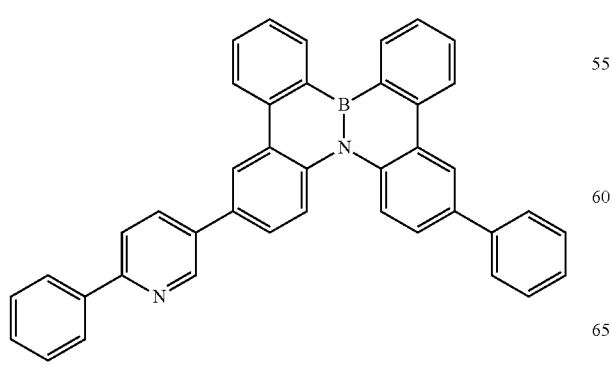
-continued
(2-162)
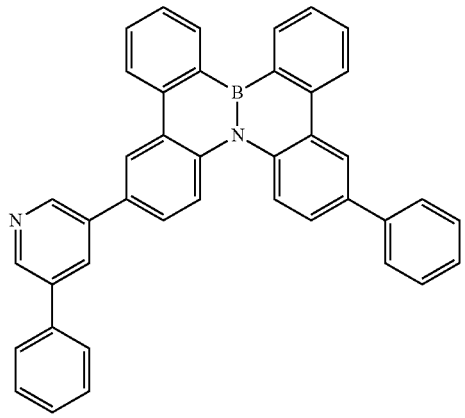
(2-163)
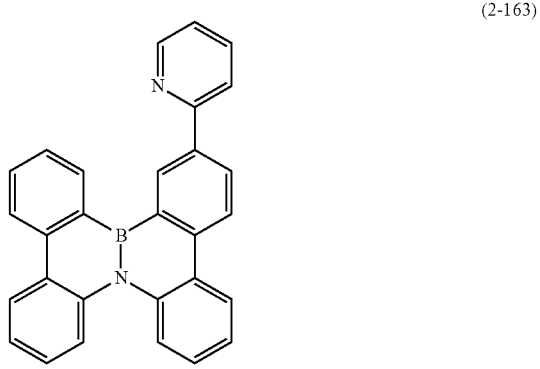
(2-164)
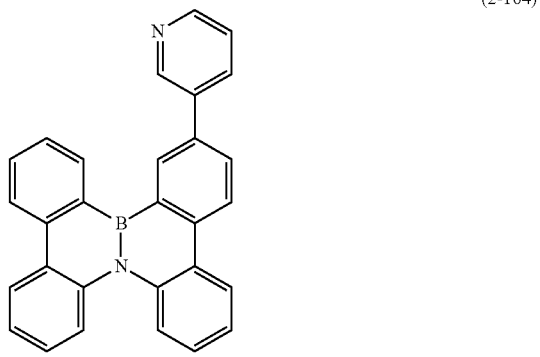
(2-165)
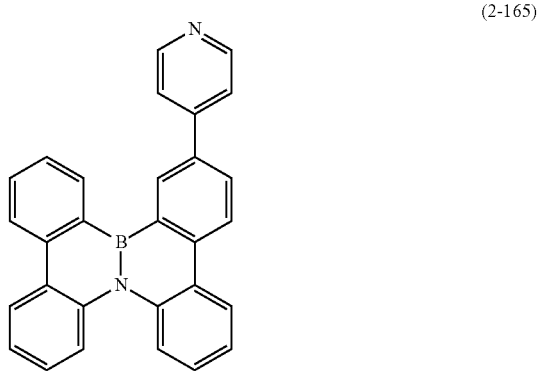

(2-166)
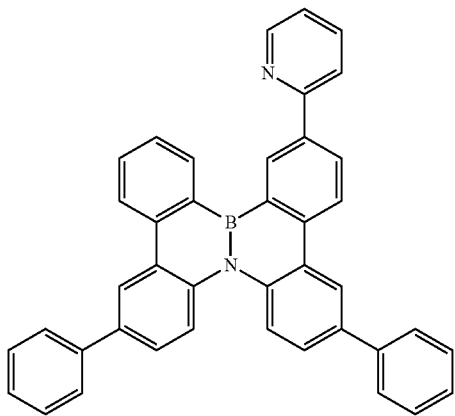
(2-171)
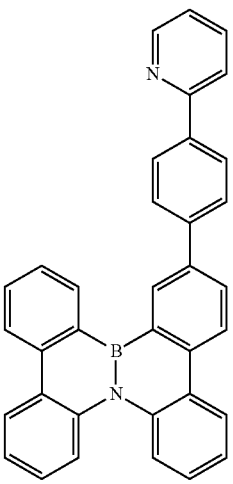
(2-167)
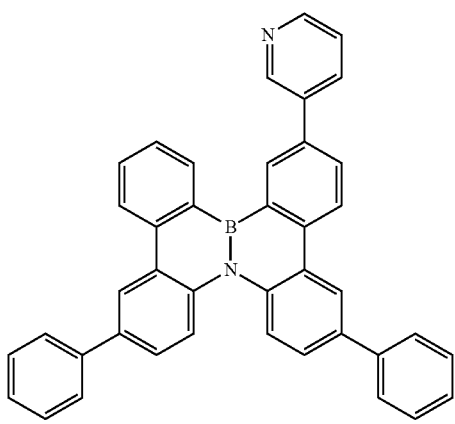
(2-172)
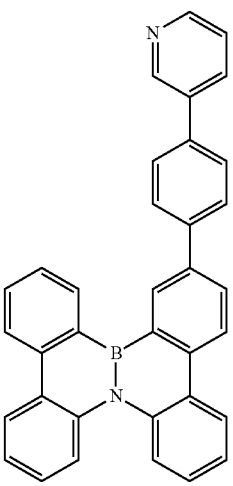
(2-168)
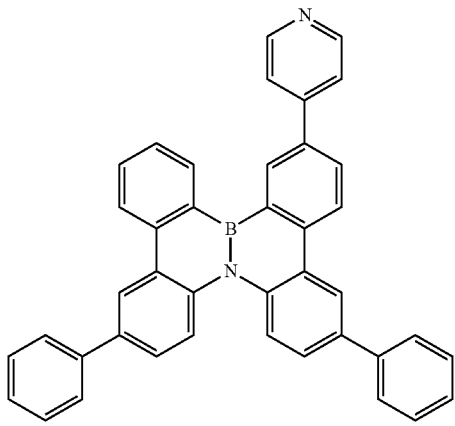
(2-173)
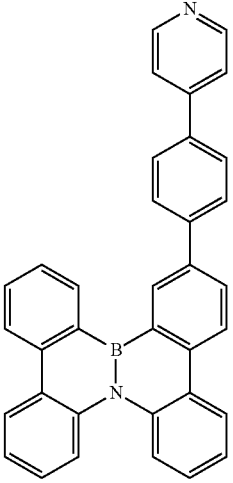

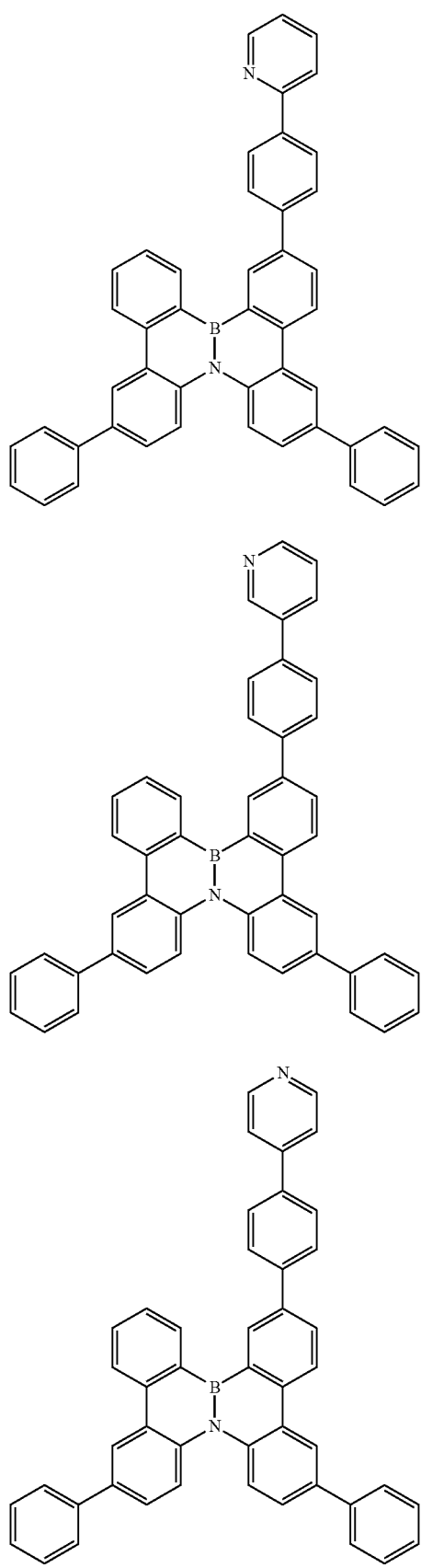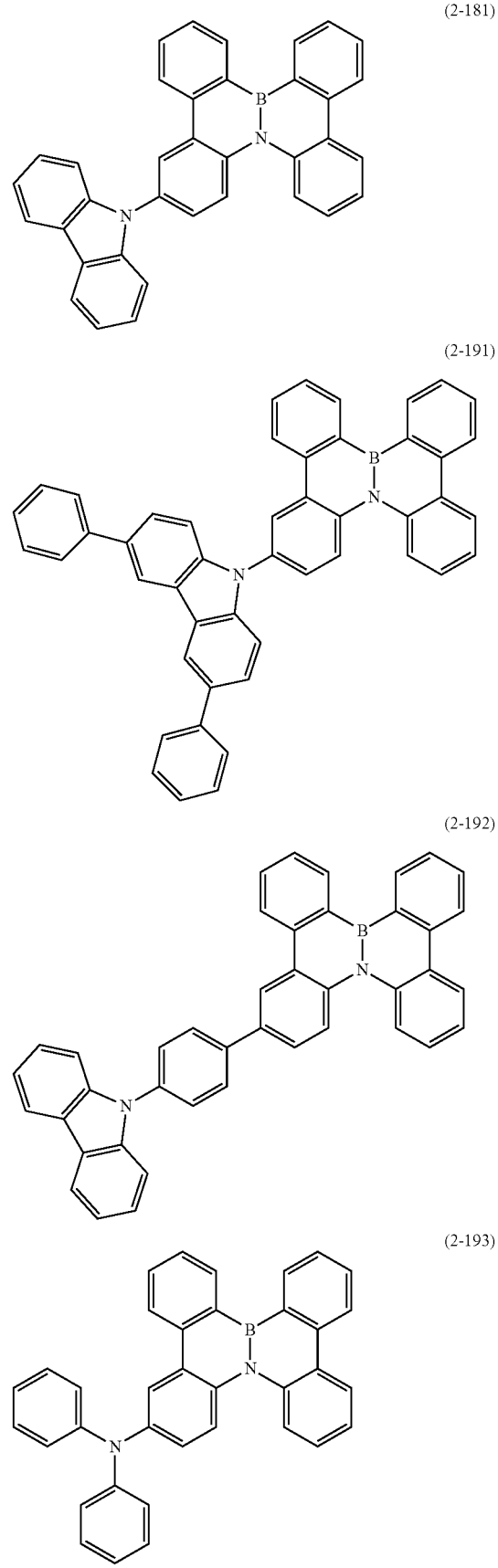 [SMILES: c1ccc2c(c1)B1c3ccccc3-c3cc(-n4c5ccccc5c5ccccc54)ccc3N1c1ccccc1-2 ; c1ccc(-c2ccc3c(c2)c2cc(-c4ccccc4)ccc2n3-c2ccc3c(c2)-c2ccccc2B2c4ccccc4-c4ccccc4N23)cc1 ; c1ccc2c(c1)B1c3ccccc3-c3cc(-c4ccc(-n5c6ccccc6c6ccccc65)cc4)ccc3N1c1ccccc1-2 ; c1ccc(N(c2ccccc2)c2ccc3c(c2)-c2ccccc2B2c4ccccc4-c4ccccc4N23)cc1]

-continued
(2-194)
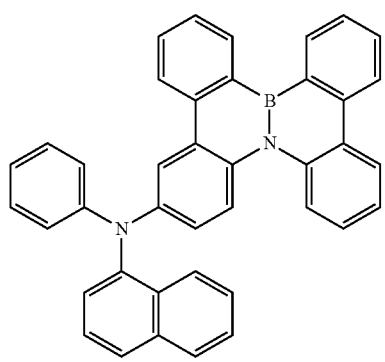
(2-195)
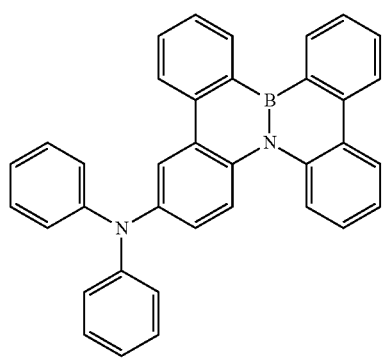
(2-196)
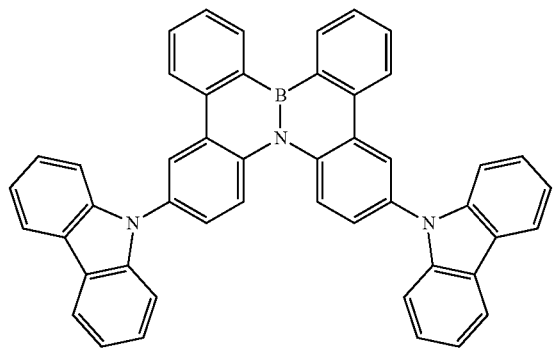
(2-197)
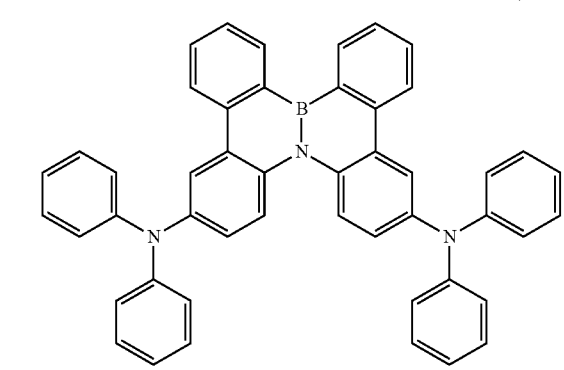
-continued
(2-198)
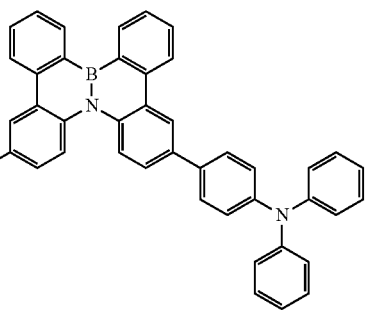
(2-201)
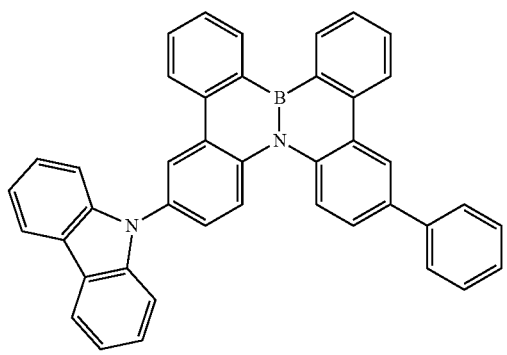
(2-202)
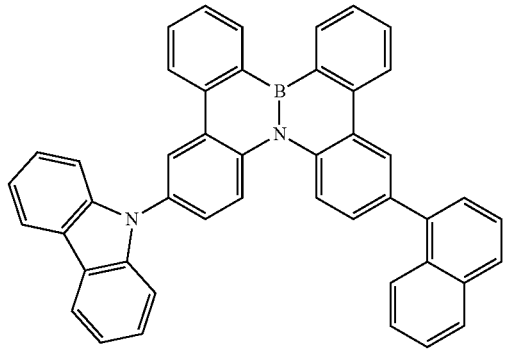
(2-203)
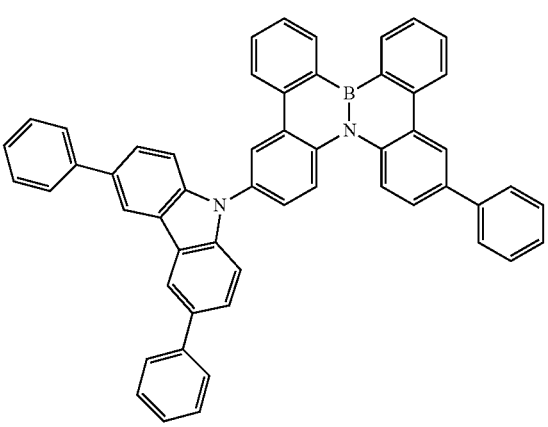

-continued
(2-204)
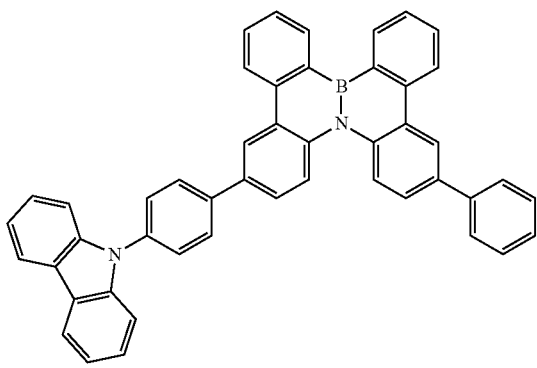
(2-205)
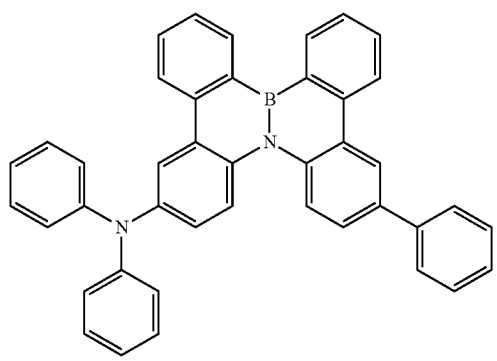
(2-206)
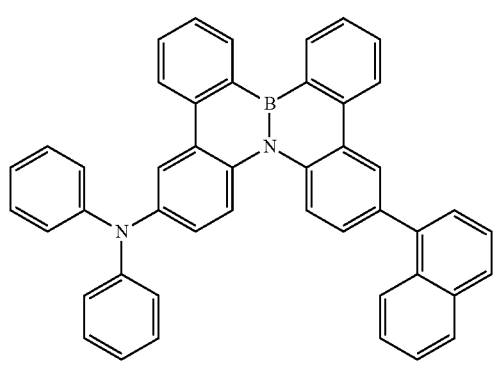
(2-207)
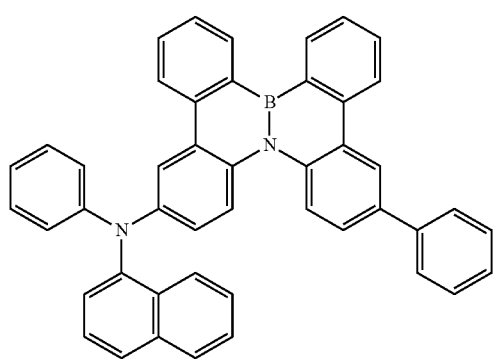
-continued
(2-208)
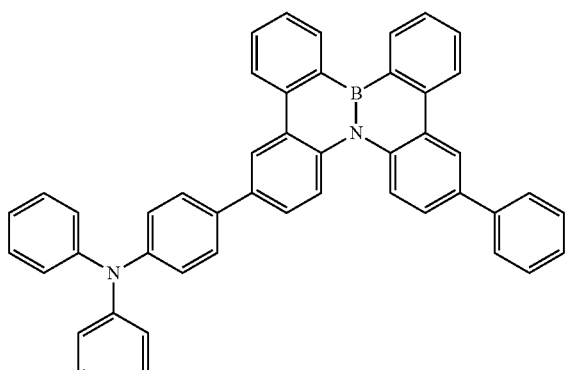
(2-211)
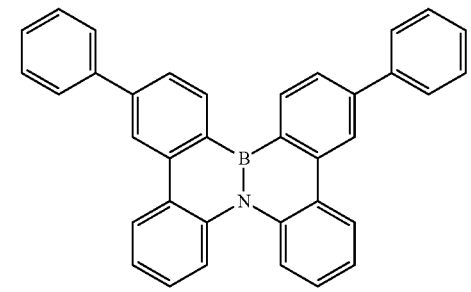
(2-212)
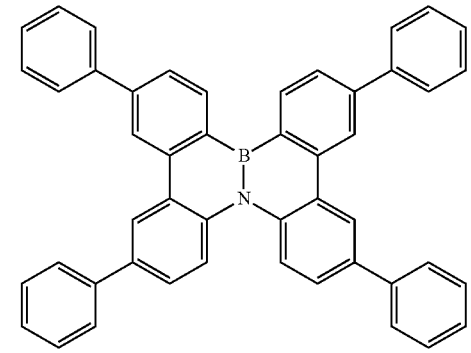
(2-213)
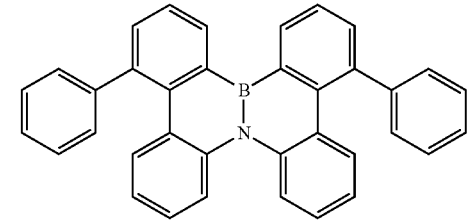
(2-214)
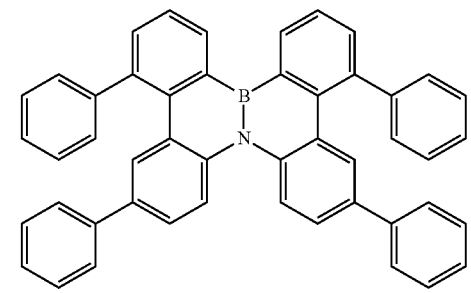

(2-215)
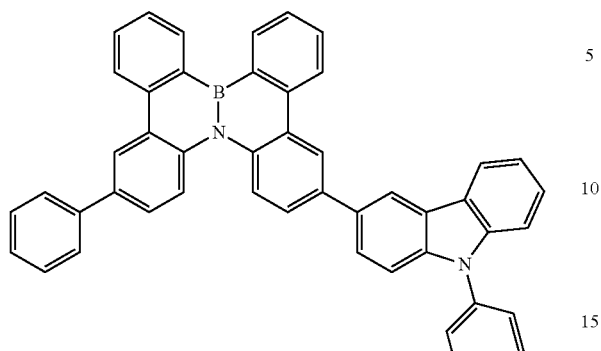
(2-216)
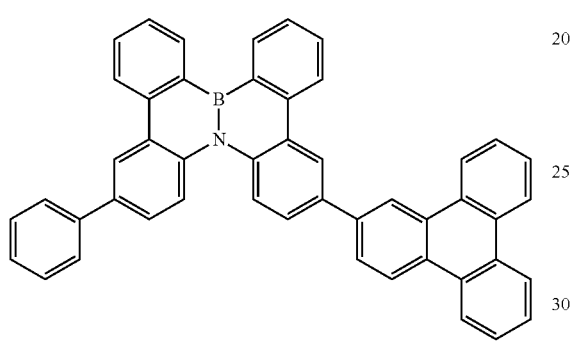
(FG-1-1)
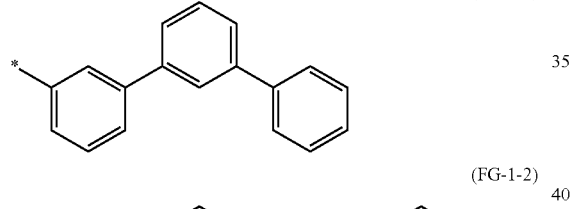
(FG-1-2)
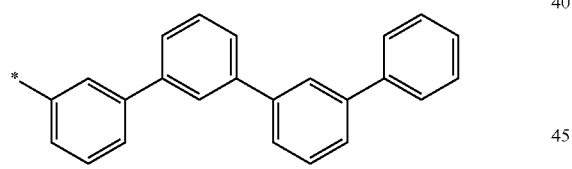
(FG-1-3)
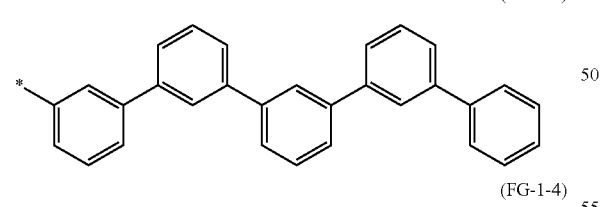
(FG-1-4)
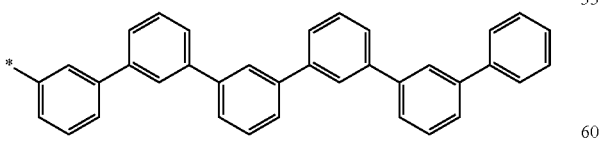
(FG-1-1001)
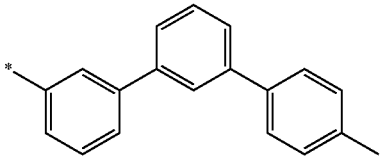
(FG-1-1002)
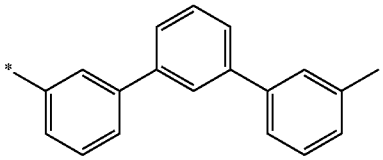
(FG-1-1003)
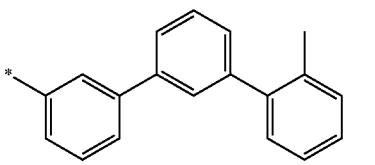
(FG-1-1004)
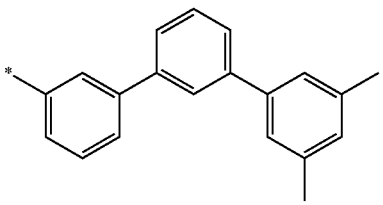
(FG-1-1005)
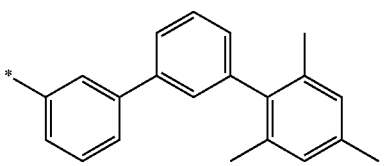
(FG-1-1006)
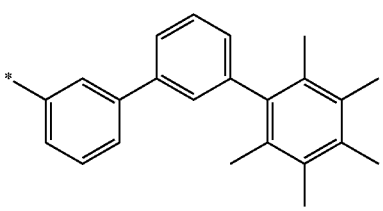
(FG-1-1021)
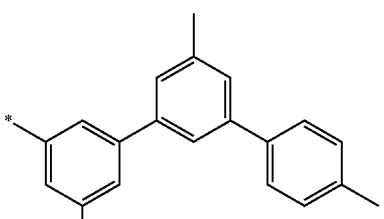
(FG-1-1022)
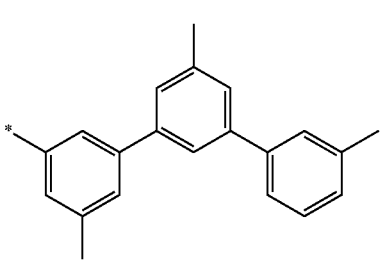

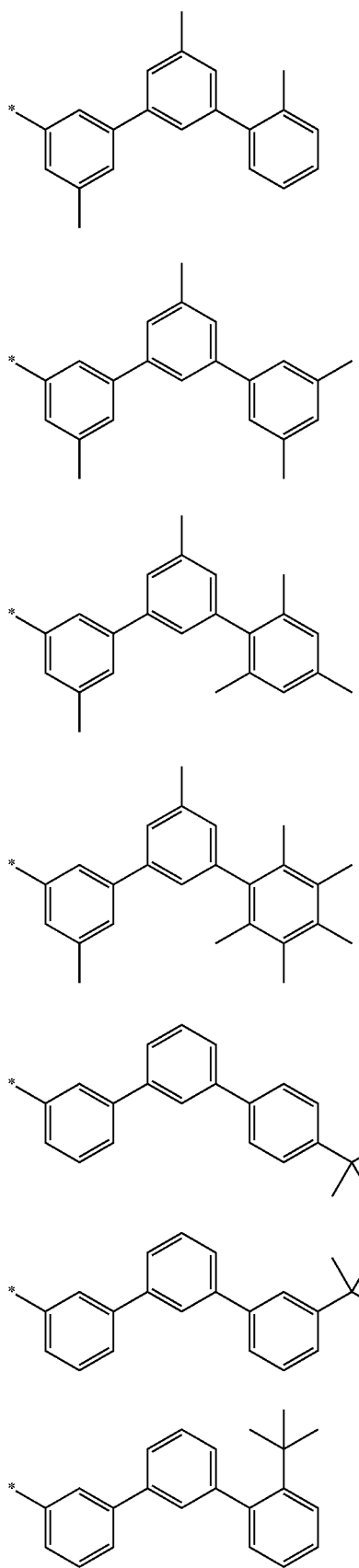
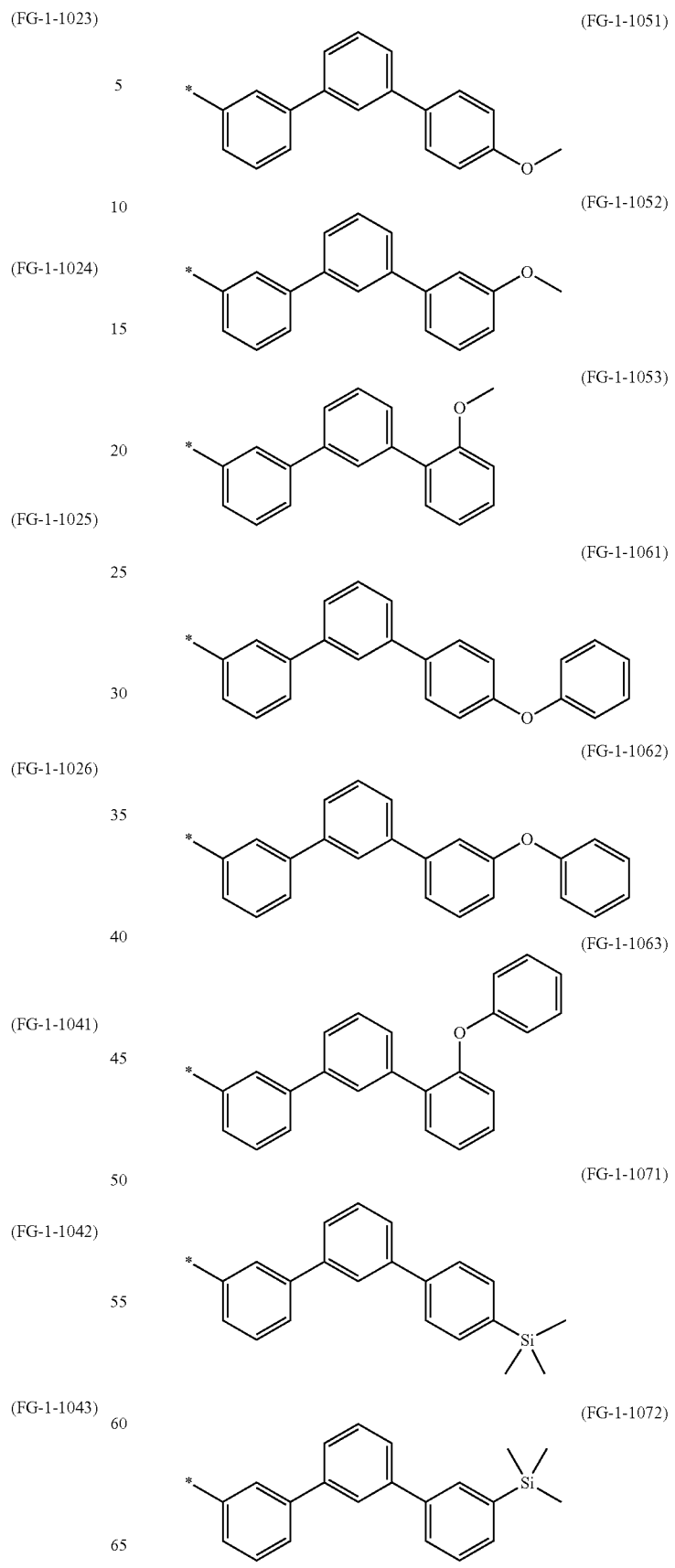

(FG-1-1073)
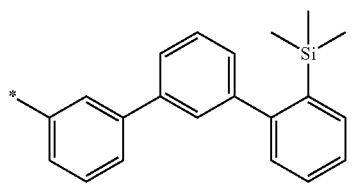
(FG-1-1081)
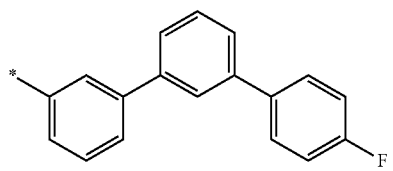
(FG-1-1082)
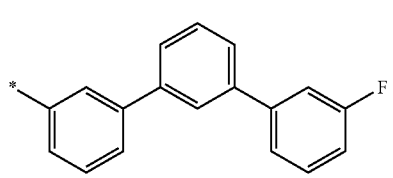
(FG-1-1083)
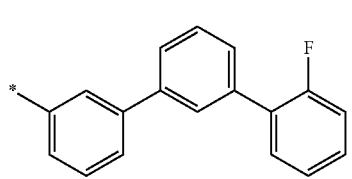
(FG-1-1084)
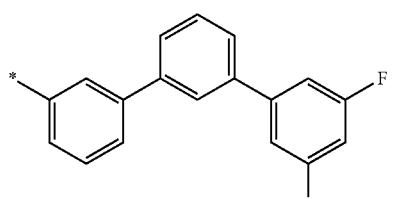
(FG-1-1085)
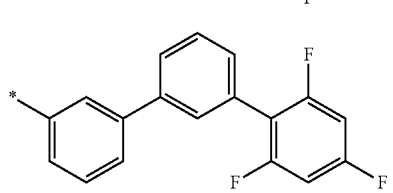
(FG-1-1086)
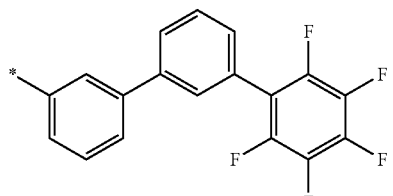
(FG-1-1101)
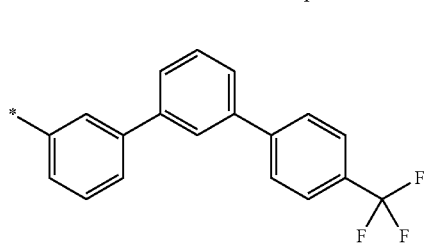
(FG-1-1102)
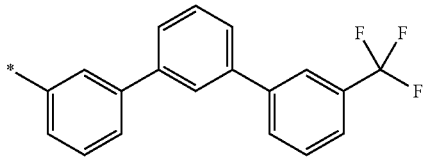
(FG-1-1103)
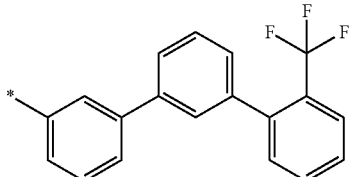
(FG-1-2001)
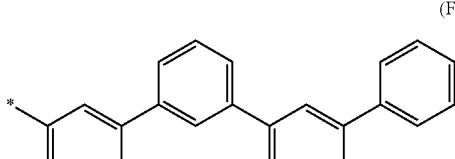
(FG-1-2002)
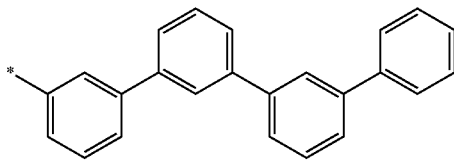
(FG-1-2003)
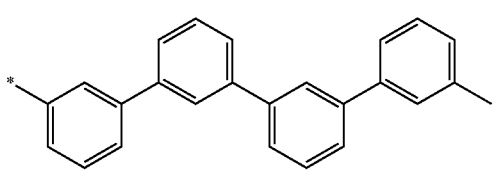
(FG-1-2004)
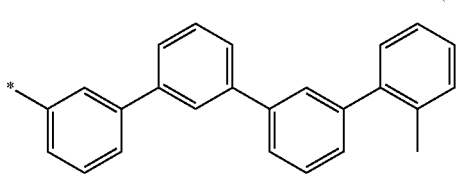
(FG-1-2005)
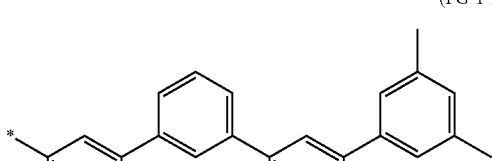
(FG-1-2006)
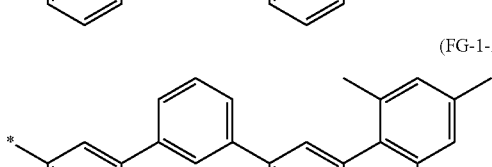

(FG-1-2021)
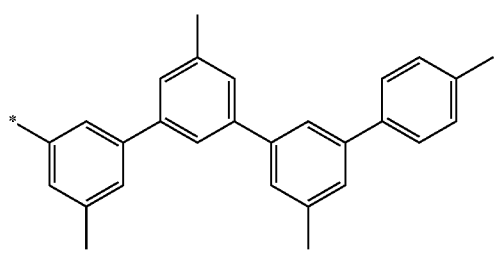
(FG-1-2022)
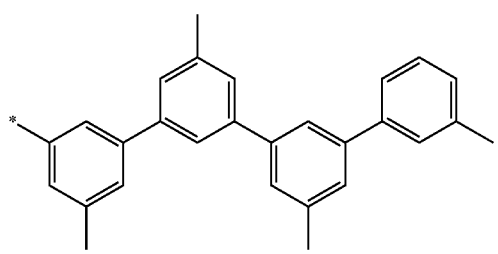
(FG-1-2023)
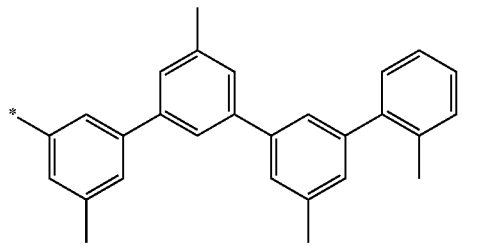
(FG-1-2024)
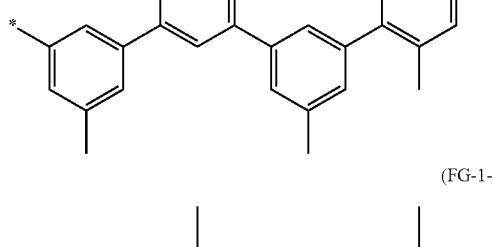
(FG-1-2025)
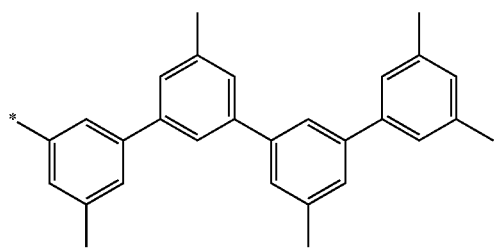
(FG-1-2026)
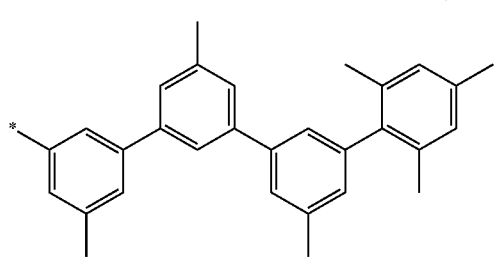
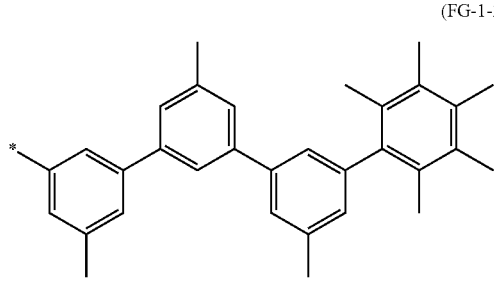
(FG-1-2041)
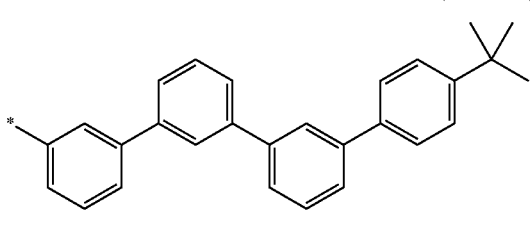
(FG-1-2042)
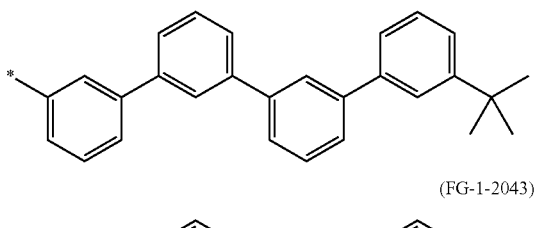
(FG-1-2043)
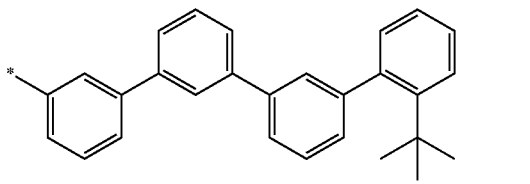
(FG-1-2051)
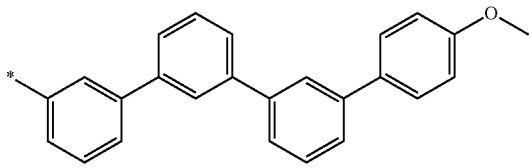
(FG-1-2052)
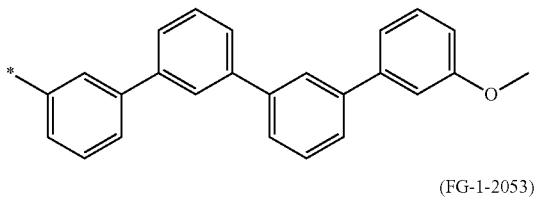
(FG-1-2053)
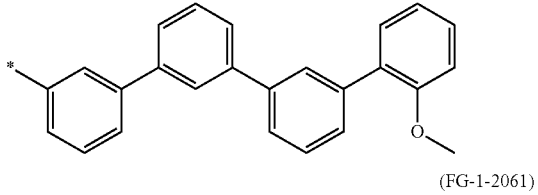
(FG-1-2061)
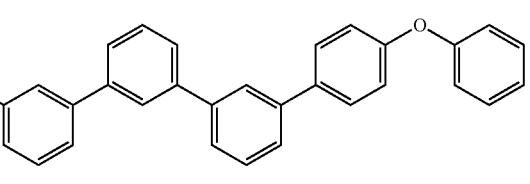
(FG-1-2062)
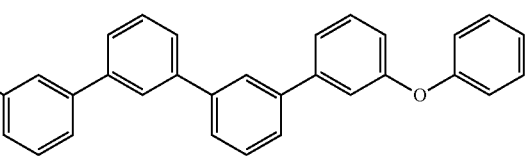

(FG-1-2063)
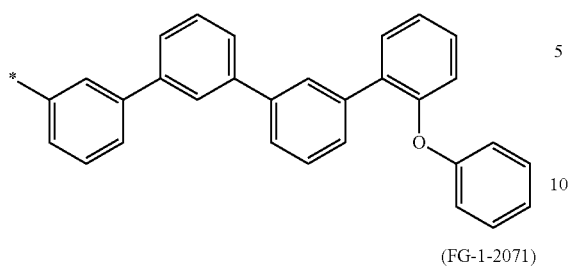
(FG-1-2071)
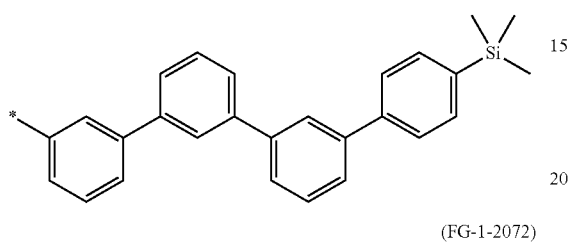
(FG-1-2072)
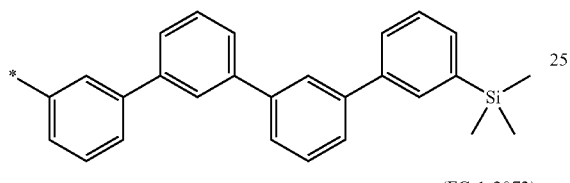
(FG-1-2073)
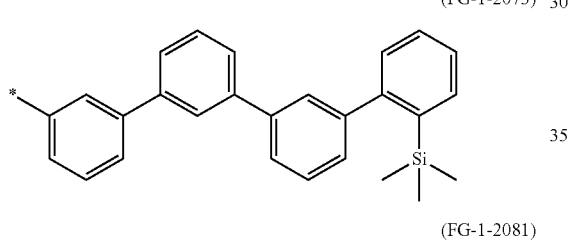
(FG-1-2081)
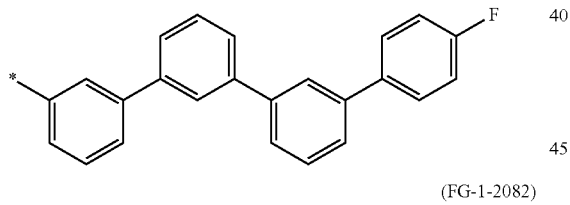
(FG-1-2082)
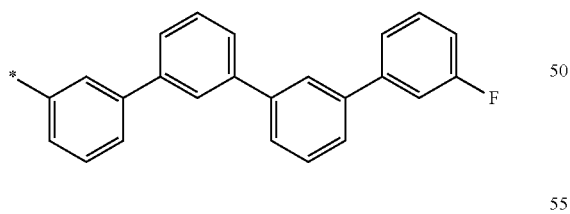
(FG-1-2083)
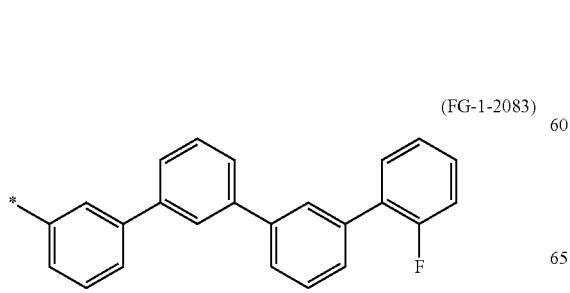
(FG-1-2084)
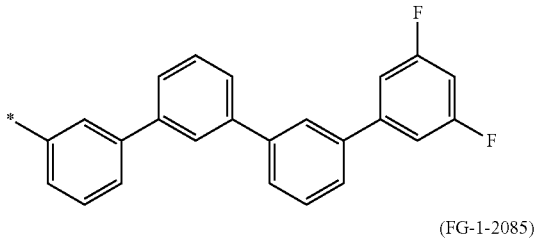
(FG-1-2085)
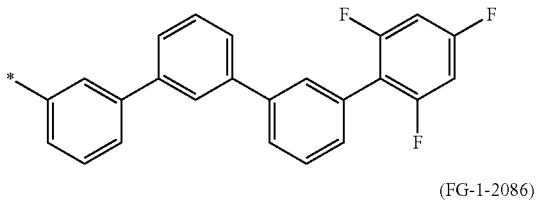
(FG-1-2086)
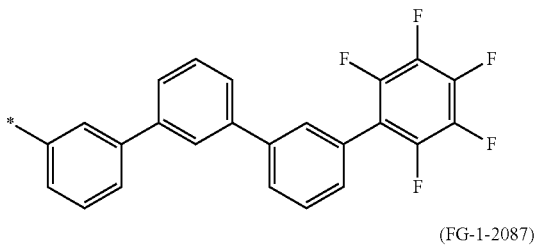
(FG-1-2087)
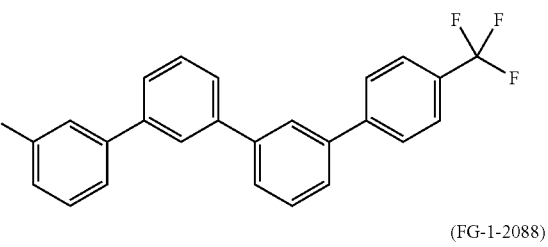
(FG-1-2088)
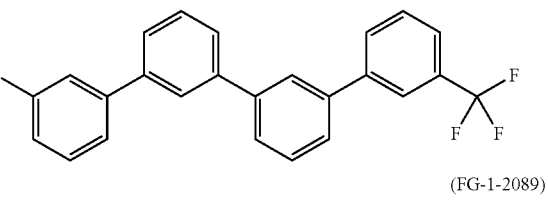
(FG-1-2089)
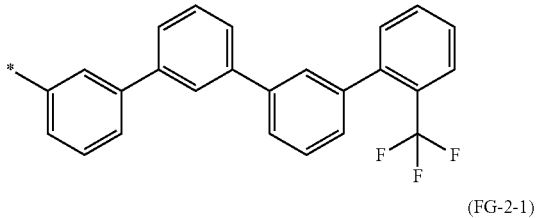
(FG-2-1)
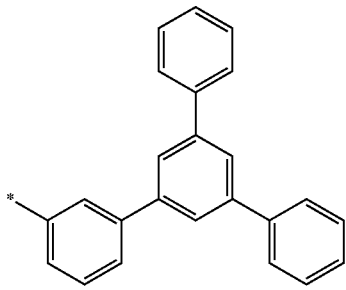

(FG-2-1001)
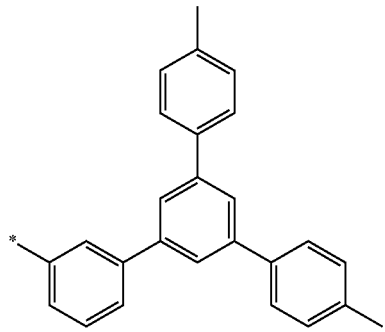
(FG-2-1002)
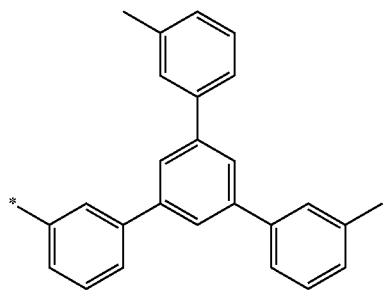
(FG-1-1003)
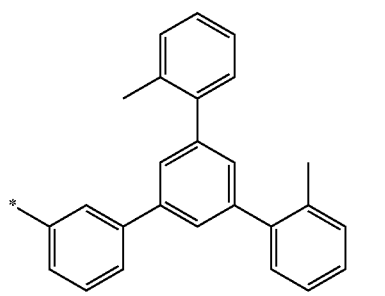
(FG-2-1004)
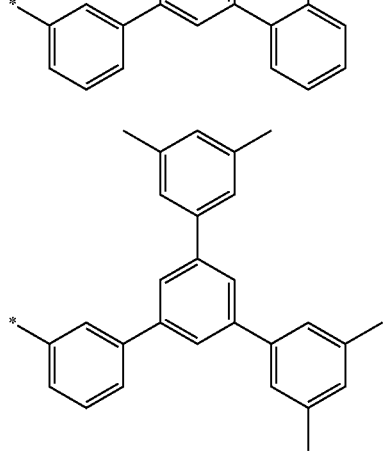
(FG-2-1005)
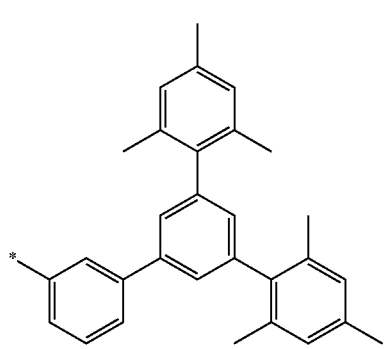
(FG-2-1006)
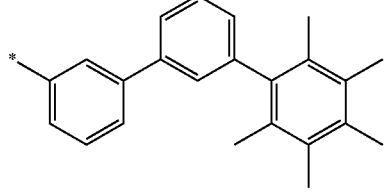
(FG-2-1041)
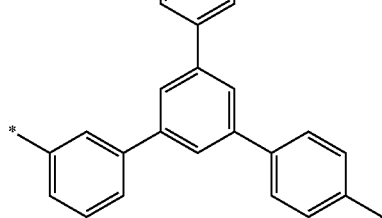
(FG-2-1042)
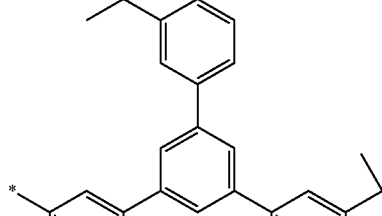
(FG-2-1043)
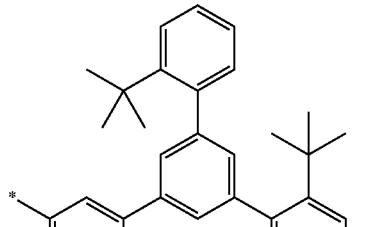

(FG-2-1051)
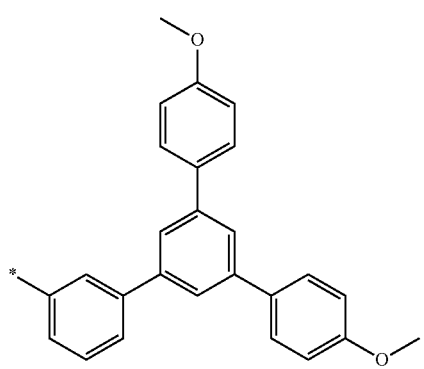
(FG-2-1052)
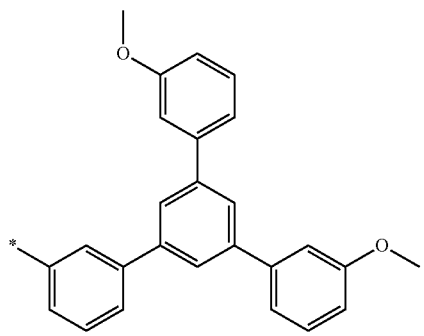
(FG-2-1053)
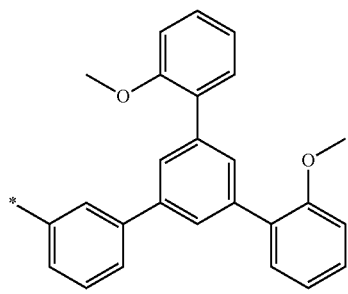
(FG-2-1061)
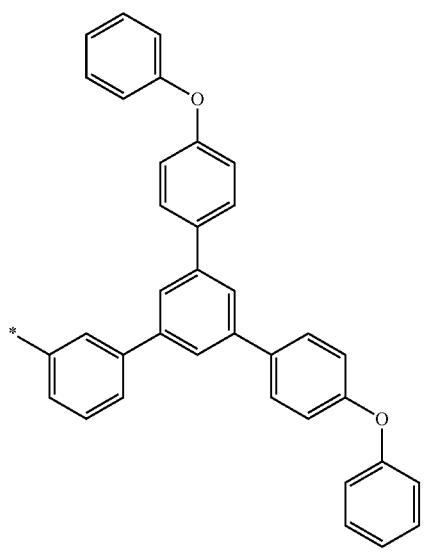
(FG-2-1062)
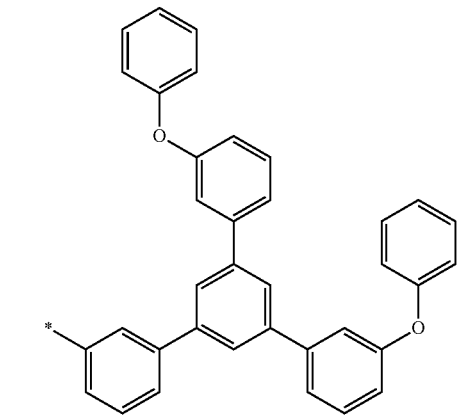
(FG-2-1063)
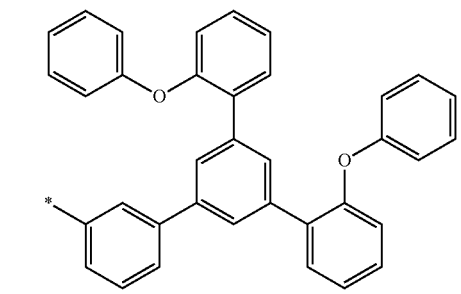
(FG-2-1071)
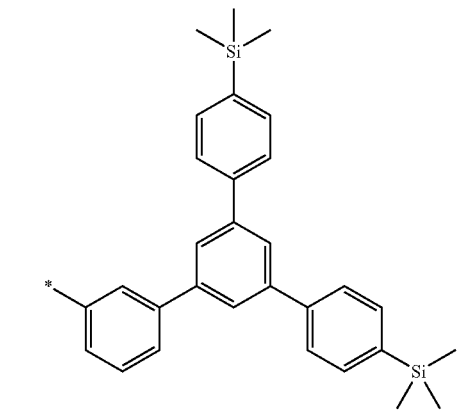
(FG-2-1072)
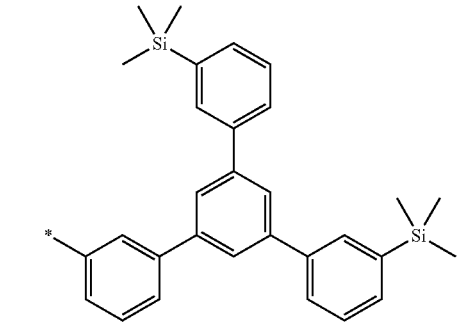

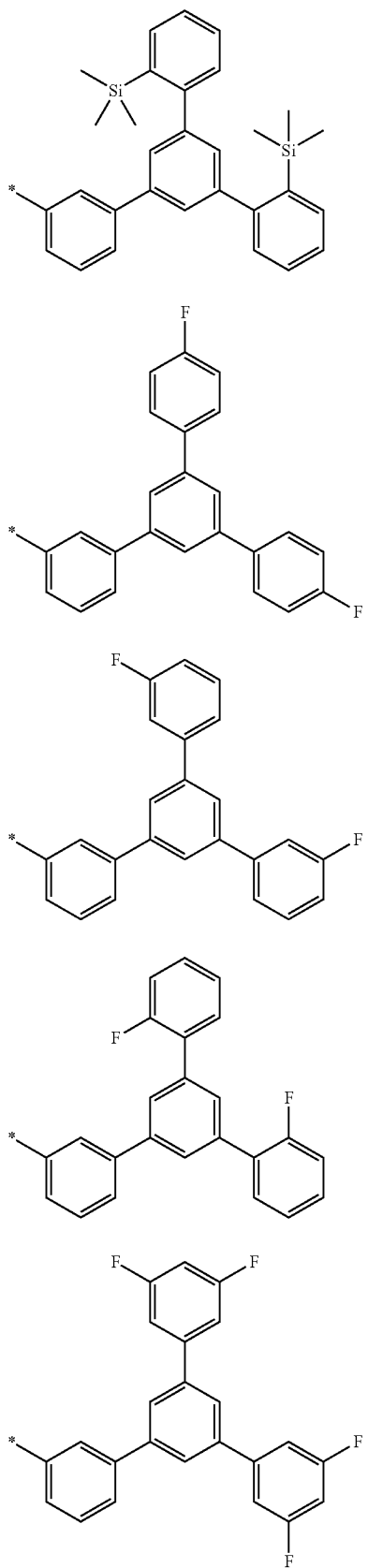
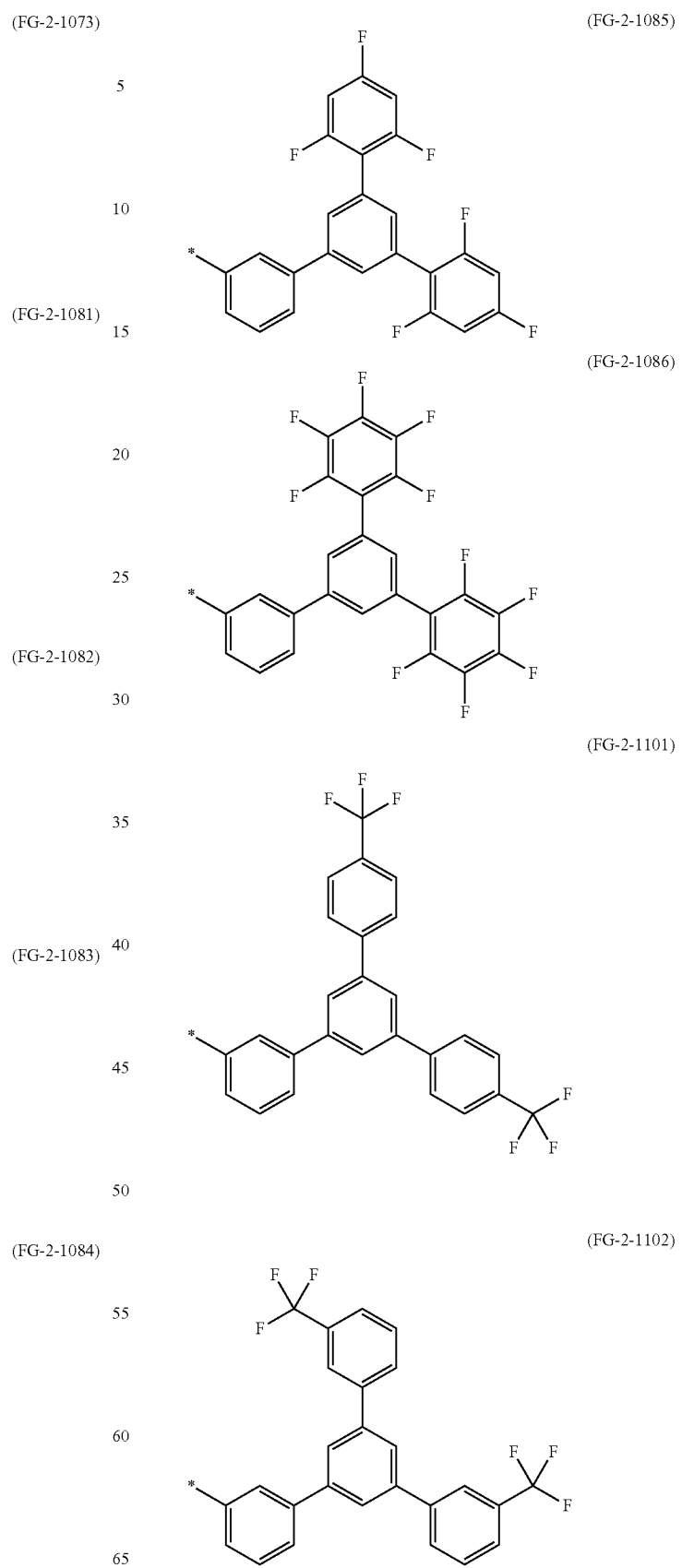

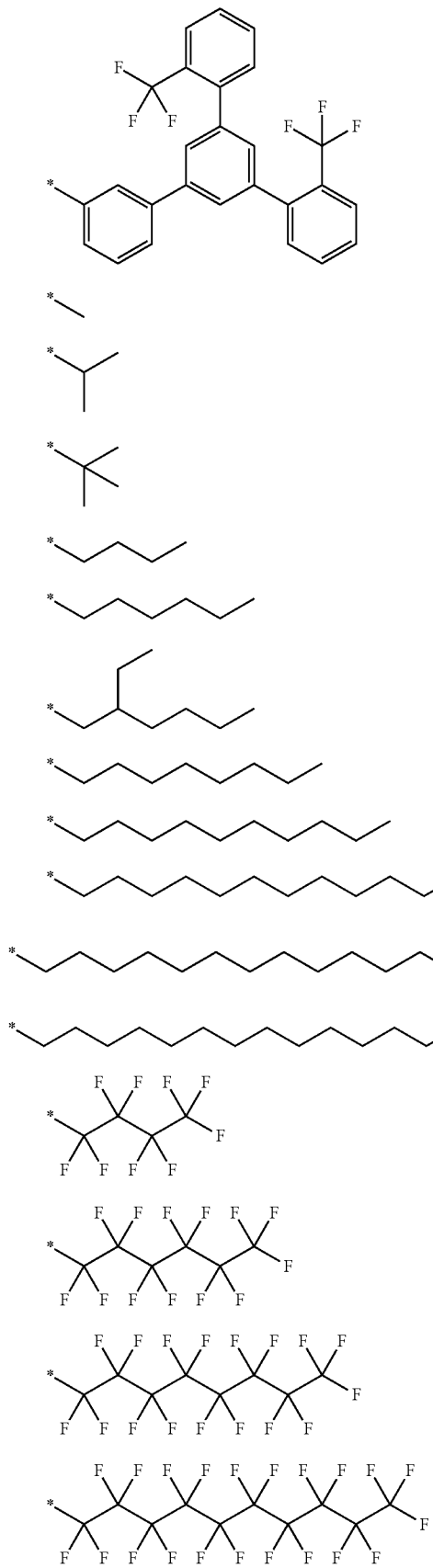
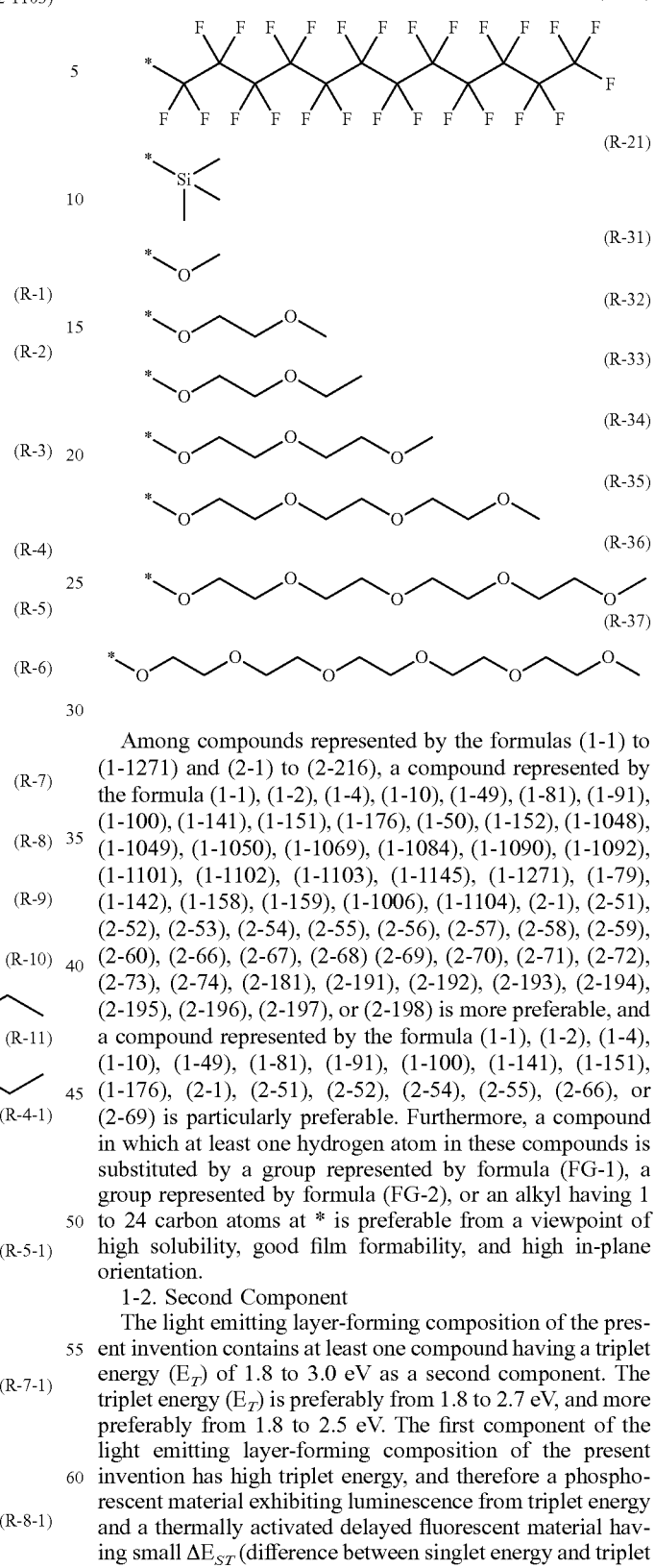

Among compounds represented by the formulas (1-1) to (1-1271) and (2-1) to (2-216), a compound represented by the formula (1-1), (1-2), (1-4), (1-10), (1-49), (1-81), (1-91), (1-100), (1-141), (1-151), (1-176), (1-50), (1-152), (1-1048), (1-1049), (1-1050), (1-1069), (1-1084), (1-1090), (1-1092), (1-1101), (1-1102), (1-1103), (1-1145), (1-1271), (1-79), (1-142), (1-158), (1-159), (1-1006), (1-1104), (2-1), (2-51), (2-52), (2-53), (2-54), (2-55), (2-56), (2-57), (2-58), (2-59), (2-60), (2-66), (2-67), (2-68) (2-69), (2-70), (2-71), (2-72), (2-73), (2-74), (2-181), (2-191), (2-192), (2-193), (2-194), (2-195), (2-196), (2-197), or (2-198) is more preferable, and a compound represented by the formula (1-1), (1-2), (1-4), (1-10), (1-49), (1-81), (1-91), (1-100), (1-141), (1-151), (1-176), (2-1), (2-51), (2-52), (2-54), (2-55), (2-66), or (2-69) is particularly preferable. Furthermore, a compound in which at least one hydrogen atom in these compounds is substituted by a group represented by formula (FG-1), a group represented by formula (FG-2), or an alkyl having 1 to 24 carbon atoms at * is preferable from a viewpoint of high solubility, good film formability, and high in-plane orientation.

1-2. Second Component

The light emitting layer-forming composition of the present invention contains at least one compound having a triplet energy ($E_T$) of 1.8 to 3.0 eV as a second component. The triplet energy ($E_T$) is preferably from 1.8 to 2.7 eV, and more preferably from 1.8 to 2.5 eV. The first component of the light emitting layer-forming composition of the present invention has high triplet energy, and therefore a phosphorescent material exhibiting luminescence from triplet energy and a thermally activated delayed fluorescent material having small $\Delta E_{ST}$ (difference between singlet energy and triplet energy) can be used.

1-2-1. Phosphorescent Material

A phosphorescent material obtains light emission from triplet utilizing an intramolecular spin-orbit interaction (heavy atom effect) of a metal atom. Examples of such a second component include a compound represented by the following general formula (B-1).

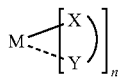
(B-1)

In formula (B-1), M represents at least one selected from the group consisting of Ir, Pt, Au, Eu, Ru, Re, Ag, and Cu, n represents an integer of 1 to 3, and "(X-Y)'s" each independently represent a bidentate monoanionic ligand.

Examples of a compound represented by formula (B-1) include compounds represented by the following general formula (B-10) and (B-15).

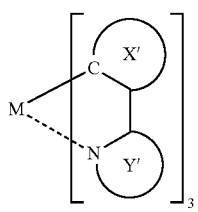
(B-10)

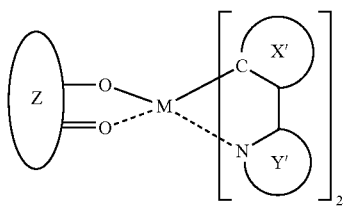
(B-15)

In formulas (B-10) and (B-15), X' represents an aromatic ring containing a carbon (C) atom bonded to M, and Y' represents a heterocyclic ring containing a nitrogen (N) atom coordinated with M. X' and Y' are bonded to each other and may form a new ring. In formula (B-15), Z is a bidentate ligand having two oxygen atoms. In formulas (B-10) and (B-15), M preferably represents Ir from a viewpoint of high efficiency and long lifetime.

Examples of a compound represented by formula (B-10) include Ir(ppy)$_3$, Ir(ppy)$_2$ (acac), Ir(mppy)$_3$, Ir(PPy)$_2$ (m-bppy), BtpIr(acac), Ir(btp)$_2$(acac), Ir(2-phq)$_3$, Hex-Ir (phq)$_3$, Ir(fbi)$_2$(acac), fac-Tris(2-(3-p-xylyl)phenyl)pyridine iridium(III), Eu(dbm)$_3$(Phen), Ir(piq)$_3$, Ir(piq)$_2$(acac), Ir(Fliq)$_2$(acac), Ir(Flq)$_2$(acac), Ru(dtb-bpy)$_3$.2(PF$_6$), Ir(2-phq)$_3$, Ir(BT)$_2$(acac), Ir(DMP)$_3$, Ir(Mphq)$_3$Ir(phq)$_2$tpy, fac-Ir(ppy)$_2$Pc, Ir(dp)PQ$_2$, Ir(Dpm) (Piq)$_2$, Hex-Ir(piq)$_2$(acac), Hex-Ir(piq)$_3$, Ir(dmpq)$_3$, Ir(dmpq)$_2$(acac), and FPQIrpic.

Other examples of a compound represented by formula (B-10) include compounds represented by the following formulas (B-10-1) to (B-10-31).

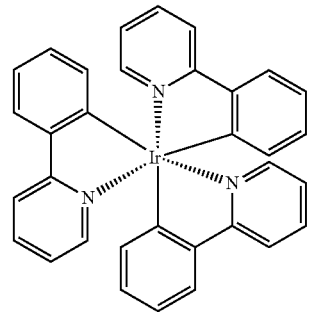
(B-10-1)

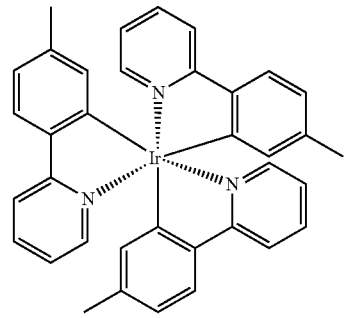
(B-10-2)

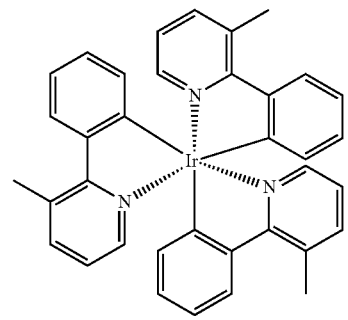
(B-10-3)

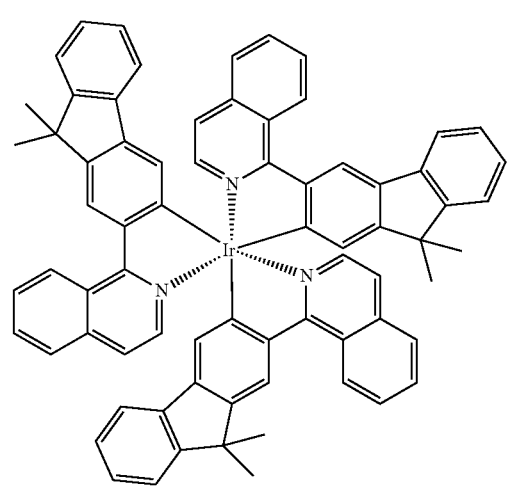
(B-10-4)

(B-10-5)
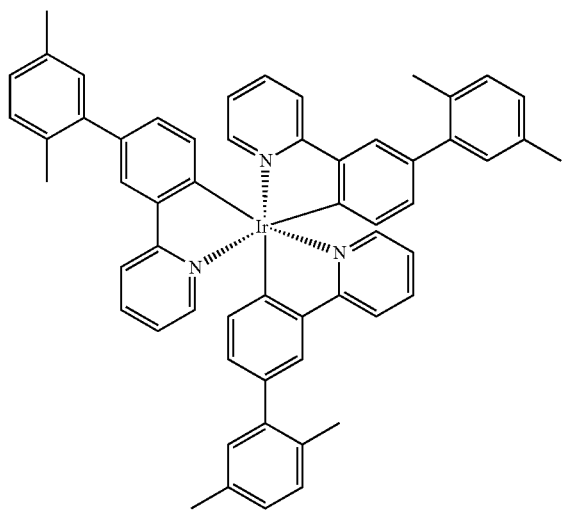
(B-10-6)
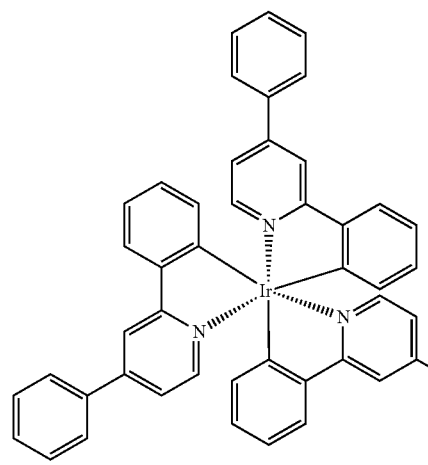
(B-10-7)
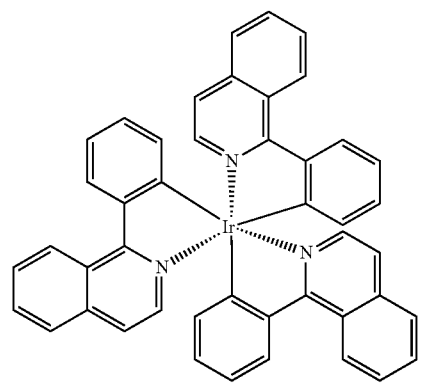
(B-10-8)
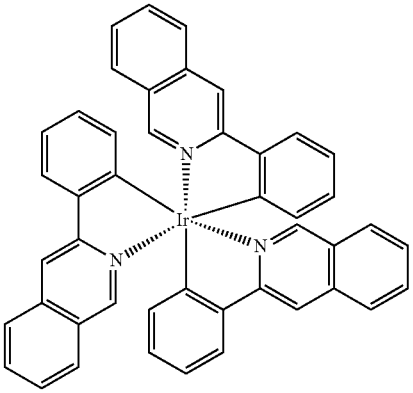
(B-10-9)
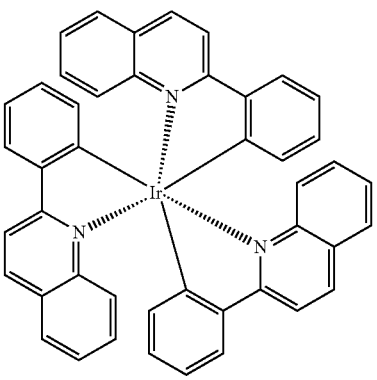
(B-10-21)
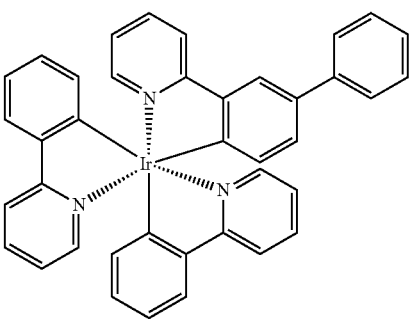
(B-10-31)
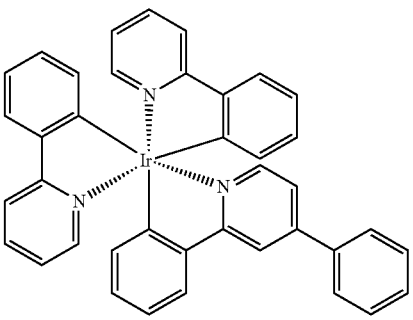
Other examples of a compound represented by the formula (B-15) include compounds represented by the following formulas (B-15-1) to (B-15-6).

(B-15-1)

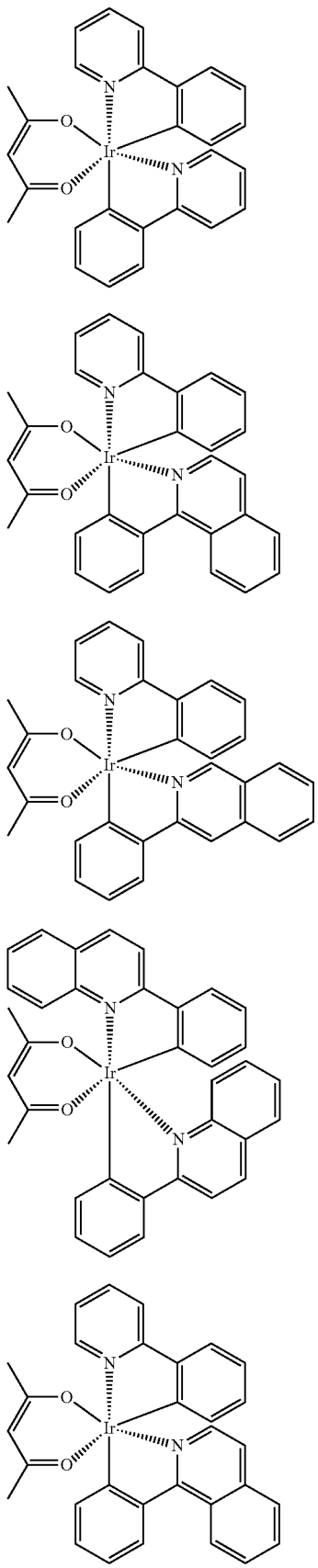

(B-15-2)

(B-15-3)

(B-15-4)

(B-15-5)

-continued (B-15-6)

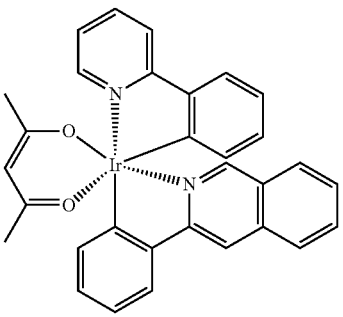

Furthermore, iridium derivatives described in JP 2006-089398 A, JP 2006-080419 A, JP 2005-298483 A, JP 2005-097263 A, JP 2004-111379 A, and the like may be used.

At least one hydrogen atom in an aryl ring and a heteroaryl ring in formula (B-1) may be substituted by a group represented by formula (FG-1), a group represented by formula (FG-2), or an alkyl having 1 to 24 carbon atoms. In a phosphorescent material, Ir(ppy)$_3$ and Hex-Ir(ppy)$_3$ are preferable for green light emission, and Ir(piq)$_3$, Hex-Ir(piq)$_3$, and Hex-Ir(piq)$_2$(acac) are preferable for red light emission from a viewpoint of high efficiency. Ir(ppy)$_3$ and Ir(piq)$_3$ substituted by a group represented by formula (FG-1), a group represented by formula (FG-2), or an alkyl having 1 to 24 carbon atoms are particularly preferable from a viewpoint of high solubility and film formability.

1-2-2. TADF Material

By reducing an energy difference between an excited singlet state and an excited triplet state, an inverse energy transfer from the excited triplet state usually having a low transition probability to the excited singlet state is generated with high efficiency, and light emission from the singlet state (thermally activated delayed fluorescence, TADF) occurs. In ordinary fluorescence emission, 75% triplet excitons generated by current excitation pass through a heat inactivation path, and cannot be taken as fluorescence. On the other hand, in TADF, all excitons can be used for fluorescence emission, and a highly efficient organic EL element can be realized.

The light emitting layer-forming composition of the present invention can contain a compound represented by general formula (B-2) as a second component.

$$ED-Ln-EA \qquad (B-2)$$

In formula (B-2), ED is an electron-donating group, Ln is a boning group, EA is an electron-accepting group, and an energy difference ($\Delta S^1 T^1$) between singlet energy ($S^1$) and triplet energy ($T^1$) of a compound represented by formula (B-2) is 0.2 eV or less (Hiroki Uoyama, Kenichi Goushi, Katsuyuki Shizu, Hiroko Nomura, Chihaya Adachi, Nature, 492, 234-238 (2012)). The energy difference ($\Delta S^1 T^1$) is preferably 0.15 eV or less, more preferably 0.10 eV or less, and still more preferably 0.08 eV or less.

Examples of ED include a functional group containing a sp$^3$ nitrogen atom. More specific examples thereof include carbazole, arylamine, and diarylamine. Examples of EA include a sp$^2$ nitrogen-containing aromatic ring, a CN-substituted aromatic ring, a ring containing ketone, and a cyano group. More specific examples thereof include pyridine, pyrimidine, and triazine. Examples of Ln include a single bond and an arylene. More specific examples thereof include a phenylene and a biphenylene. In any structure, a hydrogen atom may be substituted by an alkyl or an aryl.

Examples of a compound represented by formula (B-2) include 4CzIPN, 4CzTPN-Ph, and PIC-TRZ described below.

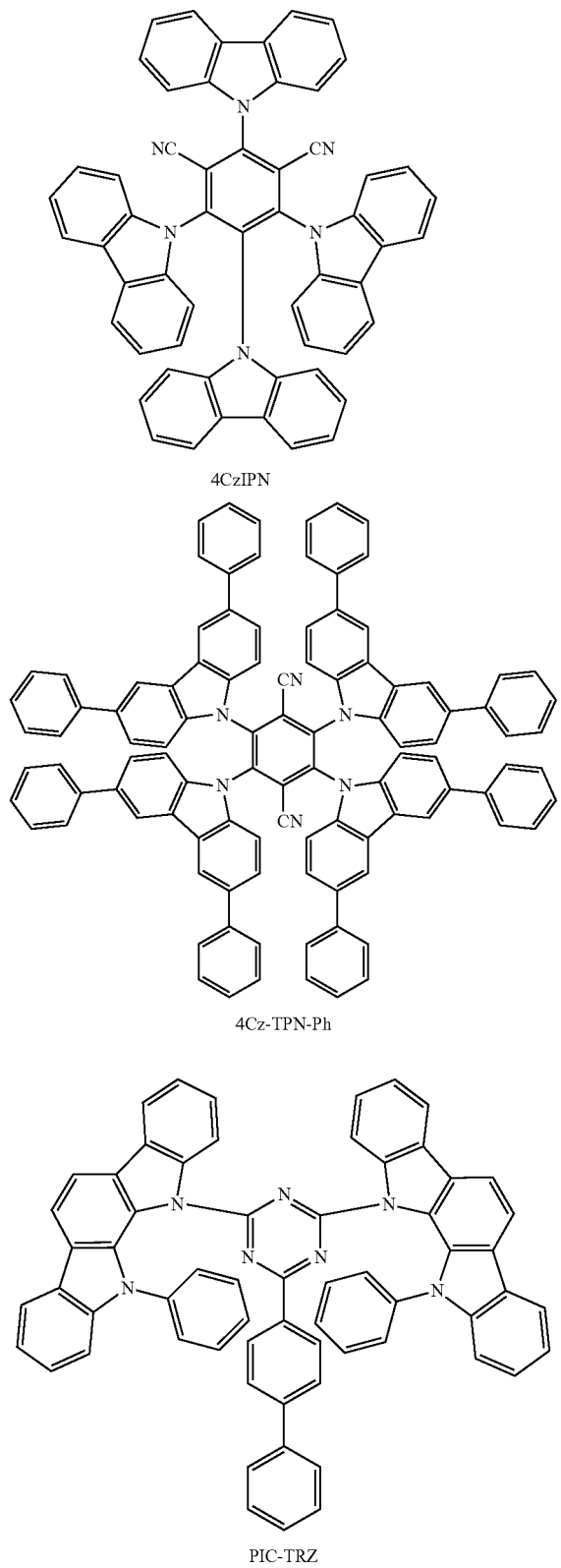

4CzIPN

4Cz-TPN-Ph

PIC-TRZ 1-3. Organic Solvent

The light emitting layer-forming composition of the present invention contains at least one organic solvent as a third component. By controlling an evaporation rate of an organic solvent at the time of film formation, it is possible to control and improve film formability, presence or absence of defects in a coating film, surface roughness, and smoothness. At the time of film formation using an ink jet method, by controlling meniscus stability at a pinhole of an ink jet head, ejection performance can be controlled and improved. In addition, by controlling a drying speed of a film and orientation of a derivative molecule, it is possible to improve electrical characteristics, luminescence characteristics, efficiency, and a lifetime of an organic EL element having a light emitting layer obtained from the light emitting layer-forming composition.

1-3-1. Physical Properties of Organic Solvent

In the third component, the boiling point of at least one organic solvent is from 130° C. to 300° C., more preferably from 140° C. to 270° C., and still more preferably from 150° C. to 250° C. A case where the boiling point is higher than 130° C. is preferable from a viewpoint of ink jet ejection performance. A case where the boiling point is lower than 300° C. is preferable from a viewpoint of defects in a coating film, surface roughness, a residual solvent, and smoothness. The third component more preferably contains two or more kinds of organic solvents from a viewpoint of good ink jet ejection performance, film formability, smoothness, and the small amount of a residual solvent. Meanwhile, in some cases, in consideration of transportability and the like, the third component may be a solid composition obtained by removing a solvent from the light emitting layer-forming composition.

Furthermore, particularly preferably, the third component contains a good solvent (GS) and a poor solvent (PS) for a compound represented by formula (A-1) and/or a compound represented by formula (A-2), and the boiling point ($BP_{GS}$) of the good solvent (GS) is lower than the boiling point ($BP_{PS}$) of the poor solvent (PS).

By adding a poor solvent having a high boiling point, a good solvent having a low boiling point is volatilized earlier at the time of film formation, and the concentration of contents in the composition and the concentration of the poor solvent are increased to promote prompt film formation. As a result, a coating film having few defects, less surface roughness, and high smoothness can be obtained.

A difference ($S_{GS}$-$S_{PS}$) between solubility ($S_{GS}$) of a compound represented by formula (A-1) and/or a compound represented by formula (A-2) in a good solvent (GS) and solubility ($S_{PS}$) of a compound represented by formula (A-1) and/or a compound represented by formula (A-2) in a poor solvent (PS) is preferably 1% or more, more preferably 3% or more, and still more preferably 5% or more. The difference in boiling point ($BP_{PS}$-$BP_{GS}$) is preferably 10° C. or more, more preferably 30° C. or more, and still more preferably 50° C. or more.

After the film formation, an organic solvent is removed from a coating film through a drying step such as evacuation, reduction in pressure, or heating. In a case of heating, heating is preferably performed at a glass transition temperature (Tg) of the first component+30° C. or lower from a viewpoint of improving coating film formability. Heating is preferably performed at a glass transition point (Tg) of the first component −30° C. or higher from a viewpoint of reducing a residual solvent. Even when the heating temperature is lower than the boiling point of an organic solvent, the organic solvent is sufficiently removed because the film is thin. Drying may be performed a plurality of times at different temperatures, or a plurality of drying methods may be used in combination.

1-3-2. Specific Examples of Organic Solvent

Examples of an organic solvent used in the light emitting layer-forming composition include an alkylbenzene-based solvent, a phenyl ether-based solvent, an alkyl ether-based solvent, a cyclic ketone-based solvent, an aliphatic ketone-based solvent, a monocyclic ketone-based solvent, a solvent having a diester skeleton, and a fluorine-based solvent. Specific examples thereof include pentanol, hexanol, heptanol, octanol, nonanol, decanol, undecanol, dodecanol, tetradecanol, hexan-2-ol, heptan-2-ol, octane-2-ol, decan-2-ol, dodecan-2-ol, cyclohexanol, α-terpineol, β-terpineol, γ-terpineol, δ-terpineol, terpineol (mixture), ethylene glycol monomethyl ether acetate, propylene glycol monomethyl ether acetate, diethylene glycol dimethyl ether, dipropylene glycol dimethyl ether, diethylene glycol ethyl methyl ether, diethylene glycol isopropyl methyl ether, dipropylene glycol monomethyl ether, diethylene glycol diethyl ether, diethylene glycol monomethyl ether, diethylene glycol butyl methyl ether, tripropylene glycol dimethyl ether, triethylene glycol dimethyl ether, diethylene glycol monobutyl ether, ethylene glycol monophenyl ether, triethylene glycol monomethyl ether, diethylene glycol dibutyl ether, triethylene glycol butyl methyl ether, polyethylene glycol dimethyl ether, tetraethylene glycol dimethyl ether, p-xylene, m-xylene, o-xylene, 2,6-lutidine, 2-fluoro-m-xylene, 3-fluoro-o-xylene, 2-chlorobenzo trifluoride, cumene, toluene, 2-chloro-6-fluorotoluene, 2-fluoroanisole, anisole, 2,3-dimethylpyrazine, bromobenzene, 4-fluoroanisole, 3-fluoroanisole, 3-trifluoromethylanisole, mesitylene, 1,2,4-trimethylbenzene, t-butylbenzene, 2-methylanisole, phenetole, benzodioxole, 4-methylanisole, s-butylbenzene, 3-methylanisole, 4-fluoro-3-methylanisole, cymene, 1,2,3-trimethylbenzene, 1,2-dichlorobenzene, 2-fluorobenzonitrile, 4-fluorobellaterol, 2,6-dimethylanisole, n-butylbenzene, 3-fluorobenzonitrile, decalin (decahydronaphthalene), neopentylbenzene, 2,5-dimethylanisole, 2,4-dimethylanisole, benzonitrile, 3,5-dimethylanisole, diphenyl ether, 1-fluoro-3,5-dimethoxybenzene, methyl benzoate, isopentylbenzene, 3,4-dimethylanisole, o-tolunitrile, n-amylbenzene, veratrol, 1,2,3,4-tetrahydronaphthalene, ethyl benzoate, n-hexylbenzene, propyl benzoate, cyclohexylbenzene, 1-methylnaphthalene, butyl benzoate, 2-methylbiphenyl, 3-phenoxytoluene, 2,2'-vitrile, dodecylbenzene, dipentylbenzene, tetramethylbenzene, trimethoxybenzene, trimethoxytoluene, 2,3-dihydrobenzofuran, 1-methyl-4-(propoxymethyl) benzene, 1-methyl-4-(butyloxymethyl) benzene, 1-methyl-4-(pentyloxymethyl) benzene, 1-methyl-4-(hexyloxymethyl) benzene, 1-methyl-4-(heptyloxymethyl) benzenebenzylbutyl ether, benzyl pentyl ether, benzyl hexyl ether, benzyl heptyl ether, and benzyl octyl ether, but are not limited thereto. Furthermore, these solvents may be used singly or in a mixture thereof.

1-4. Optional Components

The light emitting layer-forming composition may contain an optional component as long as properties thereof are not impaired. Examples of an optional component include a binder and a surfactant.

1-4-1. Binder

The light emitting layer-forming composition may contain a binder. The binder forms a film at the time of film formation, and bonds the obtained film to a substrate. The binder also plays a role of dissolving, dispersing, and binding other components in the light emitting layer-forming composition.

Examples of a binder used in the light emitting layer-forming composition include an acrylic resin, polyethylene terephthalate, an ethylene-vinyl acetate copolymer, an ethylene-vinyl alcohol copolymer, an acrylonitrile-ethylene-styrene copolymer (AES) resin, an ionomer, chlorinated polyether, a diallyl phthalate resin, an unsaturated polyester resin, polyethylene, polypropylene, polyvinyl chloride, polyvinylidene chloride, polystyrene, polyvinyl acetate, Teflon, an acrylonitrile-butadiene-styrene copolymer (ABS) resin, an acrylonitrile-styrene copolymer (AS) resin, a phenol resin, an epoxy resin, a melamine resin, a urea resin, an alkyd resin, polyurethane, and a copolymer of the above resins and polymers, but are not limited thereto.

The binders used in the light emitting layer-forming composition may be used singly or in a mixture of a plurality of kinds thereof.

1-4-2. Surfactant

The light emitting layer-forming composition may contain, for example, a surfactant for controlling film surface uniformity of the light emitting layer-forming composition, solvent affinity of a film surface, and liquid repellency. The surfactant is classified into an ionic surfactant and a nonionic surfactant based on the structure of a hydrophilic group, and is further classified into an alkyl-based surfactant, a silicon-based surfactant, and a fluorine-based surfactant based on the structure of a hydrophobic group. The surfactant is classified into a monomolecule-based surfactant having a relatively small molecular weight and a simple structure, and a polymer-based surfactant having a large molecular weight and a side chain or a branched chain based on the structure of a molecule. The surfactant is classified into a single surfactant and a mixed surfactant obtained by mixing two or more kinds of surfactants with a base material based on the composition. As a surfactant that can be used in the light emitting layer-forming composition, all kinds of surfactants can be used.

Examples of the surfactant include Polyflow No. 45, Polyflow KL-245, Polyflow No. 75, Polyflow No. 90, Polyflow No. 95 (trade name, manufactured by Kyoeisha Chemical Co., Ltd.), Disperbyk 161, Disperbyk 162, Disperbyk 163, Disperbyk 164, Disperbyk 166, Disperbyk 170, Disperbyk 180, Disperbyk 181, Disperbyk 182, BYK 300, BYK 306, BYK 310, BYK 320, BYK 330, BYK 342, BYK 344, BYK 346 (trade names, manufactured by BYK Japan KK), KP-341, KP-358, KP-368, KF-96-50CS, KF-50-100CS (trade names, manufactured by Shin-Etsu Chemical Co., Ltd.), Surflon SC-101, Surflon KH-40 (trade names, manufactured by Seimi Chemical Co., Ltd.), Futargent 222F, Futargent 251, FTX-218 (trade name, manufactured by Neos Co., Ltd.), EFTOP EF-351, EFTOP EF-352, EFTOP EF-601, EFTOP EF-801, EFTOP EF-802 (trade names, manufactured by Mitsubishi Materials Corporation), Megafac F-470, Megafac F-471, Megafac F-475, Megafac R-08, Megafac F-477, Megafac F-479, Megafac F-553, Megafac F-554, (trade names, manufactured by DIC Corporation), fluoroalkyl benzene sulfonate, fluoroalkyl carboxylate, fluoroalkyl polyoxyethylene ether, fluoroalkyl ammonium iodide, fluoroalkyl betaine, fluoroalkyl sulfonate, diglycerin tetrakis(fluoroalkyl polyoxyethylene ether), a fluoroalkyl trimethyl ammonium salt, fluoroalkyl aminosulfonate, polyoxyethylene nonyl phenyl ether, polyoxyethylene octyl phenyl ether, polyoxyethylene alkyl ether, polyoxyethylene laurate, polyoxyethylene oleate, polyoxyethylene stearate, polyoxyethylene lauryl amine, sorbitan laurate, sorbitan palmitate, sorbitan stearate, sorbitan oleate, sorbitan fatty acid ester, polyoxyethylene sorbitan laurate, polyoxyethylene sorbitan palmitate, polyoxyethylene sorbitan stearate, polyoxyethylene sorbitan oleate, polyoxyethylene naphthyl ether, alkylbenzene sulfonate, and alkyl diphenyl ether disulfonate.

The surfactants may be used singly or in combination of two or more kinds thereof.

1-5. Composition and Physical Properties of Light Emitting Layer-Forming Composition As for the contents of the components in the light emitting layer-forming composition of the present invention, preferably, the content of the first component is from 0.0999% by weight to 8.0% by weight with respect to the total weight of the light emitting layer-forming composition, the content of the second component is from 0.0001% by weight to 2.0% by weight with respect to the total weight of the light emitting layer-forming composition, and the content of the third component is from 90.0% by weight to 99.9% by weight with respect to the total weight of the light emitting layer-forming composition from a viewpoint of good solubility, storage stability, and film formability of the components in the light emitting layer-forming composition, high quality of a coating film obtained from the light emitting layer-forming composition, good ejection performance in a case of using an ink jet method, and good electrical characteristics, luminescent characteristics, efficiency, and a lifetime of an organic EL element having a light emitting layer manufactured using the composition.

More preferably, the content of the first component is from 0.17% by weight to 4.0% by weight with respect to the total weight of the light emitting layer-forming composition, the content of the second component is from 0.03% by weight to 1.0% by weight with respect to the total weight of the light emitting layer-forming composition, and the content of the third component is from 95.0% by weight to 99.8% by with respect to the total weight of the light emitting layer-forming composition. Still more preferably, the content of the first component is from 0.25% by weight to 2.5% by weight with respect to the total weight of the light emitting layer-forming composition, the content of the second component is from 0.05% by weight to 0.5% by weight with respect to the total weight of the light emitting layer-forming composition, and the content of the third component is from 97.0% by weight to 99.7% by with respect to the total weight of the light emitting layer-forming composition. In another preferable embodiment, the content of the first component is from 0.095% by weight to 4.0% by weight with respect to the total weight of the light emitting layer-forming composition, the content of the second component is from 0.005% by weight to 1.0% by weight with respect to the total weight of the light emitting layer-forming composition, and the content of the third component is from 95.0% by weight to 99.9% by with respect to the total weight of the light emitting layer-forming composition.

The light emitting layer-forming composition can be manufactured by appropriately selecting and performing stirring, mixing, heating, cooling, dissolving, dispersing, and the like of the above components by a known method. After preparation, filtration, degassing (also referred to as degassing), an ion exchange treatment, an inert gas replacement/encapsulation treatment, and the like may be appropriately selected and performed.

The light emitting layer-forming composition having a high viscosity brings about good film formability and good ejection performance in a case of using an ink jet method. Meanwhile, the lower viscosity makes it easier to make a thin film. Therefore, the viscosity of the light emitting layer-forming composition is preferably from 0.3 mPa·s to 3 mPa·s, and more preferably from 1 mPa·s to 3 mPa·s at 25° C. In the present invention, the viscosity is a value measured using a cone plate type rotational viscometer (cone plate type).

The light emitting layer-forming composition having a low surface tension brings about a coating film having good film formability and no defects. Meanwhile, the light emitting layer-forming composition having a high surface tension brings about good ink jet ejection performance. Therefore, the surface tension of the light emitting layer-forming composition is preferably from 20 mN/m to 40 mN/m, and more preferably from 20 mN/m to 30 mN/m at 25° C. In the present invention, the surface tension is a value measured using a hanging drop method.

3. Method for Manufacturing Compound Represented by General Formula (A-1) or (A-2)

For a compound represented by formula (A-1), first, rings a to c are bonded with a bonding group (—O—) to manufacture an intermediate (first reaction), and then the rings a to c are bonded with a bonding group (group containing B) to manufacture a final product (second reaction). For a compound represented by formula (A-2), first, rings a to d are bonded with a bonding group (>NH or a single bond) to manufacture an intermediate (first reaction), and then the rings a to d are bonded with a bonding group (group containing B) to manufacture a final product (second reaction). In the first reaction, for example, in an etherification reaction, a general reaction such as a nucleophilic substitution reaction or an Ullmann reaction can be utilized, and in an amination reaction, a general reaction such as a Buchwald-Hartwig reaction can be utilized. In the second reaction, a Tandem Hetero-Friedel-Crafts reaction (continuous aromatic electrophilic substitution reaction, the same hereinafter) can be utilized.

3-1. Manufacturing Method: Example of Second Reaction of Compound Represented by General Formula (A-1)

As indicated in the following scheme (1), the second reaction is a reaction for introducing a B (boron) atom to bond ring a, ring b, and ring c, and a case of a compound represented by formula (A-1) is exemplified below. First, a hydrogen atom between the two O atoms is ortho-metalated with n-butyllithium, sec-butyllithium, t-butyllithium, or the like. Subsequently, boron trichloride, boron tribromide, or the like is added thereto to perform lithium-boron metal exchange, and then a Brønsted base such as N,N-diisopropylethylamine is added thereto to induce a Tandem Bora-Friedel-Crafts reaction. Thus, an intended product can be obtained. In the second reaction, a Lewis acid such as aluminum trichloride may be added in order to accelerate the reaction.

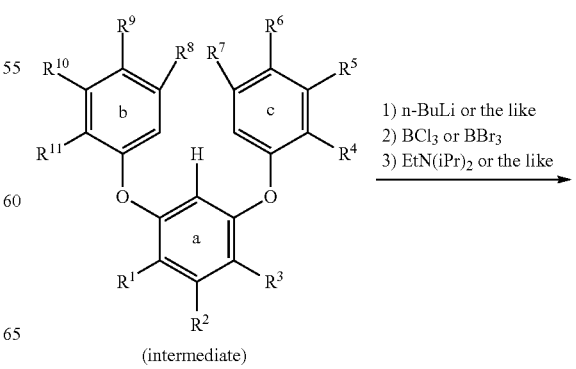

scheme (1)

1) n-BuLi or the like
2) BCl$_3$ or BBr$_3$
3) EtN(iPr)$_2$ or the like (intermediate)

-continued

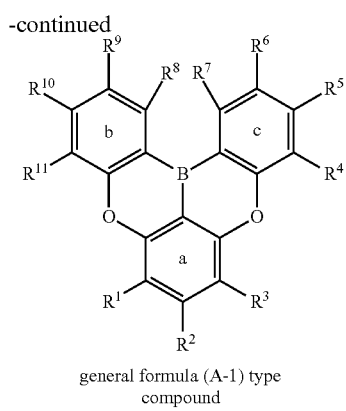

general formula (A-1) type compound

In the above scheme, a lithium atom is introduced into a desired position by ortho-metalation. However, a lithium atom can be introduced into a desired position by introducing a bromine atom or the like into a position into which it is desired to introduce a lithium atom as in the following scheme (2) and performing halogen-metal exchange.

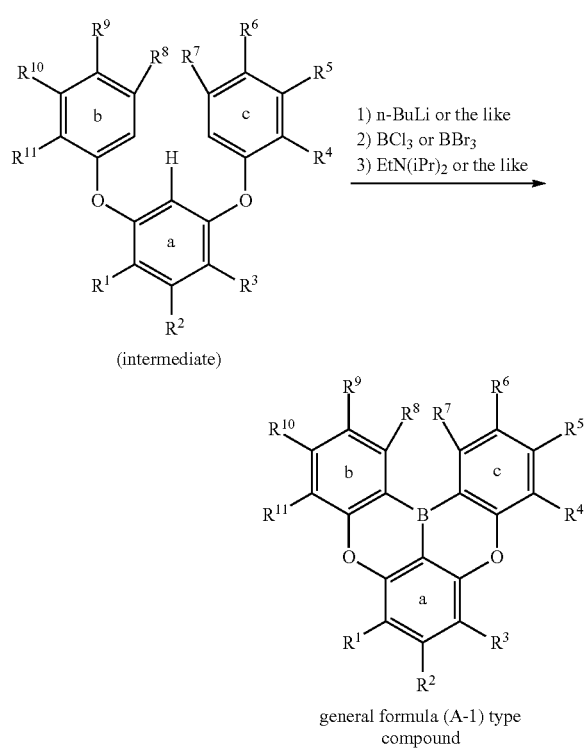

Furthermore, in order to obtain a compound substituted by a group represented by formula (FG-1), a group represented by formula (FG-2), or an alkyl having 1 to 24 carbon atoms, these groups may be introduced into an intermediate in advance, or may be introduced after the second reaction. Introduction of a deuterium atom or a halogen atom is similar.

By appropriately selecting the above synthesis method and appropriately selecting raw materials to be used, it is possible to synthesize a compound represented by formula (A-1) having a substituent at a desired position.

3-2. Manufacturing Method: Case of Compound Represented by General Formula (A-2)

The first reaction and the second reaction in the above method for manufacturing a compound represented by formula (A-1) can be applied to a method for manufacturing a compound represented by formula (A-2). That is, the second reaction is a reaction to introduce a B (boron) atom to bond NH to ring c and ring d. A hydrogen atom of NH is ortho-metalated with n-butyllithium, sec-butyllithium, t-butyllithium, or the like. Thereafter, boron trichloride, boron tribromide, or the like is added thereto to perform lithium-boron metal exchange, and then a Brønsted base such as N,N-diisopropylethylamine is added thereto to induce a Tandem Bora-Friedel-Crafts reaction. Thus, an intended product can be obtained. Also here, in the second reaction, a Lewis acid such as aluminum trichloride may be added in order to accelerate the reaction.

4. Organic Electroluminescent Element

The light emitting layer-forming composition (ink composition) according to the present invention can be used, for example, as a light emitting layer of an organic EL element. Hereinafter, an organic EL element according to the present embodiment will be described in detail based on the drawings. FIG. 1 is a schematic cross-sectional view illustrating the organic EL element according to the present embodiment.

4-1. Structure of Organic Electroluminescent Element

An organic EL element 100 illustrated in FIG. 1 includes a substrate 101, a positive electrode 102 provided on the substrate 101, a hole injection layer 103 provided on the positive electrode 102, a hole transport layer 104 provided on the hole injection layer 103, a light emitting layer 105 provided on the hole transport layer 104, an electron transport layer 106 provided on the light emitting layer 105, an electron injection layer 107 provided on the electron transport layer 106, and a negative electrode 108 provided on the electron injection layer 107.

Incidentally, the organic EL element 100 may be configured, by reversing the manufacturing order, to include, for example, the substrate 101, the negative electrode 108 provided on the substrate 101, the electron injection layer 107 provided on the negative electrode 108, the electron transport layer 106 provided on the electron injection layer 107, the light emitting layer 105 provided on the electron transport layer 106, the hole transport layer 104 provided on the light emitting layer 105, the hole injection layer 103 provided on the hole transport layer 104, and the positive electrode 102 provided on the hole injection layer 103.

Not all of the above layers are essential. The configuration includes the positive electrode 102, the light emitting layer 105, and the negative electrode 108 as a minimum constituent unit, while the hole injection layer 103, the hole transport layer 104, the electron transport layer 106, and the electron injection layer 107 are optionally provided. Each of the above layers may be formed of a single layer or a plurality of layers.

An embodiment of layers constituting the organic EL element may be, in addition to the above configuration embodiment of "substrate/positive electrode/hole injection layer/hole transport layer/light emitting layer/electron transport layer/electron injection layer/negative electrode", a configuration embodiment of "substrate/positive electrode/hole transport layer/light emitting layer/electron transport layer/electron injection layer/negative electrode", "substrate/positive electrode/hole injection layer/light emitting layer/electron transport layer/electron injection layer/negative electrode", "substrate/positive electrode/hole injection layer/hole transport layer/light emitting layer/electron injection layer/negative electrode", "substrate/positive electrode/hole injection layer/hole transport layer/light emitting layer/electron transport layer/negative electrode", "substrate/positive electrode/light emitting layer/electron transport layer/electron injection layer/negative electrode", "substrate/positive electrode/hole transport layer/light emitting layer/electron injection layer/negative electrode", "substrate/positive electrode/hole transport layer/light emitting layer/electron transport layer/negative electrode", "substrate/positive electrode/hole injection layer/light emitting layer/electron injection layer/negative electrode", "substrate/positive electrode/hole injection layer/light emitting layer/electron transport layer/negative electrode", "substrate/positive electrode/light emitting layer/electron transport layer/negative electrode", or "substrate/positive electrode/light emitting layer/electron injection layer/negative electrode".

4-2. Substrate in Organic Electroluminescent Element

The substrate 101 serves as a support of the organic EL element 100, and usually, quartz, glass, metals, plastics, and the like are used. The substrate 101 is formed into a plate shape, a film shape, or a sheet shape according to a purpose, and for example, a glass plate, a metal plate, a metal foil, a plastic film, and a plastic sheet are used. Among these examples, a glass plate and a plate made of a transparent synthetic resin such as polyester, polymethacrylate, polycarbonate, or polysulfone are preferable. For a glass substrate, soda lime glass, alkali-free glass, and the like are used. The thickness is only required to be a thickness sufficient for maintaining mechanical strength. Therefore, the thickness is only required to be 0.2 mm or more, for example. The upper limit value of the thickness is, for example, 2 mm or less, and preferably 1 mm or less. Regarding a material of glass, glass having fewer ions eluted from the glass is desirable, and therefore alkali-free glass is preferable. However, soda lime glass which has been subjected to barrier coating with $SiO_2$ or the like is also commercially available, and therefore this soda lime glass can be used. Furthermore, the substrate 101 may be provided with a gas barrier film such as a dense silicon oxide film on at least one surface in order to increase a gas barrier property. Particularly in a case of using a plate, a film, or a sheet made of a synthetic resin having a low gas barrier property as the substrate 101, a gas barrier film is preferably provided.

4-3. Positive Electrode in Organic Electroluminescent Element

The positive electrode 102 plays a role of injecting a hole into the light emitting layer 105. Incidentally, in a case where the hole injection layer 103 and/or the hole transport layer 104 are/is provided between the positive electrode 102 and the light emitting layer 105, a hole is injected into the light emitting layer 105 through these layers.

Examples of a material to form the positive electrode 102 include an inorganic compound and an organic compound. Examples of the inorganic compound include a metal (aluminum, gold, silver, nickel, palladium, chromium, and the like), a metal oxide (indium oxide, tin oxide, indium-tin oxide (ITO), indium-zinc oxide (IZO), and the like), a metal halide (copper iodide and the like), copper sulfide, carbon black, ITO glass, and Nesa glass. Examples of the organic compound include an electrically conductive polymer such as polythiophene such as poly(3-methylthiophene), polypyrrole, or polyaniline. In addition to these compounds, a material can be appropriately selected for use from materials used as a positive electrode of an organic EL element.

A resistance of a transparent electrode is not limited as long as a sufficient current can be supplied to light emission of a luminescent element. However, low resistance is desirable from a viewpoint of consumption power of the luminescent element. For example, an ITO substrate having a resistance of 300Ω/□ or less functions as an element electrode. However, a substrate having a resistance of about 10Ω/□ can be also supplied at present, and therefore it is particularly desirable to use a low resistance product having a resistance of, for example, 100 to 5Ω/□, preferably 50 to 5Ω/□. The thickness of an ITO can be arbitrarily selected according to a resistance value, but an ITO having a thickness of 50 to 300 nm is often used.

4-4. Hole Injection Layer and Hole Transport Layer in Organic Electroluminescent Element The hole injection layer 103 plays a role of efficiently injecting a hole that migrates from the positive electrode 102 into the light emitting layer 105 or the hole transport layer 104. The hole transport layer 104 plays a role of efficiently transporting a hole injected from the positive electrode 102 or a hole injected from the positive electrode 102 through the hole injection layer 103 to the light emitting layer 105. The hole injection layer 103 and the hole transport layer 104 are each formed by laminating and mixing one or more kinds of hole injecting/transporting materials, or by a mixture of hole injecting/transporting materials and a polymer binder. Furthermore, a layer may be formed by adding an inorganic salt such as iron(III) chloride to the hole injecting/transporting materials.

A hole injecting/transporting substance needs to efficiently inject/transport a hole from a positive electrode between electrodes to which an electric field is applied, and preferably has high hole injection efficiency and transports an injected hole efficiently. For this purpose, a substance which has low ionization potential, large hole mobility, and excellent stability, and in which impurities that serve as traps are not easily generated at the time of manufacturing and at the time of use, is preferable.

As a material to form the hole injection layer 103 and the hole transport layer 104, any compound can be selected for use among compounds that have been conventionally used as charge transporting materials for holes, p-type semiconductors, and known compounds used in a hole injection layer and a hole transport layer of an organic EL element. Specific examples thereof include a heterocyclic compound including a carbazole derivative (N-phenylcarbazole, polyvinylcarbazole, and the like), a biscarbazole derivative such as bis(N-arylcarbazole) or bis(N-alkylcarbazole), a triarylamine derivative (a polymer having an aromatic tertiary amino in a main chain or a side chain, 1,1-bis(4-di-p-tolylaminophenyl)cyclohexane, N,N'-diphenyl-N,N'-di(3-methylphenyl)-4,4'-diaminobiphenyl, N,N'-diphenyl-N,N'-dinaphthyl-4,4'-diaminobiphenyl, N,N'-diphenyl-N,N'-di(3-methylphenyl)-4,4'-diphenyl-1,1'-diamine, N,N'-dinaphthyl-N,N'-diphenyl-4,4'-dphenyl-1,1'-diamine, $N^4,N^{4'}$-diphenyl-$N^4,N^{4'}$-bis(9-phenyl-9H-carbazol-3-yl)-[1,1'-biphenyl]-4,4'-diamine, $N^4,N^4,N^{4'},N^{4'}$-tetra[1,1'-biphenyl]-4-yl)-[1,1'-biphenyl]-4,4'-diamine, a triphenylamine derivative such as 4,4',4''-tris(3-methylphenyl(phenyl)amino)triphenylamine, a starburst amine derivative, and the like), a stilbene derivative, a phthalocyanine derivative (non-metal, copper phthalocyanine, and the like), a pyrazoline derivative, a hydrazone-based compound, a benzofuran derivative, a thiophene derivative, an oxadiazole derivative, a quinoxaline derivative (for example, 1,4,5,8,9,12-hexaazatriphenylene-2,3,6,7,10,11-hexacarbonitrile, and the like), and a porphyrin derivative, and a polysilane. Among the polymer-based materials, a polycarbonate, a styrene derivative, a polyvinylcarbazole, a polysilane, and the like having the above monomers in side chains are preferable. However, there is no particular limitation as long as a compound can form a thin film needed for manufacturing a luminescent element, can inject a hole from a positive electrode, and can transport a hole.

Furthermore, it is also known that electroconductivity of an organic semiconductor is strongly affected by doping into the organic semiconductor. Such an organic semiconductor matrix substance is formed of a compound having a good electron-donating property, or a compound having a good electron-accepting property. For doping with an electron-donating substance, a strong electron acceptor such as tetracyanoquinonedimethane (TCNQ) or 2,3,5,6-tetrafluorotetracyano-1,4-benzoquinonedimethane (F4TCNQ) is known (see, for example, "M. Pfeiffer, A. Beyer, T. Fritz, K. Leo, Appl. Phys. Lett., 73(22), 3202-3204 (1998)" and "J. Blochwitz, M. Pheiffer, T. Fritz, K. Leo, Appl. Phys. Lett., 73(6), 729-731 (1998)"). These compounds generate a so-called hole by an electron transfer process in an electron-donating type base substance (hole transporting substance). Electroconductivity of the base substance depends on the number and mobility of the holes fairly significantly. Known examples of a matrix substance having a hole transporting characteristic include a benzidine derivative (TPD and the like), a starburst amine derivative (TDATA and the like), and a specific metal phthalocyanine (particularly, zinc phthalocyanine (ZnPc) and the like) (JP 2005-167175 A).

In addition, as a material for forming the hole injection layer 103 and the hole transport layer 104 by a wet film formation method, in addition to the above materials for forming the hole injection layer 103 and the hole transport layer 104 used for vapor deposition, a hole injecting and hole transporting polymer, a hole injecting and hole transporting polymer precursor, and a polymerization initiator can be used. Examples of the material include PEDOT:PSS, polyaniline compounds (described in JP 2005-108828 A, WO 2010/058776 A, WO2013/042623 A, and the like), fluorene polymers (described in JP 2011-251984 A, JP 2011-501449 A, JP 2012-533661 A, and the like), and compounds described in "Xiaohui Yang, David C. Muller, Dieter Neher, Klaus Meerholz, Organic Electronics, 12, 2253-2257 (2011)", "Philipp Zacharias, Malte C. Gather, Markus Rojahn, Oskar Nuyken, Klaus Meerholz, Angew. Chem. Int. Ed., 46, 4388-4392 (2007)", "Chei-Yen, Yu-Cheng Lin, Wen-Yi Hung, Ken-Tsung Wong, Raymond C. Kwong, Sean C. Xia, Yu-Hung Chen, Chih-I Wu, J. Mater. Chem., 19, 3618-3626(2009)", "Fei Huang, Yen-Ju Cheng, Yong Zhang, Michelle S. Liu, Alex K.-Y. Jen, J. Mater. Chem., 18, 4495-4509(2008)", "Carlos A. Zuniga, Jassem Abdallah, Wojciech Haske, Yadong Zhang, Igor Coropceanu, Stephen Barlow, Bernard Kippelen, Seth R. Marder, Adv. Mater., 25, 1739-1744 (2013)", "Wen-Yi Hung, Chi-Yen Lin, Tsang-Lung Cheng, Shih-Wei Yang, Atul Chaskar, Gang-Lun Fan, Ken-Tsung Wong, Teng-Chih Chao, Mei-Rurng Tseng, Organic Electronics, 13, 2508-2515 (2012)", and the like.

4-5. Light Emitting Layer in Organic Electroluminescent Element

The light emitting layer 105 emits light by recombining a hole injected from the positive electrode 102 and an electron injected from the negative electrode 108 between electrodes to which an electric field is applied. A material to form the light emitting layer 105 is only required to be a compound which is excited by recombination between a hole and an electron and emits light (luminescent compound), and is preferably a compound which can form a stable thin film shape, and exhibits strong light emission (fluorescence) efficiency in a solid state.

The light emitting layer may be formed of a single layer or a plurality of layers, and each layer is formed of a material for a light emitting layer (a host material and a dopant material). The host material and the dopant material may be each formed of a single kind or a combination of a plurality of kinds thereof. The dopant material may be included in the host material wholly or partially. A compound represented by formula (A-1) or (A-2) can be used as the host material. Compound represented by formula (B-1) or (B-2) can be used as a dopant material.

The amount of use of the host material depends on the kind of the host material, and may be determined according to a characteristic of the host material. The reference of the amount of use of the host material is preferably from 50 to 99.999% by weight, more preferably from 80 to 99.95% by weight, and still more preferably from 90 to 99.9% by weight with respect to the total amount of a material for a light emitting layer.

The amount of use of the dopant material depends on the kind of the dopant material, and may be determined according to a characteristic of the dopant material. The reference of the amount of use of the dopant is preferably from 0.001 to 50% by weight, more preferably from 0.05 to 20% by weight, and still more preferably from 0.1 to 10% by weight with respect to the total amount of a material for a light emitting layer. The amount of use within the above range is preferable, for example, from a viewpoint of being able to prevent a concentration quenching phenomenon.

Examples of a host material that can be used in combination with a compound represented by formula (A-1) or (A-2) include a fused ring derivative of anthracene, pyrene, or the like conventionally known as a luminous body, a bisstyryl derivative such as a bisstyrylanthracene derivative or a distyrylbenzene derivative, a tetraphenylbutadiene derivative, a cyclopentadiene derivative, a fluorene derivative, and a benzofluorene derivative.

Furthermore, a dopant material that can be used in combination with general formula (B-1) or (B-2) is not particularly limited, but known compounds can be used. The dopant material can be selected from various materials according to a desired color of emitted light. Specific examples of the dopant material include a fused ring derivative of phenanthrene, anthracene, pyrene, tetracene, pentacene, perylene, naphthopyrene, dibenzopyrene, rubrene, chrysene, or the like, a benzoxazole derivative, a benzothiazole derivative, a benzimidazole derivative, a benzotriazole derivative, an oxazole derivative, an oxadiazole derivative, a thiazole derivative, an imidazole derivative, a thiadiazole derivative, a triazole derivative, a pyrazoline derivative, a stilbene derivative, a thiophene derivative, a tetraphenylbutadiene derivative, a cyclopentadiene derivative, a bisstyryl derivative such as a bisstyrylanthracene derivative or a distyrylbenzene derivative (JP 1-245087 A), a bisstyrylarylene derivative (JP 2-247278 A), a diazaindacene derivative, a furan derivative, a benzofuran derivative, an isobenzofuran derivative such as phenylisobenzofuran, dimesitylisobenzofuran, di(2-methylphenyl)isobenzofuran, di(2-trifluoromethylphenyl)isobenzofuran, or phenylisobenzofuran, a dibenzofuran derivative, a coumarin derivative such as a 7-dialkylaminocoumarin derivative, a 7-piperidinocoumarin derivative, a 7-hydroxycoumarin derivative, a 7-methoxycoumarin derivative, a 7-acetoxycoumarin derivative, a 3-benzothiazolylcoumarin derivative, a 3-benzimidazolylcoumarin derivative, or a 3-benzoxazolylcoumarin derivative, a dicyanomethylenepyran derivative, a dicyanomethylenethiopyran derivative, a polymethine derivative, a cyanine derivative, an oxobenzoanthracene derivative, a xanthene derivative, a rhodamine derivative, a fluorescein derivative, a pyrylium derivative, a carbostyryl derivative, an acridine derivative, an oxazine derivative, a phenylene oxide derivative, a quinacridone derivative, a quinazoline derivative, a pyrrolopyridine derivative, a furopyridine derivative, a 1,2,5-thiadiazolopyrene derivative, a pyromethene derivative, a perinone derivative, a pyrrolopyrrole derivative, a squarylium derivative, a violanthrone derivative, a phenazine derivative, an acridone derivative, a deazaflavine derivative, a fluorene derivative, and a benzofluorene derivative.

If the examples are listed for each of light colors, examples of blue to bluish green dopant materials include an aromatic hydrocarbon compound such as naphthalene, anthracene, phenanthrene, pyrene, triphenylene, perylene, fluorene, indene, or chrysene, and derivatives thereof, an aromatic heterocyclic compound such as furan, pyrrole, thiophene, silole, 9-silafluorene, 9,9'-spirobisilafluorene, benzothiophene, benzofuran, indole, dibenzothiophene, dibenzofuran, imidazopyridine, phenanthroline, pyrazine, naphthyridine, quinoxaline, pyrrolopyridine, or thioxanthene, and derivatives thereof, a distyrylbenzene derivative, a tetraphenylbutadiene derivative, a stilbene derivative, an aldazine derivative, a coumarin derivative, an azole derivative such as imidazole, thiazole, thiadiazole, carbazole, oxazole, oxadiazole, or triazole, and metal complexes thereof, and an aromatic amine derivative represented by N,N'-diphenyl-N,N'-di(3-methylphenyl)-4,4'-diphenyl-1,1'-diamine.

Furthermore, examples of a green to yellow dopant material include a coumarin derivative, a phthalimide derivative, a naphthalimide derivative, a perinone derivative, a pyrrolopyrrole derivative, a cyclopentadiene derivative, an acridone derivative, a quinacridone derivative, and a naphthacene derivative such as rubrene. Furthermore, suitable examples of the green-yellow dopant material include compounds obtained by introducing a substituent capable of shifting a wavelength to a longer wavelength, such as an aryl, a heteroaryl, an arylvinyl, an amino, or a cyano to the above compounds listed as examples of blue to bluish green dopant materials.

Furthermore, examples of an orange to red dopant material include a naphthalimide derivative such as bis(diisopropylphenyl)perylene tetracarboxylic acid imide, a perinone derivative, a rare earth complex such as a Eu complex containing acetylacetone, benzoylacetone, phenanthroline, or the like as a ligand, 4-(dicyanomethylene)-2-methyl-6-(p-dimethylaminostyryl)-4H-pyran and analogues thereof, a metal phthalocyanine derivative such as magnesium phthalocyanine or aluminum chlorophthalocyanine, a rhodamine compound, a deazaflavine derivative, a coumarin derivative, a quinacridone derivative, a phenoxazine derivative, an oxazine derivative, a quinazoline derivative, a pyrrolopyridine derivative, a squarylium derivative, a violanthrone derivative, a phenazine derivative, a phenoxazone derivative, and a thiadiazolopyrene derivative. Furthermore, suitable examples of the orange to red dopant material include compounds obtained by introducing a substituent capable of shifting a wavelength to a longer wavelength, such as an aryl, a heteroaryl, an arylvinyl, an amino, or a cyano to the above compounds listed as examples of blue to bluish green and green to yellow dopant materials.

In addition to the above compounds, a dopant can be appropriately selected for use from compounds described in "Kagaku Kogyo (Chemical Industry)", June 2004, p. 13, and reference documents described therein.

An amine having a stilbene structure is represented by the following formula, for example.

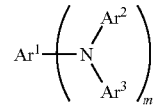

In the formula, $Ar^1$ represents an m-valent group derived from an aryl having 6 to 30 carbon atoms, and $Ar^2$ and $Ar^3$ each independently represent an aryl having 6 to 30 carbon atoms, while at least one of $Ar^1$ to $Ar^3$ has a stilbene structure, $Ar^1$ to $Ar^3$ may be substituted by an aryl, a heteroaryl, an alkyl, a trisubstituted silyl (a silyl trisubstituted by an aryl and/or an alkyl), or a cyano, and m represents an integer of 1 to 4.

The amine having a stilbene structure is more preferably a diaminostilbene represented by the following formula.

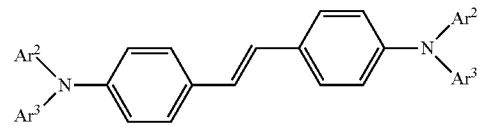

In the formula, $Ar^2$ and $Ar^3$ each independently represent an aryl having 6 to 30 carbon atoms, while $Ar^2$ and $Ar^3$ may be substituted by an aryl, a heteroaryl, an alkyl, a trisubstituted silyl (a silyl trisubstituted by an aryl and/or an alkyl), or a cyano.

Specific examples of the aryl having 6 to 30 carbon atoms include a phenyl, a naphthyl, an acenaphthylenyl, a fluorenyl, a phenalenyl, a phenanthrenyl, an anthryl, a fluoranthenyl, a triphenylenyl, a pyrenyl, a chrysenyl, a naphthacenyl, a perylenyl, a stilbenyl, a distyrylphenyl, a distyrylbiphenylyl, and a distyrylfluorenyl.

Specific examples of the amine having a stilbene structure include N,N,N',N'-tetra(4-biphenylyl)-4,4'-diaminostilbene, N,N,N',N'-tetra(1-naphthyl)-4,4'-diaminostilbene, N,N,N',N'-tetra(2-naphthyl)-4,4'-diaminostilbene, N,N'-di(2-naphthyl)-N,N'-diphenyl-4,4'-diaminostilbene, N,N'-di(9-phenanthryl)-N,N'-diphenyl-4,4'-diaminostilbene, 4,4'-bis[4"-bis(diphenylamino)styryl]-biphenyl, 1,4-bis[4'-bis(diphenylamino)styryl]-benzene, 2,7-bis[4'-bis(diphenylamino)styryl]-9,9-dimethylfluorene, 4,4'-bis(9-ethyl-3-carbazovinylene)-biphenyl, and 4,4'-bis(9-phenyl-3-carbazovinylene)-biphenyl.

Furthermore, amines having a stilbene structure described in JP 2003-347056 A, JP 2001-307884 A, and the like may also be used.

Examples of the perylene derivative include 3,10-bis(2,6-dimethylphenyl)perylene, 3,10-bis(2,4,6-trimethylphenyl)perylene, 3,10-diphenylperylene, 3,4-diphenylperylene, 2,5,8,11-tetra-t-butylperylene, 3,4,9,10-tetraphenylperylene, 3-(1'-pyrenyl)-8,11-di(t-butyl)perylene, 3-(9'-anthryl)-8,11-di(t-butyl)perylene, and 3,3'-bis(8,11-di(t-butyl)perylenyl).

Furthermore, perylene derivatives described in JP 11-97178 A, JP 2000-133457 A, JP 2000-26324 A, JP 2001-267079 A, JP 2001-267078 A, JP 2001-267076 A, JP 2000-34234 A, JP 2001-267075 A, JP 2001-217077 A, and the like may also be used.

Examples of the borane derivative include 1,8-diphenyl-10-(dimesitylboryl)anthracene, 9-phenyl-10-(dimesitylboryl)anthracene, 4-(9'-anthryl)dimesitylborylnaphthalene, 4-(10'-phenyl-9'-anthryl)dimesitylborylnaphthalene, 9-(dimesitylboryl)anthracene, 9-(4'-biphenylyl)-10-(dimesitylboryl)anthracene, and 9-(4'-(N-carbazolyl)phenyl)-10-(dimesitylboryl)anthracene.

Furthermore, borane derivatives described in WO 2000/40586 A and the like may also be used.

An aromatic amine derivative is represented by the following formula, for example.

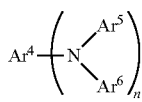

In the formula, $Ar^4$ represents an n-valent group derived from an aryl having 6 to 30 carbon atoms, and $Ar^5$ and $Ar^6$ each independently represent an aryl having 6 to 30 carbon atoms, while $Ar^4$ to $Ar^6$ may be substituted by an aryl, a heteroaryl, an alkyl, a trisubstituted silyl (a silyl trisubstituted by an aryl and/or an alkyl), or a cyano, and n represents an integer of 1 to 4.

Particularly, an aromatic amine derivative in which $Ar^4$ represents a divalent group derived from anthracene, chrysene, fluorene, benzofluorene, or pyrene, $Ar^5$ and $Ar^6$ each independently represent an aryl having 6 to 30 carbon atoms, $Ar^4$ to $Ar^6$ may be substituted by an aryl, a heteroaryl, an alkyl, a trisubstituted silyl (a silyl trisubstituted by an aryl and/or an alkyl), or a cyano, and n represents 2, is more preferable.

Specific examples of the aryl having 6 to 30 carbon atoms include a phenyl, a naphthyl, an acenaphthylenyl, a fluorenyl, a phenalenyl, a phenanthrenyl, an anthryl, a fluoranthenyl, a triphenylenyl, a pyrenyl, a chrysenyl, a naphthacenyl, a perylenyl, and a pentacenyl.

Examples of a chrysene-based aromatic amine derivative include N,N,N',N'-tetraphenylchrysene-6,12-diamine, N,N,N',N'-tetra(p-tolyl)chrysene-6,12-diamine, N,N,N',N'-tetra(m-tolyl)chrysene-6,12-diamine, N,N,N',N'-tetrakis(4-isopropylphenyl)chrysene-6,12-diamine, N,N,N',N'-tetra(naphthalen-2-yl)chrysene-6,12-diamine, N,N'-diphenyl-N,N'-di(p-tolyl)chrysene-6,12-diamine, N,N'-diphenyl-N,N'-bis(4-ethylphenyl)chrysene-6,12-diamine, N,N'-diphenyl-N,N'-bis(4-ethylphenyl)chrysene-6,12-diamine, N,N'-diphenyl-N,N'-bis(4-isopropylphenyl)chrysene-6,12-diamine, N,N'-diphenyl-N,N'-bis(4-t-butylphenyl)chrysene-6,12-diamine, and N,N'-bis(4-isopropylphenyl)-N,N'-di(p-tolyl)chrysene-6,12-diamine.

Furthermore, examples of a pyrene-based aromatic amine derivative include N,N,N',N'-tetraphenylpyrene-1,6-diamine, N,N,N',N'-tetra(p-tolyl)pyrene-1,6-diamine, N,N,N',N'-tetra(m-tolyl)pyrene-1,6-diamine, N,N,N',N'-tetrakis(4-isopropyophenyl)pyrene-1,6-diamine, N,N,N',N'-tetrakis(3,4-dimethylphenyl)pyrene-1,6-diamine, N,N'-diphenyl-N,N'-di(p-tolyl)pyrene-1,6-diamine, N,N'-diphenyl-N,N'-bis(4-ethylphenyl)pyrene-1,6-diamine, N,N'-diphenyl-N,N'-bis(4-ethylphenyl)pyrene-1,6-diamine, N,N'-diphenyl-N,N'-bis(4-isopropylphenyl)pyrene-1,6-diamine, N,N'-diphenyl-N,N'-bis(4-t-butylphenyl)pyrene-1,6-diamine, N,N'-bis(4-isopropylphenyl)-N,N'-di(p-tolyl)pyrene-1,6-diamine, N,N,N',N'-tetrakis(3,4-dimethylphenyl)-3,8-diphenylpyrene-1,6-diamine, N,N,N,N-tetraphenylpyrene-1,8-diamine, N,N'-bis(biphenyl-4-yl)-N,N'-diphenylpyrene-1,8-diamine, and $N^1,N^6$-diphenyl-$N^1,N^6$-bis(4-trimethylsilanyl-phenyl)-1H,8H-pyrene-1,6-diamine.

Furthermore, examples of an anthracene-based aromatic amine derivative include N,N,N,N-tetraphenylanthracene-9,10-diamine, N,N,N',N'-tetra(p-tolyl)anthracene-9,10-diamine, N,N,N',N'-tetra(m-tolyl)anthracene-9,10-diamine, N,N,N',N'-tetrakis(4-isopropylphenyl)anthracene-9,10-diamine, N,N'-diphenyl-N,N'-di(p-tolyl)anthracene-9,10-diamine, N,N'-diphenyl-N,N'-di(m-tolyl)anthracene-9,10-diamine, N,N'-diphenyl-N,N'-bis(4-ethylphenyl)anthracene-9,10-diamine, N,N'-diphenyl-N,N'-bis(4-ethylphenyl)anthracene-9,10-diamine, N,N'-diphenyl-N,N'-bis(4-isopropylphenyl)anthracene-9,10-diamine, N,N'-diphenyl-N,N'-bis(4-t-butylphenyl)anthracene-9,10-diamine, N,N'-bis(4-isopropylphenyl)-N,N'-di(p-tolyl)anthracene-9,10-diamine, 2,6-di-t-butyl-N,N,N',N'-tetra(p-tolyl)anthracene-9,10-diamine, 2,6-di-t-butyl-N,N'-diphenyl-N,N'-bis(4-isopropylphenyl)anthracene-9,10-diamine, 2,6-di-t-butyl-N,N'-bis(4-isopropylphenyl)-N,N'-di(p-tolyl) anthracene-9,10-diamine, 2,6-dicyclohexyl-N,N'-bis(4-isopropylphenyl)-N,N'-di(p-tolyl)anthracene-9,10-diamine, 2,6-dicyclohexyl-N,N'-bis(4-isopropylphenyl)-N,N'-bis(4-t-butylphenyl)anthracene-9,10-diamine, 9,10-bis(4-diphenylaminophenyl)anthracene, 9,10-bis(4-di(1-naphthylamino)phenyl)anthracene, 9,10-bis(4-di(2-naphthylamino)phenyl)anthracene, 10-di-p-tolylamino-9-(4-di-p-tolylamino-1-naphthyl)anthracene, 10-diphenylamino-9-(4-diphenylamino-1-naphthyl)anthracene, and 10-diphenylamino-9-(6-diphenylamino-2-naphthyl)anthracene.

Furthermore, other examples include [4-(4-diphenylamino-phenyl)naphthalen-1-yl]-diphenylamine, [6-(4-diphenylamino-phenyl)naphthalen-2-yl]-diphenylamine, 4,4'-bis[4-diphenylaminonaphthalen-1-yl]biphenyl, 4,4'-bis[6-diphenylaminonaphthalen-2-yl]biphenyl, 4,4''-bis[4-diphenylaminonaphthalen-1-yl]-p-terphenyl, and 4,4''-bis[6-diphenylaminonaphthalen-2-yl]-p-terphenyl.

Furthermore, aromatic amine derivatives described in JP 2006-156888A and the like may also be used.

Examples of the coumarin derivative include coumarin-6 and coumarin-334.

Furthermore, coumarin derivatives described in JP 2004-43646 A, JP 2001-76876 A, JP 6-298758 A, and the like may also be used.

Examples of the pyran derivative include DCM and DCJTB described below.

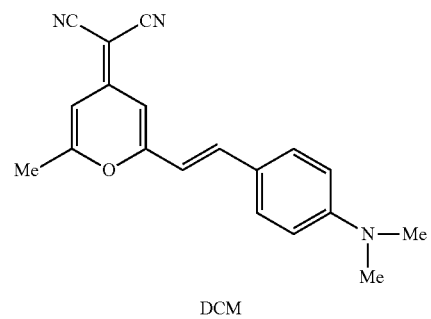

DCM

-continued

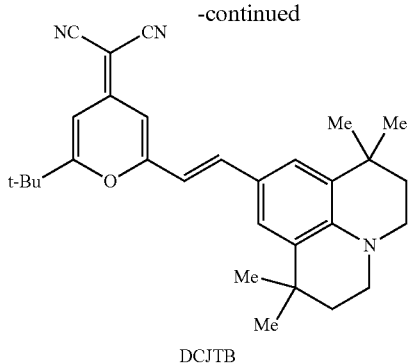

DCJTB

Furthermore, pyran derivatives described in JP 2005-126399 A, JP 2005-097283 A, JP 2002-234892 A, JP 2001-220577 A, JP 2001-081090 A, JP 2001-052869 A, and the like may also be used.

4-6. Electron Injection Layer and Electron Transport Layer in Organic Electroluminescent Element The electron injection layer 107 plays a role of efficiently injecting an electron migrating from the negative electrode 108 into the light emitting layer 105 or the electron transport layer 106. The electron transport layer 106 plays a role of efficiently transporting an electron injected from the negative electrode 108, or an electron injected from the negative electrode 108 through the electron injection layer 107 to the light emitting layer 105. The electron transport layer 106 and the electron injection layer 107 are each formed by laminating and mixing one or more kinds of electron transporting/injecting materials, or by a mixture of an electron transporting/injecting material and a polymeric binder.

An electron injection/transport layer is a layer that manages injection of an electron from a negative electrode and transport of an electron, and is preferably a layer that has high electron injection efficiency and can efficiently transport an injected electron. For this purpose, a substance which has high electron affinity, large electron mobility, and excellent stability, and in which impurities that serve as traps are not easily generated at the time of manufacturing and at the time of use, is preferable. However, when a transport balance between a hole and an electron is considered, in a case where the electron injection/transport layer mainly plays a role of efficiently preventing a hole coming from a positive electrode from flowing toward a negative electrode side without being recombined, even if electron transporting ability is not so high, an effect of enhancing light emission efficiency is equal to that of a material having high electron transporting ability. Therefore, the electron injection/transport layer according to the present embodiment may also include a function of a layer that can efficiently prevent migration of a hole.

A material (electron transport material) for forming the electron transport layer 106 or the electron injection layer 107 can be arbitrarily selected for use from a compound conventionally used as an electron transfer compound in a photoconductive material, and known compounds that are used in an electron injection layer and an electron transport layer of an organic EL element.

A material used in an electron transport layer or an electron injection layer preferably includes at least one selected from a compound formed of an aromatic ring or a heteroaromatic ring including one or more kinds of atoms selected from carbon, hydrogen, oxygen, sulfur, silicon, and phosphorus atoms, a pyrrole derivative and a fused ring derivative thereof, and a metal complex having an electron-accepting nitrogen atom. Specific examples of the material include a fused ring-based aromatic ring derivative of naphthalene, anthracene, or the like, a styryl-based aromatic ring derivative represented by 4,4'-bis(diphenylethenyl)biphenyl, a perinone derivative, a coumarin derivative, a naphthalimide derivative, a quinone derivative such as anthraquinone or diphenoquinone, a phosphorus oxide derivative, a carbazole derivative, and an indole derivative. Examples of the metal complex having an electron-accepting nitrogen atom include a hydroxyazole complex such as a hydroxyphenyloxazole complex, an azomethine complex, a tropolone metal complex, a flavonol metal complex, and a benzoquinoline metal complex. These materials are used singly, but may also be used in a mixture with other materials.

Furthermore, specific examples of other electron transfer compounds include a pyridine derivative, a naphthalene derivative, an anthracene derivative, a phenanthroline derivative, a perinone derivative, a coumarin derivative, a naphthalimide derivative, an anthraquinone derivative, a diphenoquinone derivative, a diphenylquinone derivative, a perylene derivative, an oxadiazole derivative (1,3-bis[(4-t-butylphenyl)-1,3,4-oxadiazolyl]phenylene and the like), a thiophene derivative, a triazole derivative (N-naphthyl-2,5-diphenyl-1,3,4-triazole and the like), a thiadiazole derivative, a metal complex of an oxine derivative, a quinolinol-based metal complex, a quinoxaline derivative, a polymer of a quinoxaline derivative, a benzazole compound, a gallium complex, a pyrazole derivative, a perfluorinated phenylene derivative, a triazine derivative, a pyrazine derivative, a benzoquinoline derivative (2,2'-bis(benzo[h]quinolin-2-yl)-9,9'-spirobifluorene and the like), an imidazopyridine derivative, a borane derivative, a benzimidazole derivative (tris(N-phenylbenzimidazol-2-yl)benzene and the like), a benzoxazole derivative, a benzothiazole derivative, a quinoline derivative, an oligopyridine derivative such as terpyridine, a bipyridine derivative, a terpyridine derivative (1,3-bis(4'-(2,2':6'2"-terpyridinyl))benzene and the like), a naphthyridine derivative (bis(1-naphthyl)-4-(1,8-naphthyridin-2-yl)phenylphosphine oxide and the like), an aldazine derivative, a carbazole derivative, an indole derivative, a phosphorus oxide derivative, and a bisstyryl derivative.

Furthermore, a metal complex having an electron-accepting nitrogen atom can also be used, and examples thereof include a quinolinol-based metal complex, a hydroxyazole complex such as a hydroxyphenyloxazole complex, an azomethine complex, a tropolone-metal complex, a flavonol-metal complex, and a benzoquinoline-metal complex.

The materials described above are used singly, but may also be used in a mixture with other materials.

Among the materials described above, a quinolinol-based metal complex, a bipyridine derivative, a phenanthroline derivative, and a borane derivative are preferable.

A quinolinol-based metal complex is a compound represented by the following general formula (E-1).

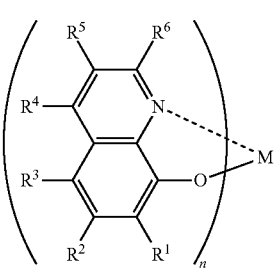

(E-1)

In the formula, $R^1$ to $R^6$ each independently represent a hydrogen atom, a fluorine atom, an alkyl, an aralkyl, an alkenyl, a cyano, an alkoxy, or an aryl, M represents Li, Al, Ga, Be, or Zn, and n represents an integer of 1 to 3.

Specific examples of the quinolinol-based metal complex include 8-quinolinollithium, tris(8-quinolinolato)aluminum, tris(4-methyl-8-quinolinolato)aluminum, tris(5-methyl-8-quinolinolato)aluminum, tris(3,4-dimethyl-8-quinolinolato)aluminum, tris(4,5-dimethyl-8-quinolinolato)aluminum, tris(4,6-dimethyl-8-quinolinolato)aluminum, bis(2-methyl-8-quinolinolato) (phenolato)aluminum, bis(2-methyl-8-quinolinolato) (2-methylphenolato)aluminum, bis(2-methyl-8-quinolinolato) (3-methylphenolato)aluminum, bis(2-methyl-8-quinolinolato) (4-methylphenolato)aluminum, bis(2-methyl-8-quinolinolato) (2-phenylphenolato)aluminum, bis(2-methyl-8-quinolinolato) (3-phenylphenolato)aluminum, bis(2-methyl-8-quinolinolato) (4-phenylphenolato)aluminum, bis(2-methyl-8-quinolinolato) (2,3-dimethylphenolato)aluminum, bis(2-methyl-8-quinolinolato) (2,6-dimethylphenolato)aluminum, bis(2-methyl-8-quinolinolato) (3,4-dimethylphenolato)aluminum, bis(2-methyl-8-quinolinolato) (3,5-dimethylphenolato)aluminum, bis(2-methyl-8-quinolinolato) (3,5-di-t-butylphenolato)aluminum, bis(2-methyl-8-quinolinolato)(2,6-diphenylphenolato)aluminum, bis(2-methyl-8-quinolinolato)(2,4,6-triphenylphenolato)aluminum, bis(2-methyl-8-quinolinolato) (2,4,6-trimethylphenolato)aluminum, bis(2-methyl-8-quinolinolato) (2,4,5,6-tetramethylphenolato)aluminum, bis(2-methyl-8-quinolinolato) (1-naphtholato) aluminum, bis(2-methyl-8-quinolinolato) (2-naphtholato) aluminum, bis(2,4-dimethyl-8-quinolinolato) (2-phenylphenolato)aluminum, bis(2,4-dimethyl-8-quinolinolato) (3-phenylphenolato)aluminum, bis(2,4-dimethyl-8-quinolinolato)(4-phenylphenolato)aluminum, bis(2,4-dimethyl-8-quinolinolato) (3,5-dimethylphenolato)aluminum, bis(2,4-dimethyl-8-quinolinolato) (3,5-di-t-butylphenolato) aluminum, bis(2-methyl-8-quinolinolato)aluminum-μ-oxo-bis(2-methyl-8-quinolinolato)aluminum, bis(2,4-dimethyl-8-quinolinolato)aluminum-μ-oxo-bis(2,4-dimethyl-8-quinolinolato)aluminum, bis(2-methyl-4-ethyl-8-quinolinolato)aluminum-μ-oxo-bis(2-ethyl-4-ethyl-8-quinolinolato)aluminum, bis(2-methyl-4-methoxy-8-quinolinolato)aluminum-μ-oxo-bis(2-methyl-4-methoxy-8-quinolinolato)aluminum, bis(2-methyl-5-cyano-8-quinolinolato)aluminum-μ-oxo-bis(2-methyl-5-cyano-8-quinolinolato)aluminum, bis(2-methyl-5-trifluoromethyl-8-quinolinolato)aluminum-μ-oxo-bis(2-methy-5-trifluoromethyl-8-quinolinolato)aluminum, and bis(10-hydroxybenzo[h]quinoline)beryllium.

A bipyridine derivative is a compound represented by the following general formula (E-2).

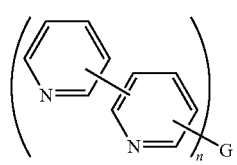

(E-2)

In the formula, G represents a simple bond or an n-valent linking group, and n represents an integer of 2 to 8. A carbon not used for a pyridine-pyridine bond or a pyridine-G bond may be substituted by an aryl, a heteroaryl, an alkyl, or a cyano.

Examples of G in general formula (E-2) include groups represented by the following structural formulas. Note that R's in the following structural formulas each independently represent a hydrogen atom, a methyl, an ethyl, an isopropyl, a cyclohexyl, a phenyl, a 1-naphthyl, a 2-naphthyl, a biphenylyl, or a terphenylyl.

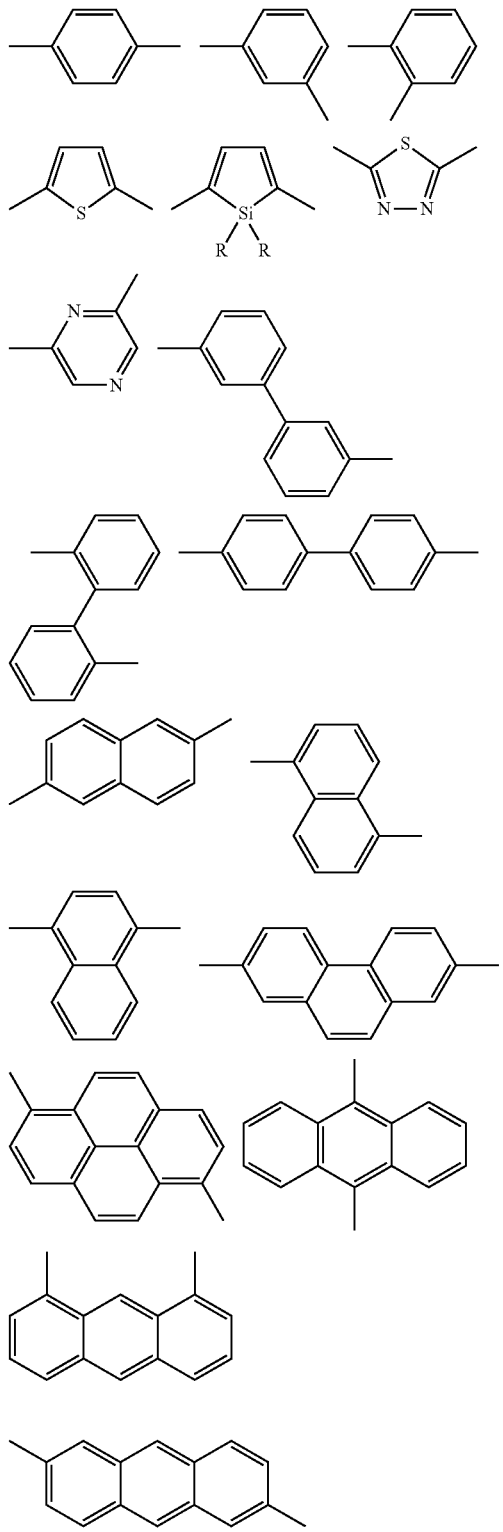

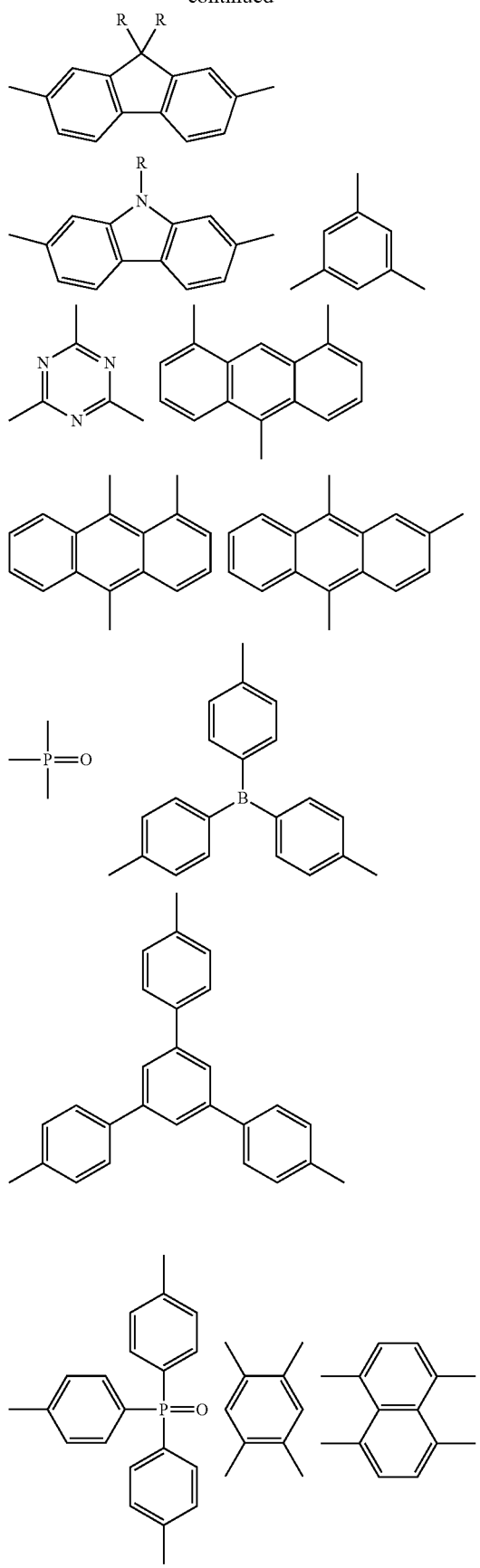

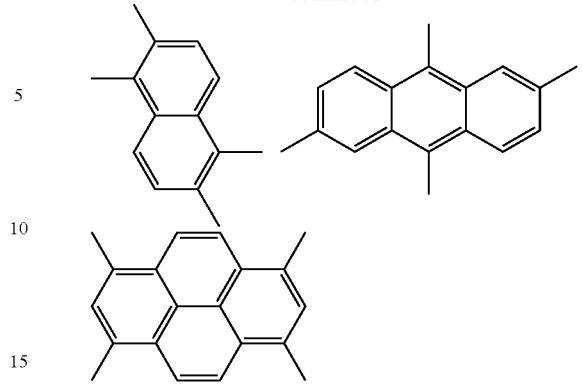

Specific examples of the pyridine derivative include 2,5-bis(2,2'-pyridin-6-yl)-1,1-dimethyl-3,4-diphenylsilole, 2,5-bis(2,2'-pyridin-6-yl)-1,1-dimethyl-3,4-dimesitylsilole, 2,5-bis(2,2'-pyridin-5-yl)-1,1-dimethyl-3,4-diphenylsilole, 2,5-bis(2,2'-pyridin-5-yl)-1,1-dimethyl-3,4-dimesitylsilole, 9,10-di(2,2'-pyridin-6-yl)anthracene, 9,10-di(2,2'-pyridin-5-yl)anthracene, 9,10-di(2,3'-pyridin-6-yl)anthracene, 9,10-di(2,3'-pyridin-5-yl)anthracene, 9,10-di(2,3'-pyridin-6-yl)-2-phenylanthracene, 9,10-di(2,3'-pyridin-5-yl)-2-phenylanthracene, 9,10-di(2,2'-pyridin-6-yl)-2-phenylanthracene, 9,10-di(2,2'-pyridin-5-yl)-2-phenylanthracene, 9,10-di(2,4'-pyridin-6-yl)-2-phenylanthracene, 9,10-di(2,4'-pyridin-5-yl)-2-phenylanthracene, 9,10-di(3,4'-pyridin-6-yl)-2-phenylanthracene, 9,10-di(3,4'-pyridin-5-yl)-2-phenylanthracene, 3,4-diphenyl-2,5-di(2,2'-pyridin-6-yl)thiophene, 3,4-diphenyl-2,5-di(2,3'-pyridin-5-yl)thiophene, and 6',6"-di(2-pyridyl)-2,2':4',4":2",2'"-quaterpyridine.

A phenanthroline derivative is a compound represented by the following general formula (E-3-1) or (E-3-2).

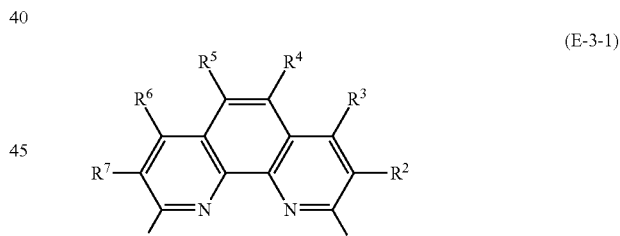
(E-3-1)

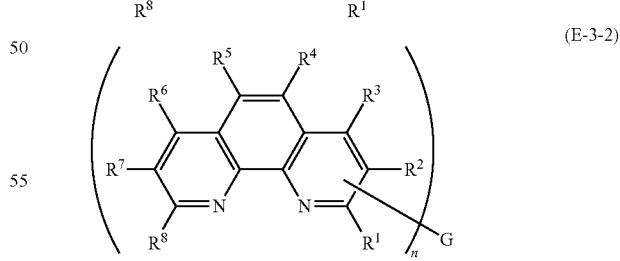
(E-3-2)

In the formula, $R^1$ to $R^8$ each independently represent a hydrogen atom, an alkyl (a methyl, an ethyl, an isopropyl, a hydroxyethyl, a methoxymethyl, a trifluoromethyl, a t-butyl, a cyclopentyl, a cyclohexyl, a benzyl, or the like), an alkyloxy (a methoxy, an ethoxy, an isopropoxy, a butoxy, or the like), an aryloxy (a phenoxy, a 1-naphthyloxy, a 4-tolyloxy, or the like), a halogen atom (a fluorine atom, a chlorine atom, a bromine atom, an iodine atom, or the like), an aryl (a phenyl, a naphthyl, a p-tolyl, a p-chlorophenyl, or the like), an alkylthio (a methylthio, an ethylthio, an isopropylthio, or the like), an arylthio (a phenylthio or the like), a cyano, a nitro, and a heterocyclic ring (a pyrrole, a pyrrolidyl, a pyrazolyl, an imidazolyl, a pyridyl, a benzimidazolyl, a benzthiazolyl, a benzoxazolyl, or the like). An alkyl or a halogen atom is preferable. A methyl, an ethyl, an isopropyl, or a fluorine atom is more preferable. Adjacent groups may be bonded to each other to form a fused ring. G represents a simple bond or an n-valent linking group, and n represents an integer of 2 to 8. Examples of G of general formula (E-3-2) include the same groups as those described in the section of the bipyridine derivative. In the above formula (E-3-2), any one of $R^1$ to $R^8$ is bonded to G.

Specific examples of the phenanthroline derivative include 4,7-diphenyl-1,10-phenanthroline, 2,9-dimethyl-4,7-diphenyl-1,10-phenanthroline, 9,10-di(1,10-phenanthrolin-2-yl)anthracene, 2,6-di(1,10-phenanthrolin-5-yl)pyridine, 1,3,5-tri(1,10-phenanthrolin-5-yl)benzene, 9,9'-difluoro-bi(1,10-phenanthrolin-5-yl), bathocuproine, and 1,3-bis(2-phenyl-1,10-phenanthrolin-9-yl)benzene.

Particularly, a case of using a phenanthroline derivative in an electron transport layer or an electron injection layer will be described. In order to obtain stable light emission over a long time, a material having excellent thermal stability or thin film formability is desired. Among phenanthroline derivatives, a phenanthroline derivative in which a substituent itself has a three-dimensional steric structure, a phenanthroline derivative having a three-dimensional steric structure as a result of steric repulsion between a substituent and a phenanthroline skeleton or between a substituent and an adjacent substituent, or a phenanthroline derivative having a plurality of phenanthroline skeletons linked together, is preferable. Furthermore, in a case of linking a plurality of phenanthroline skeletons, a compound containing a conjugated bond, a substituted or unsubstituted aromatic hydrocarbon, or a substituted or unsubstituted heterocyclic aromatic ring in a linked unit, is more preferable.

A borane derivative is a compound represented by the following general formula (E-4), specific examples of which are disclosed in JP 2007-27587 A.

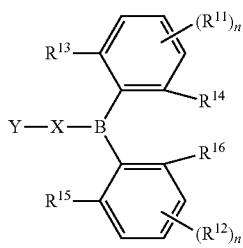

(E-4)

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and a cyano, $R^{13}$ to $R^{16}$ each independently represent an optionally substituted alkyl or an optionally substituted aryl, X represents an optionally substituted arylene, Y represents an optionally substituted aryl having 16 or fewer carbon atoms, a substituted boryl, or an optionally substituted carbazolyl, and n's each independently represent an integer of 0 to 3. Examples of a substituent in a case of being "optionally substituted" or "substituted" include an aryl, a heteroaryl, and an alkyl.

Among compounds represented by the above general formula (E-4), a compound represented by the following general formula (E-4-1), and compounds represented by the following general formulas (E-4-1-1) to (E-4-1-4) are preferable. Specific examples of the compounds include 9-[4-(4-dimesitylborylnaphthalen-1-yl)phenyl]carbazole and 9-[4-(4-dimesitylborylnaphthalen-1-yl)naphthalen-1-yl]carbazole.

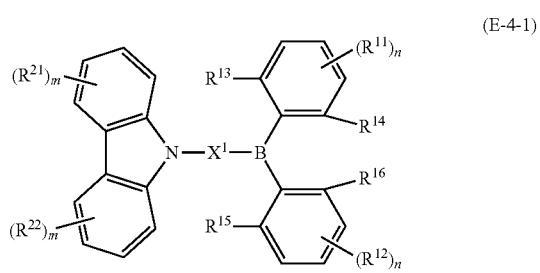

(E-4-1)

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and a cyano, $R^{13}$ to $R^{16}$ each independently represent an optionally substituted alkyl or an optionally substituted aryl, $R^{21}$ and $R^{22}$ each independently represent at least one of a hydrogen atom, an alkyl, an optionally substituted aryl, a substituted silyl, an optionally substituted nitrogen-containing heterocyclic ring, and a cyano, $X^1$ represents an optionally substituted arylene having 20 or fewer carbon atoms, n's each independently represent an integer of 0 to 3, and m's each independently represent an integer of 0 to 4. Examples of a substituent in a case of being "optionally substituted" or "substituted" include an aryl, a heteroaryl, and an alkyl.

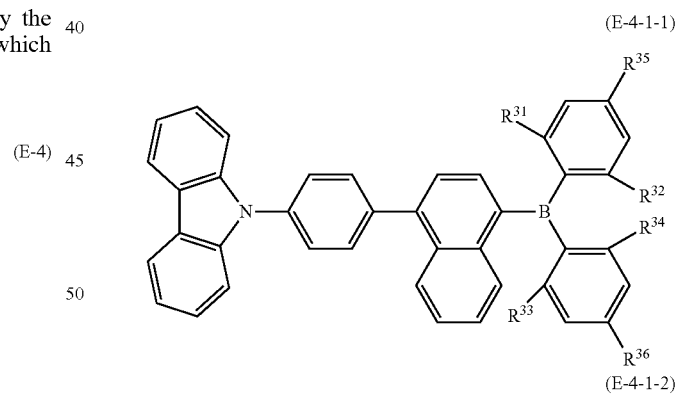

(E-4-1-1)

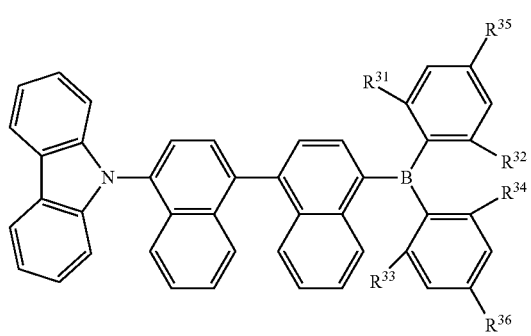

(E-4-1-2)

(E-4-1-3)

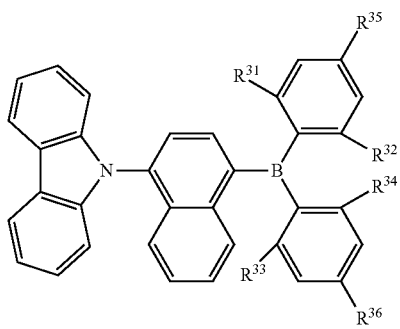

(E-4-2-1)

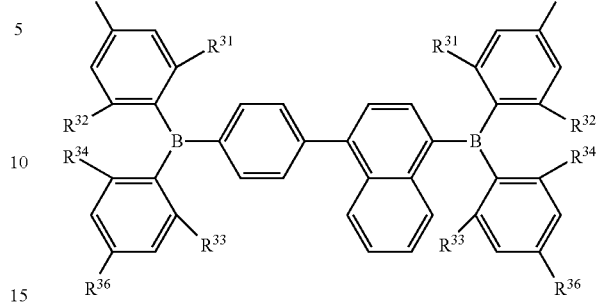

In the formula, $R^{31}$ to $R^{34}$ each independently represent any one of a methyl, an isopropyl, and a phenyl, and $R^{35}$ and $R^{36}$ each independently represent any one of a hydrogen atom, a methyl, an isopropyl, and a phenyl.

Among compounds represented by the above general formula (E-4), a compound represented by the following general formula (E-4-3) and a compound represented by the following general formula (E-4-3-1) or (E-4-3-2) are preferable.

(E-4-1-4)

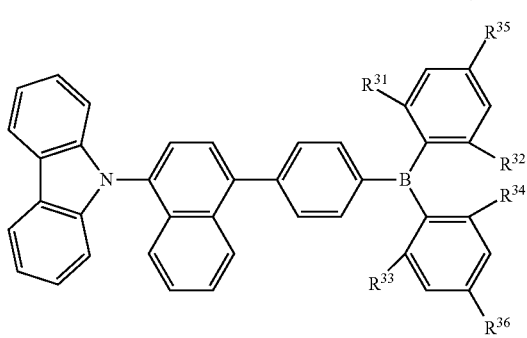

In the formula, $R^{31}$ to $R^{34}$ each independently represent any one of a methyl, an isopropyl, and a phenyl, and $R^{35}$ and $R^{36}$ each independently represent any one of a hydrogen atom, a methyl, an isopropyl, and a phenyl.

Among compounds represented by the above general formula (E-4), a compound represented by the following general formula (E-4-2) and a compound represented by the following general formula (E-4-2-1) are preferable.

(E-4-3)

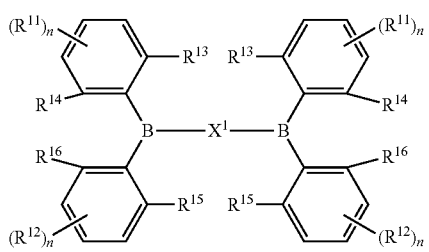

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and a cyano, $R^{13}$ to $R^{16}$ each independently represent an optionally substituted alkyl or an optionally substituted aryl, $X^1$ represents an optionally substituted arylene having 10 or fewer carbon atoms, $Y^1$ represents an optionally substituted aryl having 14 or fewer carbon atoms, and n's each independently represent an integer of 0 to 3. Examples of a substituent in a case of being "optionally substituted" or "substituted" include an aryl, a heteroaryl, and an alkyl.

(E-4-2)

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and a cyano, $R^{13}$ to $R^{16}$ each independently represent an optionally substituted alkyl or an optionally substituted aryl, $X^1$ represents an optionally substituted arylene having 20 or fewer carbon atoms, and n's each independently represent an integer of 0 to 3. Examples of a substituent in a case of being "optionally substituted" or "substituted" include an aryl, a heteroaryl, and an alkyl.

(E-4-3-1)

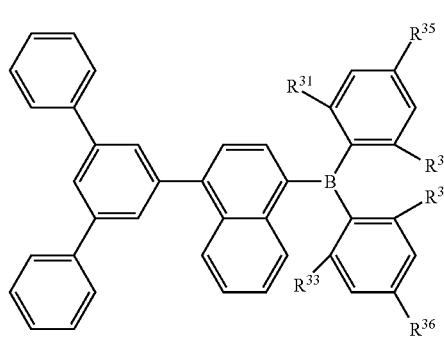

-continued

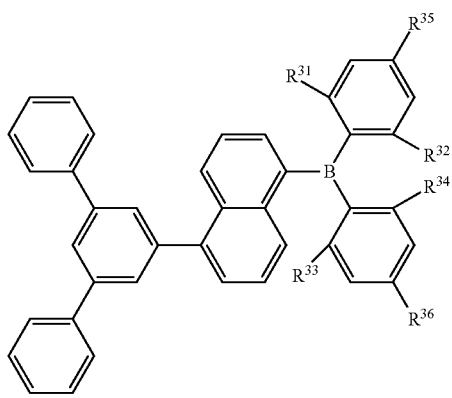
(E-4-3-2)

In each of the formulas, $R^{31}$ to $R^{34}$ each independently represent any one of a methyl, an isopropyl, and a phenyl, and $R^{35}$ and $R^{36}$ each independently represent any one of a hydrogen atom, a methyl, an isopropyl, and a phenyl.

A benzimidazole derivative is a compound represented by the following general formula (E-5).

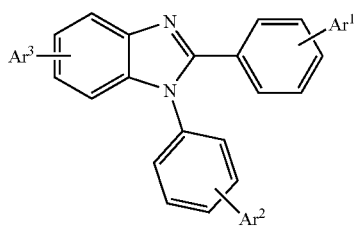
(E-5)

In the formula, $Ar^1$ to $Ar^3$ each independently represent a hydrogen atom or an optionally substituted aryl having 6 to 30 carbon atoms. Examples of a substituent in a case of being "optionally substituted" include an aryl, a heteroaryl, an alkyl, and a cyano. Particularly, a benzimidazole derivative in which $Ar^1$ is an anthryl optionally substituted by an aryl, a heteroaryl, an alkyl, or a cyano is preferable.

Specific examples of the aryl having 6 to 30 carbon atoms include a phenyl, a 1-naphthyl, a 2-naphthyl, an acenaphthylen-1-yl, an acenaphthylen-3-yl, an acenaphthylen-4-yl, an acenaphthylen-5-yl, a fluoren-1-yl, a fluoren-2-yl, a fluoren-3-yl, a fluoren-4-yl, a fluoren-9-yl, a phenalen-1-yl, a phenalen-2-yl, a 1-phenanthryl, a 2-phenanthryl, a 3-phenanthryl, a 4-phenanthryl, a 9-phenanthryl, a 1-anthryl, a 2-anthryl, a 9-anthryl, a fluoranthen-1-yl, a fluoranthen-2-yl, a fluoranthen-3-yl, a fluoranthen-7-yl, a fluoranthen-8-yl, a triphenylen-1-yl, a triphenylen-2-yl, a pyren-1-yl, a pyren-2-yl, a pyren-4-yl, a chrysen-1-yl, a chrysen-2-yl, a chrysen-3-yl, a chrysen-4-yl, a chrysen-5-yl, a chrysen-6-yl, a naphthacen-1-yl, a naphthacen-2-yl, a naphthacen-5-yl, a perylen-1-yl, a perylen-2-yl, a perylen-3-yl, a pentacen-1-yl, a pentacen-2-yl, a pentacen-5-yl, and a pentacen-6-yl.

Specific examples of the benzimidazole derivative include 1-phenyl-2-(4-(10-phenylanthracen-9-yl)phenyl)-1H-benzo[d]imidazole, 2-(4-(10-(naphthalen-2-yl)anthracen-9-yl)phenyl)-1-phenyl-1H-benzo[d]imidazole, 2-(3-(10-(naphthalen-2-yl)anthracen-9-yl)phenyl)-1-phenyl-1H-benzo[d]imidazole, 5-(10-(naphthlen-2-yl)anthracen-9-yl)-1,2-diphenyl-1H-benzo[d]imidazole, 1-(4-(10-(naphthalen-2-yl)anthracen-9-yl)phenyl)-2-phenyl-1H-benzo[d]imidazole, 2-(4-(9,10-di(naphthalen-2-yl)anthracen-2-yl)phenyl)-1-phenyl-1H-benzo[d]imidazole, 1-(4-(9,10-di(naphthalen-2-yl)anthracen-2-yl)phenyl)-2-phenyl-1H-benzo[d]imidazole, and 5-(9,10-di(naphthalen-2-yl)anthracen-2-yl)-1,2-diphenyl-1H-benzo[d]imidazole.

An electron transport layer or an electron injection layer may further contain a substance that can reduce a material to form an electron transport layer or an electron injection layer. As this reducing substance, various substances are used as long as having reducibility to a certain extent. For example, at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal, can be suitably used.

Preferable examples of the reducing substance include an alkali metal such as Na (work function 2.36 eV), K (work function 2.28 eV), Rb (work function 2.16 eV), or Cs (work function 1.95 eV), and an alkaline earth metal such as Ca (work function 2.9 eV), Sr (work function 2.0 to 2.5 eV), or Ba (work function 2.52 eV). A reducing substance having a work function of 2.9 eV or less is particularly preferable. Among these substances, an alkali metal such as K, Rb, or Cs is a more preferable reducing substance, Rb or Cs is a still more preferable reducing substance, and Cs is the most preferable reducing substance. These alkali metals have particularly high reducing ability, and can enhance emission luminance of an organic EL element or can lengthen a lifetime thereof by adding the alkali metals in a relatively small amount to a material to form an electron transport layer or an electron injection layer. Furthermore, as the reducing substance having a work function of 2.9 eV or less, a combination of two or more kinds of these alkali metals is also preferable, and particularly, a combination including Cs, for example, a combination of Cs with Na, a combination of Cs with K, a combination of Cs with Rb, or a combination of Cs with Na and K, is preferable. By inclusion of Cs, reducing ability can be efficiently exhibited, and emission luminance of an organic EL element is enhanced or a lifetime thereof is lengthened by adding Cs to a material to form an electron transport layer or an electron injection layer.

4-7. Negative Electrode in Organic Electroluminescent Element

The negative electrode 108 plays a role of injecting an electron to the light emitting layer 105 through the electron injection layer 107 and the electron transport layer 106.

A material to form the negative electrode 108 is not particularly limited as long as being a substance capable of efficiently injecting an electron to an organic layer. However, a material similar to the materials to form the positive electrode 102 can be used. Among these materials, a metal such as tin, indium, calcium, aluminum, silver, copper, nickel, chromium, gold, platinum, iron, zinc, lithium, sodium, potassium, cesium, or magnesium, and alloys thereof (a magnesium-silver alloy, a magnesium-indium alloy, an aluminum-lithium alloy such as lithium fluoride/aluminum, and the like) are preferable. In order to enhance element characteristics by increasing electron injection efficiency, lithium, sodium, potassium, cesium, calcium, magnesium, or an alloy containing these low work function metals is effective. However, many of these low work function-metals are generally unstable in air. In order to ameliorate this problem, for example, a method for using an electrode having high stability obtained by doping an organic layer with a trace amount of lithium, cesium, or magnesium is known. Other examples of a dopant that can be used include an inorganic salt such as lithium fluoride, cesium fluoride, lithium oxide, or cesium oxide. However, the dopant is not limited thereto.

Furthermore, in order to protect an electrode, a metal such as platinum, gold, silver, copper, iron, tin, aluminum, or indium, an alloy using these metals, an inorganic substance such as silica, titania, or silicon nitride, polyvinyl alcohol, vinyl chloride, a hydrocarbon-based polymer compound, or the like may be laminated as a preferable example. A method for manufacturing these electrodes is not particularly limited as long as being able to obtain conduction, such as resistance heating, electron beam deposition, sputtering, ion plating, or coating.

4-8. Binder that May be Used in Each Layer

A material used in the above hole injection layer, hole transport layer, light emitting layer, electron transport layer, and electron injection layer can form each of the layers by being used singly. However, it is also possible to use the material by dispersing the material in a solvent-soluble resin such as polyvinyl chloride, polycarbonate, polystyrene, poly (N-vinylcarbazole), polymethyl methacrylate, polybutyl methacrylate, polyester, polysulfone, polyphenylene oxide, polybutadiene, a hydrocarbon resin, a ketone resin, a phenoxy resin, polyamide, ethyl cellulose, a vinyl acetate resin, an ABS resin, or a polyurethane resin, a curable resin such as a phenolic resin, a xylene resin, a petroleum resin, a urea resin, a melamine resin, an unsaturated polyester resin, an alkyd resin, an epoxy resin, or a silicone resin, or the like.

4-9. Method for Manufacturing Organic Electroluminescent Element

Each of layers constituting an organic EL element can be formed by forming a thin film of a material to constitute each of the layers by a method such as a vapor deposition method, resistance heating deposition, electron beam deposition, sputtering, a molecular lamination method, a printing method, a spin coating method, a casting method, a coating method, or a laser heating drawing method (LITI). The film thickness of each of the layers thus formed is not particularly limited, and can be appropriately set according to a property of a material, but is usually within a range of 2 nm to 5000 nm.

4-9-1. Wet Film Formation Method

The light emitting layer-forming composition (ink composition) of the present invention is formed using a wet film formation method.

In the wet film formation method, generally, a coating film is formed through an applying step of applying a light emitting layer-forming composition onto a substrate and a drying step of removing a solvent from the applied light emitting layer-forming composition. According to a difference in the applying step, a method using a spin coater is referred to as a spin coating method, a method using a slit coater is referred to as a slit coating method, a method using a plate is referred to gravure, offset, reverse offset, and flexographic printing methods, a method using an ink jet printer is referred to as an ink jet method, and a method for spraying the composition is referred to as a spraying method. Examples of the drying step include methods of air drying, heating, and drying under reduced pressure. The drying step may be performed only once, or may be performed a plurality of times using different methods and conditions. Furthermore, different methods may be used in combination like calcination under reduced pressure.

The wet film formation method is a film formation method using a solution, and examples thereof include a part of printing methods (ink jet method), a spin coating method, a casting method, and a coating method. Unlike a vacuum deposition method, the wet film formation method does not need to use an expensive vacuum deposition apparatus, and a film can be formed under atmospheric pressure. In addition, the wet film formation method can increase an area and manufacture a product continuously, leading to reduction in manufacturing cost.

Meanwhile, as compared with the vacuum deposition method, lamination is difficult by the wet film formation method. In a case where a laminated film is manufactured using the wet film formation method, it is necessary to prevent dissolution of a lower layer due to a composition of an upper layer, and techniques of using a composition with controlled solubility, crosslinking the lower layer, using orthogonal solvents (solvents which are not dissolved in each other), and the like are used. However, even with these techniques, it may be difficult to use the wet film formation method for application to all the films.

Therefore, in general, a method is adopted in which only some of the layers are formed by the wet film formation method and the remaining layers are formed by the vacuum deposition method to manufacture an organic EL element.

For example, a procedure for partially applying the wet film formation method to manufacture an organic EL element will be described below.

(Procedure 1) Film formation of positive electrode by vacuum deposition method
(Procedure 2) Film formation of hole injection layer by wet film formation method
(Procedure 3) Film formation of hole transport layer by wet film formation method
(Procedure 4) Film formation of light emitting layer-forming composition containing host material and dopant material by wet film formation method
(Procedure 5) Film formation of electron transport layer by vacuum deposition method
(Procedure 6) Film formation of electron injection layer by vacuum deposition method
(Procedure 7) Film formation of negative electrode by vacuum deposition method Through this procedure, an organic EL element formed of anode/hole injection layer/hole transport layer/light emitting layer including a host material and a dopant material/electron transport layer/electron injection layer/negative electrode is obtained.

4-9-2. Other Film Formation Method

For film formation of the light emitting layer-forming composition, a laser heating drawing method (LITI) can be used. LITI is a method for heating and depositing a compound attached to a base material with a laser, and the light emitting layer-forming composition can be used for a material to be applied to a base material.

4-9-3. Optional Step

A suitable treatment step, washing step, and drying step may be appropriately performed before and after each of the steps of film formation. Examples of the treatment step include an exposure treatment, a plasma surface treatment, an ultrasonic treatment, an ozone treatment, a washing treatment using a suitable solvent, and a heat treatment. Examples of the treatment step further include a series of steps for manufacturing a bank.

4-9-3-1. Bank (Partition Wall Material)

A photolithography technique can be used for manufacturing a bank. As a bank material that can be used for photolithography, a positive resist material and a negative resist material can be used. A patternable printing method such as an ink jet method, gravure offset printing, reverse offset printing, or screen printing can also be used. In this case, a permanent resist material can also be used.

Examples of a material used for a bank include a polysaccharide and a derivative thereof, a homopolymer and a copolymer of a hydroxyl-containing ethylenic monomer, a biopolymer compound, a polyacryloyl compound, polyester, polystyrene, polyimide, polyamideimide, polyetherimide, polysulfide, polysulfone, polyphenylene, polyphenyl ether, polyurethane, epoxy (meth)acrylate, melamine (meth)acrylate, polyolefin, cyclic polyolefin, an acrylonitrile-butadiene-styrene copolymer (ABS), a silicone resin, polyvinyl chloride, chlorinated polyethylene, chlorinated polypropylene, polyacetate, polynorbornene, a synthetic rubber, a fluorinated polymer such as polyfluorovinylidene, polytetrafluoroethylene, or polyhexafluoropropylene pyrene, a fluoroolefin-hydrocarbon olefin copolymer, and a fluorocarbon polymer, but are not limited thereto.

4-10. Example of Manufacturing Organic Electroluminescent Element

Next, an example of a method for manufacturing an organic EL element by a vacuum deposition method and a wet film formation method using an ink jet will be described.

4-10-1. Example of Manufacturing Organic Electroluminescent Element by Vacuum Deposition Method As an example of a method for manufacturing an organic EL element by a vacuum deposition method, a method for manufacturing an organic EL element formed of positive electrode/hole injection layer/hole transport layer/light emitting layer including a host material and a dopant material/electron transport layer/electron injection layer/negative electrode will be described. A thin film of a positive electrode material is formed on an appropriate substrate to manufacture a positive electrode by a vapor deposition method or the like, and then thin films of a hole injection layer and a hole transport layer are formed on this positive electrode. A thin film is formed thereon by co-depositing a host material and a dopant material to obtain a light emitting layer. An electron transport layer and an electron injection layer are formed on this light emitting layer, and a thin film formed of a substance for negative electrode is formed by a vapor deposition method or the like to obtain a negative electrode. An intended organic EL element is thereby obtained. Incidentally, in manufacturing the above organic EL element, it is also possible to manufacture the element by reversing the manufacturing order, that is, in order of a negative electrode, an electron injection layer, an electron transport layer, a light emitting layer, a hole transport layer, a hole injection layer, and a positive electrode.

Figure 2:
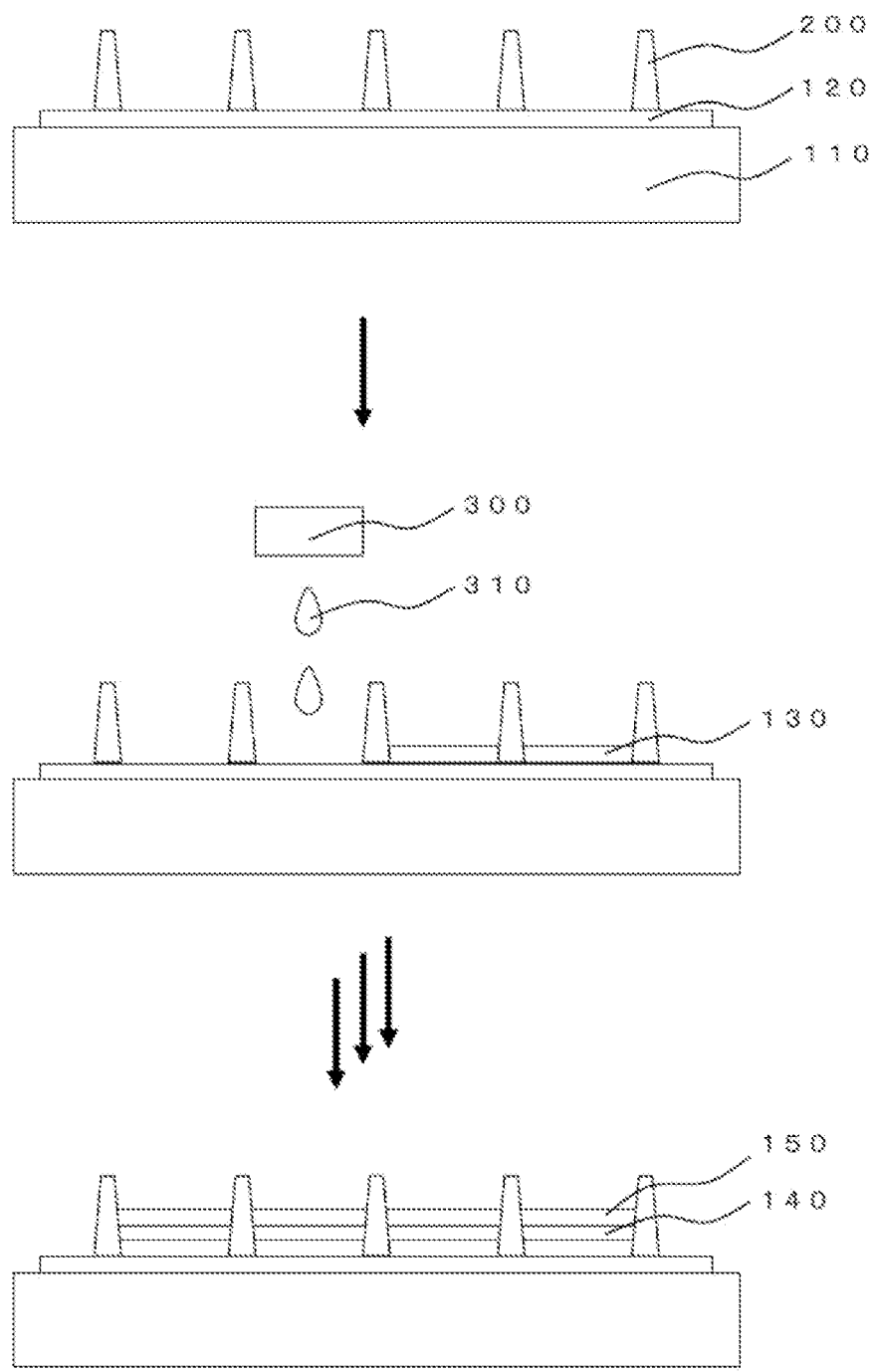
FIG. 2 is a diagram for explaining a method for manufacturing an organic EL element on a substrate having a bank by an ink jet method.

4-10-2. Example of Manufacturing Organic Electroluminescent Element by Ink Jet With reference to FIG. 2, a method for manufacturing an organic EL element on a substrate having a bank by an ink jet method will be described. First, a bank (200) is provided on an electrode (120) on a substrate (110). In this case, a coating film (130) can be manufactured by dropping an ink droplet (310) between the banks (200) from an ink jet head (300) and drying the ink droplet (310). If this process is repeated, a subsequent coating film (140) and a light emitting layer (150) are manufactured, and an electron transport layer, an electron injection layer, and an electrode are formed by a vacuum deposition method, an organic EL element in which a light emitting part is partitioned by a bank material can be manufactured.

4-11. Confirmation of Electric Characteristics and Luminescence Characteristics of Organic Electroluminescent Element In a case where a direct current voltage is applied to the organic EL element thus obtained, it is only required to apply the voltage by assuming a positive electrode as a positive polarity and assuming a negative electrode as a negative polarity. By applying a voltage of about 2 to 40 V, light emission can be observed from a transparent or semitransparent electrode side (the positive electrode or the negative electrode, or both the electrodes). This organic EL element also emits light even in a case where a pulse current or an alternating current is applied. Note that a waveform of an alternating current applied may be any waveform.

4-12. Application Example of Organic Electroluminescent Element

The present invention can also be applied to a display apparatus including an organic EL element, a lighting apparatus including an organic EL element, or the like.

The display apparatus or lighting apparatus including an organic EL element can be manufactured by a known method such as connecting the organic EL element according to the present embodiment to a known driving apparatus, and can be driven by appropriately using a known driving method such as direct driving, pulse driving, or alternating driving.

Examples of the display apparatus include a panel display such as a color flat panel display and a flexible display such as a flexible color organic EL display (see, for example, JP 13035066 A, JP 2003-321546 A, JP 2004-281806 A, and the like). Examples of a display method of the display include a matrix method and/or a segment method. Note that the matrix display and the segment display may co-exist in the same panel.

A matrix refers to a system in which pixels for display are arranged two-dimensionally as in a lattice form or a mosaic form, and characters or images are displayed by an assembly of pixels. The shape or size of the pixel depends on intended use. For example, for display of images and characters of a personal computer, a monitor, or a television, square pixels each having a size of 300 µm or less on each side are usually used, and in a case of a large-sized display such as a display panel, pixels having a size in the order of millimeters on each side are used. In a case of monochromic display, it is only required to arrange pixels of the same color. However, in a case of color display, display is performed by arranging pixels of red, green and blue. In this case, typically, delta type display and stripe type display are available. For this matrix driving method, either a line sequential driving method or an active matrix method may be employed. The line sequential driving method has an advantage of having a simpler structure. However, in consideration of operation characteristics, the active matrix method may be superior. Therefore, it is necessary to use the line sequential driving method and the active matrix method properly according to intended use.

In the segment method (type), a pattern is formed so as to display predetermined information, and a determined region emits light. Examples of the segment method include display of time or temperature in a digital clock or a digital thermometer, display of a state of operation in an audio instrument or an electromagnetic cooker, and panel display in an automobile.

Examples of the lighting apparatus include a lighting apparatuses for indoor lighting or the like, and a backlight of a liquid crystal display apparatus (see, for example, JP 2003-257621 A, JP 2003-277741 A, and JP 2004-119211 A). The backlight is mainly used for enhancing visibility of a display apparatus that is not self-luminous, and is used in a liquid crystal display apparatus, a timepiece, an audio apparatus, an automotive panel, a display panel, a sign, and the like. Particularly, in a backlight for use in a liquid crystal display apparatus, among the liquid crystal display apparatuses, for use in a personal computer in which thickness reduction has been a problem to be solved, in consideration of difficulty in thickness reduction because a conventional type backlight is formed from a fluorescent lamp or a light guide plate, a backlight using the luminescent element according to the present embodiment is characterized by its thinness and lightweightness.

EXAMPLES

Hereinafter, the present invention will be described more specifically based on Examples, but the present invention is not limited to these Examples.

Synthesis Example 1: Compound of Formula (1-91)

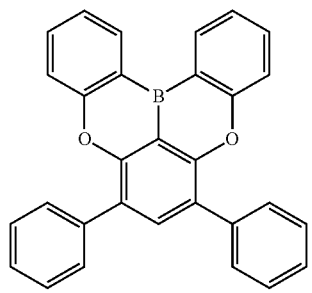

(1-91)

A flask containing 1,5-dibromo-2,4-difluorobenzene (30.0 g), phenol (31.2 g), potassium carbonate (45.7 g), and NMP (150 ml) was heated and stirred at 160° C. The reaction liquid was cooled to room temperature, and NMP was distilled off under reduced pressure. Subsequently, water and toluene were added thereto, and the mixture was partitioned. The solvent was distilled off under reduced pressure, and then the residue was purified using a silica gel short pass column (developing liquid: heptane/toluene=1 (volume ratio)). Thus, ((4,6-dibromo-1,3-phenylene)bis(oxy))dibenzene (44.0 g) was obtained.

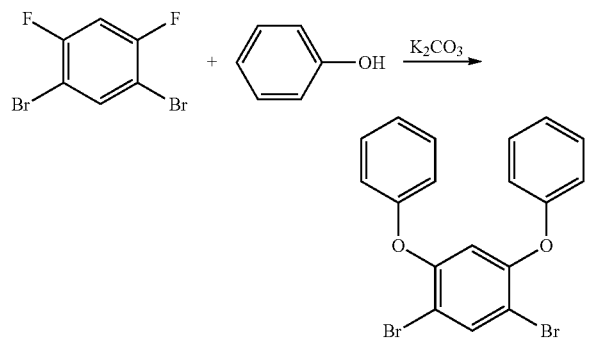

In a nitrogen atmosphere, Pd(PPh₃)₄ (5.5 g) was added to a suspension solution of ((4,6-dibromo-1,3-phenylene)bis(oxy))dibenzene (40.0 g), phenylboronic acid (34.8 g), sodium carbonate (60.6 g), toluene (500 ml), isopropanol (100 ml), and water (100 ml), and the mixture was stirred for eight hours at a reflux temperature. The reaction liquid was cooled to room temperature, water and toluene were added thereto, and then the mixture was partitioned. The solvent of the organic layer was distilled off under reduced pressure. The resulting solid was dissolved in heated chlorobenzene, and the solution was caused to pass through a silica gel short pass column (developing liquid: toluene). An appropriate amount of the solvent was distilled off, and then reprecipitation was performed by adding heptane to the residue. Thus, 4',6'-diphenoxy-1,1':3',1''-terphenyl (41.0 g) was obtained.

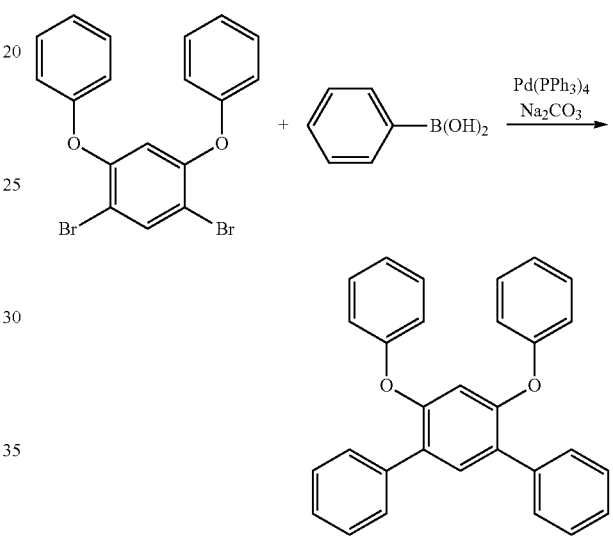

A 2.6 M n-butyllithium hexane solution (29.0 ml) was put into a flask containing 4',6'-diphenoxy-1,1':3',1''-terphenyl (30.0 g) and ortho-xylene (300 ml) at 0° C. in a nitrogen atmosphere. After completion of dropwise addition, the temperature of the mixture was raised to 70° C., and the mixture was stirred for four hours. The temperature of the mixture was further raised to 100° C., and hexane was distilled off. The mixture was cooled to −50° C., and boron tribromide (8.4 ml) was added thereto. The temperature of the mixture was raised to room temperature, and the mixture was stirred for one hour. Thereafter, the mixture was cooled to 0° C. again, N,N-diisopropylethylamine (25.0 ml) was added thereto, and the mixture was stirred at room temperature until heat generation was settled. Thereafter, the mixture was heated and stirred for four hours at 120° C. The reaction liquid was cooled to room temperature, and an organic substance was extracted with toluene. Water was added to the toluene solution thus obtained, the mixture was partitioned, and the solvent was distilled off under reduced pressure. The resulting solid was dissolved in chlorobenzene, an appropriate amount of the mixture was then distilled off under reduced pressure, and reprecipitation was performed by adding heptane thereto. Reprecipitation was further performed similarly by replacing heptane with ethyl acetate. Thus, a compound (yield: 4.2 g) represented by formula (1-91) was obtained.

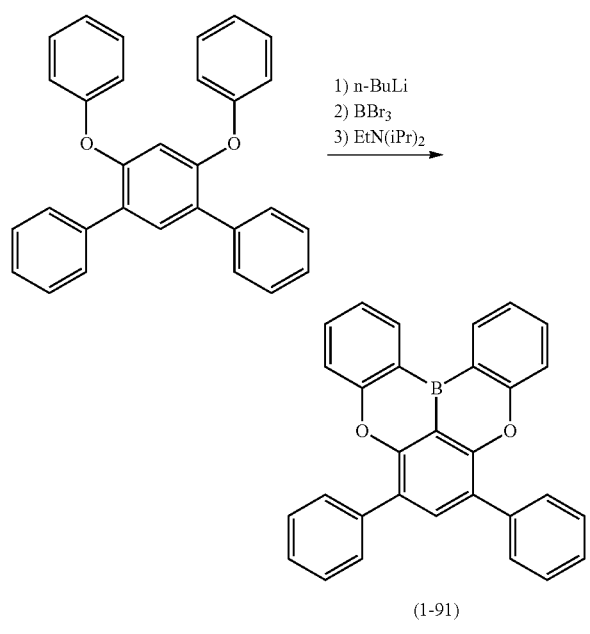

Synthesis Example 2: Compound of Formula (1-1-1)

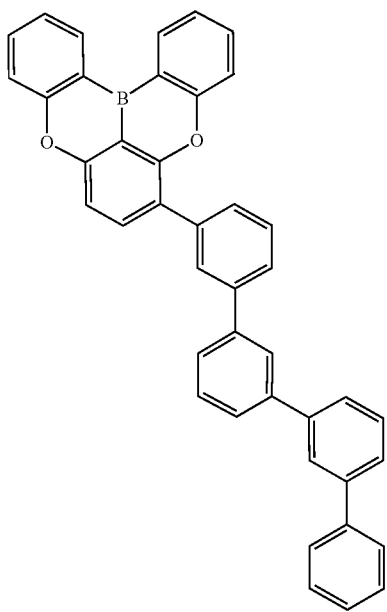

1-Bromo-3-iodobenzene (42.44 g, 150 mmol, 1.0 eq.), biphenyl-3-ylboronic acid (29.70 g, 1.0 eq.), sodium carbonate (31.80 g, 2.0 eq.), and tetrakis(triphenylphosphine) palladium(0) (3.47 g, 0.02 eq.) were weighed and put into a 1 L three-necked round bottom flask. Degassing under reduced pressure and nitrogen purge were sufficiently performed. Thereafter, toluene (360 mL), ethanol (90 mL), and water (90 mL) were added thereto in a nitrogen atmosphere, and the mixture was refluxed and stirred at 74° C. After three hours, heating was stopped, and the temperature of the reaction liquid was returned to room temperature. Extraction was performed with toluene three times, the organic solvent layers were then unified, anhydrous sodium sulfate was added thereto, and the mixture was allowed to stand for a while. Sodium sulfate was filtered off, and the solution was concentrated under reduced pressure. The resulting oil was caused to pass through a silica gel short column chromatography using toluene as an eluent, and a fraction containing a desired product was collected and concentrated under reduced pressure. The resulting oil was caused to pass through a silica gel short column chromatography using heptane as an eluent, and a fraction containing a desired product was collected and concentrated under reduced pressure. A desired product "P3Br" was obtained as a transparent oil (yield: 26.60 g, yield: 57.3%).

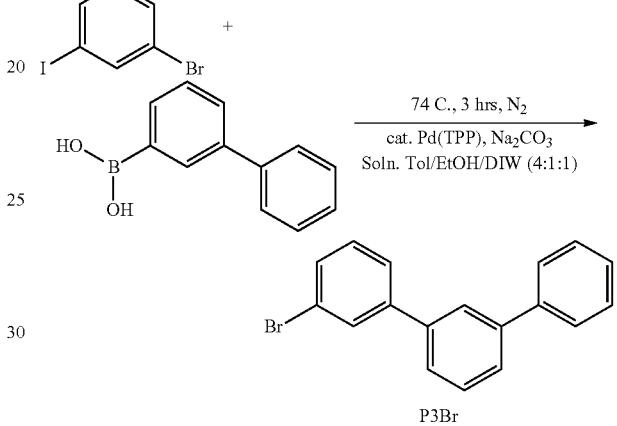

P3Br (26.60 g, 86.03 mmol, 1.0 eq.), bispinacolato diboron (103.23 g, 1.2 eq.), potassium acetate (25.33 g, 3 eq.), and a bis(diphenylphosphino) ferrocene-palladium(II) dichloride dichloromethane complex (2.11 g, 0.03 eq.) were weighed and put into a 1 L three-necked round bottom flask. Degassing under reduced pressure and nitrogen purge were sufficiently performed. Thereafter, cyclopentyl methyl ether (300 mL) was added thereto in a nitrogen atmosphere, and the mixture was refluxed and stirred at 100° C. After three hours, heating was stopped, and the temperature of the reaction liquid was returned to room temperature. Extraction was performed with toluene three times, the organic solvent layers were then unified, anhydrous sodium sulfate was added thereto, and the mixture was allowed to stand for a while. Sodium sulfate was filtered off, and the solution was concentrated under reduced pressure. The resulting oil was caused to pass through an activated carbon column chromatography using toluene as an eluent, and a fraction containing a desired product was collected and concentrated under reduced pressure. The resulting yellow oil was dissolved in hot methanol, was allowed to stand at room temperature, and was then cooled with ice. A desired product "P3Bpin" of precipitated acicular crystals was collected (yield: 28.48 g, yield: 92.9%).

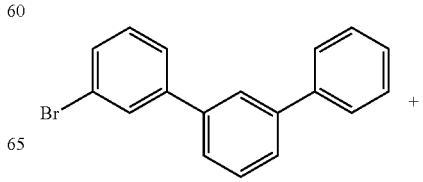

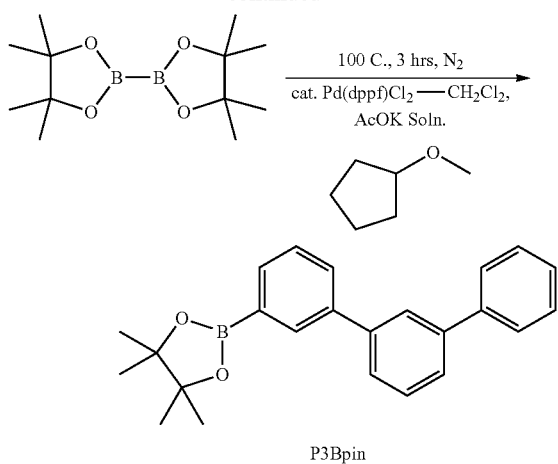

P3Bpin

1-Bromo-3-iodobenzene (3.57 g, 12.6 mmol, 1.0 eq.), P3Bpin (4.55 g, 1.0 eq.), sodium carbonate (4.01 g, 3.0 eq.), and tetrakis(triphenylphosphine) palladium(0) (0.44 g, 0.03 eq.) were weighed and put into a 300 mL three-necked round bottom flask. Degassing under reduced pressure and nitrogen purge were sufficiently performed. Thereafter, toluene (40 mL), ethanol (10 mL), and water (10 mL) were added thereto in a nitrogen atmosphere, and the mixture was refluxed and stirred at 74° C. After three hours, heating was stopped, and the temperature of the reaction liquid was returned to room temperature. Extraction was performed with toluene three times, the organic solvent layers were then unified, anhydrous sodium sulfate was added thereto, and the mixture was allowed to stand for a while. Sodium sulfate was filtered off, and the solution was concentrated under reduced pressure. The resulting oil was caused to pass through a silica gel short column chromatography using toluene as an eluent, and a fraction containing a desired product was collected and concentrated under reduced pressure. The resulting oil was caused to pass through a silica gel column chromatography using heptane-toluene (9:1 (volume ratio)) as an eluent, and a fraction containing a desired product was collected and concentrated under reduced pressure. A desired product "P4Br" was obtained as a transparent oil (yield: 3.97 g, yield: 80.8%).

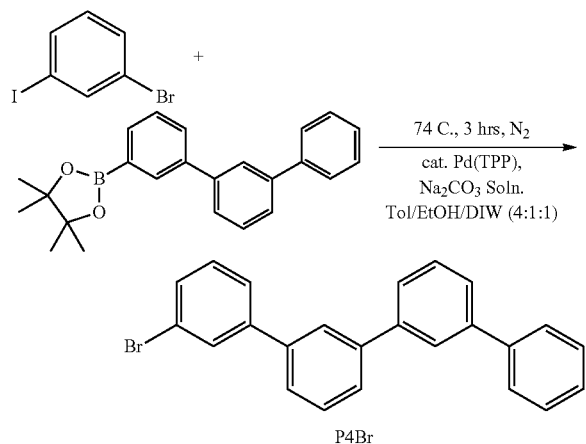

P4Br

P4Br (3.97 g, 10.20 mmol, 1.0 eq.), bispinacolato diboron (3.11 g, 1.2 eq.), potassium acetate (3.00 g, 3 eq.), and a bis(diphenylphosphino) ferrocene-palladium(II) dichloride dichloromethane complex (0.25 g, 0.03 eq.) were weighed and put into a 200 mL three-necked round bottom flask. Degassing under reduced pressure and nitrogen purge were sufficiently performed. Thereafter, cyclopentyl methyl ether (40 mL) was added thereto in a nitrogen atmosphere, and the mixture was refluxed and stirred at 100° C. After three hours, heating was stopped, and the temperature of the reaction liquid was returned to room temperature. Extraction was performed with toluene three times, the organic solvent layers were then unified, anhydrous sodium sulfate was added thereto, and the mixture was allowed to stand for a while. Sodium sulfate was filtered off, and the solution was concentrated under reduced pressure. The resulting oil was caused to pass through an activated carbon column chromatography using toluene as an eluent, and a fraction containing a desired product was collected and concentrated under reduced pressure. A desired product "P4Bpin" was obtained as a transparent oil (yield: 4.30 g, yield: 95.1%).

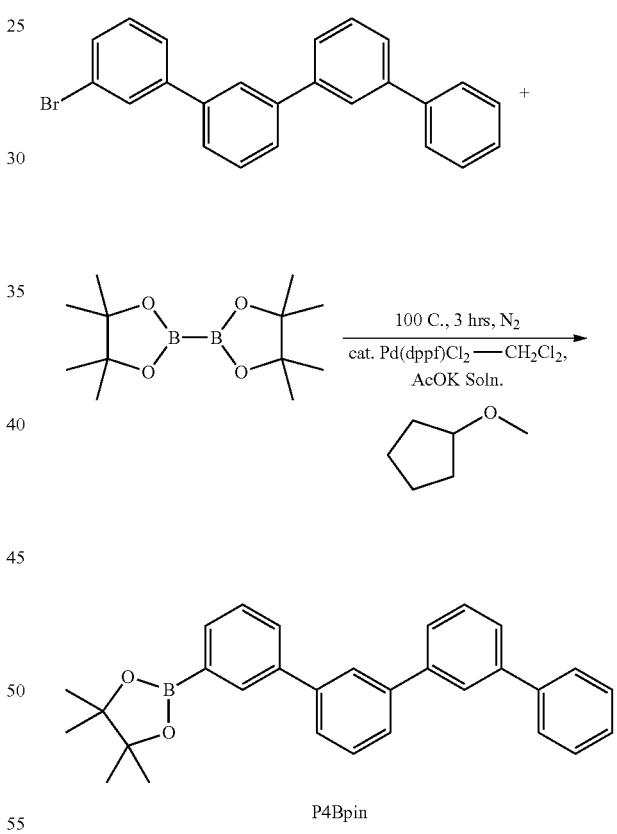

P4Bpin

In a nitrogen atmosphere, a solution of 1-bromo-2,4-difluorobenzene (23.0 g), phenol (33.6 g), potassium carbonate (49.4 g), and NMP (150 ml) was heated to 170° C. and was stirred. After completion of the reaction, the reaction liquid was cooled to room temperature, toluene and a saturated aqueous solution of sodium chloride were added thereto, and the mixture was partitioned. The solvent was distilled off under reduced pressure. Subsequently, the resultant was purified by silica gel column chromatography to obtain "13Px4B".

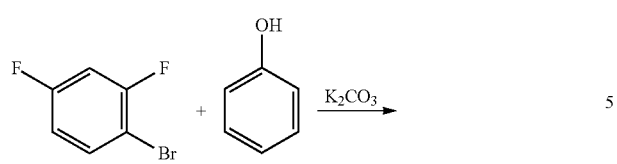

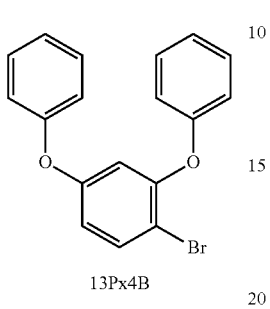

13Px4B

In a nitrogen atmosphere, Pd(PPh$_3$)$_4$ (0.41 g) was added to a suspension solution of 13Px4B (4.0 g), P4Bpin (5.1 g), sodium carbonate (3.7 g), toluene (36 ml), isopropanol (9 ml), and water (9 ml), and the mixture was stirred at reflux temperature. After completion of the reaction, the reaction liquid was cooled to room temperature, water and toluene were added thereto, and the mixture was partitioned. The solvent of the organic layer was distilled off under reduced pressure. The resulting solid was caused to pass through a silica gel short pass column, an appropriate amount of the solvent was distilled off, and then reprecipitation was performed. Thus, a desired product "13Px4P4" was obtained.

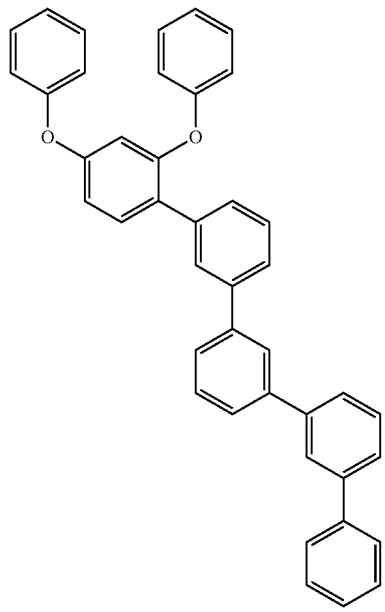

13Px4P4

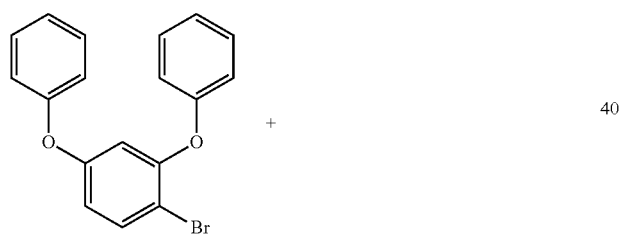

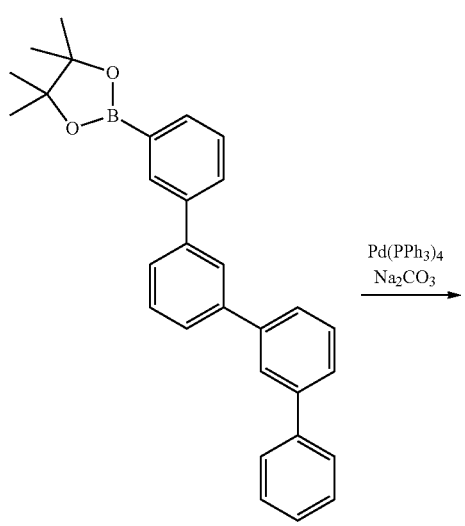

A 2.6 M n-butyllithium hexane solution (5.1 ml, 1.5 eq.) was put into a flask containing 13Px4P4 (5.0 g, 8.8 mmol) and ortho-xylene (50 ml) at 0° C. in a nitrogen atmosphere. After completion of dropwise addition, the temperature of the mixture was raised to 70° C., and the mixture was stirred. After completion of the reaction, the temperature of the mixture was further raised to 100° C., and hexane was distilled off. Subsequently, the mixture was cooled to −50° C., and boron tribromide (1.4 ml, 1.7 eq.) was added thereto. The temperature of the mixture was raised to room temperature, and the mixture was stirred for one hour. Thereafter, the mixture was cooled again to 0° C., N,N-diisopropylethylamine (1.0 ml, 3.0 eq.) was added thereto, and the mixture was stirred at room temperature until heat generation was settled. Subsequently, the mixture was heated and stirred at 120° C. After completion of the reaction, the reaction liquid was cooled to room temperature, and an organic material was extracted with toluene. Water was added to the toluene solution thus obtained, the mixture was partitioned, and the solvent was distilled off under reduced pressure. The resulting solid was dissolved, and then reprecipitation was performed. By changing the solvent and performing reprecipitation similarly, a compound represented by formula (1-1-1) was obtained.

Synthesis Example 3: Compound of Formula (1-1-2)

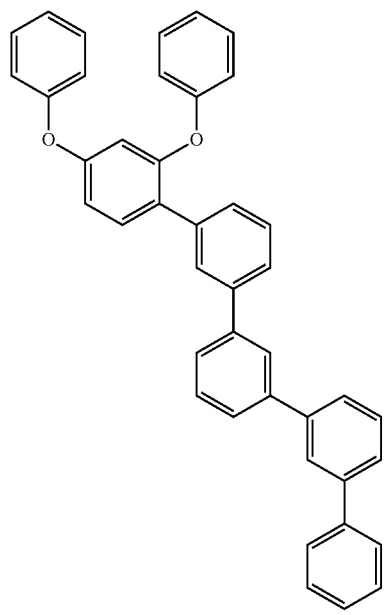

1) n-BuLi
2) BBr₃
3) EtN(iPr)₂

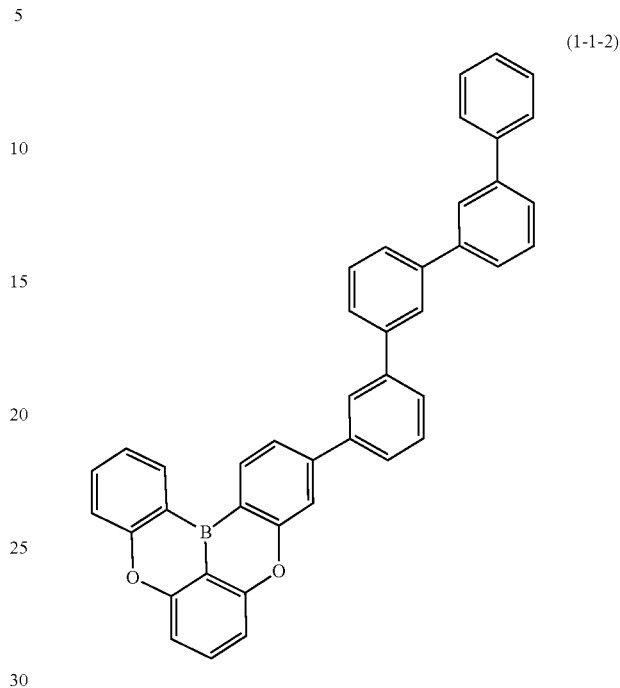
(1-1-2)

3-Bromophenol (8.0 g, 46.2 mmol, 1.0 eq.), P4Bpin (20.0 g, 1.0 eq.), sodium carbonate (14.7 g, 3.0 eq.), and tetrakis(triphenylphosphine) palladium(0) (1.6 g, 0.03 eq.) were weighed and put into a 500 mL three-necked round bottom flask. Degassing under reduced pressure and nitrogen purge were sufficiently performed. Thereafter, toluene (120 mL), ethanol (30 mL), and water (30 mL) were added thereto in a nitrogen atmosphere, and the mixture was refluxed and stirred. After completion of the reaction, heating was stopped, and the temperature of the reaction liquid was returned to room temperature. Extraction was performed with toluene three times, the organic solvent layers were then unified, anhydrous sodium sulfate was added thereto, and the mixture was allowed to stand for a while. Sodium sulfate was filtered off, and the solution was concentrated under reduced pressure. The mixture containing a desired product was caused to pass through a silica gel short column chromatography, and a fraction containing a desired product was collected and concentrated under reduced pressure. Subsequently, the resulting product was caused to pass through a silica gel column chromatography, and a fraction containing a desired product was collected and concentrated under reduced pressure. Thus, a desired product "P5mOH" was obtained.

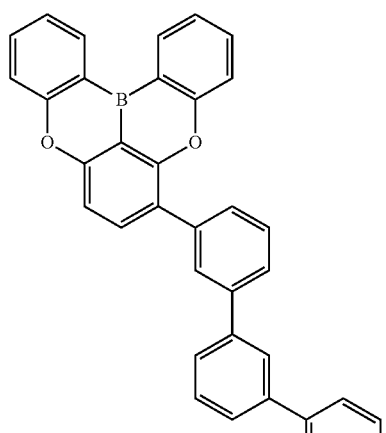
(1-1-1)

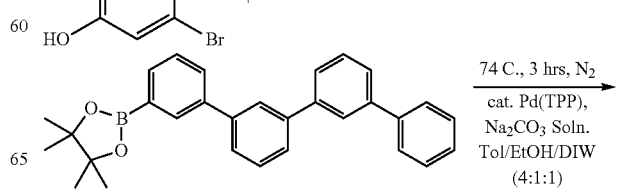

74 C., 3 hrs, N₂
cat. Pd(TPP),
Na₂CO₃ Soln.
Tol/EtOH/DIW
(4:1:1)

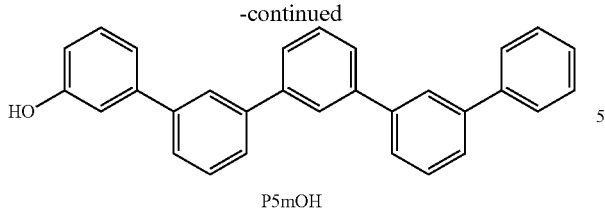

P5mOH

In a nitrogen atmosphere, copper(I) iodide (1.6 g, 0.03 eq.) and iron(III) acetylacetonate (6.1 g, 0.06 eq.) were added to an NMP (300 ml) solution of 1-bromo-3-fluorobenzene (50.0 g, 0.29 mol), phenol (30.0 g, 1.1 eq.), and potassium carbonate (79.0 g, 2.0 eq.) in a nitrogen atmosphere. The temperature of the mixture was raised to 150° C., and the mixture was stirred for four hours. The reaction liquid was cooled to room temperature, and a salt precipitated by adding ethyl acetate and aqueous ammonia thereto was removed by suction filtration using a Hirsch funnel covered with Celite. The filtrate was partitioned, and the solvent of the organic layer was distilled off under reduced pressure. Subsequently, the residue was purified using a silica gel short pass column (developing liquid: toluene/heptane=2/8 (volume ratio)), and thus 1-fluoro-3-phenoxybenzene "1F3Px" (yield: 41.0 g, yield: 36.0%) was obtained.

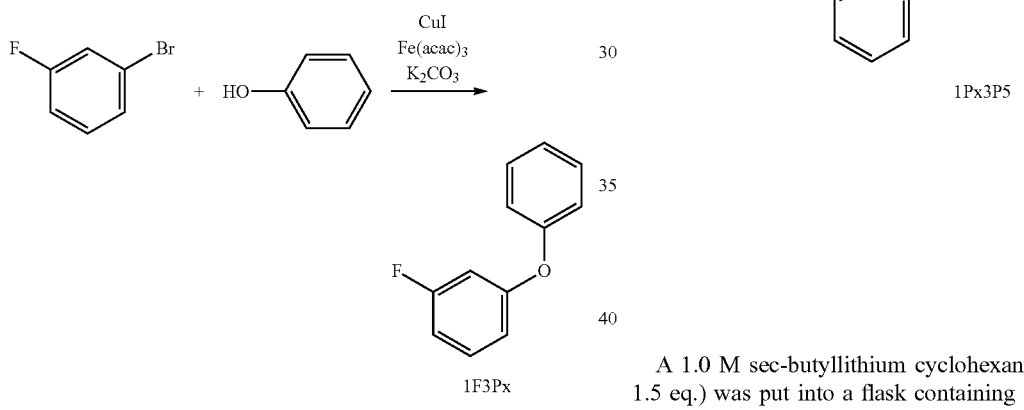

1F3Px

A flask containing 1F3Px (2.6 g, 15 mmol), P5mOH (12.0 g, 2 eq.), cesium carbonate (10.0 g, 2 eq.), and NMP (30 ml) was heated and stirred in a nitrogen atmosphere. After the reaction was stopped, the reaction liquid was cooled to room temperature, and NMP was distilled off under reduced pressure. Subsequently, water and ethyl acetate were added to the residue, and the mixture was partitioned. The solvent was distilled off under reduced pressure, then purification was performed by silica gel column chromatography to obtain a desired product "1Px3P5".

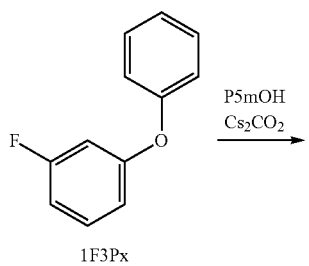

1F3Px

1Px3P5

A 1.0 M sec-butyllithium cyclohexane solution (5.0 ml, 1.5 eq.) was put into a flask containing 1Px3P5 (1.8 g, 3.2 mmol, 1 eq.) and xylene (10 ml) at 0° C. in a nitrogen atmosphere. After completion of dropwise addition, the temperature of the mixture was raised to 70° C., and the mixture was stirred. Then, after completion of the reaction, a component having a lower boiling point than xylene was distilled off under reduced pressure. The residue was cooled to −50° C., boron tribromide (0.5 ml) was added thereto, the temperature of the mixture was raised to room temperature, and the mixture was stirred for 0.5 hours. Thereafter, the mixture was cooled again to 0° C., N,N-diisopropylethylamine (2 ml) was added thereto, and the mixture was stirred at room temperature until heat generation was settled. Subsequently, the temperature of the mixture was raised to 120° C., and the mixture was heated and stirred. After completion of the reaction, the reaction liquid was cooled to room temperature. An aqueous solution of sodium acetate that had been cooled in an ice bath was added thereto, subsequently ethyl acetate was added thereto, and a generated solid was collected by suction filtration. The resulting solid was washed with refluxing ethyl acetate, and then was purified with a silica gel short pass column. By further performing recrystallization, a compound represented by formula (1-1-2) was obtained.

Synthesis Example 4: Compound of Formula (1-1-3)

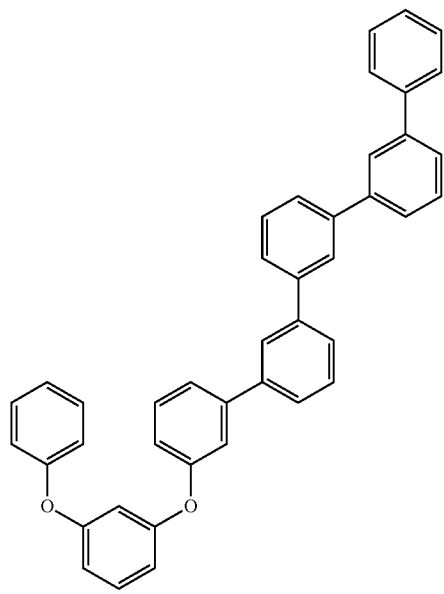

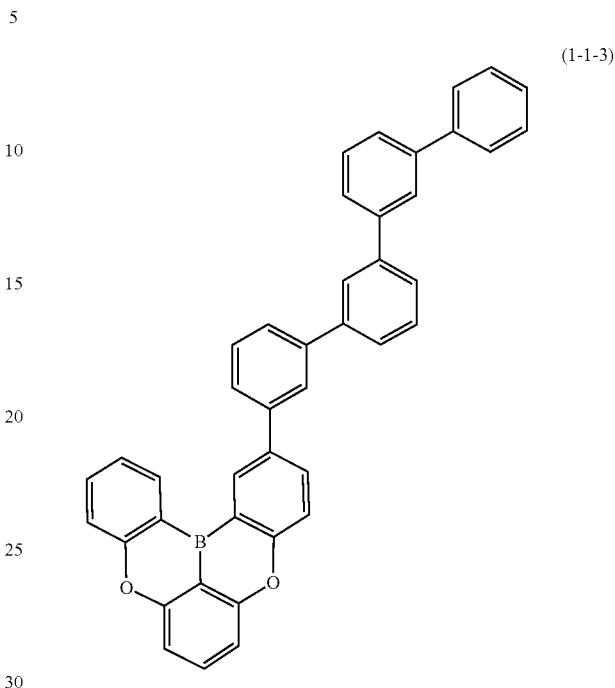

(1-1-3)

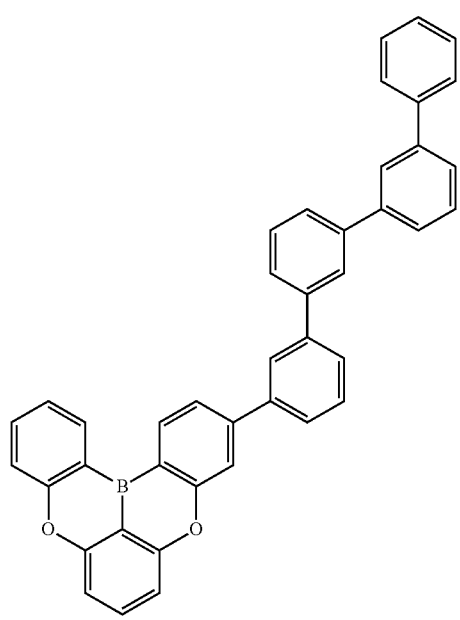

(1-1-2)

4-Bromophenol (8.0 g, 46.2 mmol, 1.0 eq.), P4Bpin (20.0 g, 1.0 eq.), sodium carbonate (14.7 g, 3.0 eq.), and tetrakis(triphenylphosphine) palladium(0) (1.6 g, 0.03 eq.) were weighed and put into a 300 mL three-necked round bottom flask. Degassing under reduced pressure and nitrogen purge were sufficiently performed. Thereafter, toluene (120 mL), ethanol (30 mL), and water (30 mL) were added thereto in a nitrogen atmosphere, and the mixture was refluxed and stirred. After completion of the reaction, heating was stopped, and the temperature of the reaction liquid was returned to room temperature. Extraction was performed with toluene, the organic solvent layers were then unified, anhydrous sodium sulfate was added thereto, and the mixture was allowed to stand for a while. Sodium sulfate was filtered off, and the solution was concentrated under reduced pressure. The resulting mixture containing a desired product was caused to pass through a silica gel short column chromatography, and a fraction containing a desired product was collected and concentrated under reduced pressure. The resulting product was further caused to pass through a silica gel column chromatography, and a fraction containing a desired product was collected and concentrated under reduced pressure. Thus, a desired product "P5pOH" was obtained.

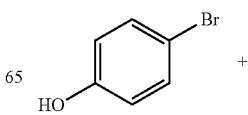

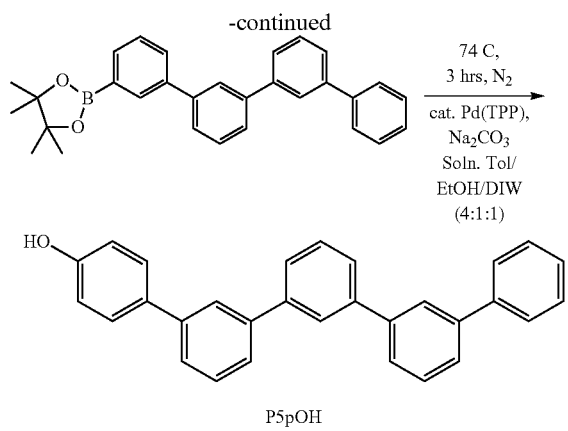

P5pOH

A flask containing 1F3Px (3.2 g, 18 mmol), P5pOH (14.5 g, 2 eq.), cesium carbonate (12.0 g), and NMP (30 ml) was heated and stirred at 200° C. in a nitrogen atmosphere. After the reaction was stopped, the reaction liquid was cooled to room temperature, and NMP was distilled off under reduced pressure. Subsequently, water and ethyl acetate were added to the residue, and the mixture was partitioned. The solvent was distilled off under reduced pressure, then purification was performed by silica gel column chromatography to obtain "1Px3P5(p)".

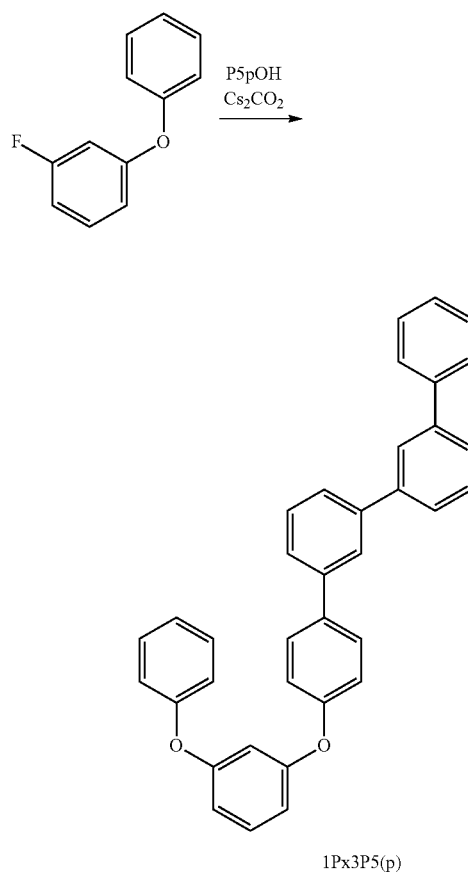

1Px3P5(p)

A 1.0 M sec-butyllithium hexane solution (5.0 ml) was put into a flask containing 1Px3P5(p) (1.8 g) and xylene (10 ml) at 0° C. in a nitrogen atmosphere. After completion of dropwise addition, the temperature of the mixture was raised to 70° C., and the mixture was stirred. Then, after completion of the reaction, a component having a lower boiling point than xylene was distilled off under reduced pressure. The residue was cooled to −50° C., boron tribromide (0.5 ml) was added thereto, the temperature of the mixture was raised to room temperature, and the mixture was stirred for 0.5 hours. Thereafter, the mixture was cooled again to 0° C., N,N-diisopropylethylamine (2 ml) was added thereto, and the mixture was stirred at room temperature until heat generation was settled. Subsequently, the temperature of the mixture was raised to 120° C., and the mixture was heated and stirred. The reaction liquid was cooled to room temperature. An aqueous solution of sodium acetate that had been cooled in an ice bath was added thereto, subsequently ethyl acetate was added thereto, and a generated solid was collected by suction filtration. The resulting solid was washed with refluxing ethyl acetate, and then was purified with a silica gel short pass column. By further performing recrystallization, a compound represented by formula (1-1-3) was obtained.

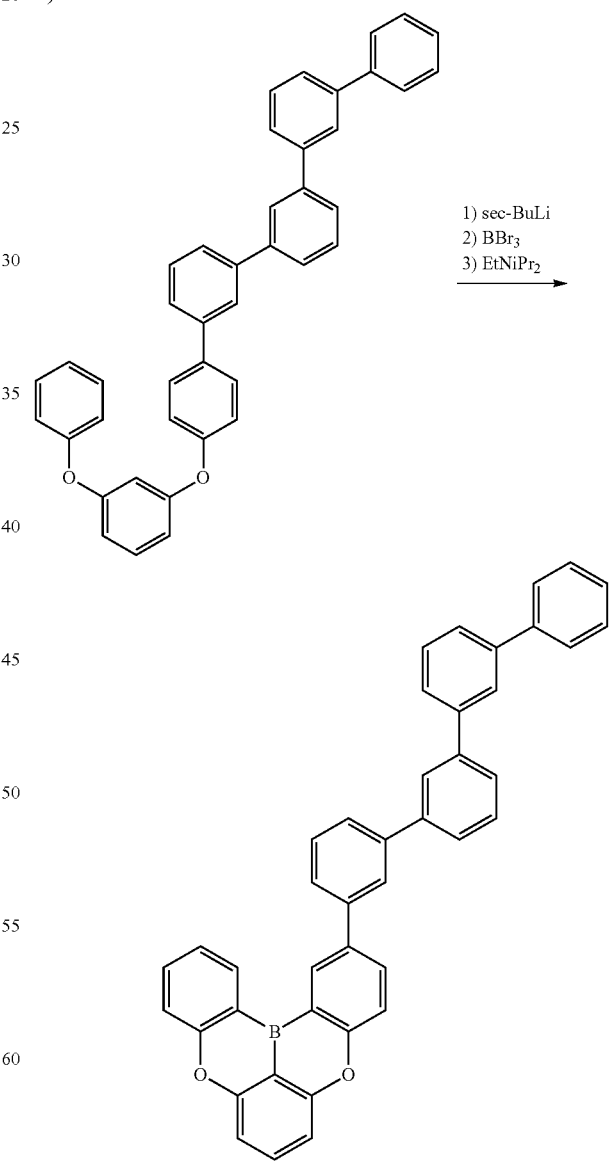

(1-1-3)

Synthesis Example 5: Compound of Formula (1-1-4)

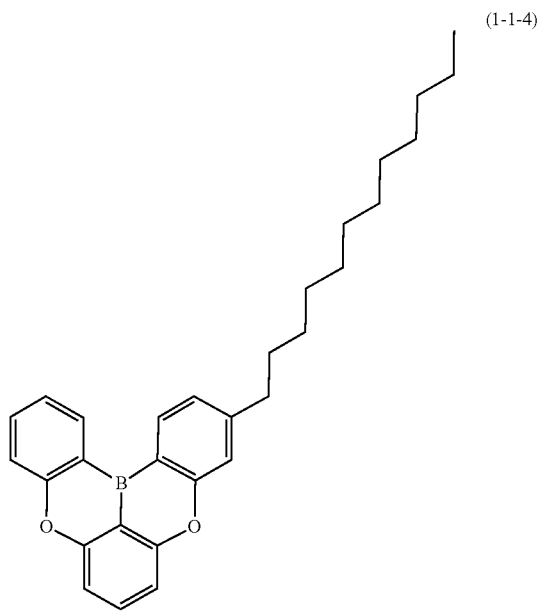 [SMILES: CCCCCCCCCCCCc1ccc2c(c1)Oc1cccc3c1B2c1ccccc1O3]

(1-1-4)

A flask containing 1F3Px (10 g, 53 mmol), 3-bromophenol (9.2 g, 1 eq.), potassium carbonate (15 g, 2 eq.), and NMP (50 ml) was heated and stirred for two hours at 200° C. in a nitrogen atmosphere. After the reaction was stopped, the reaction liquid was cooled to room temperature, and NMP was distilled off under reduced pressure. Subsequently, water and toluene were added thereto, and the mixture was partitioned. The solvent was distilled off under reduced pressure, and then the residue was purified by silica gel column chromatography (developing liquid: heptane/toluene=7/3 (volume ratio)). The resulting product was further dissolved in ethyl acetate, and then reprecipitation was performed by adding heptane to obtain "1Px3PBr" (yield: 13.1 g, yield: 72%).

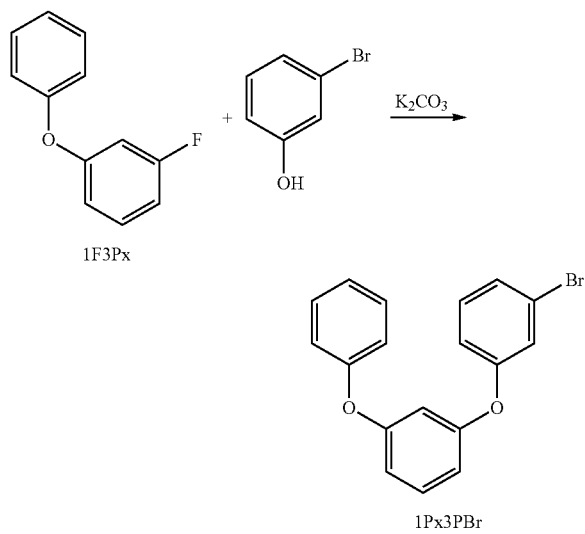

1Px3PBr (10 g, 30 mmol), [1,3-bis(diphenylphosphino)propane] nickel(II) dichloride (0.16 g), and cyclopentyl methyl ether (40 mL) were put into a flask and cooled with ice water in a nitrogen atmosphere, and a 1 mol/L dodecylmagnesium bromide diethyl ether solution (40 mL, 1.4 eq.) was slowly added dropwise such that the internal temperature did not exceed 25° C. Subsequently, the temperature was raised to room temperature, and then the resulting mixture was stirred at room temperature. After completion of the reaction, the mixture was cooled again with ice water, and then water was slowly added dropwise to stop the reaction. Subsequently, the mixture was neutralized with 1N hydrochloric acid, then heptane was added thereto, and the precipitate was filtered. The resultant desired product was partitioned, and silica gel column chromatography was performed to obtain a desired product "1Px3PC12".

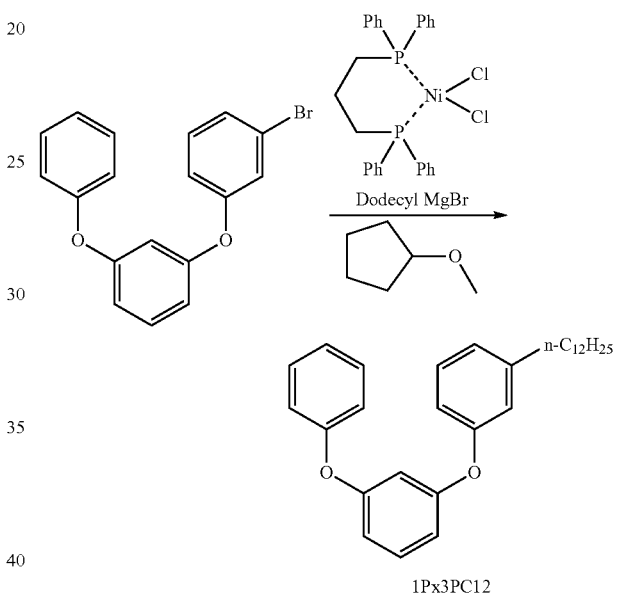

1Px3PC12

A 1.0 M sec-butyllithium cyclohexane solution (35 ml, 1.5 eq.) was put into a flask containing 1Px3PC12 (10 g, 0.23 mmol) and xylene (50 ml) at 0° C. in a nitrogen atmosphere. After completion of dropwise addition, the temperature of the mixture was raised to 70° C., and the mixture was stirred. Then, after completion of the reaction, a component having a lower boiling point than xylene was distilled off under reduced pressure. The residue was cooled to −50° C., boron tribromide (4.0 ml, 1.7 eq.) was added thereto, the temperature of the mixture was raised to room temperature, and the mixture was stirred for 0.5 hours. Thereafter, the mixture was cooled again to 0° C., N,N-diisopropylethylamine (12 ml, 3 eq.) was added thereto, and the mixture was stirred at room temperature until heat generation was settled. Subsequently, the temperature of the mixture was raised to 120° C., and the mixture was heated and stirred. The reaction liquid was cooled to room temperature. An aqueous solution of sodium acetate that had been cooled in an ice bath was added thereto, subsequently ethyl acetate was added thereto, and the mixture was partitioned. The mixture containing a desired product was purified by silica gel column chromatography to obtain a compound represented by formula (1-1-4).

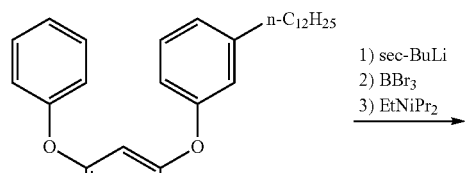

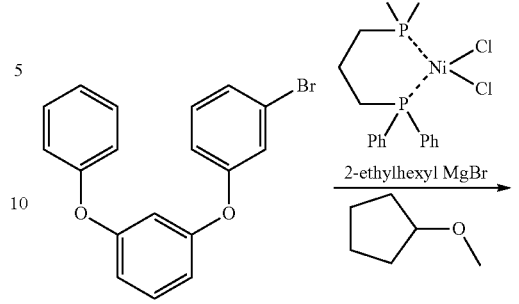

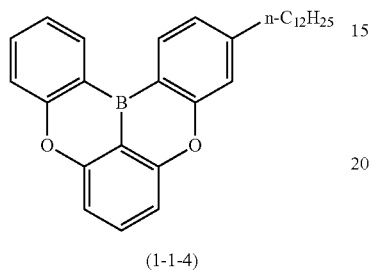

(1-1-4)

Synthesis Example 6: Compound of Formula (1-1-5)

(1-1-5)

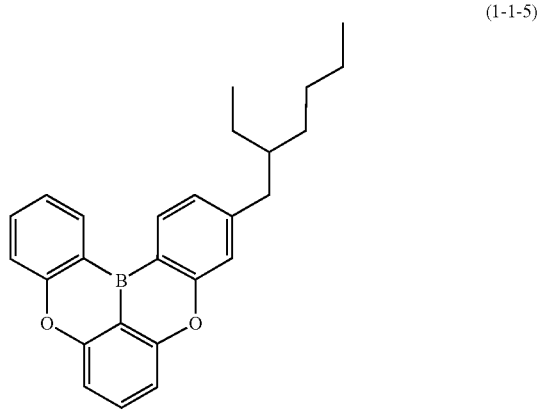 [SMILES: CCCCC(CC)Cc1ccc2c(c1)Oc1cccc3c1B2c1ccccc1O3]

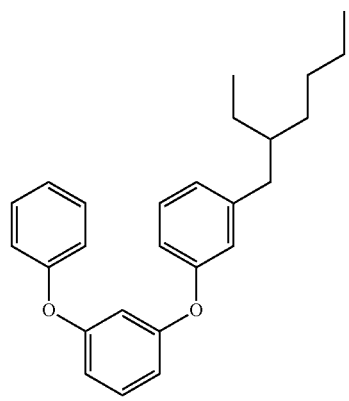

1Px3P2EH

1Px3PBr (10 g, 30 mmol), [1,3-bis(diphenylphosphino) propane] nickel(II) dichloride (0.16 g, 0.01 eq.), and cyclopentyl methyl ether (60 ml) were put into a flask and cooled with ice water in a nitrogen atmosphere, and a 1 mol/L 2 ethylhexylmagnesium bromide diethyl ether solution (40 mL, 1.4 eq.) was slowly added dropwise such that the internal temperature did not exceed 25° C. Subsequently, the temperature was raised to room temperature, and then the resulting mixture was stirred at room temperature. After completion of the reaction, the mixture was cooled again with ice water, and then water was slowly added dropwise to stop the reaction. Subsequently, the mixture was neutralized with 1N hydrochloric acid, then heptane was added thereto, and the precipitate was partitioned. The mixture containing a desired product was purified by silica gel column chromatography to obtain a desired compound "1Px3P2EH".

A 1.0 M sec-butyllithium cyclohexane solution (40 ml) was put into a flask containing 1Px3P2EH (9.8 g) and xylene (50 ml) at 0° C. in a nitrogen atmosphere. After completion of dropwise addition, the temperature of the mixture was raised to 70° C., and the mixture was stirred. Then, after completion of the reaction, a component having a lower boiling point than xylene was distilled off under reduced pressure. The residue was cooled to −50° C., boron tribromide (4.2 ml) was added thereto, the temperature of the mixture was raised to room temperature, and the mixture was stirred for 0.5 hours. Thereafter, the mixture was cooled again to 0° C., N,N-diisopropylethylamine (14 ml) was added thereto, and the mixture was stirred at room temperature until heat generation was settled. Subsequently, the temperature of the mixture was raised to 120° C., and the mixture was heated and stirred. After completion of the reaction, the reaction liquid was cooled to room temperature. An aqueous solution of sodium acetate that had been cooled in an ice bath was added thereto, subsequently ethyl acetate was added thereto, and the mixture was partitioned. The organic layer was concentrated and then purified by silica gel column chromatography to obtain a compound represented by formula (1-1-5).

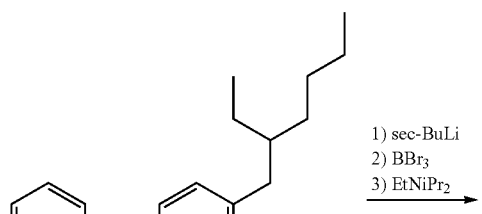

1) sec-BuLi
2) BBr₃
3) EtNiPr₂

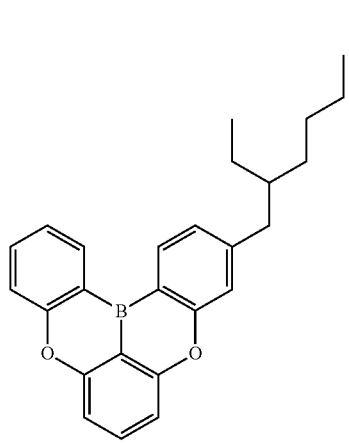

(1-1-5)

Synthesis Example 7: Compound of Formula (2-51)

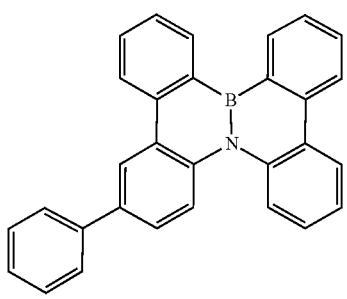

(2-51)

First, a flask containing 2,4-dibromoaniline (25.0 g), phenylboronic acid (30.0 g), Pd (PPh₃)₄ (5.8 g), tripotassium phosphate (106.0 g), xylene (300 ml), t-butyl alcohol (50 ml), and water (50 ml) was stirred at 120° C. for 30 minutes. The reaction liquid was cooled to room temperature, water and ethyl acetate were added to the reaction liquid, and the mixture was partitioned. The organic layer was caused to pass through a silica gel short column, a by-product having high polarity was removed, and then the solvent was distilled off under reduced pressure. The residue was further purified by silica gel column chromatography (developing liquid: toluene/heptane=8/2 (volume ratio), and then reprecipitation was performed with heptane to obtain [1,1':3',1''-terphenyl]-4'-amine (yield: 13.1 g).

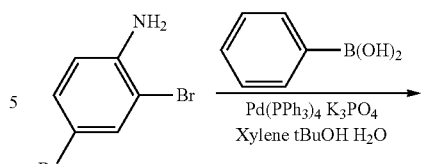

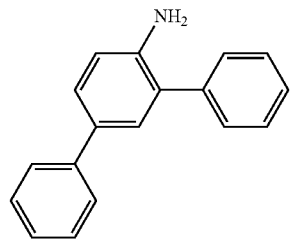

Subsequently, a flask containing [1,1':3',1''-terphenyl]-4'-amine (13.0 g), 2-bromobiphenyl (12.4 g), sodium t-butoxide (7.6 g), Pd(dba)₂ (0.08 g), 4-(di-t-butylphosphino)-N,N-dimethylaniline (0.07 g), and toluene (100 ml) was stirred in a nitrogen atmosphere at 80° C. for 30 minutes. The reaction liquid was cooled to room temperature, water and ethyl acetate were added to the reaction liquid, and the mixture was partitioned. The solvent was distilled off under reduced pressure, and then the residue was purified by silica gel column chromatography (developing liquid: toluene/heptane=2/8 (volume ratio)). Thus, N-([1,1'-biphenyl]-2-yl)-[1,1':3',1''-terphenyl]-4'-amine (yield: 20.0 g) was obtained.

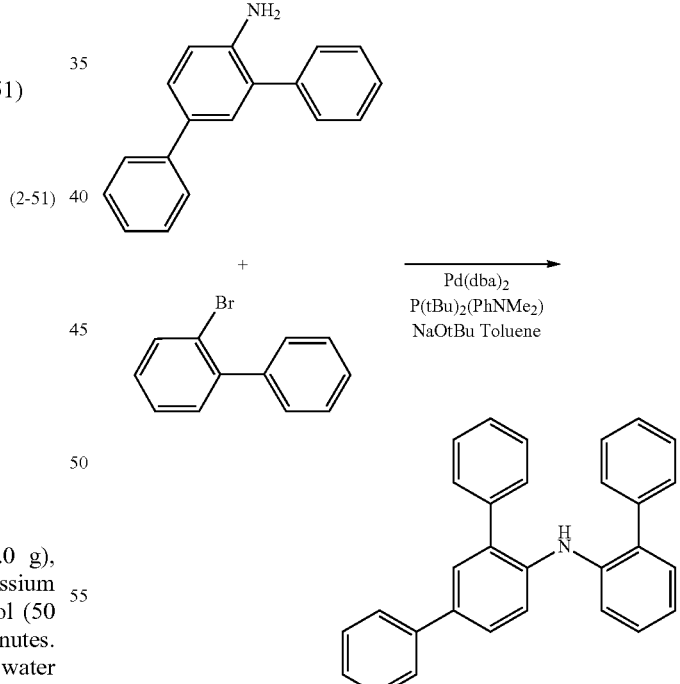

A flask containing N-([1,1'-biphenyl]-2-yl)-[1,1':3',1''-terphenyl]-4'-amine (18.6 g) obtained as described above and toluene (250 ml) was cooled to −70° C., and a 1.6 M hexane solution of n-butyllithium (29.3 ml) was added dropwise thereto. After completion of dropwise addition, the temperature of the mixture was temporarily raised to 0° C., and the suspension thus obtained was added dropwise to a solution obtained by diluting a 1.0 M heptane solution of boron trichloride (46.9 ml) with toluene at −60° C. Subsequently, the temperature of the reaction liquid was raised to room temperature, and then the solvent was distilled off under reduced pressure once. Orthodichlorobenzene (300 ml), 2,2,6,6-tetramethylpiperidine (13.9 g), and aluminum trichloride (25.0 g) were added thereto, and the mixture was stirred at 170° C. for 20 hours. The reaction liquid was cooled to 60° C., and was added to ice water (suspension solution) including sodium carbonate (10.0 g) and sodium acetate (31.0 g). The organic layer was partitioned, then suction filtration was performed using a Hirsch funnel covered with Celite, and the solvent was distilled off under reduced pressure. Subsequently, the residue was purified by activated alumina column chromatography (developing liquid: toluene/triethylamine=100/1 (volume ratio)), and then reprecipitation was performed with an ethyl acetate/heptane mixed solvent to obtain a compound (yield: 14.0 g) represented by formula (2-51).

First, N-bromosuccinimide (NBS) (2.8 g) was added to a THF (40 ml) solution of 2-phenyl-4b-aza-12b-borazibenzo [g,p] chrysene (6.0 g) in a nitrogen atmosphere, and the resulting mixture was stirred at room temperature overnight. After completion of the reaction, an aqueous solution of sodium nitrite and toluene were added thereto, the resulting mixture was partitioned, and the solvent was distilled off under reduced pressure. The resulting solid was dissolved in chlorobenzene and was caused to pass through an activated alumina short column (developing solution: toluene/triethylamine=100/1 (volume ratio)). The solvent was distilled off under reduced pressure, and the resulting solid was washed with heptane to obtain 2-bromo-7-phenyl-4b-aza-12b-borazibenzo [g,p] chrysene (yield: 6.1 g).

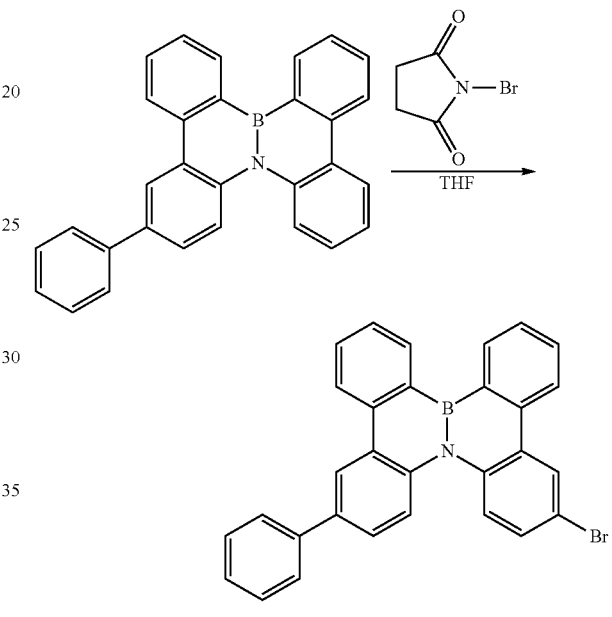

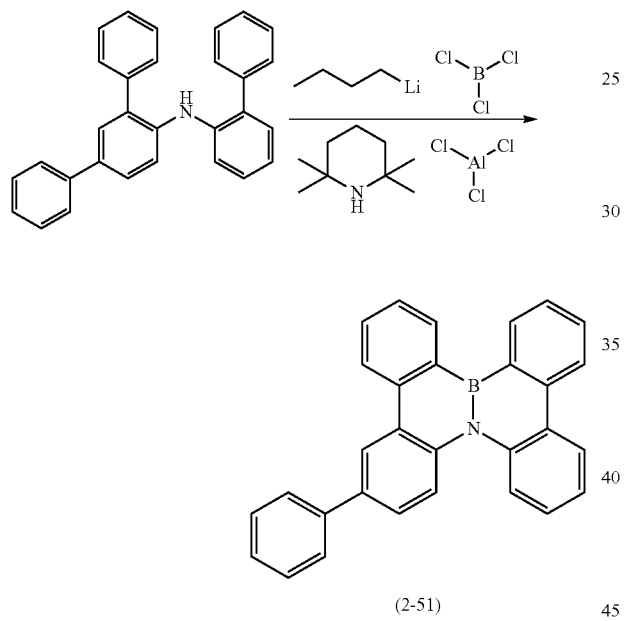

(2-51)

Synthesis Example 8: Compound of Formula (2-51-1)

2-Bromo-7-phenyl-4b-aza-12b-borazibenzo [g,p] chrysene (5.0 g, 0.10 mol), P4Bpin (4.5 g, 1 eq.), Pd(TPP)$_4$ (0.36 g, 0.03 eq.), and sodium carbonate (3.3 g, 3 eq.) were dissolved in toluene (36 ml), isopropanol (9 mL), and water (9 mL), and then were heated and stirred at 80° C. After completion of the reaction, the reaction liquid was cooled to room temperature, water and ethyl acetate were added to the reaction liquid, and the mixture was partitioned. Subsequently, the solvent was distilled off under reduced pressure, (2-51-1)

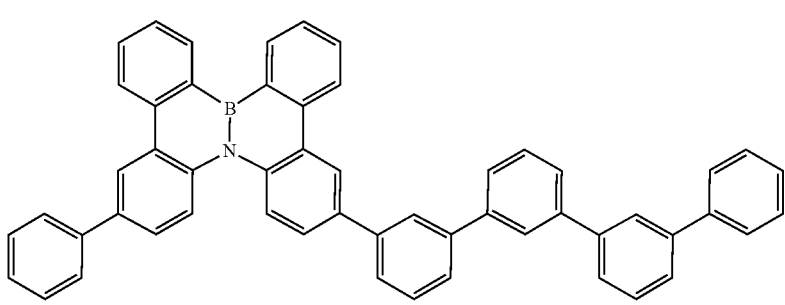

and then the mixture was caused to pass through an activated alumina short column. After the solvent was distilled off under reduced pressure, by reprecipitation and purification, a compound represented by formula (2-51-1) was obtained.

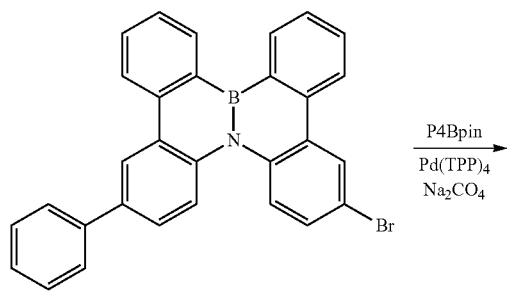

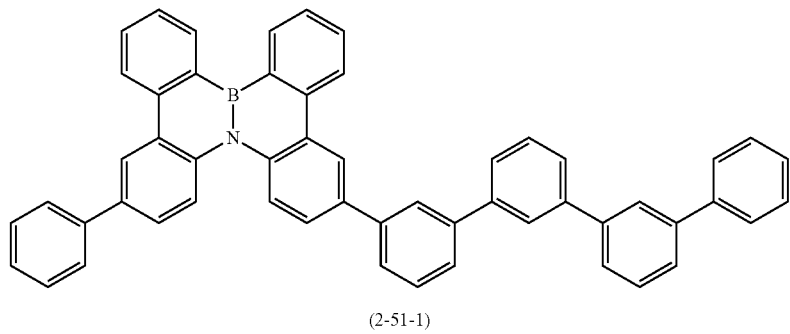

(2-51-1)

<Preparation of Light Emitting Layer-Forming Composition>

A method for preparing a light emitting layer-forming composition according to each of Examples 1 to 9 is described. Compounds used for preparation of the composition are indicated below.

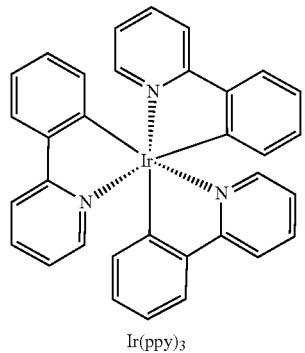

Ir(ppy)$_3$

-continued

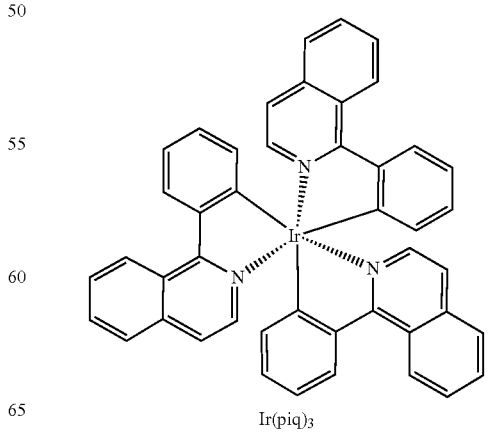

Ir(piq)$_3$

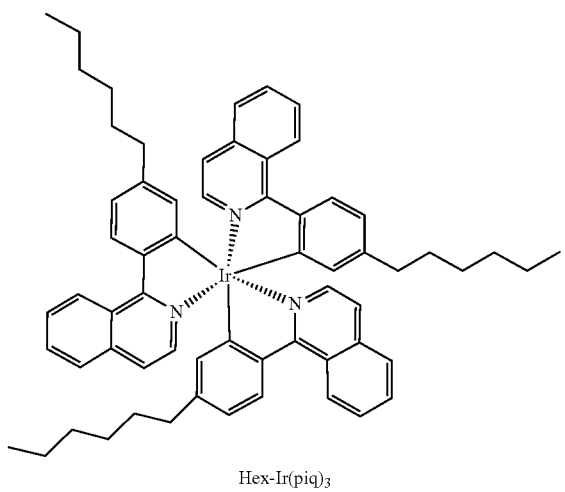

Hex-Ir(piq)₃

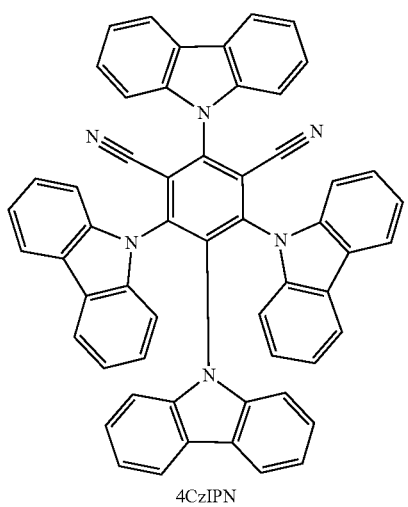

4CzIPN

<Measurement of Triplet Energy of Dopant>

Triplet energy of a dopant used in Examples was measured. For Ir(ppy)₃, Ir(piq)₃, and Hex-Ir(piq)₃, a phosphorescent spectrum of a dichloromethane or tetrahydrofuran solution at room temperature was measured (fluorescence spectrophotometer F-7000 manufactured by Hitachi), and calculation was performed with a peak top value. For 4CzIPN, a thin film dispersed at a concentration of 5% by weight in polymethacrylate was manufactured, a spectrum was measured under liquid nitrogen cooling, and calculation was performed with a peak top value. Table 1 indicates a peak top of a phosphorescent spectrum of each dopant and triplet energy calculated.

TABLE 1

| Dopant | Phosphorescent peak top Wavelength [nm] | Triplet energy [eV] | Triplet energy range 1.8~3.0 [eV] |
|---|---|---|---|
| Ir(ppy)₃ | 513 | 2.42 | Within range |
| Ir(piq)₃ | 615 | 2.02 | Within range |
| Hex-Ir(piq)₃ | 617 | 2.01 | Within range |
| 4CzIPN | 504 | 2.46 | Within range |

Example 1

A light emitting layer-forming composition can be prepared by stirring the following components until a uniform solution is obtained.

| Ir(piq)₃ | 0.05% by weight |
| Compound (1-1-1) | 0.95% by weight |
| Anisole | 99.00% by weight |

Example 2

A light emitting layer-forming composition can be prepared by stirring the following components until a uniform solution is obtained.

| Hex-Ir(piq)₃ | 0.05% by weight |
| Compound (1-1-1) | 0.95% by weight |
| Toluene | 70.00% by weight |
| Decalin | 29.00% by weight |

Example 3

A light emitting layer-forming composition can be prepared by stirring the following components until a uniform solution is obtained.

| 4CzIPN | 0.05% by weight |
| Compound (1-1-1) | 0.95% by weight |
| Toluene | 70.00% by weight |
| Decalin | 29.00% by weight |

Example 4

A light emitting layer-forming composition can be prepared by stirring the following components until a uniform solution is obtained.

| Ir(piq)₃ | 0.05% by weight |
| Compound (1-1-2) | 0.95% by weight |
| Toluene | 99.00% by weight |

Example 5

A light emitting layer-forming composition can be prepared by stirring the following components until a uniform solution is obtained.

| Ir(piq)₃ | 0.05% by weight |
| Compound (1-1-3) | 0.95% by weight |
| Toluene | 99.00% by weight |

Example 6

A light emitting layer-forming composition can be prepared by stirring the following components until a uniform solution is obtained.

| | |
|---|---|
| Ir(piq)$_3$ | 0.05% by weight |
| Compound (1-1-4) | 0.95% by weight |
| Toluene | 99.00% by weight |

Example 7

A light emitting layer-forming composition can be prepared by stirring the following components until a uniform solution is obtained.

| | |
|---|---|
| Ir(piq)$_3$ | 0.05% by weight |
| Compound (1-1-5) | 0.95% by weight |
| Toluene | 99.00% by weight |

Example 8

A light emitting layer-forming composition can be prepared by stirring the following components until a uniform solution is obtained.

| | |
|---|---|
| Ir(ppy)$_3$ | 0.05% by weight |
| Compound (2-51-1) | 0.95% by weight |
| Toluene | 70.00% by weight |
| Decalin | 29.00% by weight |

Example 9

A light emitting layer-forming composition can be prepared by stirring the following components until a uniform solution is obtained.

| | |
|---|---|
| Ir(ppy)$_3$ | 0.05% by weight |
| Compound (1-1-1) | 0.65% by weight |
| Compound (2-51-1) | 0.30% by weight |
| Toluene | 70.00% by weight |
| Decalin | 29.00% by weight |

<Evaluation of Coating Film Formability>

A light emitting layer-forming composition was subjected to coating film formation onto a 4×4 cm glass substrate by a spin coating method, and the degree of film defects was evaluated. A product in which a film was not formed on the substrate after film formation and a product with a pinhole in a coating film were evaluated as "poor", and a product without a pinhole was evaluated as "good".

<Evaluation of In-Plane Orientation>

In-plane orientation of a host compound in a vapor deposited film or a coating film can be calculated by evaluating anisotropy of a refractive index and an extinction coefficient with an ellipsometer (Daisuke Yokoyama, Akio Sakaguchi, Michio Suzuki, Chihaya Adachi, Applied Physics Letters, 96, 073302 (2010), Daisuke Yokoyama, Journal of Materials Chemistry, 21, 19187-19202 (2011)). Furthermore, in-plane orientation of a light-emitting compound in a vapor deposited film or a coating film can be calculated by measuring angle dependence of a light emission intensity of P-polarized light of the light-emitting compound, and comparing a measurement result with a simulation result (Jorg Frischeisen, Daisuke Yokoyama, Chihaya Adachi, Wolfgang Brutting, Applied Physics Letters, 96, 073302 (2010)).

<Evaluation of Luminescence Quantum Yield of Coating Film>

Coating film formation was performed onto a 1×1 cm quartz substrate by a spin coating method. A luminescence quantum yield (PL) of the coating film was measured using a fluorescence quantum yield measuring device (Hamamatsu Photonics).

The light emitting layer-forming composition of the present invention had excellent coating film formability and fluorescence quantum yield. Furthermore, a light emitting layer-forming composition prepared using a compound substituted by a group represented by formula (FG-1), a group represented by formula (FG-2), or an alkyl having 1 to 24 carbon atoms had a higher fluorescence quantum yield compared with a compound not substituted by these groups.

A coating film using a dopant having triplet energy within a range of 1.8 to 3.0 eV had a higher luminescence quantum yield than a coating film using a dopant having triplet energy outside a range of 1.8 to 3.0 eV.

<Manufacturing Organic Electroluminescent Element and Evaluation Thereof>

Example 10 describes a method for manufacturing an organic EL element using a crosslinkable hole transport material. Example 11 describes a method for manufacturing an organic EL element using an orthogonal solvent system. Table 2 indicates a material configuration of each of layers in an organic EL element manufactured.

TABLE 2

| | Hole Injection layer (40 nm) | Hole Transport layer (30 nm) | Light emitting layer (20 nm) | | | Electron Transport layer (30 nm) | Negative electrode (1 nm/ 100 nm) |
|---|---|---|---|---|---|---|---|
| | | | Host | Dopant | Ink | | |
| Example 10 | PEDOT:PSS | OTPD | 1-1-1 | Hex-Ir(piq)$_3$ | Example 2 | TPBi | LiF/Al |
| Example 11 | PEDOT:PSS | TcTa | 1-1-1 | Hex-Ir(piq)$_3$ | Example 2 | TPBi | LiF/Al |

The structures of "PEDOT:PSS", "OTPD", "TcTa", and "TPBi" in Table 2 are indicated below.
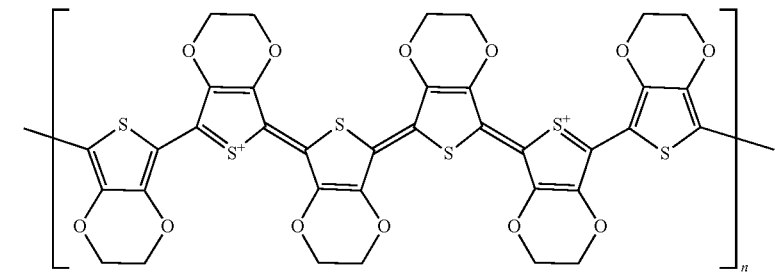
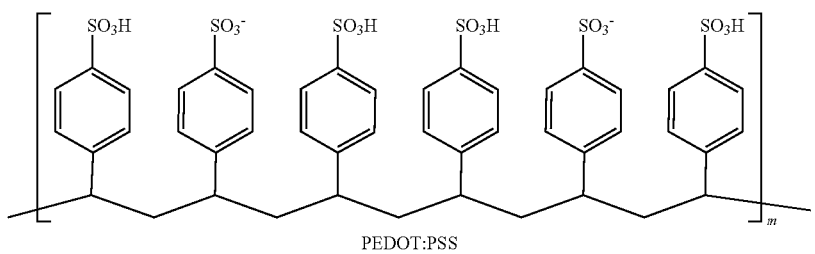
PEDOT:PSS
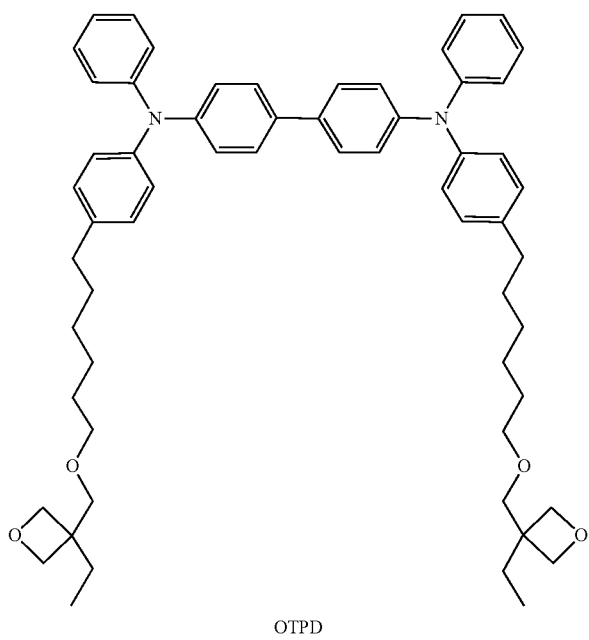
OTPD

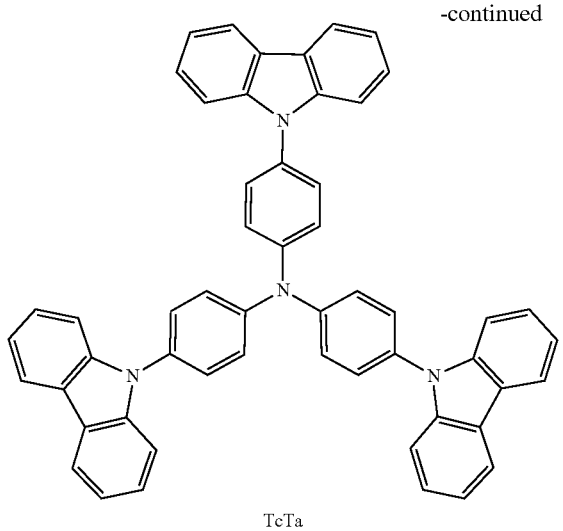

TcTa

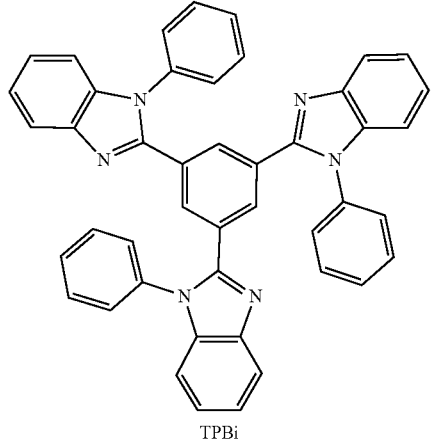

TPBi

<PEDOT:PSS Solution>

A commercially available PEDOT:PSS solution (Clevios (TM) P VP AI4083, aqueous dispersion of PEDOT:PSS, manufactured by Heraeus Holdings) was used.

<Preparation of OTPD Solution>

OTPD (LT-N 159, manufactured by Luminescence Technology Corp.) and IK-2 (photocation polymerization initiator, manufactured by Sun Apro Co.) were dissolved in toluene, and an OTPD solution having an OTPD concentration of 0.7 wt % and IK-2 concentration of 0.007 wt % was prepared.

<Preparation of TcTa Solution>

TcTa (LT-E207, TcTa, manufactured by Luminescence Technology Corp.) was dissolved in orthodichlorobenzene to prepare a 0.7 wt % TcTa solution.

Example 10

A PEDOT:PSS solution was spin-coated on a glass substrate on which ITO had been vapor-deposited so as to have a thickness of 150 nm, and was baked on a hot plate at 200° C. for one hour to form a PEDOT:PSS film with a film thickness of 40 nm (hole injection layer). Subsequently, the OTPD solution was spin-coated and dried on a hot plate at 80° C. for 10 minutes. Exposure was performed with an exposure machine at an exposure intensity of 100 mJ/cm$^2$, and baking was performed on a hot plate at 100° C. for one hour to form an OTPD film with a thickness of 30 nm, insoluble in a solution (hole transport layer). Subsequently, the light emitting layer-forming composition prepared in Example 2 was spin-coated and baked on a hot plate at 120° C. for one hour to form a light emitting layer with a thickness of 20 nm.

The prepared multilayer film was fixed to a substrate holder of a commercially available vapor deposition apparatus (manufactured by Showa Shinku Co., Ltd.). A molybdenum deposition boat containing TPBi, a molybdenum deposition boat containing LiF, and a tungsten deposition boat containing aluminum were attached thereto. A vacuum chamber was evacuated to $5 \times 10^{-4}$ Pa. Thereafter, the deposition boat containing TPBi was heated, and vapor deposition was performed so as to obtain a film thickness of 30 nm to form an electron transport layer. A deposition rate during formation of the electron transport layer was 1 nm/sec.

Thereafter, the vapor deposition boat containing LiF was heated, and vapor deposition was performed at a deposition rate of 0.01 to 0.1 nm/sec so as to obtain a film thickness of 1 nm. Subsequently, the boat containing aluminum was heated, and vapor deposition was performed so as to obtain a film thickness of 100 nm. Thus, a negative electrode was formed. In this way, an organic EL element was obtained.

Example 11

A PEDOT:PSS solution was spin-coated on a glass substrate on which ITO had been vapor-deposited so as to have a thickness of 150 nm, and was baked on a hot plate at 200° C. for one hour to form a PEDOT:PSS film with a film thickness of 40 nm (hole injection layer). Subsequently, a TcTa solution was spin-coated and baked on a hot plate at 120° C. for one hour to form a TcTa film having a thickness of 30 nm (hole transport layer). Subsequently, the light emitting layer-forming composition prepared in Example 2 was spin-coated and baked on a hot plate at 120° C. for one hour to form a light emitting layer with a thickness of 20 nm. Subsequently, an electron transport layer and a negative electrode were vapor-deposited in a similar manner to Example 10 to obtain an organic EL element.

INDUSTRIAL APPLICABILITY

The polycyclic aromatic compound of the present invention has excellent solubility, film formability, wet coatability, and in-plane orientation, and therefore can provide a light emitting layer-forming composition having good film formability and storage stability by a wet film formation method. Furthermore, use of a composition containing this polycyclic aromatic compound can provide an excellent organic EL element.

REFERENCE SIGNS LIST

100 Organic electroluminescent element
101 Substrate
102 Positive electrode
103 Hole injection layer
104 Hole transport layer
105 Light emitting layer 106 Electron transport layer
107 Electron injection layer
108 Negative electrode
110 Substrate
120 Electrode
130 Coating film
140 Coating film
150 Light emitting layer
200 Bank
300 Ink jet head
310 Droplet of ink

The invention claimed is:

1. A compound represented by the following general formula (A-1)

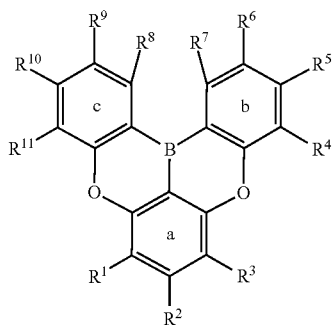

(A-1)

in general formula (A-1), $R^1$ to $R^{11}$ each independently represent a hydrogen atom, an aryl, a heteroaryl, a diarylamino, a diheteroarylamino, an arylheteroarylamino, or an aryloxy, while at least one hydrogen atom in these may be further substituted by an aryl, a heteroaryl, or a diarylamino, adjacent groups among $R^1$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, or an aryloxy, at least one hydrogen atom in these may be further substituted by an aryl, a heteroaryl, or a diarylamino, at least one hydrogen atom in a compound represented by the above formula (A-1) is substituted by a group represented by the following general formula (FG-1), a group represented by the following general formula (FG-2), or an alkyl having 7 to 24 carbon atoms, at least one hydrogen atom in a compound represented by the above formula (A-1) may be further substituted by a halogen atom or a deuterium atom, any —$CH_2$— in the alkyl may be substituted by —O— or —$Si(CH_3)_2$—, any —$CH_2$— excluding —$CH_2$-directly bonded to the compound represented by the above formula (A-1) in the alkyl may be substituted by an arylene having 6 to 24 carbon atoms, and any hydrogen atom in the alkyl may be substituted by a fluorine atom

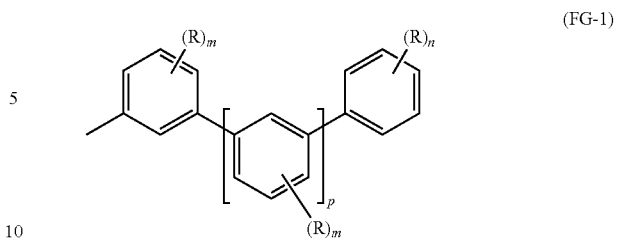

(FG-1)

in general formula (FG-1),

R's each independently represent a fluorine atom, a trimethylsilyl, a trifluoromethyl, an alkyl having 1 to 24 carbon atoms, or a cycloalkyl having 3 to 24 carbon atoms, any —$CH_2$-in the alkyl may be substituted by —O—, any —$CH_2$— excluding —$CH_2$-directly bonded to a phenyl or a phenylene in the alkyl may be substituted by an arylene having 6 to 24 carbon atoms, at least one hydrogen atom in the cycloalkyl may be substituted by an alkyl having 1 to 24 carbon atoms or an aryl having 6 to 12 carbon atoms, when two adjacent R's each represent an alkyl or a cycloalkyl, these R's may be bonded to each other to form a ring, m's each independently represent an integer of 0 to 4, n's each independently represent an integer of 0 to 5, and p's each independently represent an integer of 1 to 5

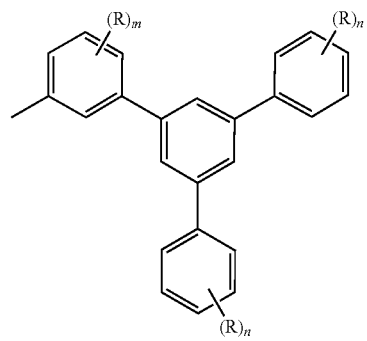

(FG-2)

in general formula (FG-2),

R's each independently represent a fluorine atom, a trimethylsilyl, a trifluoromethyl, an alkyl having 1 to 24 carbon atoms, a cycloalkyl having 3 to 24 carbon atoms, or an aryl having 6 to 12 carbon atoms, any —$CH_2$-in the alkyl may be substituted by —O—, any —$CH_2$— excluding —$CH_2$— directly bonded to a phenyl or a phenylene in the alkyl may be substituted by an arylene having 6 to 24 carbon atoms, at least one hydrogen atom in the cycloalkyl may be substituted by an alkyl having 1 to 24 carbon atoms or an aryl having 6 to 12 carbon atoms, at least one hydrogen atom in the aryl may be substituted by an alkyl having 1 to 24 carbon atoms, when two adjacent R's each represent an alkyl or a cycloalkyl, these R's may be bonded to each other to form a ring, m's each independently represent an integer of 0 to 4, and n's each independently represent an integer of 0 to 5.

2. The compound of claim 1, in which
in the above formula (A-1),
$R^1$ to $R^{11}$ each independently represent a hydrogen atom, an aryl having 6 to 30 carbon atoms, a heteroaryl having 2 to 30 carbon atoms or a diarylamino (the aryl is an aryl having 6 to 12 carbon atoms), at least one hydrogen atom in these may be further substituted by an aryl having 6 to 30 carbon atoms, a heteroaryl having 2 to 30 carbon atoms or a diarylamino (the aryl is an aryl having 6 to 12 carbon atoms), adjacent groups among $R^1$ to $R^{11}$ may be bonded to each other to form an aryl ring having 9 to 16 carbon atoms or a heteroaryl ring having 6 to 15 carbon atoms together with ring a, ring b, or ring c, at least one hydrogen atom in the ring thus formed may be substituted by an aryl having 6 to 30 carbon atoms, a heteroaryl having 2 to 30 carbon atoms or a diarylamino (the aryl is an aryl having 6 to 12 carbon atoms), at least one hydrogen atom in these may be further substituted by an aryl having 6 to 30 carbon atoms, a heteroaryl having 2 to 30 carbon atoms or a diarylamino (the aryl is an aryl having 6 to 12 carbon atoms), and at least one hydrogen atom in a compound represented by the above formula (A-1) is substituted by a group represented by the above formula (FG-1), a group represented by the above formula (FG-2), or an alkyl having 7 to 24 carbon atoms, at least one hydrogen atom in a compound represented by the above formula (A-1) may be further substituted by a halogen atom or a deuterium atom.

3. The compound of claim 1, in which
in the above formula (A-1),
$R^1$ to $R^{11}$ each independently represent any one selected from the group consisting of a hydrogen atom and groups represented by the following formulas (RG-1) to (RG-10), and the groups represented by the following formulas (RG-1) to (RG-10) are each bonded to the above formula (A-1) at *, and

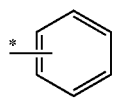

(RG-1)

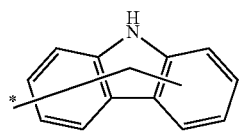

(RG-2)

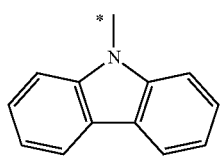

(RG-3)

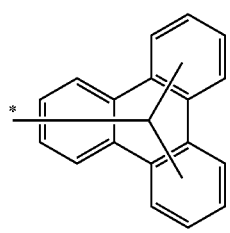

(RG-4)

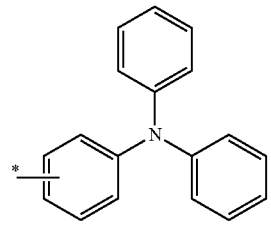

(RG-5)

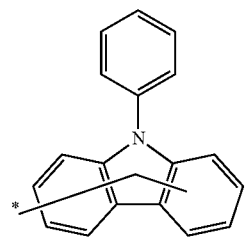

(RG-6)

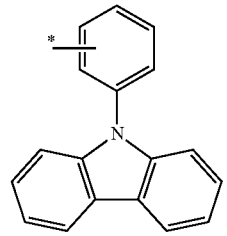

(RG-7)

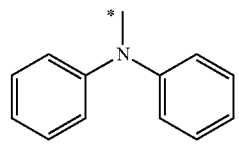

(RG-8)

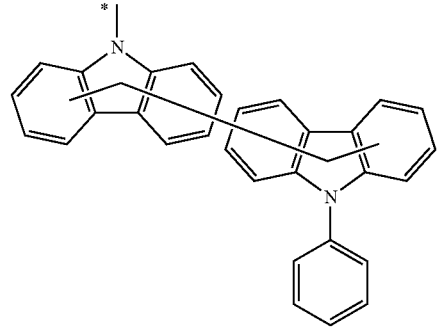

(RG-9)

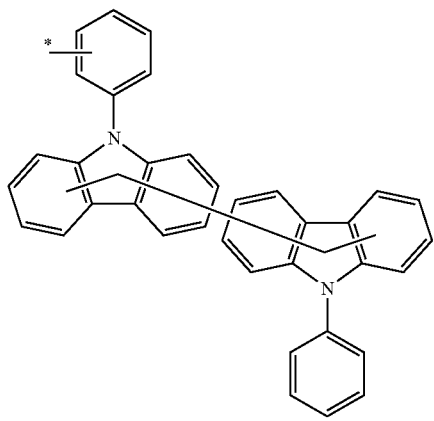

(RG-10)

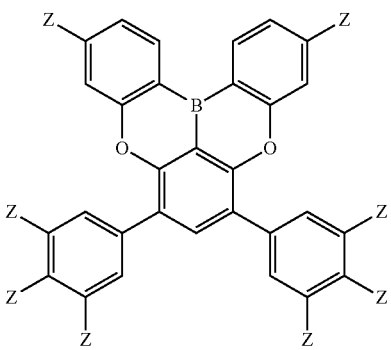

(1-91-z)

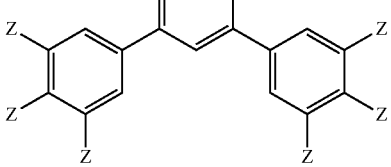

at least one hydrogen atom in a compound represented by the above formula (A-1) is substituted by a group represented by the above formula (FG-1), a group represented by the above formula (FG-2), or an alkyl having 7 to 24 carbon atoms.

4. The compound of claim 1, in which a compound represented by the above formula (A-1) is a compound represented by the following formula (1-1-z), (1-49-z), (1-91-z), (1-100-z), (1-152-z), (1-176-z), (1-1048-z), (1-1049-z), (1-1050-z), (1-1069-z), (1-1101-z), (1-1102-z), or (1-1103-z)

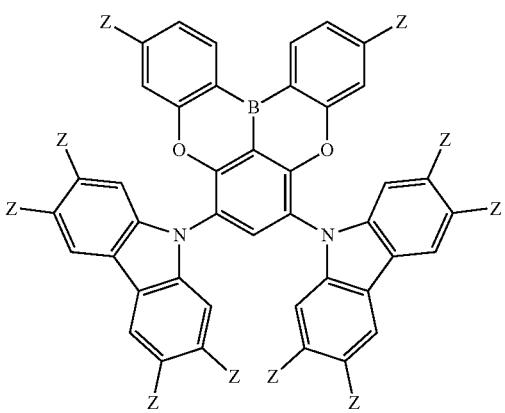

(1-100-z)

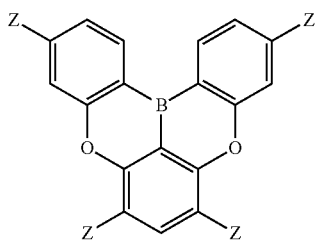

(1-1-z)

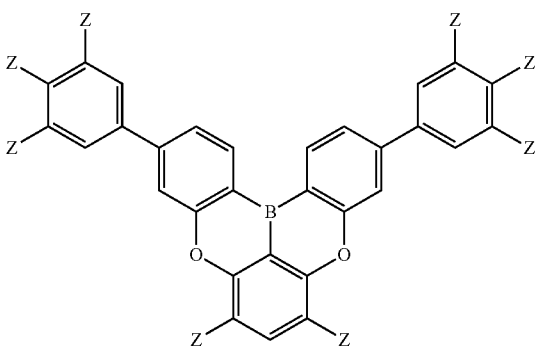

(1-152-z)

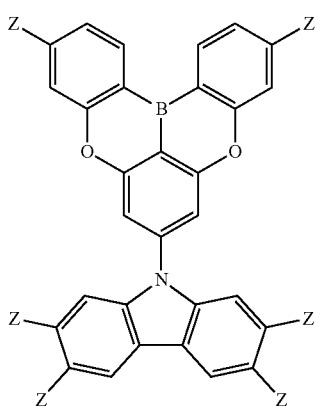

(1-49-z)

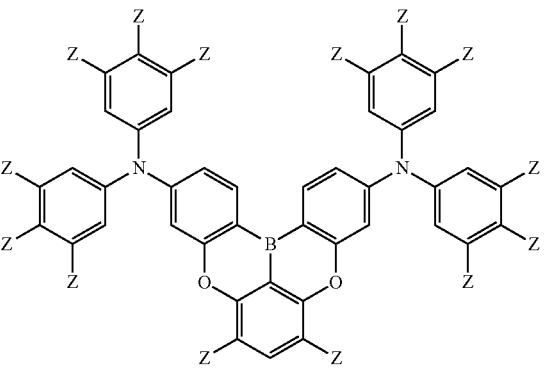

(1-176-z)

(1-1048-z) 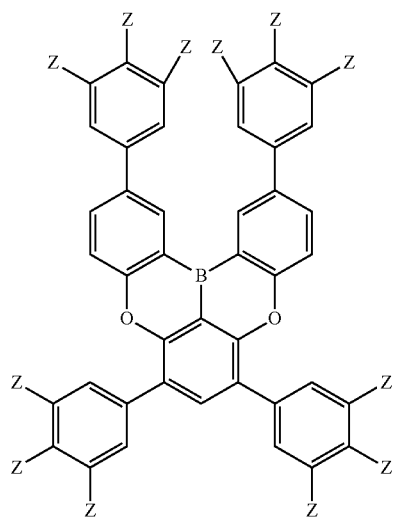
(1-1069-z) 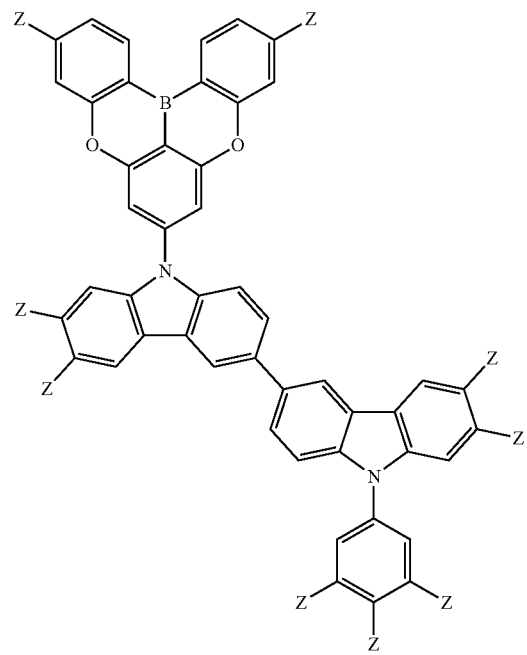
(1-1049-z) 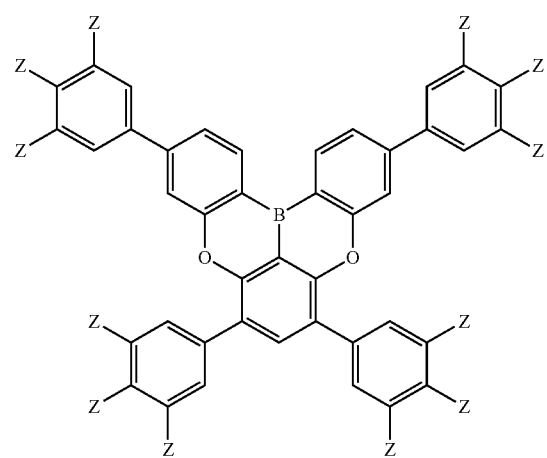
(1-1101-z) 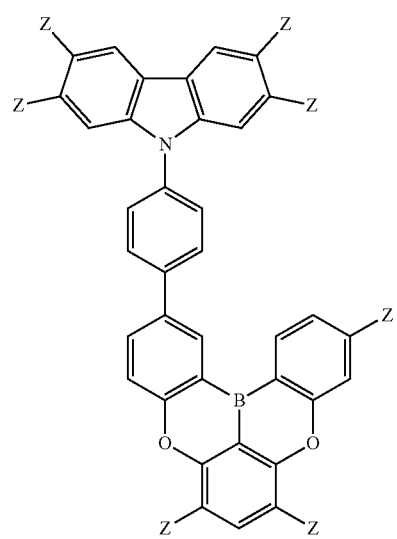
(1-1050-z) 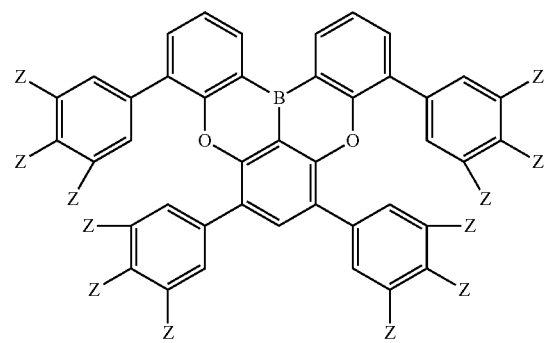
(1-1102-z) 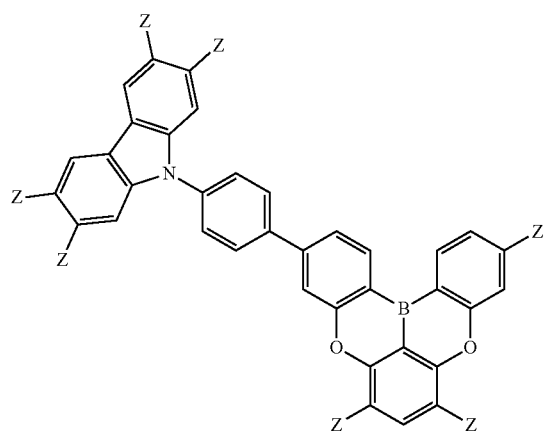

-continued (1-1103-z)

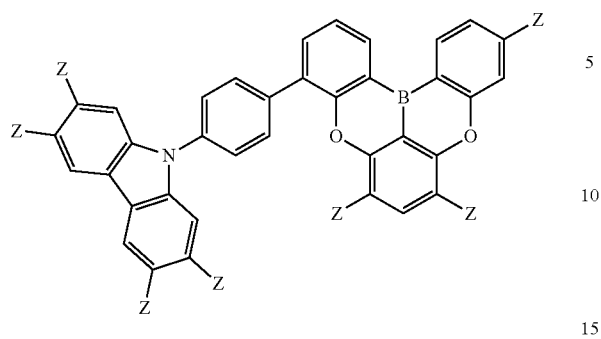

z's in the above formulas each represent a hydrogen atom, a group represented by the above formula (FG-1), a group represented by the above formula (FG-2), or an alkyl having 7 to 24 carbon atoms, and not all z's represent hydrogen atoms.

5. The compound of claim 1, in which
in the above formula (FG-1), m and n each represent 0, and p represents an integer of 1 to 3, and
in the formula (FG-2), m and n each represent 0.

6. The compound of claim 1, in which at least one hydrogen atom in a compound represented by the above formula (A-1) is substituted by a group represented by the above formula (FG-1).

* * * * *